US012057314B2

(12) United States Patent
Kajbafvala et al.

(10) Patent No.: US 12,057,314 B2
(45) Date of Patent: Aug. 6, 2024

(54) METHODS FOR SILICON GERMANIUM UNIFORMITY CONTROL USING MULTIPLE PRECURSORS

(71) Applicant: ASM IP Holding B.V., Almere (NL)

(72) Inventors: Amir Kajbafvala, Chandler, AZ (US); Peter Westrom, Payson, AZ (US); Joe Margetis, Gilbert, AZ (US); Xin Sun, Tempe, AZ (US); Caleb Miskin, Mesa, AZ (US); Yen Lin Leow, Grenoble (FR); Yanfu Lu, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/317,965

(22) Filed: May 12, 2021

(65) Prior Publication Data

US 2021/0358741 A1 Nov. 18, 2021

Related U.S. Application Data

(60) Provisional application No. 63/025,499, filed on May 15, 2020.

(51) Int. Cl.

| | |
|---|---|
| ***C30B 25/16*** | (2006.01) |
| ***C23C 16/08*** | (2006.01) |
| ***C23C 16/455*** | (2006.01) |
| ***C23C 16/52*** | (2006.01) |
| ***C30B 25/18*** | (2006.01) |

(Continued)

(52) U.S. Cl.

CPC .......... *H01L 21/0262* (2013.01); *C23C 16/08* (2013.01); *C23C 16/45512* (2013.01); *C23C 16/52* (2013.01); *C30B 25/165* (2013.01); *C30B 25/186* (2013.01); *C30B 29/52* (2013.01); *H01L 21/02532* (2013.01)

(58) Field of Classification Search

CPC ......... C30B 25/00; C30B 25/02; C30B 25/14; C30B 25/16; C30B 25/165; C30B 25/18; C30B 25/186; C30B 29/00; C30B 29/52; H01L 21/02532; H01L 21/0262

USPC ............................... 117/84, 88, 95, 937, 939

See application file for complete search history.

(56) References Cited

U.S. PATENT DOCUMENTS

| | | | |
|---|---|---|---|
| D30,036 | S | 1/1899 | Rhind |
| D31,889 | S | 11/1899 | Gill |

(Continued)

FOREIGN PATENT DOCUMENTS

| | | |
|---|---|---|
| AT | 520629 | 6/2019 |
| CN | 1186873 | 7/1998 |

(Continued)

OTHER PUBLICATIONS

CNIPA; Office Action dated Jan. 10, 2013 in Application No. 201080015699.9.

(Continued)

*Primary Examiner* — Kenneth A Bratland, Jr.

(74) *Attorney, Agent, or Firm* — Snell & Wilmer L.L.P.

(57) ABSTRACT

A method of forming a silicon germanium layer on a surface of a substrate and a system for forming a silicon germanium layer are disclosed. Examples of the disclosure provide a method that includes providing a plurality of growth precursors to control and/or promote parasitic gas-phase and surface reactions, such that greater control of the film (e.g., thickness and/or composition) uniformity can be realized.

24 Claims, 12 Drawing Sheets

(51) Int. Cl.
*C30B 29/52* (2006.01)
*H01L 21/02* (2006.01)

(56) References Cited

U.S. PATENT DOCUMENTS

D56,051 S 8/1920 Cohn
2,059,480 A 11/1936 Obermaier
2,161,626 A 6/1939 Loughner et al.
2,240,163 A 4/1941 Pick
2,266,416 A 12/1941 Duclos
2,280,778 A 4/1942 Andersen
D142,841 S 11/1945 D'Algodt
2,410,420 A 11/1946 Bennett
2,441,253 A 5/1948 Sarver
2,480,557 A 8/1949 Cummins
2,563,931 A 8/1951 Harrison
2,660,061 A 11/1953 Lewis
2,745,640 A 5/1956 Cushman
2,847,320 A 8/1958 Bulloff
2,990,045 A 6/1961 Root
3,038,951 A 6/1962 Mead
3,089,507 A 5/1963 Drake et al.
3,094,396 A 6/1963 Flugge et al.
3,197,682 A 7/1965 Klass et al.
3,232,437 A 2/1966 Hultgren
3,263,502 A 8/1966 Springfield
3,332,286 A 7/1967 Strong
3,410,349 A 11/1968 Troutman
3,420,622 A 1/1969 Donges et al.
3,588,192 A 6/1971 Drutchas et al.
3,634,740 A 1/1972 Stevko
3,647,387 A 3/1972 Benson
3,647,716 A 3/1972 Koches
3,713,899 A 1/1973 Sebestyen
3,718,429 A 2/1973 Williamson
3,796,182 A 3/1974 Rosler
3,814,128 A 6/1974 Grantham
3,833,492 A 9/1974 Bollyky
3,854,443 A 12/1974 Baerg
3,862,397 A 1/1975 Anderson et al.
3,867,205 A 2/1975 Schley
3,885,504 A 5/1975 Baermann
3,887,790 A 6/1975 Ferguson
3,904,371 A 9/1975 Neti
3,913,058 A 10/1975 Nishio et al.
3,913,617 A 10/1975 van Laar
3,916,270 A 10/1975 Wachtler et al.
3,947,685 A 3/1976 Meinel
3,960,559 A 6/1976 Suzuki
3,962,004 A 6/1976 Sonneborn
3,983,401 A 9/1976 Livesay
3,997,638 A 12/1976 Manning et al.
4,048,110 A 9/1977 Vanderspurt
4,054,071 A 10/1977 Patejak
4,058,430 A 11/1977 Suntola et al.
4,079,944 A 3/1978 Durley et al.
4,093,491 A 6/1978 Whelpton et al.
4,099,041 A 7/1978 Berkman et al.
D249,341 S 9/1978 Mertz
4,126,027 A 11/1978 Smith et al.
4,134,425 A 1/1979 Gussefeld et al.
4,145,699 A 3/1979 Hu et al.
4,149,237 A 4/1979 Freitas
4,152,760 A 5/1979 Freitas et al.
4,157,751 A 6/1979 Grundken et al.
4,164,959 A 8/1979 Wurzburger
4,176,630 A 12/1979 Elmer
4,179,530 A 12/1979 Koppl et al.
4,181,330 A 1/1980 Kojima
4,184,188 A 1/1980 Briglia
4,194,536 A 3/1980 Stine et al.
4,217,463 A 8/1980 Swearingen
4,229,064 A 10/1980 Vetter et al.
4,234,449 A 11/1980 Wolson et al.
4,241,000 A 12/1980 McCauley et al.
4,314,763 A 2/1982 Steigmeier et al.
4,322,592 A 3/1982 Martin
4,324,611 A 4/1982 Vogel et al.
4,333,735 A 6/1982 Hardy
4,355,912 A 10/1982 Haak
4,384,918 A 5/1983 Abe
4,389,973 A 6/1983 Suntola et al.
D269,850 S 7/1983 Preisler et al.
4,393,013 A 7/1983 McMenamin
4,401,507 A 8/1983 Engle
4,412,133 A 10/1983 Eckes et al.
4,413,022 A 11/1983 Suntola et al.
4,414,492 A 11/1983 Hanlet
4,436,674 A 3/1984 McMenamin
4,444,990 A 4/1984 Villar
D274,122 S 6/1984 Stahel et al.
4,454,370 A 6/1984 Voznick
4,455,193 A 6/1984 Jeuch et al.
4,465,716 A 8/1984 Baber et al.
4,466,766 A 8/1984 Geren et al.
4,479,831 A 10/1984 Sandow
4,480,284 A 10/1984 Tojo et al.
4,481,300 A 11/1984 Hartnett et al.
4,484,061 A 11/1984 Zelinka et al.
4,488,506 A 12/1984 Heinecke et al.
4,495,024 A 1/1985 Bok
4,496,828 A 1/1985 Kusmierz et al.
4,499,354 A 2/1985 Hill et al.
4,502,094 A 2/1985 Lewin et al.
4,504,439 A 3/1985 Elter et al.
4,512,113 A 4/1985 Budinger
4,512,841 A 4/1985 Cunningham et al.
4,520,116 A 5/1985 Gentilman et al.
4,520,421 A 5/1985 Sakitani et al.
4,527,005 A 7/1985 McKelvey et al.
4,534,816 A 8/1985 Chen et al.
4,535,628 A 8/1985 Hope
4,537,001 A 8/1985 Uppstrom
4,548,688 A 10/1985 Mathews
4,551,192 A 11/1985 Di Milia et al.
4,554,611 A 11/1985 Lewin
4,560,590 A 12/1985 Bok
4,570,328 A 2/1986 Price et al.
4,575,408 A 3/1986 Bok
4,575,636 A 3/1986 Caprari
4,578,560 A 3/1986 Tanaka et al.
4,579,080 A 4/1986 Martin et al.
4,579,378 A 4/1986 Snyders
4,579,623 A 4/1986 Suzuki et al.
4,581,520 A 4/1986 Vu et al.
4,590,326 A 5/1986 Woldy
4,611,966 A 9/1986 Johnson
4,620,998 A 11/1986 Lalvani
4,622,918 A 11/1986 Bok
4,624,728 A 11/1986 Bithell et al.
D288,556 S 3/1987 Wallgren
4,653,541 A 3/1987 Oehlschlaeger et al.
4,654,226 A 3/1987 Jackson et al.
4,655,592 A 4/1987 Allemand
4,662,987 A 5/1987 Bok
4,664,769 A 5/1987 Cuomo et al.
4,670,126 A 6/1987 Messer et al.
4,681,134 A 7/1987 Paris
4,693,211 A 9/1987 Ogami et al.
4,700,089 A 10/1987 Fujii et al.
4,707,815 A 11/1987 Yamasaki
4,717,461 A 1/1988 Strahl et al.
4,718,637 A 1/1988 Contin
4,720,362 A 1/1988 Gentilman et al.
4,720,407 A 1/1988 Sculke
4,721,533 A 1/1988 Phillippi et al.
4,721,534 A 1/1988 Phillippi et al.
4,722,298 A 2/1988 Rubin et al.
4,724,272 A 2/1988 Raniere et al.
4,725,204 A 2/1988 Powell
4,735,259 A 4/1988 Vincent
4,738,618 A 4/1988 Massey et al.
4,738,748 A 4/1988 Kisa
4,747,367 A 5/1988 Posa

(56) References Cited

U.S. PATENT DOCUMENTS 4,749,416 A 6/1988 Greenspan
4,750,520 A 6/1988 Heim et al.
4,753,192 A 6/1988 Goldsmith et al.
4,753,856 A 6/1988 Haluska et al.
4,756,794 A 7/1988 Yoder
4,764,076 A 8/1988 Layman et al.
4,770,590 A 9/1988 Hugues et al.
4,771,015 A 9/1988 Kanai
4,775,281 A 10/1988 Prentakis
4,776,744 A 10/1988 Stonestreet et al.
4,780,169 A 10/1988 Stark et al.
4,781,511 A 11/1988 Harada et al.
4,789,294 A 12/1988 Sato et al.
4,790,258 A 12/1988 Drage et al.
4,802,441 A 2/1989 Waugh
4,804,086 A 2/1989 Grohrock
4,808,387 A 2/1989 Datta et al.
4,812,201 A 3/1989 Sakai et al.
4,812,217 A 3/1989 George et al.
4,821,674 A 4/1989 deBoer et al.
4,827,430 A 5/1989 Aid et al.
4,828,224 A 5/1989 Crabb et al.
4,830,515 A 5/1989 Cortes
4,837,113 A 6/1989 Luttmer et al.
4,837,185 A 6/1989 Yau et al.
4,854,263 A 8/1989 Chang et al.
4,854,266 A 8/1989 Simson et al.
4,857,137 A 8/1989 Tachi et al.
4,857,382 A 8/1989 Liu et al.
4,858,557 A 8/1989 Pozzetti et al.
4,863,374 A 9/1989 Vukovich
4,867,629 A 9/1989 Iwasawa et al.
4,871,523 A 10/1989 Datta et al.
4,874,273 A 10/1989 Tokisue et al.
4,880,982 A 11/1989 Hoksaas
4,882,199 A 11/1989 Sadoway et al.
4,886,162 A 12/1989 Ambrogio
4,916,091 A 4/1990 Freeman et al.
4,917,556 A 4/1990 Stark et al.
4,920,918 A 5/1990 Adams et al.
4,925,388 A 5/1990 Iseki et al.
4,931,135 A 6/1990 Horiuchi et al.
4,934,831 A 6/1990 Volbrecht
4,938,815 A 7/1990 McNeilly
D309,702 S 8/1990 Hall
4,949,671 A 8/1990 Davis et al.
4,949,848 A 8/1990 Kos
4,950,624 A 8/1990 Inuzima et al.
4,956,538 A 9/1990 Moslehi
4,958,061 A 9/1990 Wakabayashi et al.
D311,126 S 10/1990 Crowley
4,962,063 A 10/1990 Maydan et al.
4,963,506 A 10/1990 Liaw et al.
4,976,996 A 12/1990 Monkowski et al.
4,978,567 A 12/1990 Miller
4,984,904 A 1/1991 Nakano et al.
4,985,114 A 1/1991 Okudaira
4,986,215 A 1/1991 Yamada
4,987,102 A 1/1991 Nguyen et al.
4,987,856 A 1/1991 Hey
4,989,992 A 2/1991 Piai
4,991,614 A 2/1991 Hammel
5,002,632 A 3/1991 Loewenstein et al.
5,013,691 A 5/1991 Lory et al.
5,022,961 A 6/1991 Izumi et al.
5,027,746 A 7/1991 Frijlink
5,028,366 A 7/1991 Harakal et al.
D320,148 S 9/1991 Andrews
5,049,029 A 9/1991 Mitsui et al.
5,053,247 A 10/1991 Moore
5,057,436 A 10/1991 Ball
5,060,322 A 10/1991 Delepine
5,061,083 A 10/1991 Grimm et al.
5,062,386 A 11/1991 Christensen
5,064,337 A 11/1991 Asakawa et al.
5,065,698 A 11/1991 Koike
5,067,437 A 11/1991 Watanabe et al.
5,069,591 A 12/1991 Kinoshita
5,071,258 A 12/1991 Usher et al.
5,074,017 A 12/1991 Toya et al.
5,082,517 A 1/1992 Moslehi
5,084,126 A 1/1992 McKee
5,088,444 A 2/1992 Ohmine et al.
5,097,890 A 3/1992 Nakao
5,098,638 A 3/1992 Sawada
5,098,865 A 3/1992 Machado
5,104,514 A 4/1992 Quartarone
5,107,170 A 4/1992 Ishikawa et al.
5,108,192 A 4/1992 Mailliet et al.
5,110,407 A 5/1992 Ono et al.
5,114,683 A 5/1992 Hirase
5,116,018 A 5/1992 Friemoth et al.
5,117,121 A 5/1992 Watanabe et al.
D327,534 S 6/1992 Manville
5,119,760 A 6/1992 McMillan et al.
5,124,272 A 6/1992 Saito et al.
5,125,358 A 6/1992 Ueda et al.
5,125,710 A 6/1992 Gianelo
5,130,003 A 7/1992 Conrad
5,134,965 A 8/1992 Tokuda et al.
5,137,286 A 8/1992 Whitford
5,151,296 A 9/1992 Tokunaga
5,154,301 A 10/1992 Kos
5,158,128 A 10/1992 Inoue et al.
D330,900 S 11/1992 Wakegijig
5,167,716 A 12/1992 Boitnott et al.
5,167,761 A 12/1992 Westendorp et al.
5,174,881 A 12/1992 Iwasaki et al.
5,176,451 A 1/1993 Sasada
5,178,639 A 1/1993 Nishi
5,178,682 A 1/1993 Tsukamoto et al.
5,180,273 A 1/1993 Sakaya et al.
5,180,435 A 1/1993 Markunas et al.
5,181,779 A 1/1993 Shia et al.
5,182,232 A 1/1993 Chhabra et al.
5,183,511 A 2/1993 Yamazaki et al.
5,186,120 A 2/1993 Ohnishi et al.
D333,606 S 3/1993 Kanemitsu et al.
5,192,717 A 3/1993 Kawakami
5,193,912 A 3/1993 Saunders
5,193,969 A 3/1993 Rush et al.
5,194,401 A 3/1993 Adams et al.
5,199,603 A 4/1993 Prescott
5,208,961 A 5/1993 Lajoie
5,213,650 A 5/1993 Wang et al.
5,219,226 A 6/1993 James
5,221,556 A 6/1993 Hawkins et al.
5,225,366 A 7/1993 Yoder
5,226,383 A 7/1993 Bhat
5,226,713 A 7/1993 Matsumura
5,226,967 A 7/1993 Chen et al.
5,228,114 A 7/1993 Suzuki
5,231,062 A 7/1993 Mathers et al.
5,232,508 A 8/1993 Arena et al.
5,234,526 A 8/1993 Chen et al.
5,242,501 A 9/1993 McDiarmid
5,242,539 A 9/1993 Kumihashi et al.
5,243,195 A 9/1993 Nishi
5,243,202 A 9/1993 Mori et al.
5,246,218 A 9/1993 Yap et al.
5,246,500 A 9/1993 Samata et al.
5,249,960 A 10/1993 Monoe
5,250,092 A 10/1993 Nakano
5,252,133 A 10/1993 Miyazaki et al.
5,252,134 A 10/1993 Stauffer
5,259,881 A 11/1993 Edwards et al.
5,261,167 A 11/1993 Sakata
5,266,526 A 11/1993 Aoyama
5,268,989 A 12/1993 Moslehi et al.
5,271,967 A 12/1993 Kramer et al.
5,273,609 A 12/1993 Moslehi
5,277,932 A 1/1994 Spencer
5,278,494 A 1/1994 Obigane
5,279,886 A 1/1994 Kawai et al.

(56) References Cited

U.S. PATENT DOCUMENTS

| | | | |
|---|---|---|---|
| 5,279,986 | A | 1/1994 | Maloney et al. |
| 5,280,894 | A | 1/1994 | Witcraft et al. |
| 5,281,274 | A | 1/1994 | Yoder |
| 5,284,519 | A | 2/1994 | Gadgil |
| 5,288,684 | A | 2/1994 | Yamazaki et al. |
| 5,294,572 | A | 3/1994 | Granneman et al. |
| 5,294,778 | A | 3/1994 | Carman et al. |
| 5,295,777 | A | 3/1994 | Hodos |
| 5,298,089 | A | 3/1994 | Bowe et al. |
| 5,305,417 | A | 4/1994 | Najm et al. |
| 5,306,666 | A | 4/1994 | Izumi |
| 5,306,946 | A | 4/1994 | Yamamoto |
| 5,308,650 | A | 5/1994 | Krummel et al. |
| 5,308,788 | A | 5/1994 | Fitch et al. |
| 5,310,410 | A | 5/1994 | Begin et al. |
| 5,310,456 | A | 5/1994 | Kadomura |
| 5,312,245 | A | 5/1994 | Brannen et al. |
| 5,313,061 | A | 5/1994 | Drew et al. |
| 5,314,538 | A | 5/1994 | Maeda et al. |
| 5,314,570 | A | 5/1994 | Ikegaya et al. |
| 5,315,092 | A | 5/1994 | Takahashi et al. |
| 5,320,218 | A | 6/1994 | Yamashita et al. |
| 5,326,427 | A | 7/1994 | Jerbic |
| 5,328,360 | A | 7/1994 | Yokokawa |
| 5,328,810 | A | 7/1994 | Lowrey et al. |
| 5,335,309 | A | 8/1994 | Fujii et al. |
| 5,336,327 | A | 8/1994 | Lee |
| 5,338,362 | A | 8/1994 | Imahashi |
| 5,340,261 | A | 8/1994 | Oosawa et al. |
| 5,346,961 | A | 9/1994 | Shaw et al. |
| 5,348,774 | A | 9/1994 | Golecki et al. |
| 5,350,480 | A | 9/1994 | Gray |
| 5,354,433 | A | 10/1994 | Granneman et al. |
| 5,354,580 | A | 10/1994 | Goela et al. |
| 5,356,478 | A | 10/1994 | Chen et al. |
| 5,356,672 | A | 10/1994 | Schmitt et al. |
| 5,360,269 | A | 11/1994 | Ogawa et al. |
| 5,362,328 | A | 11/1994 | Gardiner et al. |
| 5,364,667 | A | 11/1994 | Rhieu |
| D353,452 | S | 12/1994 | Groenhoff |
| 5,374,315 | A | 12/1994 | Deboer et al. |
| D354,898 | S | 1/1995 | Nagy |
| 5,378,501 | A | 1/1995 | Foster et al. |
| 5,380,367 | A | 1/1995 | Bertone |
| 5,382,311 | A | 1/1995 | Ishikawa et al. |
| 5,387,265 | A | 2/1995 | Kakizaki et al. |
| 5,388,945 | A | 2/1995 | Garric et al. |
| 5,393,577 | A | 2/1995 | Uesugi et al. |
| 5,397,395 | A | 3/1995 | Sano et al. |
| 5,403,630 | A | 4/1995 | Matsui et al. |
| 5,404,082 | A | 4/1995 | Hernandez et al. |
| 5,407,449 | A | 4/1995 | Zinger |
| 5,407,867 | A | 4/1995 | Iwasaki et al. |
| 5,413,813 | A | 5/1995 | Cruse et al. |
| 5,414,221 | A | 5/1995 | Gardner |
| 5,415,753 | A | 5/1995 | Hurwitt et al. |
| 5,418,382 | A | 5/1995 | Blackwood et al. |
| 5,421,893 | A | 6/1995 | Perlov |
| 5,422,139 | A | 6/1995 | Fischer |
| 5,423,942 | A | 6/1995 | Robbins et al. |
| 5,426,137 | A | 6/1995 | Allen |
| 5,427,824 | A | 6/1995 | Inushima et al. |
| 5,430,011 | A | 7/1995 | Tanaka et al. |
| 5,431,734 | A | 7/1995 | Chapple-Sokol et al. |
| 5,443,646 | A | 8/1995 | Yamada et al. |
| 5,443,648 | A | 8/1995 | Ohkase |
| 5,443,686 | A | 8/1995 | Jones et al. |
| 5,444,217 | A | 8/1995 | Moore |
| 5,447,294 | A | 9/1995 | Sakata et al. |
| 5,453,124 | A | 9/1995 | Moslehi et al. |
| D363,464 | S | 10/1995 | Fukasawa |
| 5,456,207 | A | 10/1995 | Gedridge et al. |
| 5,456,757 | A | 10/1995 | Aruga et al. |
| 5,461,214 | A | 10/1995 | Peck et al. |
| 5,462,899 | A | 10/1995 | Ikeda |
| 5,463,176 | A | 10/1995 | Eckert |
| 5,464,313 | A | 11/1995 | Ohsawa |
| 5,474,410 | A | 12/1995 | Ozawa et al. |
| 5,474,612 | A | 12/1995 | Sato et al. |
| 5,478,429 | A | 12/1995 | Komino et al. |
| 5,480,488 | A | 1/1996 | Bittner et al. |
| 5,480,818 | A | 1/1996 | Matsumoto et al. |
| 5,482,559 | A | 1/1996 | Imai et al. |
| 5,484,484 | A | 1/1996 | Yamaga et al. |
| 5,494,439 | A | 2/1996 | Goldstein et al. |
| 5,494,494 | A | 2/1996 | Mizuno et al. |
| 5,496,408 | A | 3/1996 | Motoda et al. |
| 5,501,740 | A | 3/1996 | Besen et al. |
| 5,503,875 | A | 4/1996 | Imai et al. |
| 5,504,042 | A | 4/1996 | Cho et al. |
| 5,510,277 | A | 4/1996 | Cunningham et al. |
| 5,512,102 | A | 4/1996 | Yamazaki |
| 5,514,439 | A | 5/1996 | Sibley |
| 5,518,549 | A | 5/1996 | Hellwig |
| 5,518,780 | A | 5/1996 | Tamor et al. |
| 5,519,234 | A | 5/1996 | Paz de Araujo |
| 5,520,743 | A | 5/1996 | Takahashi et al. |
| 5,523,616 | A | 6/1996 | Yasuhide |
| 5,527,111 | A | 6/1996 | Lysen et al. |
| 5,527,417 | A | 6/1996 | Iida et al. |
| 5,531,218 | A | 7/1996 | Krebs |
| 5,531,835 | A | 7/1996 | Fodor et al. |
| 5,537,311 | A | 7/1996 | Stevens |
| 5,540,059 | A | 7/1996 | Yokokawa |
| 5,540,821 | A | 7/1996 | Tepman |
| 5,540,898 | A | 7/1996 | Davidson |
| 5,554,557 | A | 9/1996 | Koh |
| 5,556,275 | A | 9/1996 | Sakata et al. |
| 5,558,717 | A | 9/1996 | Zhao et al. |
| 5,559,046 | A | 9/1996 | Oishi et al. |
| 5,562,383 | A | 10/1996 | Iwai et al. |
| 5,562,947 | A | 10/1996 | White et al. |
| 5,562,952 | A | 10/1996 | Nakahigashi et al. |
| 5,565,038 | A | 10/1996 | Ashley |
| 5,569,402 | A | 10/1996 | Meisser et al. |
| 5,574,247 | A | 11/1996 | Nishitani et al. |
| 5,576,629 | A | 11/1996 | Turner |
| 5,577,331 | A | 11/1996 | Suzuki |
| 5,583,736 | A | 12/1996 | Anderson et al. |
| 5,584,936 | A | 12/1996 | Pickering et al. |
| 5,584,963 | A | 12/1996 | Takahashi |
| 5,586,585 | A | 12/1996 | Bonora et al. |
| 5,589,002 | A | 12/1996 | Su |
| 5,589,110 | A | 12/1996 | Motoda et al. |
| 5,595,606 | A | 1/1997 | Fujikawa et al. |
| 5,601,641 | A | 2/1997 | Stephens |
| 5,602,060 | A | 2/1997 | Kobayashi et al. |
| 5,604,410 | A | 2/1997 | Vollkommer et al. |
| 5,611,448 | A | 3/1997 | Chen |
| 5,616,264 | A | 4/1997 | Nishi et al. |
| 5,616,947 | A | 4/1997 | Tamura |
| 5,621,982 | A | 4/1997 | Yamashita |
| 5,632,919 | A | 5/1997 | MacCracken et al. |
| 5,637,153 | A | 6/1997 | Niino et al. |
| D380,527 | S | 7/1997 | Velez |
| 5,645,646 | A | 7/1997 | Beinglass et al. |
| 5,650,013 | A | 7/1997 | Yamazaki |
| 5,650,351 | A | 7/1997 | Wu |
| 5,653,807 | A | 8/1997 | Crumbaker |
| 5,656,093 | A | 8/1997 | Burkhart et al. |
| 5,661,263 | A | 8/1997 | Salvaggio |
| 5,662,470 | A | 9/1997 | Huussen et al. |
| 5,663,899 | A | 9/1997 | Zvonar et al. |
| 5,665,608 | A | 9/1997 | Chapple-Sokol et al. |
| 5,667,592 | A | 9/1997 | Boitnott et al. |
| 5,670,786 | A | 9/1997 | Meyer et al. |
| 5,679,215 | A | 10/1997 | Barnes et al. |
| 5,681,779 | A | 10/1997 | Pasch et al. |
| D386,076 | S | 11/1997 | Moore |
| 5,683,517 | A | 11/1997 | Shan |
| 5,683,561 | A | 11/1997 | Hollars et al. |
| 5,685,912 | A | 11/1997 | Nishizaka |
| 5,685,914 | A | 11/1997 | Hills et al. |
| 5,690,742 | A | 11/1997 | Ogata et al. |

(56) References Cited

U.S. PATENT DOCUMENTS 5,695,567 A 12/1997 Kordina
5,697,706 A 12/1997 Ciaravino et al.
5,698,036 A 12/1997 Ishii et al.
5,700,729 A 12/1997 Lee et al.
5,708,825 A 1/1998 Sotomayor
5,709,745 A 1/1998 Larkin et al.
5,711,811 A 1/1998 Suntola et al.
5,716,133 A 2/1998 Hosokawa et al.
5,718,574 A 2/1998 Shimazu
5,720,927 A 2/1998 Cripe et al.
D392,855 S 3/1998 Pillow
5,724,748 A 3/1998 Brooks
5,728,223 A 3/1998 Murakarni et al.
5,728,425 A 3/1998 Ebe et al.
5,730,801 A 3/1998 Tepman et al.
5,730,802 A 3/1998 Ishizumi et al.
5,732,597 A 3/1998 Devenyi
5,732,744 A 3/1998 Barr et al.
5,732,957 A 3/1998 Yu
5,736,314 A 4/1998 Hayes et al.
5,753,835 A 5/1998 Gustin
5,754,390 A 5/1998 Sandhu et al.
5,759,281 A 6/1998 Gurary et al.
5,761,328 A 6/1998 Solberg et al.
5,766,365 A 6/1998 Umutoy et al.
5,768,125 A 6/1998 Zinger et al.
5,769,952 A 6/1998 Komino
5,775,889 A 7/1998 Kobayashi et al.
5,777,838 A 7/1998 Tamagawa et al.
5,779,203 A 7/1998 Edlinger
5,781,693 A 7/1998 Ballance et al.
5,782,979 A 7/1998 Kaneno
5,790,750 A 8/1998 Anderson
5,791,782 A 8/1998 Wooten et al.
5,792,272 A 8/1998 Van Os et al.
5,796,074 A 8/1998 Edelstein et al.
5,801,104 A 9/1998 Schuegraf et al.
5,801,945 A 9/1998 Comer
5,804,505 A 9/1998 Yamada et al.
5,806,980 A 9/1998 Berrian
5,813,851 A 9/1998 Nakao
5,818,716 A 10/1998 Chin et al.
5,819,092 A 10/1998 Ferguson et al.
5,819,434 A 10/1998 Herchen et al.
5,820,366 A 10/1998 Lee
5,820,685 A 10/1998 Kurihra et al.
5,820,686 A 10/1998 Moore
5,826,129 A 10/1998 Hasebe et al.
5,827,420 A 10/1998 Shirazi et al.
5,827,435 A 10/1998 Samukawa
5,827,757 A 10/1998 Robinson et al.
5,836,483 A 11/1998 Disel
5,837,058 A 11/1998 Chen et al.
5,837,320 A 11/1998 Hampden-Smith et al.
5,844,683 A 12/1998 Pavloski et al.
5,846,332 A 12/1998 Zhao et al.
5,851,293 A 12/1998 Lane et al.
5,851,294 A 12/1998 Young et al.
5,851,299 A 12/1998 Cheng et al.
5,852,445 A 12/1998 Yoshikawa et al.
5,852,879 A 12/1998 Schumaier
5,853,484 A 12/1998 Jeong
D403,949 S 1/1999 Nakamura
D404,370 S 1/1999 Kimura
D404,372 S 1/1999 Ishii
5,855,680 A 1/1999 Soininen et al.
5,855,681 A 1/1999 Maydan et al.
5,855,687 A 1/1999 DuBois et al.
5,855,726 A 1/1999 Soraoka et al.
5,857,777 A 1/1999 Schuh
5,861,233 A 1/1999 Sekine et al.
5,862,302 A 1/1999 Okase
5,863,123 A 1/1999 Lee et al.
5,865,205 A 2/1999 Wilmer
5,866,795 A 2/1999 Wang et al.
5,871,586 A 2/1999 Crawley et al.
5,872,065 A 2/1999 Sivaramakrishnan
5,873,942 A 2/1999 Park
5,877,095 A 3/1999 Tamura et al.
5,879,128 A 3/1999 Tietz et al.
5,879,459 A 3/1999 Gadgil et al.
5,880,980 A 3/1999 Rothacher et al.
5,882,165 A 3/1999 Maydan et al.
5,884,640 A 3/1999 Fishkin et al.
5,888,304 A 3/1999 Umotoy et al.
5,891,251 A 4/1999 MacLeish et al.
5,893,741 A 4/1999 Huang
5,897,348 A 4/1999 Wu
5,897,378 A 4/1999 Eriguchi
5,897,379 A 4/1999 Ulrich et al.
5,897,710 A 4/1999 Sato et al.
D409,894 S 5/1999 McClurg
5,904,170 A 5/1999 Harvey et al.
D411,516 S 6/1999 Imafuku et al.
5,908,672 A 6/1999 Ryu
5,915,200 A 6/1999 Tokumasu et al.
5,915,562 A 6/1999 Nyseth et al.
5,916,365 A 6/1999 Sherman
D412,270 S 7/1999 Fredrickson
5,920,798 A 7/1999 Higuchi et al.
5,928,426 A 7/1999 Aitchison
D412,512 S 8/1999 Boisvert
5,937,142 A 8/1999 Moslehi et al.
5,937,323 A 8/1999 Orczyk et al.
5,939,886 A 8/1999 Turner et al.
5,947,718 A 9/1999 Weaver
5,950,327 A 9/1999 Peterson et al.
5,950,925 A 9/1999 Fukunaga et al.
5,954,375 A 9/1999 Trickle et al.
5,961,775 A 10/1999 Fujimura
5,968,275 A 10/1999 Lee et al.
5,970,621 A 10/1999 Bazydola
5,972,196 A 10/1999 Murphy et al.
5,975,492 A 11/1999 Brenes
5,976,973 A 11/1999 Ohira et al.
5,979,506 A 11/1999 Aarseth
5,982,931 A 11/1999 Ishimaru
5,984,391 A 11/1999 Vanderpot et al.
5,987,480 A 11/1999 Donohue et al.
5,989,342 A 11/1999 Ikeda et al.
5,992,453 A 11/1999 Zimmer
5,997,588 A 12/1999 Goodwin
5,997,768 A 12/1999 Scully
5,998,870 A 12/1999 Lee et al.
6,000,732 A 12/1999 Scheler et al.
6,001,183 A 12/1999 Gurary et al.
6,001,267 A 12/1999 Van Os et al.
6,004,204 A 12/1999 Luxton et al.
D419,652 S 1/2000 Hall et al.
6,013,553 A 1/2000 Wallace
6,013,920 A 1/2000 Gordon et al.
6,014,677 A 1/2000 Hayashi et al.
6,015,459 A 1/2000 Jamison et al.
6,015,465 A 1/2000 Kholodenko et al.
6,017,779 A 1/2000 Miyasaka
6,017,818 A 1/2000 Lu
6,022,180 A 2/2000 Motoyama et al.
6,022,802 A 2/2000 Jang
6,024,799 A 2/2000 Chen et al.
6,025,117 A 2/2000 Nakano et al.
6,027,163 A 2/2000 Longenecker et al.
6,029,602 A 2/2000 Bhatnagar
6,030,900 A 2/2000 Grass1 et al.
6,033,215 A 3/2000 Ohsawa
6,035,101 A 3/2000 Sajoto et al.
6,035,804 A 3/2000 Arami et al.
6,039,809 A 3/2000 Toyama et al.
6,042,652 A 3/2000 Hyun
6,044,860 A 4/2000 Neu
6,045,260 A 4/2000 Schwartz et al.
6,048,154 A 4/2000 Wytman
6,050,506 A 4/2000 Guo et al.
6,053,982 A 4/2000 Halpin et al.
6,053,983 A 4/2000 Saeki et al.

(56) References Cited

U.S. PATENT DOCUMENTS

| | | | |
|---|---|---|---|
| 6,054,013 | A | 4/2000 | Collins et al. |
| 6,054,678 | A | 4/2000 | Miyazaki |
| 6,060,691 | A | 5/2000 | Minami et al. |
| 6,060,721 | A | 5/2000 | Huang |
| 6,063,196 | A | 5/2000 | Li et al. |
| 6,066,204 | A | 5/2000 | Haven |
| 6,068,441 | A | 5/2000 | Raaijmakers et al. |
| 6,071,572 | A | 6/2000 | Mosely et al. |
| 6,072,163 | A | 6/2000 | Armstrong et al. |
| 6,073,973 | A | 6/2000 | Boscaljon et al. |
| 6,074,154 | A | 6/2000 | Ueda et al. |
| 6,074,443 | A | 6/2000 | Venkatesh |
| 6,074,514 | A | 6/2000 | Bjorkman et al. |
| 6,077,027 | A | 6/2000 | Kawamura et al. |
| 6,079,356 | A | 6/2000 | Umotoy et al. |
| 6,079,927 | A | 6/2000 | Muka |
| 6,083,321 | A | 7/2000 | Lei et al. |
| 6,086,677 | A | 7/2000 | Umotoy et al. |
| 6,090,212 | A | 7/2000 | Mahawili |
| 6,090,442 | A | 7/2000 | Klaus et al. |
| 6,090,659 | A | 7/2000 | Laibowitz et al. |
| 6,091,062 | A | 7/2000 | Pfahnl et al. |
| 6,093,252 | A | 7/2000 | Wengert et al. |
| 6,093,253 | A | 7/2000 | Lofgren |
| 6,093,611 | A | 7/2000 | Gardner et al. |
| 6,095,083 | A | 8/2000 | Rice et al. |
| 6,096,133 | A | 8/2000 | Yuuki et al. |
| 6,096,267 | A | 8/2000 | Kishkovich |
| 6,099,302 | A | 8/2000 | Hong et al. |
| 6,099,649 | A | 8/2000 | Schmitt et al. |
| 6,099,651 | A | 8/2000 | Sajoto et al. |
| 6,102,565 | A | 8/2000 | Kita et al. |
| 6,104,002 | A | 8/2000 | Hirose et al. |
| 6,104,011 | A | 8/2000 | Juliano |
| 6,104,401 | A | 8/2000 | Parsons |
| 6,106,625 | A | 8/2000 | Koai et al. |
| 6,106,678 | A | 8/2000 | Shufflebotham |
| 6,110,531 | A | 8/2000 | Paz de Araujo et al. |
| 6,113,703 | A | 9/2000 | Anderson et al. |
| 6,119,710 | A | 9/2000 | Brown |
| 6,121,061 | A | 9/2000 | Van Bilsen et al. |
| 6,121,158 | A | 9/2000 | Benchikha et al. |
| 6,122,036 | A | 9/2000 | Yamasaki et al. |
| 6,124,600 | A | 9/2000 | Moroishi et al. |
| 6,125,789 | A | 10/2000 | Gupta et al. |
| 6,126,744 | A | 10/2000 | Hawkins et al. |
| 6,126,848 | A | 10/2000 | Li et al. |
| 6,127,249 | A | 10/2000 | Hu |
| 6,129,044 | A | 10/2000 | Zhao et al. |
| 6,129,546 | A | 10/2000 | Sada |
| 6,132,207 | A | 10/2000 | Stoutjesdijk |
| 6,134,807 | A | 10/2000 | Komino |
| 6,135,460 | A | 10/2000 | Wise et al. |
| 6,137,240 | A | 10/2000 | Bogdan |
| 6,139,239 | A | 10/2000 | Snijders |
| 6,139,983 | A | 10/2000 | Ohashi et al. |
| 6,140,252 | A | 10/2000 | Cho et al. |
| 6,143,079 | A | 11/2000 | Halpin |
| 6,143,082 | A | 11/2000 | McInerney et al. |
| 6,143,129 | A | 11/2000 | Savas et al. |
| 6,146,463 | A | 11/2000 | Yudovsky et al. |
| 6,148,761 | A | 11/2000 | Majewski et al. |
| 6,151,446 | A | 11/2000 | Hunter et al. |
| 6,152,070 | A | 11/2000 | Fairbairn et al. |
| 6,152,669 | A | 11/2000 | Morita et al. |
| 6,156,151 | A | 12/2000 | Komino et al. |
| 6,158,941 | A | 12/2000 | Muka et al. |
| 6,159,301 | A | 12/2000 | Sato et al. |
| 6,160,244 | A | 12/2000 | Ohashi |
| 6,161,500 | A | 12/2000 | Kopacz et al. |
| 6,162,323 | A | 12/2000 | Koshimizu |
| 6,164,894 | A | 12/2000 | Cheng |
| 6,174,809 | B1 | 1/2001 | Kang et al. |
| 6,176,929 | B1 | 1/2001 | Fukunaga et al. |
| 6,177,688 | B1 | 1/2001 | Linthicum et al. |
| 6,178,918 | B1 | 1/2001 | Van Os et al. |
| 6,179,955 | B1 | 1/2001 | Shin et al. |
| 6,180,979 | B1 | 1/2001 | Hofman et al. |
| 6,182,603 | B1 | 2/2001 | Shang et al. |
| 6,183,564 | B1 | 2/2001 | Reynolds et al. |
| 6,183,565 | B1 | 2/2001 | Granneman et al. |
| 6,187,672 | B1 | 2/2001 | Zhao et al. |
| 6,187,691 | B1 | 2/2001 | Fukuda |
| 6,189,482 | B1 | 2/2001 | Zhao et al. |
| 6,190,037 | B1 | 2/2001 | Das et al. |
| 6,190,113 | B1 | 2/2001 | Bui et al. |
| 6,190,634 | B1 | 2/2001 | Lieber et al. |
| 6,191,399 | B1 | 2/2001 | Van Bilsen |
| 6,194,037 | B1 | 2/2001 | Terasaki et al. |
| 6,200,897 | B1 | 3/2001 | Wang et al. |
| 6,201,999 | B1 | 3/2001 | Jevtic |
| 6,203,613 | B1 | 3/2001 | Gates et al. |
| 6,203,618 | B1 | 3/2001 | Hashizume et al. |
| 6,207,932 | B1 | 3/2001 | Yoo |
| 6,207,936 | B1 | 3/2001 | de Waard |
| 6,209,221 | B1 | 4/2001 | Beulens |
| 6,210,485 | B1 | 4/2001 | Zhao et al. |
| 6,212,789 | B1 | 4/2001 | Kato |
| 6,213,708 | B1 | 4/2001 | Allen |
| 6,214,122 | B1 | 4/2001 | Thompson |
| 6,214,717 | B1 | 4/2001 | Yan et al. |
| 6,217,658 | B1 | 4/2001 | Orczyk et al. |
| 6,217,662 | B1 | 4/2001 | Kong et al. |
| 6,218,288 | B1 | 4/2001 | Li et al. |
| 6,224,679 | B1 | 5/2001 | Sasaki et al. |
| 6,225,020 | B1 | 5/2001 | Jung et al. |
| 6,225,602 | B1 | 5/2001 | Buiijze et al. |
| 6,225,745 | B1 | 5/2001 | Srivastava |
| 6,230,650 | B1 | 5/2001 | Yamazaki |
| 6,231,290 | B1 | 5/2001 | Kikuchi et al. |
| 6,235,121 | B1 | 5/2001 | Honma et al. |
| 6,235,858 | B1 | 5/2001 | Swarup et al. |
| 6,238,734 | B1 | 5/2001 | Senzaki et al. |
| 6,239,402 | B1 | 5/2001 | Araki et al. |
| 6,239,715 | B1 | 5/2001 | Belton |
| 6,240,875 | B1 | 6/2001 | Wijck et al. |
| 6,241,822 | B1 | 6/2001 | Ide |
| 6,242,359 | B1 | 6/2001 | Misra |
| 6,243,654 | B1 | 6/2001 | Johnson et al. |
| 6,245,647 | B1 | 6/2001 | Akiyama et al. |
| 6,245,665 | B1 | 6/2001 | Yokoyama |
| 6,247,245 | B1 | 6/2001 | Ishii |
| 6,250,250 | B1 | 6/2001 | Maishev et al. |
| 6,255,221 | B1 | 7/2001 | Hudson et al. |
| 6,257,758 | B1 | 7/2001 | Culbertson |
| 6,261,648 | B1 | 7/2001 | Akiba et al. |
| 6,264,467 | B1 | 7/2001 | Lue et al. |
| 6,265,113 | B1 | 7/2001 | Rosasco et al. |
| 6,265,311 | B1 | 7/2001 | Hautala et al. |
| 6,270,572 | B1 | 8/2001 | Kim et al. |
| 6,271,148 | B1 | 8/2001 | Kao |
| 6,271,320 | B1 | 8/2001 | Keller et al. |
| 6,274,496 | B1 | 8/2001 | Leusink et al. |
| 6,274,878 | B1 | 8/2001 | Li et al. |
| 6,281,098 | B1 | 8/2001 | Wang |
| 6,281,141 | B1 | 8/2001 | Das et al. |
| 6,283,692 | B1 | 9/2001 | Perlov et al. |
| 6,284,050 | B1 | 9/2001 | Shi et al. |
| 6,284,149 | B1 | 9/2001 | Li et al. |
| 6,287,965 | B1 | 9/2001 | Kang et al. |
| 6,287,988 | B1 | 9/2001 | Nagamine et al. |
| 6,293,700 | B1 | 9/2001 | Lund et al. |
| D449,873 | S | 10/2001 | Bronson |
| 6,296,710 | B1 | 10/2001 | Allen et al. |
| 6,296,711 | B1 | 10/2001 | Loan et al. |
| 6,296,909 | B1 | 10/2001 | Spitsberg |
| 6,297,539 | B1 | 10/2001 | Ma et al. |
| 6,299,133 | B2 | 10/2001 | Waragai et al. |
| 6,302,964 | B1 | 10/2001 | Umotoy et al. |
| 6,303,523 | B2 | 10/2001 | Cheung |
| 6,305,898 | B1 | 10/2001 | Yamagishi et al. |
| 6,311,016 | B1 | 10/2001 | Yanagawa et al. |
| 6,312,525 | B1 | 11/2001 | Bright et al. |
| 6,315,512 | B1 | 11/2001 | Tabrizi et al. |

(56) References Cited

U.S. PATENT DOCUMENTS 6,316,162 B1 11/2001 Jung et al.
6,316,371 B1 11/2001 Oosterlaken et al.
6,320,320 B1 11/2001 Bailey et al.
6,321,680 B2 11/2001 Cook et al.
6,321,780 B1 11/2001 Iwabuchi
D451,893 S 12/2001 Robson
D452,220 S 12/2001 Robson
6,325,858 B1 12/2001 Wengert
6,326,322 B1 12/2001 Kim et al.
6,326,597 B1 12/2001 Lubomirsky et al.
6,328,561 B1 12/2001 Hasper et al.
6,328,864 B1 12/2001 Ishizawa et al.
6,329,297 B1 12/2001 Balish
6,333,275 B1 12/2001 Mayer et al.
6,335,049 B1 1/2002 Basceri
6,335,240 B1 1/2002 Kim et al.
6,335,293 B1 1/2002 Luo et al.
6,342,427 B1 1/2002 Choi et al.
6,343,239 B1 1/2002 Toda et al.
6,344,084 B1 2/2002 Koinuma et al.
6,344,232 B1 2/2002 Jones et al.
6,346,419 B1 2/2002 Ryerson et al.
6,347,636 B1 2/2002 Xia
6,350,391 B1 2/2002 Livshits et al.
6,352,049 B1 3/2002 Yin et al.
6,352,945 B1 3/2002 Matsuki
6,357,984 B1 3/2002 Zinger et al.
6,363,294 B1 3/2002 Coronel et al.
D455,024 S 4/2002 Mimick et al.
6,367,410 B1 4/2002 Leahey et al.
6,368,773 B1 4/2002 Jung et al.
6,368,987 B1 4/2002 Kopacz et al.
6,370,796 B1 4/2002 Zucker
6,372,583 B1 4/2002 Tyagi
6,374,831 B1 4/2002 Chandran
6,375,312 B1 4/2002 Ikeda et al.
6,375,749 B1 4/2002 Boydston et al.
6,375,750 B1 4/2002 Van Os et al.
6,379,466 B1 4/2002 Sahin et al.
D457,609 S 5/2002 Piano
6,383,300 B1 5/2002 Saito et al.
6,383,566 B1 5/2002 Zagdoun
6,383,955 B1 5/2002 Matsuki
6,387,207 B1 5/2002 Janakiraman
6,387,823 B1 5/2002 Sonderman et al.
6,387,827 B1 5/2002 Mertens et al.
6,390,753 B1 5/2002 de Ridder et al.
6,390,754 B2 5/2002 Yamaga et al.
6,391,803 B1 5/2002 Kim et al.
6,395,650 B1 5/2002 Callegari et al.
6,398,184 B1 6/2002 Sowada et al.
6,399,022 B1 6/2002 Schuler et al.
6,402,806 B1 6/2002 Schmitt et al.
6,410,433 B1 6/2002 Hautala et al.
6,410,459 B2 6/2002 Blalock et al.
6,410,463 B1 6/2002 Matsuki
6,413,321 B1 7/2002 Kim et al.
6,413,583 B1 7/2002 Moghadam et al.
6,420,279 B1 7/2002 Ono et al.
6,423,949 B1 7/2002 Chen et al.
D461,233 S 8/2002 Whalen
D461,882 S 8/2002 Piano
6,428,859 B1 8/2002 Chiang et al.
6,429,465 B1 8/2002 Yagi et al.
6,432,206 B1 8/2002 Tolt
6,432,255 B1 8/2002 Sun et al.
6,432,479 B2 8/2002 Chang et al.
6,432,849 B1 8/2002 Endo et al.
6,433,298 B1 8/2002 Ishii
6,435,798 B1 8/2002 Satoh
6,435,865 B1 8/2002 Tseng et al.
6,436,819 B1 8/2002 Zhang
6,437,444 B2 8/2002 Andideh
6,438,502 B1 8/2002 Awtrey
6,439,822 B1 8/2002 Kimura et al.
6,440,261 B1 8/2002 Tepman et al.
6,441,350 B1 8/2002 Stoddard et al.
6,445,574 B1 9/2002 Saw et al.
6,446,573 B2 9/2002 Hirayama et al.
6,447,232 B1 9/2002 Davis et al.
6,447,651 B1 9/2002 Ishikawa et al.
6,447,937 B1 9/2002 Murakawa et al.
6,448,192 B1 9/2002 Kaushik
6,450,117 B1 9/2002 Murugesh et al.
6,450,757 B1 9/2002 Saeki
6,451,713 B1 9/2002 Tay et al.
6,452,017 B1 9/2002 Uhlenbrock et al.
6,454,860 B2 9/2002 Metzner et al.
6,454,909 B1 9/2002 Matsuse et al.
6,455,098 B2 9/2002 Tran et al.
6,455,225 B1 9/2002 Kong et al.
6,455,445 B2 9/2002 Matsuki
6,460,482 B1 10/2002 Kuibira et al.
6,461,435 B1 10/2002 Littau et al.
6,461,436 B1 10/2002 Campbell et al.
6,461,439 B1 10/2002 Granneman et al.
6,462,310 B1 10/2002 Ratliff et al.
6,464,825 B1 10/2002 Shinozaki
6,468,924 B2 10/2002 Lee
6,471,779 B1 10/2002 Nishio et al.
6,472,266 B1 10/2002 Yu et al.
6,474,987 B1 11/2002 Huang et al.
6,475,276 B1 11/2002 Elers et al.
6,475,902 B1 11/2002 Hausmann et al.
6,475,930 B1 11/2002 Junker et al.
6,478,872 B1 11/2002 Chae et al.
6,481,945 B1 11/2002 Hasper et al.
6,482,331 B2 11/2002 Lu et al.
6,482,663 B1 11/2002 Buckland
6,483,989 B1 11/2002 Okada et al.
6,488,774 B1 12/2002 Horie et al.
6,490,493 B1 12/2002 Dharnipragada
6,492,625 B1 12/2002 Boguslavskiy et al.
6,494,065 B2 12/2002 Babbitt
6,494,998 B1 12/2002 Brcka
6,496,819 B1 12/2002 Bello et al.
6,497,734 B1 12/2002 Barber et al.
6,497,767 B1 12/2002 Okase et al.
6,498,091 B1 12/2002 Chen et al.
6,499,533 B2 12/2002 Yamada
6,500,487 B1 12/2002 Holst et al.
6,502,530 B1 1/2003 Turlot et al.
6,503,079 B2 1/2003 Kogano et al.
6,503,330 B1 1/2003 Sneh et al.
6,503,365 B1 1/2003 Kim et al.
6,503,562 B1 1/2003 Saito et al.
6,503,826 B1 1/2003 Oda
6,506,009 B1 1/2003 Nulman et al.
6,506,253 B2 1/2003 Sakuma
6,507,410 B1 1/2003 Robertson et al.
6,511,539 B1 1/2003 Raaijmakers
6,514,313 B1 2/2003 Spiegelman
6,514,666 B1 2/2003 Choi et al.
6,521,295 B1 2/2003 Remington
6,521,547 B1 2/2003 Chang et al.
6,527,884 B1 3/2003 Takakuwa et al.
6,528,171 B1 3/2003 Endler et al.
6,528,430 B2 3/2003 Kwan
6,528,752 B1 3/2003 Ishii et al.
6,528,767 B2 3/2003 Bagley et al.
6,530,994 B1 3/2003 Mahawili
6,531,193 B2 3/2003 Fonash et al.
6,531,412 B2 3/2003 Conti et al.
6,534,133 B1 3/2003 Kaloyeros et al.
6,534,395 B2 3/2003 Werkhoven et al.
6,536,950 B1 3/2003 Green
6,539,891 B1 4/2003 Kang et al.
6,540,469 B2 4/2003 Matsunaga et al.
6,540,838 B2 4/2003 Sneh et al.
6,544,906 B2 4/2003 Rotondaro et al.
6,552,209 B1 4/2003 Lei et al.
6,558,517 B2 5/2003 Basceri
6,558,755 B2 5/2003 Berry et al.
6,559,026 B1 5/2003 Rossman et al.

(56) References Cited

U.S. PATENT DOCUMENTS 6,562,094 B2 5/2003 Denker et al.
6,565,763 B1 5/2003 Asakawa et al.
6,566,278 B1 5/2003 Harvey et al.
6,569,239 B2 5/2003 Arai et al.
6,569,971 B2 5/2003 Roh et al.
6,573,030 B1 6/2003 Fairbairn et al.
6,574,644 B2 6/2003 Hsu et al.
6,576,062 B2 6/2003 Matsuse
6,576,064 B2 6/2003 Griffiths et al.
6,576,300 B1 6/2003 Berry et al.
6,576,564 B2 6/2003 Agarwal
6,578,589 B1 6/2003 Mayusumi
6,579,833 B1 6/2003 McNallan et al.
6,580,050 B1 6/2003 Miller et al.
6,582,174 B1 6/2003 Hayashi
6,583,048 B2 6/2003 Vincent et al.
6,583,572 B2 6/2003 Veltrop et al.
6,587,108 B1 7/2003 Guerlain et al.
6,589,352 B1 7/2003 Yudovsky et al.
6,589,707 B2 7/2003 Lee et al.
6,589,868 B2 7/2003 Rossman
6,590,251 B2 7/2003 Kang et al.
6,594,550 B1 7/2003 Okrah
6,596,398 B1 7/2003 Russo et al.
6,596,653 B2 7/2003 Tan
6,598,559 B1 7/2003 Vellore et al.
6,602,806 B1 8/2003 Xia et al.
6,607,602 B1 8/2003 Granneman et al.
6,607,868 B2 8/2003 Choi
6,607,948 B1 8/2003 Sugiyama et al.
6,608,745 B2 8/2003 Tsuruta et al.
6,610,375 B2 8/2003 Akiba et al.
6,613,685 B1 9/2003 Granneman et al.
6,616,986 B2 9/2003 Sherman
6,617,253 B1 9/2003 Chu et al.
6,620,251 B2 9/2003 Kitano
6,623,799 B1 9/2003 Lee et al.
6,624,064 B1 9/2003 Sahin
6,627,268 B1 9/2003 Fair et al.
6,627,503 B2 9/2003 Ma et al.
6,630,030 B1 10/2003 Suntola et al.
6,632,478 B2 10/2003 Gaillard et al.
6,633,364 B2 10/2003 Hayashi
6,635,115 B1 10/2003 Fairbairn et al.
6,635,117 B1 10/2003 Kinnard et al.
6,635,578 B1 10/2003 Xu et al.
6,638,839 B2 10/2003 Deng et al.
6,640,145 B2 10/2003 Hoffberg et al.
6,645,304 B2 11/2003 Yamaguchi
6,648,974 B1 11/2003 Ogliari et al.
6,649,921 B1 11/2003 Cekic et al.
6,652,924 B2 11/2003 Sherman
6,656,281 B1 12/2003 Ueda
6,656,282 B2 12/2003 Kim et al.
6,658,933 B2 12/2003 Allegre et al.
6,659,111 B1 12/2003 Mouri et al.
6,660,662 B2 12/2003 Ishikawa et al.
6,662,817 B2 12/2003 Yamagishi
6,663,332 B1 12/2003 Sluijk et al.
6,673,196 B1 1/2004 Oyabu
6,676,290 B1 1/2004 Lu
6,676,759 B1 1/2004 Takagi
6,679,194 B2 1/2004 Ham et al.
6,682,971 B2 1/2004 Tsuneda et al.
6,682,973 B1 1/2004 Paton et al.
6,683,274 B1 1/2004 Kwon et al.
D486,891 S 2/2004 Cronce
6,684,659 B1 2/2004 Tanaka et al.
6,684,719 B2 2/2004 Gehner et al.
6,686,281 B2 2/2004 Yamazaki et al.
6,688,784 B1 2/2004 Templeton
6,689,220 B1 2/2004 Nguyen
6,692,575 B1 2/2004 Omstead et al.
6,692,576 B2 2/2004 Halpin et al.
6,692,903 B2 2/2004 Chen et al.
6,696,367 B1 2/2004 Aggarwal
6,699,003 B2 3/2004 Saeki
6,699,399 B1 3/2004 Qian et al.
6,700,089 B1 3/2004 Hirooka
6,709,989 B2 3/2004 Ramdani et al.
6,710,364 B2 3/2004 Guldi et al.
6,710,857 B2 3/2004 Kondo
6,712,949 B2 3/2004 Gopal
6,713,824 B1 3/2004 Mikata
6,715,949 B1 4/2004 Fisher et al.
6,716,477 B1 4/2004 Komiyama et al.
6,716,571 B2 4/2004 Gabriel
6,719,499 B1 4/2004 Kuznetsov et al.
6,720,260 B1 4/2004 Fair et al.
6,720,262 B2 4/2004 Koh et al.
6,720,531 B1 4/2004 Jacobson et al.
6,722,837 B2 4/2004 Inui
6,723,642 B1 4/2004 Lim et al.
6,730,614 B1 5/2004 Lim et al.
6,732,006 B2 5/2004 Haanstra et al.
6,734,090 B2 5/2004 Agarwala et al.
6,734,631 B2 5/2004 Juestel et al.
6,737,716 B1 5/2004 Matsuo et al.
6,740,853 B1 5/2004 Johnson et al.
6,743,475 B2 6/2004 Skarp et al.
6,743,738 B2 6/2004 Todd et al.
6,745,095 B1 6/2004 Ben-Dov
6,746,240 B2 6/2004 de Ridder et al.
6,746,308 B1 6/2004 Bode et al.
6,749,671 B2 6/2004 Holst et al.
6,753,507 B2 6/2004 Fure et al.
6,755,221 B2 6/2004 Jeong et al.
6,756,085 B2 6/2004 Waldfried
6,756,293 B2 6/2004 Li et al.
6,756,318 B2 6/2004 Nguyen et al.
6,759,098 B2 7/2004 Han
6,760,981 B2 7/2004 Leap
6,766,545 B2 7/2004 Hodges
6,767,447 B2 7/2004 Uno et al.
D494,552 S 8/2004 Tezuka et al.
6,776,849 B2 8/2004 Aggarwal et al.
6,780,704 B1 8/2004 Raaijmakers et al.
6,783,875 B2 8/2004 Yamada et al.
6,784,033 B1 8/2004 Yamazaki
6,784,108 B1 8/2004 Donohoe et al.
D496,008 S 9/2004 Takahashi et al.
6,786,997 B1 9/2004 Yamazaki
D497,536 S 10/2004 Fujiwara
D497,977 S 11/2004 Engelbrektsson
6,811,960 B2 11/2004 Lee et al.
6,812,157 B1 11/2004 Gadgil
6,815,350 B2 11/2004 Kim et al.
6,815,352 B1 11/2004 Tamura et al.
6,818,566 B2 11/2004 Leeson et al.
6,818,864 B2 11/2004 Ptak
6,820,570 B2 11/2004 Kilpela et al.
6,821,889 B2 11/2004 Elers et al.
6,821,910 B2 11/2004 Adomaitis et al.
6,824,665 B2 11/2004 Shelnut et al.
6,825,106 B1 11/2004 Gao et al.
6,825,134 B2 11/2004 Law et al.
D499,620 S 12/2004 Horner-Richardson et al.
6,827,789 B2 12/2004 Lee et al.
6,828,235 B2 12/2004 Takano
6,831,004 B2 12/2004 Byun
6,833,024 B2 12/2004 Holst et al.
6,835,039 B2 12/2004 Van Den Berg
6,838,122 B2 1/2005 Basceri et al.
6,841,201 B2 1/2005 Shanov et al.
6,843,202 B2 1/2005 Kusuda
6,843,858 B2 1/2005 Rossman
6,846,146 B2 1/2005 Inui
6,846,515 B2 1/2005 Vrtis
6,846,742 B2 1/2005 Rossman
6,847,014 B1 1/2005 Benjamin et al.
6,849,241 B2 2/2005 Dauelsberg et al.
6,849,857 B2 2/2005 Ichiki et al.
6,854,580 B2 2/2005 Braford
6,858,524 B2 2/2005 Haukka et al.

(56) References Cited

U.S. PATENT DOCUMENTS

| | | | |
|---|---|---|---|
| 6,858,547 | B2 | 2/2005 | Metzner |
| 6,861,642 | B2 | 3/2005 | Ichiki et al. |
| 6,863,019 | B2 | 3/2005 | Shamouilian |
| 6,863,281 | B2 | 3/2005 | Endou et al. |
| 6,864,041 | B2 | 3/2005 | Brown |
| 6,867,086 | B1 | 3/2005 | Chen et al. |
| 6,867,153 | B2 | 3/2005 | Tokunaga |
| 6,867,859 | B1 | 3/2005 | Powell |
| 6,872,258 | B2 | 3/2005 | Park et al. |
| 6,872,259 | B2 | 3/2005 | Strang |
| D504,142 | S | 4/2005 | Horner-Richardson et al. |
| 6,874,247 | B1 | 4/2005 | Hsu |
| 6,874,480 | B1 | 4/2005 | Ismailov |
| 6,875,477 | B2 | 4/2005 | Trickett et al. |
| 6,875,677 | B1 | 4/2005 | Conley, Jr. et al. |
| 6,876,017 | B2 | 4/2005 | Goodner |
| 6,876,191 | B2 | 4/2005 | de Ridder |
| 6,878,206 | B2 | 4/2005 | Tzu et al. |
| 6,878,402 | B2 | 4/2005 | Chiang et al. |
| 6,883,733 | B1 | 4/2005 | Lind |
| 6,884,066 | B2 | 4/2005 | Nguyen et al. |
| 6,884,295 | B2 | 4/2005 | Ishii |
| 6,884,319 | B2 | 4/2005 | Kim |
| 6,884,475 | B2 | 4/2005 | Basceri |
| D505,590 | S | 5/2005 | Greiner |
| 6,889,211 | B1 | 5/2005 | Yoshiura et al. |
| 6,889,864 | B2 | 5/2005 | Lindfors et al. |
| 6,890,596 | B2 | 5/2005 | Sarigiannis et al. |
| 6,895,158 | B2 | 5/2005 | Alyward et al. |
| 6,899,507 | B2 | 5/2005 | Yamagishi et al. |
| 6,902,395 | B2 | 6/2005 | Oosterlaken et al. |
| 6,902,647 | B2 | 6/2005 | Hasper |
| 6,909,839 | B2 | 6/2005 | Wang et al. |
| 6,911,092 | B2 | 6/2005 | Sneh |
| 6,913,152 | B2 | 7/2005 | Zuk |
| 6,913,796 | B2 | 7/2005 | Albano et al. |
| 6,916,398 | B2 | 7/2005 | Chen et al. |
| 6,916,559 | B2 | 7/2005 | Murakawa et al. |
| 6,917,755 | B2 | 7/2005 | Nguyen et al. |
| 6,924,078 | B2 | 8/2005 | Lee et al. |
| 6,928,890 | B2 | 8/2005 | Gehner et al. |
| 6,929,699 | B2 | 8/2005 | Whitesell |
| 6,929,700 | B2 | 8/2005 | Tan et al. |
| 6,930,041 | B2 | 8/2005 | Agarwal |
| 6,930,059 | B2 | 8/2005 | Conley, Jr. et al. |
| 6,935,269 | B2 | 8/2005 | Lee et al. |
| 6,939,579 | B2 | 9/2005 | Bondestam et al. |
| 6,939,817 | B2 | 9/2005 | Sandhu et al. |
| 6,942,753 | B2 | 9/2005 | Choi et al. |
| 6,949,204 | B1 | 9/2005 | Lenz et al. |
| 6,951,587 | B1 | 10/2005 | Narushima |
| 6,952,656 | B1 | 10/2005 | Cordova et al. |
| 6,953,609 | B2 | 10/2005 | Carollo |
| 6,955,741 | B2 | 10/2005 | Yamagishi |
| 6,955,836 | B2 | 10/2005 | Kumagai et al. |
| 6,955,928 | B1 | 10/2005 | Brennan |
| 6,963,052 | B2 | 11/2005 | Kuibira et al. |
| 6,972,055 | B2 | 12/2005 | Sferlazzo |
| 6,972,478 | B1 | 12/2005 | Waite et al. |
| 6,974,781 | B2 | 12/2005 | Timmermans et al. |
| 6,975,921 | B2 | 12/2005 | Verhaar |
| 6,976,822 | B2 | 12/2005 | Woodruff |
| RE38,937 | E | 1/2006 | Nakamura |
| 6,981,832 | B2 | 1/2006 | Zinger et al. |
| 6,982,046 | B2 | 1/2006 | Srivastava et al. |
| 6,982,103 | B2 | 1/2006 | Basceri et al. |
| 6,984,591 | B1 | 1/2006 | Buchanan et al. |
| 6,984,595 | B1 | 1/2006 | Yamazaki |
| 6,985,788 | B2 | 1/2006 | Haanstra et al. |
| 6,986,914 | B2 | 1/2006 | Elers et al. |
| 6,987,155 | B2 | 1/2006 | Roh et al. |
| 6,990,430 | B2 | 1/2006 | Hosek |
| 7,005,227 | B2 | 2/2006 | Yueh et al. |
| 7,005,391 | B2 | 2/2006 | Min |
| 7,008,879 | B2 | 3/2006 | Lee et al. |
| 7,010,580 | B1 | 3/2006 | Fu et al. |
| 7,017,514 | B1 | 3/2006 | Shepherd et al. |
| 7,018,941 | B2 | 3/2006 | Cui et al. |
| 7,021,330 | B2 | 4/2006 | Maula et al. |
| 7,021,881 | B2 | 4/2006 | Yamagishi |
| 7,036,453 | B2 | 5/2006 | Ishikawa et al. |
| 7,041,609 | B2 | 5/2006 | Vaartstra |
| 7,045,430 | B2 | 5/2006 | Ahn et al. |
| 7,049,226 | B2 | 5/2006 | Chung et al. |
| 7,049,247 | B2 | 5/2006 | Gates et al. |
| 7,052,584 | B2 | 5/2006 | Basceri |
| 7,053,009 | B2 | 5/2006 | Conley, Jr. et al. |
| 7,055,263 | B2 | 6/2006 | Wu et al. |
| 7,055,875 | B2 | 6/2006 | Bonora |
| 7,062,161 | B2 | 6/2006 | Kusuda et al. |
| D524,600 | S | 7/2006 | Austin et al. |
| D525,127 | S | 7/2006 | Cogley et al. |
| 7,070,178 | B2 | 7/2006 | Van Der Toorn et al. |
| 7,071,051 | B1 | 7/2006 | Jeon et al. |
| 7,073,834 | B2 | 7/2006 | Matsumoto et al. |
| 7,074,690 | B1 | 7/2006 | Gauri et al. |
| 7,077,614 | B1 | 7/2006 | Hasper et al. |
| 7,080,545 | B2 | 7/2006 | Dimeo et al. |
| 7,084,060 | B1 | 8/2006 | Furukawa |
| 7,084,079 | B2 | 8/2006 | Conti et al. |
| 7,085,623 | B2 | 8/2006 | Siegers |
| 7,086,347 | B2 | 8/2006 | Howald et al. |
| 7,088,003 | B2 | 8/2006 | Gates et al. |
| 7,090,394 | B2 | 8/2006 | Hashikura et al. |
| 7,092,287 | B2 | 8/2006 | Beulens et al. |
| 7,098,149 | B2 | 8/2006 | Lukas |
| 7,098,150 | B2 | 8/2006 | Misra et al. |
| 7,100,459 | B2 | 9/2006 | Gehner et al. |
| 7,101,763 | B1 | 9/2006 | Anderson et al. |
| 7,108,753 | B2 | 9/2006 | Wood |
| 7,109,098 | B1 | 9/2006 | Ramaswamy et al. |
| 7,109,114 | B2 | 9/2006 | Chen et al. |
| 7,111,232 | B1 | 9/2006 | Bascom |
| 7,115,305 | B2 | 10/2006 | Bronikowski et al. |
| 7,115,838 | B2 | 10/2006 | Kurara et al. |
| 7,122,085 | B2 | 10/2006 | Shero et al. |
| 7,122,222 | B2 | 10/2006 | Xiao et al. |
| 7,122,844 | B2 | 10/2006 | Nakamura et al. |
| 7,129,165 | B2 | 10/2006 | Basol et al. |
| 7,132,360 | B2 | 11/2006 | Schaeffer et al. |
| 7,135,421 | B2 | 11/2006 | Ahn et al. |
| 7,140,558 | B2 | 11/2006 | McCracken et al. |
| 7,141,499 | B2 | 11/2006 | Raaijmakers |
| 7,143,897 | B1 | 12/2006 | Guzman et al. |
| 7,144,806 | B1 | 12/2006 | Fair et al. |
| 7,144,809 | B2 | 12/2006 | Elers et al. |
| 7,147,766 | B2 | 12/2006 | Uzoh et al. |
| 7,153,542 | B2 | 12/2006 | Nguyen et al. |
| D535,673 | S | 1/2007 | Conway et al. |
| 7,156,380 | B2 | 1/2007 | Soininen |
| 7,163,393 | B2 | 1/2007 | Adachi et al. |
| 7,163,721 | B2 | 1/2007 | Zhang et al. |
| 7,163,900 | B2 | 1/2007 | Weber |
| 7,168,852 | B2 | 1/2007 | Linnarsson |
| 7,172,497 | B2 | 2/2007 | Basol et al. |
| 7,173,216 | B2 | 2/2007 | Ptak |
| 7,183,229 | B2 | 2/2007 | Yamanaka |
| 7,186,648 | B1 | 3/2007 | Rozbicki |
| 7,192,824 | B2 | 3/2007 | Ahn et al. |
| 7,192,892 | B2 | 3/2007 | Ahn et al. |
| 7,195,479 | B2 | 3/2007 | Beatty et al. |
| 7,195,693 | B2 | 3/2007 | Cowans |
| D541,125 | S | 4/2007 | Gaudron |
| 7,198,447 | B2 | 4/2007 | Morimitsu et al. |
| 7,199,513 | B2 | 4/2007 | Huber et al. |
| 7,201,943 | B2 | 4/2007 | Park et al. |
| 7,202,148 | B2 | 4/2007 | Chen et al. |
| 7,202,512 | B2 | 4/2007 | Chen et al. |
| 7,204,886 | B2 | 4/2007 | Chen et al. |
| 7,204,887 | B2 | 4/2007 | Kawamura et al. |
| 7,205,246 | B2 | 4/2007 | MacNeil et al. |
| 7,205,247 | B2 | 4/2007 | Lee et al. |
| 7,207,763 | B2 | 4/2007 | Lee |
| 7,208,198 | B2 | 4/2007 | Basceri et al. |

(56) References Cited

U.S. PATENT DOCUMENTS 7,208,389 B1 4/2007 Tipton et al.
7,210,925 B2 5/2007 Adachi
7,211,524 B2 5/2007 Ryu et al.
7,211,525 B1 5/2007 Shanker
7,214,630 B1 5/2007 Varadarajan et al.
7,217,617 B2 5/2007 Basceri
7,223,014 B2 5/2007 Lojen
7,208,413 B2 6/2007 Byun et al.
7,229,502 B2 6/2007 Wang et al.
7,234,476 B2 6/2007 Arai
7,235,137 B2 6/2007 Kitayama et al.
7,235,482 B2 6/2007 Wu
7,235,501 B2 6/2007 Ahn et al.
7,238,596 B2 7/2007 Kouvetakis et al.
7,238,616 B2 7/2007 Agarwal
7,238,653 B2 7/2007 Lee et al.
D549,815 S 8/2007 Murphy
7,256,375 B2 8/2007 Oosterlaken
7,265,061 B1 9/2007 Cho et al.
7,274,867 B2 9/2007 Peukert
D553,104 S 10/2007 Oohashi et al.
7,279,256 B2 10/2007 Son
7,290,813 B2 11/2007 Bonora
7,294,581 B2 11/2007 Haverkort et al.
7,296,460 B2 11/2007 Dimeo et al.
7,297,641 B2 11/2007 Todd et al.
7,298,009 B2 11/2007 Yan et al.
7,301,623 B1 11/2007 Madsen et al.
D556,704 S 12/2007 Nakamura et al.
D557,226 S 12/2007 Uchino et al.
D558,021 S 12/2007 Lawrence
7,307,028 B2 12/2007 Goto et al.
7,307,178 B2 12/2007 Kiyomori et al.
7,311,977 B2 12/2007 Yokota et al.
7,312,148 B2 12/2007 Ramaswamy et al.
7,312,162 B2 12/2007 Ramaswamy et al.
7,312,494 B2 12/2007 Ahn et al.
D559,993 S 1/2008 Nagakubo et al.
D559,994 S 1/2008 Nagakubo et al.
7,320,544 B2 1/2008 Hsieh
7,323,401 B2 1/2008 Ramaswamy et al.
D562,357 S 2/2008 Hardy
7,326,656 B2 2/2008 Brask et al.
7,326,657 B2 2/2008 Xia et al.
7,327,948 B1 2/2008 Shrinivasan
7,329,947 B2 2/2008 Adachi et al.
7,335,611 B2 2/2008 Ramaswamy et al.
7,351,057 B2 4/2008 Berenbak et al.
7,354,482 B2 4/2008 Konishi et al.
7,354,847 B2 4/2008 Chan et al.
7,354,873 B2 4/2008 Fukazawa et al.
7,356,762 B2 4/2008 van Driel
7,357,138 B2 4/2008 Ji et al.
7,361,447 B2 4/2008 Jung
7,375,035 B2 5/2008 Heden et al.
7,376,520 B2 5/2008 Wong
7,378,618 B1 5/2008 Sorabji et al.
7,379,785 B2 5/2008 Higashi et al.
D571,383 S 6/2008 Ota et al.
D571,831 S 6/2008 Ota et al.
7,381,644 B1 6/2008 Soubramonium et al.
7,387,685 B2 6/2008 Choi et al.
7,393,207 B2 7/2008 Imai
7,393,418 B2 7/2008 Yokogawa
7,393,736 B2 7/2008 Ahn et al.
7,393,765 B2 7/2008 Hanawa et al.
7,396,491 B2 7/2008 Marking et al.
7,399,388 B2 7/2008 Moghadam et al.
7,399,570 B2 7/2008 Lee et al.
7,402,534 B2 7/2008 Mahajani
7,405,166 B2 7/2008 Liang et al.
7,405,454 B2 7/2008 Ahn et al.
D575,713 S 8/2008 Ratcliffe
7,408,225 B2 8/2008 Shinriki et al.
7,410,290 B2 8/2008 Tanaka
7,410,666 B2 8/2008 Elers
7,411,352 B2 8/2008 Madocks
7,414,281 B1 8/2008 Fastow
D576,001 S 9/2008 Brunderman
7,422,635 B2 9/2008 Zheng et al.
7,422,636 B2 9/2008 Ishizaka
7,422,653 B2 9/2008 Blahnik et al.
7,422,775 B2 9/2008 Ramaswamy et al.
7,425,224 B2 9/2008 Nguyen
7,427,571 B2 9/2008 Lindeboom et al.
7,429,532 B2 9/2008 Ramaswamy et al.
7,431,966 B2 10/2008 Derderian et al.
7,432,476 B2 10/2008 Morita et al.
7,437,060 B2 10/2008 Wang et al.
7,442,275 B2 10/2008 Cowans
7,456,429 B2 11/2008 Levy
D583,395 S 12/2008 Ueda
7,467,632 B2 12/2008 Lee et al.
7,473,655 B2 1/2009 Wang et al.
7,475,588 B2 1/2009 Dimeo et al.
7,476,291 B2 1/2009 Wang et al.
7,479,198 B2 1/2009 Guffrey
7,482,247 B1 1/2009 Papasouliotis
7,482,283 B2 1/2009 Yamasaki et al.
D585,968 S 2/2009 Elkins et al.
7,489,389 B2 2/2009 Shibazaki et al.
7,494,882 B2 2/2009 Vitale
7,497,614 B2 3/2009 Gaff
7,498,242 B2 3/2009 Kumar et al.
7,501,292 B2 3/2009 Matsushita et al.
7,501,355 B2 3/2009 Bhatia et al.
7,503,980 B2 3/2009 Kida et al.
7,504,344 B2 3/2009 Matsuki et al.
D590,933 S 4/2009 Vansell
7,514,058 B1 4/2009 Hitzman et al.
7,514,375 B1 4/2009 Shanker et al.
D593,585 S 6/2009 Ota et al.
D593,969 S 6/2009 Li
7,541,297 B2 6/2009 Mallick et al.
7,544,398 B1 6/2009 Chang et al.
7,547,363 B2 6/2009 Tomiyasu et al.
7,547,633 B2 6/2009 Ranish et al.
7,550,396 B2 6/2009 Frohberg et al.
D596,476 S 7/2009 Welch
7,561,982 B2 7/2009 Rund et al.
7,563,715 B2 7/2009 Haukka et al.
7,566,891 B2 7/2009 Rocha-Alvarez et al.
7,569,193 B2 8/2009 Ferron et al.
7,575,968 B2 8/2009 Sadaka et al.
7,579,285 B2 8/2009 Zimmerman et al.
7,579,785 B2 8/2009 Shinmen et al.
D600,223 S 9/2009 Aggarwal
7,582,555 B1 9/2009 Lang
7,582,575 B2 9/2009 Fukazawa et al.
7,589,003 B2 9/2009 Kouvetakis et al.
7,589,028 B1 9/2009 Cho et al.
7,589,029 B2 9/2009 Derderian et al.
7,591,601 B2 9/2009 Matsuoka et al.
7,591,907 B2 9/2009 Chen et al.
D602,575 S 10/2009 Breda
7,598,513 B2 10/2009 Kouvetakis et al.
7,601,223 B2 10/2009 Lindfors et al.
7,601,225 B2 10/2009 Tuominen et al.
7,601,652 B2 10/2009 Singh et al.
7,611,640 B1 11/2009 Howald et al.
7,611,751 B2 11/2009 Elers
7,611,980 B2 11/2009 Wells et al.
7,618,226 B2 11/2009 Takizawa
7,621,672 B2 11/2009 Ripley
7,622,369 B1 11/2009 Lee et al.
7,622,378 B2 11/2009 Liu et al.
7,623,940 B2 11/2009 Huskamp et al.
D606,952 S 12/2009 Lee et al.
7,625,820 B1 12/2009 Papasouliotis
7,629,277 B2 12/2009 Ghatnagar
7,632,549 B2 12/2009 Goundar
7,638,951 B2 12/2009 DeVincentis et al.
7,640,142 B2 12/2009 Tachikawa et al.
7,645,341 B2 1/2010 Kennedy et al.

(56) References Cited

U.S. PATENT DOCUMENTS

| | | | |
|---|---|---|---|
| 7,645,484 | B2 | 1/2010 | Ishizaka |
| 7,648,895 | B2 | 1/2010 | Kurokawa et al. |
| 7,648,927 | B2 | 1/2010 | Singh et al. |
| 7,651,269 | B2 | 1/2010 | Comendant |
| 7,651,583 | B2 | 1/2010 | Kent et al. |
| 7,651,955 | B2 | 1/2010 | Ranish et al. |
| 7,651,959 | B2 | 1/2010 | Fukazawa et al. |
| 7,651,961 | B2 | 1/2010 | Clark |
| D609,652 | S | 2/2010 | Nagasaka et al. |
| D609,655 | S | 2/2010 | Sugimoto |
| 7,661,299 | B2 | 2/2010 | Kusunoki |
| 7,662,689 | B2 | 2/2010 | Boyanov et al. |
| 7,670,432 | B2 | 3/2010 | Li |
| 7,674,726 | B2 | 3/2010 | Hasper et al. |
| 7,678,197 | B2 | 3/2010 | Maki |
| 7,678,715 | B2 | 3/2010 | Mungekar et al. |
| 7,682,454 | B2 | 3/2010 | Sneh |
| 7,682,657 | B2 | 3/2010 | Sherman |
| D613,829 | S | 4/2010 | Griffin et al. |
| D614,153 | S | 4/2010 | Fondurulia et al. |
| D614,258 | S | 4/2010 | Kojima |
| D614,267 | S | 4/2010 | Breda |
| D614,268 | S | 4/2010 | Breda |
| D614,593 | S | 4/2010 | Lee et al. |
| 7,690,881 | B2 | 4/2010 | Yamagishi |
| 7,691,205 | B2 | 4/2010 | Ikedo |
| 7,692,171 | B2 | 4/2010 | Kaszuba et al. |
| 7,695,808 | B2 | 4/2010 | Tuma |
| D616,390 | S | 5/2010 | Sato |
| D616,394 | S | 5/2010 | Sato |
| 7,712,435 | B2 | 5/2010 | Yoshizaki et al. |
| 7,713,874 | B2 | 5/2010 | Milligan |
| 7,716,993 | B2 | 5/2010 | Ozawa et al. |
| 7,718,930 | B2 | 5/2010 | Kawasaki et al. |
| 7,720,560 | B2 | 5/2010 | Menser et al. |
| 7,723,648 | B2 | 5/2010 | Tsukamoto et al. |
| 7,725,012 | B2 | 5/2010 | Aggarwal et al. |
| 7,727,864 | B2 | 6/2010 | Elers |
| 7,727,880 | B1 | 6/2010 | Chattopadhyay et al. |
| 7,732,343 | B2 | 6/2010 | Niroomand et al. |
| 7,736,437 | B2 | 6/2010 | Cadwell et al. |
| 7,736,528 | B2 | 6/2010 | Okita et al. |
| 7,736,600 | B2 | 6/2010 | Clark et al. |
| 7,737,035 | B1 | 6/2010 | Lind et al. |
| 7,740,437 | B2 | 6/2010 | de Ridder et al. |
| 7,740,705 | B2 | 6/2010 | Li |
| 7,745,346 | B2 | 6/2010 | Hausmann et al. |
| 7,748,760 | B2 | 7/2010 | Kushida |
| 7,749,563 | B2 | 7/2010 | Zheng et al. |
| 7,753,584 | B2 | 7/2010 | Gambino et al. |
| 7,754,621 | B2 | 7/2010 | Putjkonen |
| 7,758,698 | B2 | 7/2010 | Bang et al. |
| 7,763,869 | B2 | 7/2010 | Matsushita et al. |
| 7,767,262 | B2 | 8/2010 | Clark |
| 7,771,796 | B2 | 8/2010 | Kohno et al. |
| 7,780,440 | B2 | 8/2010 | Shibagaki et al. |
| 7,780,789 | B2 | 8/2010 | Wu et al. |
| 7,781,352 | B2 | 8/2010 | Fukazawa et al. |
| 7,789,559 | B2 | 9/2010 | Waser et al. |
| 7,789,965 | B2 | 9/2010 | Matsushita et al. |
| 7,790,633 | B1 | 9/2010 | Tarafdar et al. |
| 7,794,546 | B2 | 9/2010 | Li |
| 7,798,096 | B2 | 9/2010 | Mahajani et al. |
| 7,799,300 | B2 | 9/2010 | Lindfors et al. |
| 7,799,706 | B2 | 9/2010 | Yeom et al. |
| 7,803,722 | B2 | 9/2010 | Liang |
| D625,977 | S | 10/2010 | Watson et al. |
| 7,795,160 | B2 | 10/2010 | Wang et al. |
| 7,806,587 | B2 | 10/2010 | Kobayashi |
| 7,807,566 | B2 | 10/2010 | Tsuji et al. |
| 7,807,578 | B2 | 10/2010 | Bencher et al. |
| 7,816,278 | B2 | 10/2010 | Reed et al. |
| 7,824,492 | B2 | 11/2010 | Tois et al. |
| 7,825,040 | B1 | 11/2010 | Fukazawa et al. |
| 7,829,460 | B2 | 11/2010 | Streck et al. |
| 7,833,348 | B2 | 11/2010 | Wada et al. |
| 7,833,353 | B2 | 11/2010 | Furukawahara et al. |
| 7,838,084 | B2 | 11/2010 | Derderian et al. |
| 7,842,518 | B2 | 11/2010 | Miyajima |
| 7,842,622 | B1 | 11/2010 | Lee et al. |
| D629,874 | S | 12/2010 | Hermans |
| 7,850,449 | B2 | 12/2010 | Yang et al. |
| 7,851,019 | B2 | 12/2010 | Tuominen et al. |
| 7,851,232 | B2 | 12/2010 | van Schravendijk et al. |
| 7,858,519 | B2 | 12/2010 | Liu et al. |
| 7,858,533 | B2 | 12/2010 | Liu et al. |
| 7,858,898 | B2 | 12/2010 | Bailey et al. |
| 7,865,070 | B2 | 1/2011 | Nakamura |
| 7,871,198 | B2 | 1/2011 | Rempe et al. |
| 7,874,726 | B2 | 1/2011 | Jacobs et al. |
| 7,884,918 | B2 | 2/2011 | Hattori |
| 7,888,233 | B1 | 2/2011 | Gauri |
| 7,894,474 | B1 | 2/2011 | Bell |
| D633,452 | S | 3/2011 | Namiki et al. |
| D634,329 | S | 3/2011 | Wastrom |
| D634,719 | S | 3/2011 | Yasuda et al. |
| 7,897,215 | B1 | 3/2011 | Fair et al. |
| 7,897,217 | B2 | 3/2011 | Faguet |
| 7,902,009 | B2 | 3/2011 | Simonelli et al. |
| 7,902,582 | B2 | 3/2011 | Forbes et al. |
| 7,906,174 | B1 | 3/2011 | Wu et al. |
| 7,910,288 | B2 | 3/2011 | Abatchev et al. |
| 7,910,452 | B2 | 3/2011 | Roh et al. |
| 7,910,494 | B2 | 3/2011 | Dip et al. |
| 7,915,139 | B1 | 3/2011 | Lang |
| 7,915,667 | B2 | 3/2011 | Knoefler et al. |
| 7,919,142 | B2 | 4/2011 | Yeom et al. |
| 7,919,416 | B2 | 4/2011 | Lee et al. |
| 7,923,382 | B2 | 4/2011 | Huotari et al. |
| 7,925,378 | B2 | 4/2011 | Gilchrist et al. |
| 7,935,940 | B1 | 5/2011 | Smargiassi |
| 7,939,447 | B2 | 5/2011 | Bauer et al. |
| 7,942,969 | B2 | 5/2011 | Riker et al. |
| 7,946,762 | B2 | 5/2011 | Yednak |
| 7,951,262 | B2 | 5/2011 | Koshiishi et al. |
| 7,955,516 | B2 | 6/2011 | Chandrachood et al. |
| 7,955,646 | B2 | 6/2011 | Cruse et al. |
| 7,955,650 | B2 | 6/2011 | Tsuji |
| 7,957,708 | B2 | 6/2011 | Karschnia et al. |
| 7,963,736 | B2 | 6/2011 | Takizawa et al. |
| 7,967,913 | B2 | 6/2011 | Hua et al. |
| 7,972,980 | B2 | 7/2011 | Lee et al. |
| 7,977,256 | B2 | 7/2011 | Liu et al. |
| 7,981,751 | B2 | 7/2011 | Zhu et al. |
| D643,055 | S | 8/2011 | Takahashi |
| 7,989,365 | B2 | 8/2011 | Park et al. |
| 7,989,736 | B2 | 8/2011 | Park et al. |
| 7,992,318 | B2 | 8/2011 | Kawaji |
| 7,993,457 | B1 | 8/2011 | Krotov et al. |
| 7,994,070 | B1 | 8/2011 | Dip et al. |
| 7,994,721 | B2 | 8/2011 | Espiau et al. |
| 7,997,795 | B2 | 8/2011 | Schwagerman et al. |
| 7,998,875 | B2 | 8/2011 | DeYoung |
| 8,003,174 | B2 | 8/2011 | Fukazawa |
| 8,003,919 | B2 | 8/2011 | Goto et al. |
| 8,004,198 | B2 | 8/2011 | Bakre et al. |
| 8,020,315 | B2 | 9/2011 | Nishimura |
| 8,030,129 | B2 | 10/2011 | Jeong |
| 8,033,771 | B1 | 10/2011 | Gage et al. |
| 8,038,835 | B2 | 10/2011 | Hayashi et al. |
| 8,041,197 | B2 | 10/2011 | Kasai et al. |
| 8,041,450 | B2 | 10/2011 | Takizawa et al. |
| 8,043,972 | B1 | 10/2011 | Liu et al. |
| 8,046,193 | B2 | 10/2011 | Yetter et al. |
| 8,047,711 | B2 | 11/2011 | Ploechinger |
| 8,048,783 | B2 | 11/2011 | Chung et al. |
| 8,051,799 | B2 | 11/2011 | Itagaki et al. |
| 8,052,794 | B2 | 11/2011 | Sumakeris et al. |
| 8,055,378 | B2 | 11/2011 | Numakura |
| 8,060,252 | B2 | 11/2011 | Gage et al. |
| 8,083,853 | B2 | 11/2011 | Choi et al. |
| RE43,023 | E | 12/2011 | Nakashima et al. |
| D649,986 | S | 12/2011 | Fujikata et al. |
| D651,291 | S | 12/2011 | Liebson et al. |

(56) References Cited

U.S. PATENT DOCUMENTS 8,071,451 B2 12/2011 Berry
8,071,452 B2 12/2011 Raisanen
8,072,578 B2 12/2011 Yasuda et al.
8,076,230 B2 12/2011 Wei
8,076,237 B2 12/2011 Uzoh
8,076,250 B1 12/2011 Rajagopalan
8,076,251 B2 12/2011 Akae et al.
8,078,310 B2 12/2011 Nishimoto et al.
8,082,946 B2 12/2011 Laverdiere et al.
8,084,104 B2 12/2011 Shinriki et al.
8,084,372 B2 12/2011 You et al.
D652,896 S 1/2012 Gether
8,092,604 B2 1/2012 Tomiyasu et al.
8,092,606 B2 1/2012 Park et al.
8,100,583 B2 1/2012 Aggarwal
D653,734 S 2/2012 Sisk
D654,882 S 2/2012 Honma et al.
D654,884 S 2/2012 Honma
D655,055 S 2/2012 Toll
8,110,099 B2 2/2012 Hersey et al.
8,114,734 B2 2/2012 Yang et al.
8,119,466 B2 2/2012 Avouris
8,119,527 B1 2/2012 Chadrashekar et al.
D655,260 S 3/2012 Honma et al.
D655,261 S 3/2012 Honma et al.
D655,599 S 3/2012 Durham
8,128,333 B2 3/2012 Aburatani
8,129,290 B2 3/2012 Balseanu et al.
8,137,462 B2 3/2012 Fondurulia et al.
8,137,465 B1 3/2012 Shrinivasan et al.
8,138,104 B2 3/2012 Balseanu et al.
8,138,676 B2 3/2012 Mills
8,142,862 B2 3/2012 Lee et al.
8,143,174 B2 3/2012 Xia et al.
8,147,242 B2 4/2012 Shibagaki et al.
8,152,922 B2 4/2012 Schmidt et al.
8,158,512 B2 4/2012 Ji et al.
8,172,947 B2 5/2012 Shibata et al.
8,173,554 B2 5/2012 Lee et al.
8,174,400 B2 5/2012 Park et al.
8,178,436 B2 5/2012 King et al.
8,187,679 B2 5/2012 Dickey et al.
8,187,951 B1 5/2012 Wang
8,192,901 B2 6/2012 Kageyama
8,196,234 B2 6/2012 Glunk
8,197,915 B2 6/2012 Oka et al.
8,198,168 B2 6/2012 Tanioku
8,202,575 B2 6/2012 Monsma et al.
8,206,506 B2 6/2012 Kadkhodayan et al.
8,216,380 B2 7/2012 White et al.
8,227,032 B2 7/2012 Dussarrat et al.
8,231,799 B2 7/2012 Bera et al.
D665,055 S 8/2012 Yanagisawa et al.
8,241,991 B2 8/2012 Hsieh et al.
8,241,992 B2 8/2012 Clevenger et al.
8,242,028 B1 8/2012 van Schravendijk et al.
8,242,031 B2 8/2012 Mallick et al.
8,246,900 B2 8/2012 Kasai et al.
8,252,114 B2 8/2012 Vukovic
8,252,659 B2 8/2012 Huyghabaert et al.
8,252,691 B2 8/2012 Beynet et al.
8,253,204 B2 8/2012 Lee et al.
8,267,633 B2 9/2012 Obikane
8,272,516 B2 9/2012 Salvador
8,278,176 B2 10/2012 Bauer et al.
8,278,224 B1 10/2012 Mui et al.
8,282,769 B2 10/2012 Iizuka
8,282,847 B2 10/2012 Romano
8,282,992 B2 10/2012 Myo et al.
8,287,648 B2 10/2012 Reed et al.
8,291,857 B2 10/2012 Lam et al.
8,293,016 B2 10/2012 Bahng et al.
8,293,642 B2 10/2012 Kim
8,298,336 B2 10/2012 Wang et al.
8,298,951 B1 10/2012 Nakano
8,307,472 B1 11/2012 Saxon et al.
8,309,173 B2 11/2012 Tuominen et al.
8,318,327 B2 11/2012 O'Donnell
8,318,584 B2 11/2012 Li et al.
8,323,413 B2 12/2012 Son
8,324,699 B2 12/2012 Ichijo et al.
8,328,939 B2 12/2012 Choi et al.
8,329,599 B2 12/2012 Fukazawa et al.
8,333,839 B2 12/2012 Oh
8,334,219 B2 12/2012 Lee et al.
8,338,809 B2 12/2012 Yang et al.
8,349,083 B2 1/2013 Takasuka et al.
D676,943 S 2/2013 Kluss et al.
8,367,528 B2 2/2013 Bauer et al.
8,372,204 B2 2/2013 Nakamura
8,378,464 B2 2/2013 Kato et al.
8,382,370 B2 2/2013 Aggarwal et al.
8,382,939 B2 2/2013 Kutney et al.
8,393,091 B2 3/2013 Kawamoto
8,394,466 B2 3/2013 Hong et al.
8,398,773 B2 3/2013 Jdira et al.
8,402,918 B2 3/2013 Kadkhodayan et al.
8,404,044 B2 3/2013 Arai
8,404,499 B2 3/2013 Moffatt
8,415,258 B2 4/2013 Akae
8,415,259 B2 4/2013 Lee et al.
8,415,587 B2 4/2013 Millman et al.
8,419,959 B2 4/2013 Bettencourt et al.
8,425,682 B2 4/2013 Wang et al.
8,430,620 B1 4/2013 Blank et al.
8,435,894 B2 5/2013 Chandrashekar et al.
8,440,259 B2 5/2013 Chiang et al.
8,443,484 B2 5/2013 Ozaki et al.
8,444,120 B2 5/2013 Gregg et al.
8,445,075 B2 5/2013 Xu et al.
8,450,191 B2 5/2013 Wang
8,454,749 B2 6/2013 Li
8,465,811 B2 6/2013 Ueda
8,465,903 B2 6/2013 Weidman et al.
8,466,411 B2 6/2013 Arai
8,470,187 B2 6/2013 Ha
8,470,718 B2 6/2013 Lee
8,484,846 B2 7/2013 Dhindsa
8,492,170 B2 7/2013 Xie et al.
8,496,377 B2 7/2013 Harr et al.
8,496,756 B2 7/2013 Cruse et al.
8,497,213 B2 7/2013 Yasui et al.
8,501,599 B2 8/2013 Ueno et al.
8,506,162 B2 8/2013 Schick et al.
8,506,713 B2 8/2013 Takagi
8,507,720 B2 8/2013 Shay
8,524,612 B2 9/2013 Li et al.
8,529,701 B2 9/2013 Morita
8,535,767 B1 9/2013 Kimura
8,536,068 B2 9/2013 Weidman et al.
D691,974 S 10/2013 Osada et al.
8,551,892 B2 10/2013 Nakano
8,557,712 B1 10/2013 Antonelli et al.
8,562,272 B2 10/2013 Lenz
8,563,443 B2 10/2013 Fukazawa
8,569,184 B2 10/2013 Oka
D693,200 S 11/2013 Saunders
D693,782 S 11/2013 Mori et al.
8,573,152 B2 11/2013 de la Llera et al.
8,573,154 B2 11/2013 Yorozuya
8,586,484 B2 11/2013 Matsuyama et al.
8,591,659 B1 11/2013 Fang et al.
8,592,005 B2 11/2013 Ueda
D694,790 S 12/2013 Matsumoto et al.
D695,240 S 12/2013 Iida et al.
8,608,885 B2 12/2013 Goto et al.
8,614,047 B2 12/2013 Ayothi et al.
8,616,765 B2 12/2013 Darabnia et al.
8,617,411 B2 12/2013 Singh
D697,038 S 1/2014 Matsumoto et al.
8,623,770 B1 1/2014 Gao et al.
8,633,115 B2 1/2014 Chang et al.
8,637,384 B2 1/2014 Ando et al.
D698,904 S 2/2014 Milligan et al.

(56) References Cited

U.S. PATENT DOCUMENTS 8,642,488 B2 2/2014 Liu et al.
8,647,439 B2 2/2014 Sanchez et al.
8,647,722 B2 2/2014 Kobayashi et al.
8,647,993 B1 2/2014 Lavoie et al.
8,651,788 B1 2/2014 Budde
8,664,627 B1 3/2014 Ishikawa et al.
8,667,654 B2 3/2014 Gros-Jean
8,668,957 B2 3/2014 Dussarrat et al.
8,669,185 B2 3/2014 Onizawa
8,679,958 B2 3/2014 Takamure et al.
D702,188 S 4/2014 Jacobs
8,683,943 B2 4/2014 Onodera et al.
8,697,198 B2 4/2014 Lee
8,703,002 B2 4/2014 Matsudo et al.
8,709,162 B2 4/2014 Leung et al.
8,710,580 B2 4/2014 Sakuma et al.
8,711,338 B2 4/2014 Liu et al.
D705,745 S 5/2014 Kurs et al.
D705,762 S 5/2014 Yu
8,664,127 B2 5/2014 Bhatia et al.
8,720,965 B2 5/2014 Hino et al.
8,721,791 B2 5/2014 Choi et al.
8,722,510 B2 5/2014 Watanabe et al.
8,722,546 B2 5/2014 Fukazawa et al.
8,726,837 B2 5/2014 Patalay et al.
8,728,832 B2 5/2014 Raisanen et al.
8,728,956 B2 5/2014 Lavoie et al.
8,741,062 B2 6/2014 Lindfors et al.
8,741,065 B2 6/2014 Odagiri et al.
8,742,668 B2 6/2014 Nakano et al.
8,758,512 B2 6/2014 Lee
8,759,223 B2 6/2014 Sapre et al.
D709,536 S 7/2014 Yoshimura et al.
D709,537 S 7/2014 Kuwabara et al.
8,764,085 B2 7/2014 Urabe
8,771,791 B2 7/2014 Lee et al.
8,771,807 B2 7/2014 Xiao et al.
8,779,502 B2 7/2014 Sakuma et al.
8,784,676 B2 7/2014 Guha et al.
8,784,950 B2 7/2014 Fukazawa et al.
8,784,951 B2 7/2014 Fukazawa et al.
8,785,215 B2 7/2014 Kobayashi et al.
8,785,311 B2 7/2014 Miyoshi
8,790,743 B1 7/2014 Omari
8,790,749 B2 7/2014 Omori et al.
8,802,201 B2 8/2014 Raisanen et al.
8,809,170 B2 8/2014 Bauer
D712,358 S 9/2014 Allen et al.
D712,359 S 9/2014 Allen et al.
8,820,809 B2 9/2014 Ando et al.
8,821,640 B2 9/2014 Cleary et al.
8,821,985 B2 9/2014 Shao et al.
8,823,672 B2 9/2014 Kim
8,828,886 B2 9/2014 Samukawa et al.
8,841,182 B1 9/2014 Chen et al.
8,845,806 B2 9/2014 Aida et al.
8,846,502 B2 9/2014 Haukka et al.
D715,410 S 10/2014 Lohmann
8,859,368 B2 10/2014 Deniz
8,860,955 B2 10/2014 Rodnick et al.
8,864,202 B1 10/2014 Schrameyer
8,864,375 B2 10/2014 Abe et al.
D716,742 S 11/2014 Jang et al.
8,876,974 B2 11/2014 Wan
8,877,300 B2 11/2014 Lee
8,877,655 B2 11/2014 Shero et al.
8,882,923 B2 11/2014 Saido et al.
8,883,270 B2 11/2014 Shero et al.
8,895,108 B2 11/2014 Lee
8,895,395 B1 11/2014 Kerber et al.
8,900,935 B2 12/2014 Guo et al.
8,900,999 B1 12/2014 Wu et al.
8,901,016 B2 12/2014 Jeongseok et al.
8,911,553 B2 12/2014 Baluja et al.
8,911,826 B2 12/2014 Adachi et al.
8,912,101 B2 12/2014 Tsuji et al.
D720,838 S 1/2015 Yamagishi et al.
8,927,906 B2 1/2015 Tadokoro et al.
8,932,802 B2 1/2015 Wu et al.
8,933,375 B2 1/2015 Dunn et al.
8,937,800 B2 1/2015 Lubomirsky et al.
8,940,646 B1 1/2015 Chandrasekharan
D723,153 S 2/2015 Borkholder
8,945,305 B2 2/2015 Marsh
8,945,306 B2 2/2015 Tsuda
8,945,339 B2 2/2015 Kakimoto
8,946,830 B2 2/2015 Jung et al.
8,956,971 B2 2/2015 Huakka
8,956,983 B2 2/2015 Swaminathan
D723,330 S 3/2015 York
D724,553 S 3/2015 Choi
D724,701 S 3/2015 Yamagishi et al.
D725,168 S 3/2015 Yamagishi
8,967,608 B2 3/2015 Mitsumori et al.
8,968,989 B2 3/2015 Ouattara et al.
8,969,934 B1 3/2015 Cheng et al.
8,974,868 B2 3/2015 Ishikawa et al.
8,980,006 B2 3/2015 Huh et al.
8,986,456 B2 3/2015 Fondurulia et al.
8,991,214 B2 3/2015 Hoshino et al.
8,991,887 B2 3/2015 Shin et al.
8,993,054 B2 3/2015 Jung et al.
8,993,072 B2 3/2015 Xiao et al.
8,993,457 B1 3/2015 Ramkumar et al.
D726,365 S 4/2015 Weigensberg
D726,884 S 4/2015 Yamagishi et al.
8,999,102 B2 4/2015 Miyoshi et al.
9,004,744 B1 4/2015 Kemp
9,005,539 B2 4/2015 Halpin et al.
9,017,481 B1 4/2015 Pettinger et al.
9,017,933 B2 4/2015 Liu et al.
9,018,093 B2 4/2015 Tsuji et al.
9,018,111 B2 4/2015 Milligan et al.
9,018,567 B2 4/2015 de Ridder et al.
9,021,985 B2 5/2015 Alokozai et al.
9,023,737 B2 5/2015 Beynet et al.
9,023,738 B2 5/2015 Kato et al.
9,029,244 B2 5/2015 Won et al.
9,029,253 B2 5/2015 Milligan et al.
9,029,272 B1 5/2015 Nakano
D732,145 S 6/2015 Yamagishi
D732,644 S 6/2015 Yamagishi et al.
D733,257 S 6/2015 Schoenherr et al.
D733,261 S 6/2015 Yamagishi et al.
D733,262 S 6/2015 Kang
9,057,388 B2 6/2015 Comeau et al.
9,064,815 B2 6/2015 Zhang et al.
D733,843 S 7/2015 Yamagishi
D734,377 S 7/2015 Hirakida
9,076,635 B2 7/2015 Gross et al.
9,076,726 B2 7/2015 Kauerauf et al.
D735,836 S 8/2015 Yamagishi et al.
D736,348 S 8/2015 Tan
9,095,869 B2 8/2015 Kilpi et al.
9,096,931 B2 8/2015 Yednak et al.
9,099,423 B2 8/2015 Weeks et al.
9,099,505 B2 8/2015 Kusakabe et al.
9,111,972 B2 8/2015 Takeshita et al.
9,117,657 B2 8/2015 Nakano et al.
9,117,866 B2 8/2015 Marquardt et al.
D739,222 S 9/2015 Chadbourne
9,123,510 B2 9/2015 Nakano et al.
9,123,577 B2 9/2015 Fujimoto et al.
9,127,358 B2 9/2015 Inoue et al.
9,127,362 B2 9/2015 Scheible et al.
9,129,897 B2 9/2015 Pore et al.
9,136,108 B2 9/2015 Matsushita et al.
9,136,180 B2 9/2015 Machkaoutsan
9,142,393 B2 9/2015 Okabe et al.
9,142,437 B2 9/2015 Fosnight et al.
9,142,764 B1 9/2015 Wang
9,153,441 B2 10/2015 Takamure et al.
9,163,310 B2 10/2015 Lee
9,166,012 B2 10/2015 Sim et al.

(56) References Cited

U.S. PATENT DOCUMENTS 9,169,975 B2 10/2015 Sarin et al.
9,171,714 B2 10/2015 Mori
9,171,715 B2 10/2015 Matero
9,171,716 B2 10/2015 Fukuda
D742,202 S 11/2015 Cyphers et al.
D743,357 S 11/2015 Vyne
D743,513 S 11/2015 Yamagishi
9,174,178 B2 11/2015 Berger et al.
9,175,394 B2 11/2015 Yudovsky et al.
9,177,784 B2 11/2015 Raisanen et al.
9,184,047 B2 11/2015 Liu et al.
9,184,054 B1 11/2015 Huang et al.
9,190,263 B2 11/2015 Ishikawa et al.
9,190,264 B2 11/2015 Yuasa et al.
9,196,483 B1 11/2015 Lee et al.
D745,641 S 12/2015 Blum
9,202,727 B2 12/2015 Dunn et al.
9,214,333 B1 12/2015 Sims et al.
9,214,340 B2 12/2015 Kurita et al.
9,219,006 B2 12/2015 Chatterjee
9,223,203 B2 12/2015 Farm et al.
9,228,259 B2 1/2016 Haukka et al.
9,240,412 B2 1/2016 Xie et al.
9,245,742 B2 1/2016 Haukka
9,252,024 B2 2/2016 Lam et al.
9,252,238 B1 2/2016 Trevino et al.
9,257,274 B2 2/2016 Kang et al.
9,263,298 B2 2/2016 Matsumoto et al.
9,267,204 B2 2/2016 Honma
9,267,850 B2 2/2016 Aggarwal
D751,176 S 3/2016 Schoenherr et al.
9,275,834 B1 3/2016 Park et al.
9,281,223 B2 3/2016 Hara
9,281,277 B2 3/2016 Baek et al.
9,284,642 B2 3/2016 Nakano
9,287,273 B2 3/2016 Ragnarsson et al.
9,297,705 B2 3/2016 Aggarwal
9,299,557 B2 3/2016 Tolle et al.
9,299,595 B2 3/2016 Dunn et al.
D753,269 S 4/2016 Yamagishi et al.
D753,629 S 4/2016 Plattard
9,305,836 B1 4/2016 Gates et al.
9,309,598 B2 4/2016 Wang et al.
9,309,978 B2 4/2016 Hatch et al.
9,310,684 B2 4/2016 Meyers et al.
9,312,155 B2 4/2016 Mori
9,315,897 B2 4/2016 Byun
9,324,811 B2 4/2016 Weeks
9,324,846 B1 4/2016 Camillo
D756,929 S 5/2016 Harck et al.
9,331,200 B1 5/2016 Wang et al.
9,337,031 B2 5/2016 Kim et al.
9,337,054 B2 5/2016 Hunks et al.
9,337,057 B2 5/2016 Park et al.
9,341,296 B2 5/2016 Yednak
9,343,297 B1 5/2016 Fukazawa et al.
9,343,308 B2 5/2016 Isii
9,343,343 B2 5/2016 Mori
9,343,350 B2 5/2016 Arai
9,349,620 B2 5/2016 Kamata et al.
9,353,440 B2 5/2016 Ge et al.
9,353,441 B2 5/2016 Chung
9,355,876 B2 5/2016 Reuter et al.
9,355,882 B2 5/2016 Wu et al.
D759,137 S 6/2016 Hassan
D759,193 S 6/2016 Gutierrez et al.
9,362,107 B2 6/2016 Thadani et al.
9,362,137 B2 6/2016 Kang et al.
9,362,180 B2 6/2016 Lee et al.
9,365,924 B2 6/2016 Nonaka
9,368,352 B2 6/2016 Takamure et al.
9,370,863 B2 6/2016 Tsuji et al.
9,378,969 B2 6/2016 Hsu et al.
D761,325 S 7/2016 Abed
9,384,987 B2 7/2016 Jung et al.
9,390,909 B2 7/2016 Pasquale et al.
9,394,608 B2 7/2016 Shero et al.
9,396,934 B2 7/2016 Tolle
9,396,956 B1 7/2016 Fukazawa
9,399,228 B2 7/2016 Breiling et al.
D764,196 S 8/2016 Handler et al.
9,404,587 B2 8/2016 Shugrue
9,412,564 B2 8/2016 Milligan
9,412,581 B2 8/2016 Thadani et al.
9,412,582 B2 8/2016 Sasaki et al.
9,418,885 B2 8/2016 Sung et al.
9,425,078 B2 8/2016 Tang et al.
9,428,833 B1 8/2016 Duvall et al.
9,443,725 B2 9/2016 Liu et al.
9,447,498 B2 9/2016 Shiba et al.
9,449,793 B2 9/2016 Shaji et al.
9,449,795 B2 9/2016 Sabri et al.
9,449,843 B1 9/2016 Korolik et al.
9,449,987 B1 9/2016 Miyata et al.
9,455,138 B1 9/2016 Fukazawa
9,455,177 B1 9/2016 Park et al.
9,460,954 B2 10/2016 De Jong et al.
9,464,352 B2 10/2016 Nakano et al.
9,472,410 B2 10/2016 Sadjadi et al.
9,472,432 B1 10/2016 Blank
9,474,163 B2 10/2016 Tolle et al.
9,478,414 B2 10/2016 Kobayashi et al.
9,478,415 B2 10/2016 Kimura
D770,993 S 11/2016 Yoshida et al.
9,484,191 B2 11/2016 Winkler
9,496,225 B1 11/2016 Adusumilli et al.
9,514,927 B2 12/2016 Tolle et al.
9,514,932 B2 12/2016 Mallick et al.
9,520,289 B2 12/2016 Park et al.
9,523,148 B1 12/2016 Pore et al.
D777,546 S 1/2017 Ishii et al.
9,543,180 B2 1/2017 Kamiya
9,556,516 B2 1/2017 Takamure
9,558,931 B2 1/2017 Tang
9,564,312 B2 2/2017 Henri et al.
9,564,314 B2 2/2017 Takamure et al.
9,570,302 B1 2/2017 Chang et al.
9,574,268 B1 2/2017 Dunn et al.
9,576,952 B2 2/2017 Joshi et al.
9,583,333 B2 2/2017 Chatterjee
9,583,345 B2 2/2017 Chen et al.
D782,419 S 3/2017 Willette
9,589,770 B2 3/2017 Winkler
9,605,342 B2 3/2017 Alokozai et al.
9,605,343 B2 3/2017 Winkler
9,605,736 B1 3/2017 Foshage et al.
9,607,837 B1 3/2017 Namba
D783,351 S 4/2017 Fujino et al.
D784,276 S 4/2017 Tiner et al.
9,613,801 B2 4/2017 Carcasi et al.
9,618,846 B2 4/2017 Shamma et al.
9,627,221 B1 4/2017 Zaitsu et al.
D785,766 S 5/2017 Sato
D787,458 S 5/2017 Kim et al.
9,640,416 B2 5/2017 Arai
9,640,448 B2 5/2017 Ikegawa et al.
9,640,542 B2 5/2017 Lee et al.
9,644,266 B2 5/2017 Nasu et al.
9,647,114 B2 5/2017 Margetis
9,653,267 B2 5/2017 Carducci et al.
9,657,845 B2 5/2017 Shugrue
9,659,799 B2 5/2017 Lawson
9,663,857 B2 5/2017 Nakano et al.
9,666,528 B1 5/2017 Bergendahl et al.
D789,888 S 6/2017 Jang et al.
D790,041 S 6/2017 Jang et al.
9,680,268 B1 6/2017 Finona
9,684,234 B2 6/2017 Darling et al.
9,685,320 B2 6/2017 Kang et al.
9,691,668 B2 6/2017 Chang et al.
9,691,771 B2 6/2017 Lansalot-Matras
9,698,031 B2 7/2017 Kobayashi et al.
9,708,707 B2 7/2017 Ditizio et al.
9,708,708 B2 7/2017 Isobe et al.

(56) References Cited

U.S. PATENT DOCUMENTS

| | | | |
|---|---|---|---|
| 9,711,345 | B2 | 7/2017 | Shiba et al. |
| D793,352 | S | 8/2017 | Hill |
| D793,526 | S | 8/2017 | Behdjat |
| D793,572 | S | 8/2017 | Kozuka et al. |
| D793,976 | S | 8/2017 | Fukushima et al. |
| D794,753 | S | 8/2017 | Miller |
| D795,208 | S | 8/2017 | Sasaki et al. |
| 9,735,024 | B2 | 8/2017 | Zaitsu |
| 9,741,546 | B2 | 8/2017 | Carducci et al. |
| 9,741,559 | B2 | 8/2017 | Shimura et al. |
| 9,745,658 | B2 | 8/2017 | Kang et al. |
| 9,748,104 | B2 | 8/2017 | Sasaki et al. |
| 9,748,145 | B1 | 8/2017 | Kannan et al. |
| D796,458 | S | 9/2017 | Jang et al. |
| D796,670 | S | 9/2017 | Dolk et al. |
| D797,067 | S | 9/2017 | Zhang et al. |
| D798,248 | S | 9/2017 | Hanson et al. |
| 9,754,779 | B1 | 9/2017 | Ishikawa |
| 9,754,818 | B2 | 9/2017 | Shiu et al. |
| 9,759,489 | B2 | 9/2017 | Kaneko |
| 9,765,432 | B2 | 9/2017 | Ge et al. |
| 9,773,818 | B2 | 9/2017 | Kimura |
| D800,782 | S | 10/2017 | Bever et al. |
| 9,778,561 | B2 | 10/2017 | Marks et al. |
| 9,780,225 | B2 | 10/2017 | Venkatasubramanian et al. |
| 9,786,491 | B2 | 10/2017 | Suzuki et al. |
| 9,786,570 | B2 | 10/2017 | Kang et al. |
| 9,790,595 | B2 | 10/2017 | Jung et al. |
| 9,793,115 | B2 | 10/2017 | Tolle |
| 9,793,135 | B1 | 10/2017 | Zaitsu et al. |
| 9,793,148 | B2 | 10/2017 | Yamagishi et al. |
| 9,798,308 | B2 | 10/2017 | Mimura |
| 9,799,736 | B1 | 10/2017 | Ebrish et al. |
| 9,803,926 | B2 | 10/2017 | Kikuchi et al. |
| D801,942 | S | 11/2017 | Riker et al. |
| D802,472 | S | 11/2017 | Sasaki et al. |
| D802,546 | S | 11/2017 | Jang et al. |
| D803,802 | S | 11/2017 | Sasaki et al. |
| 9,808,246 | B2 | 11/2017 | Shelton et al. |
| 9,812,319 | B1 | 11/2017 | Fukazawa et al. |
| 9,812,320 | B1 | 11/2017 | Pore et al. |
| 9,812,372 | B2 | 11/2017 | Choi et al. |
| 9,820,289 | B1 | 11/2017 | Pawar et al. |
| 9,824,881 | B2 | 11/2017 | Niskanen et al. |
| 9,824,884 | B1 | 11/2017 | Sims et al. |
| 9,824,893 | B1 | 11/2017 | Smith et al. |
| 9,837,355 | B2 | 12/2017 | Briggs et al. |
| 9,842,835 | B1 | 12/2017 | Cheng et al. |
| 9,847,221 | B1 | 12/2017 | McLaughlin et al. |
| 9,847,247 | B2 | 12/2017 | Huang et al. |
| 9,850,573 | B1 | 12/2017 | Sun |
| D807,494 | S | 1/2018 | Kim et al. |
| D808,254 | S | 1/2018 | Deleu |
| 9,859,151 | B1 | 1/2018 | Zhu |
| 9,865,455 | B1 | 1/2018 | Sims et al. |
| 9,865,456 | B1 | 1/2018 | Pandey et al. |
| 9,865,815 | B2 | 1/2018 | Hausmann |
| 9,868,131 | B2 | 1/2018 | Kilpi et al. |
| 9,870,964 | B1 | 1/2018 | Yoshino et al. |
| 9,875,891 | B2 | 1/2018 | Henri et al. |
| 9,875,893 | B2 | 1/2018 | Takamure et al. |
| 9,881,788 | B2 | 1/2018 | Kim et al. |
| D810,705 | S | 2/2018 | Krishnan et al. |
| 9,887,082 | B1 | 2/2018 | Pore et al. |
| 9,890,456 | B2 | 2/2018 | Tolle et al. |
| 9,891,521 | B2 | 2/2018 | Kang et al. |
| 9,892,908 | B2 | 2/2018 | Pettinger et al. |
| 9,892,913 | B2 | 2/2018 | Margetis et al. |
| 9,895,715 | B2 | 2/2018 | Haukka et al. |
| 9,899,291 | B2 | 2/2018 | Kato |
| 9,899,405 | B2 | 2/2018 | Kim |
| 9,905,420 | B2 | 2/2018 | Margetis et al. |
| 9,905,492 | B2 | 2/2018 | Tang et al. |
| 9,909,214 | B2 | 3/2018 | Suemori |
| 9,909,492 | B2 | 3/2018 | Jeswine |
| 9,911,595 | B1 | 3/2018 | Smith et al. |
| 9,911,676 | B2 | 3/2018 | Tang |
| 9,916,980 | B1 | 3/2018 | Knaepen |
| 9,920,451 | B2 | 3/2018 | Sivaramakrishnan et al. |
| 9,922,824 | B2 | 3/2018 | Okada |
| 9,929,005 | B1 | 3/2018 | Shimamoto et al. |
| 9,929,011 | B2 | 3/2018 | Hawryluk et al. |
| 9,929,055 | B2 | 3/2018 | Dube et al. |
| 9,951,421 | B2 | 4/2018 | Lind |
| 9,960,033 | B1 | 5/2018 | Nozawa |
| 9,960,072 | B2 | 5/2018 | Coomer |
| 9,966,299 | B2 | 5/2018 | Tang et al. |
| 9,970,112 | B2 | 5/2018 | Koshi et al. |
| 9,984,869 | B1 | 5/2018 | Blanquart |
| D819,580 | S | 6/2018 | Krishnan et al. |
| 9,987,747 | B2 | 6/2018 | Hwang et al. |
| 9,991,138 | B2 | 6/2018 | Lin et al. |
| 9,996,004 | B2 | 6/2018 | Smith et al. |
| 9,997,357 | B2 | 6/2018 | Arghavani et al. |
| 9,997,373 | B2 | 6/2018 | Hudson |
| 10,032,628 | B2 | 6/2018 | Xie et al. |
| 10,014,212 | B2 | 7/2018 | Chen et al. |
| 10,017,856 | B1 | 7/2018 | Arnepalli et al. |
| 10,018,920 | B2 | 7/2018 | Chang et al. |
| 10,023,960 | B2 | 7/2018 | Alokozai |
| 10,032,792 | B2 | 7/2018 | Kim et al. |
| D825,505 | S | 8/2018 | Hanson et al. |
| D825,614 | S | 8/2018 | Bever et al. |
| 10,043,661 | B2 | 8/2018 | Kato et al. |
| 10,047,435 | B2 | 8/2018 | Haukka et al. |
| 10,053,774 | B2 | 8/2018 | Tolle et al. |
| 10,060,473 | B2 | 8/2018 | Davey et al. |
| D827,592 | S | 9/2018 | Ichino et al. |
| D829,306 | S | 9/2018 | Ikedo et al. |
| 10,083,836 | B2 | 9/2018 | Milligan |
| D830,981 | S | 10/2018 | Jeong et al. |
| 10,087,522 | B2 | 10/2018 | Raisanen et al. |
| 10,087,525 | B2 | 10/2018 | Schmotzer et al. |
| 10,090,316 | B2 | 10/2018 | Ootsuka |
| 10,103,040 | B1 | 10/2018 | Oosterlaken et al. |
| 10,106,892 | B1 | 10/2018 | Siddiqui et al. |
| RE47,145 | E | 11/2018 | Hashimoto |
| D834,686 | S | 11/2018 | Yamada et al. |
| 10,121,671 | B2 | 11/2018 | Fu et al. |
| 10,134,617 | B2 | 11/2018 | Gurary et al. |
| 10,134,757 | B2 | 11/2018 | Chun et al. |
| RE47,170 | E | 12/2018 | Beynet et al. |
| 10,147,600 | B2 | 12/2018 | Takamure et al. |
| 10,167,557 | B2 | 1/2019 | Hawkins et al. |
| 10,177,024 | B2 | 1/2019 | Gomm et al. |
| 10,177,025 | B2 | 1/2019 | Pore |
| 10,179,947 | B2 | 1/2019 | Fukazawa |
| 10,186,420 | B2 | 1/2019 | Fukazawa |
| 10,190,213 | B2 | 1/2019 | Zhu et al. |
| 10,190,214 | B2 | 1/2019 | Shon et al. |
| 10,190,701 | B2 | 1/2019 | Raj et al. |
| 10,192,734 | B2 | 1/2019 | Sanchez et al. |
| 10,193,429 | B2 | 1/2019 | Smith et al. |
| D840,364 | S | 2/2019 | Ichino et al. |
| 10,204,788 | B1 | 2/2019 | Ye et al. |
| 10,211,308 | B2 | 2/2019 | Zhu et al. |
| 10,229,833 | B2 | 3/2019 | Raisanen et al. |
| 10,229,851 | B2 | 3/2019 | Briggs et al. |
| 10,229,985 | B1 | 3/2019 | Li et al. |
| 10,236,177 | B1 | 3/2019 | Kohen et al. |
| D846,008 | S | 4/2019 | Geldenhuys et al. |
| 10,249,524 | B2 | 4/2019 | den Hartog Besselink et al. |
| 10,249,577 | B2 | 4/2019 | Lee et al. |
| 10,262,859 | B2 | 4/2019 | Margetis et al. |
| 10,269,558 | B2 | 4/2019 | Blanquart et al. |
| 10,276,355 | B2 | 4/2019 | White et al. |
| D849,055 | S | 5/2019 | Kneip |
| D849,662 | S | 5/2019 | Rike |
| 10,283,353 | B2 | 5/2019 | Kobayashi et al. |
| 10,287,684 | B2 | 5/2019 | Yanai et al. |
| 10,290,508 | B1 | 5/2019 | Kubota et al. |
| 10,297,440 | B2 | 5/2019 | Yamazaki et al. |
| RE47,440 | E | 6/2019 | Yudovsky et al. |
| 10,312,055 | B2 | 6/2019 | Suzuki |

(56) References Cited

U.S. PATENT DOCUMENTS 10,312,129 B2 6/2019 Coomer
10,319,588 B2 6/2019 Mattinen et al.
10,322,384 B2 6/2019 Stumpf et al.
10,332,747 B1 6/2019 Watanabe et al.
10,332,963 B1 6/2019 Xie
D855,089 S 7/2019 Hopkins
10,340,125 B2 7/2019 Winkler
10,340,135 B2 7/2019 Blanquart
10,343,920 B2 7/2019 Haukka
10,347,547 B2 7/2019 Varadarajan et al.
10,354,873 B2 7/2019 Ko et al.
10,361,201 B2 7/2019 Xie et al.
10,361,366 B2 7/2019 Hakamata et al.
10,367,080 B2 7/2019 Tang et al.
10,388,513 B1 8/2019 Blanquart
10,395,917 B2 8/2019 Niskanen et al.
10,395,919 B2 8/2019 Masaru et al.
10,395,963 B2 8/2019 Cooke
D859,136 S 9/2019 Tenander et al.
10,400,335 B2 9/2019 Ge et al.
10,410,943 B2 9/2019 Jiang et al.
10,424,476 B2 9/2019 Suzuki et al.
10,424,477 B2 9/2019 Niskanen et al.
D864,134 S 10/2019 Watarai et al.
10,428,419 B2 10/2019 Huotari et al.
10,435,790 B2 10/2019 Fukazawa et al.
10,446,393 B2 * 10/2019 Bhargava .......... H01L 29/66795
D867,867 S 11/2019 Tenander et al.
10,468,244 B2 11/2019 Li et al.
10,468,251 B2 11/2019 Ishikawa et al.
10,483,154 B1 11/2019 Smith et al.
10,510,529 B2 12/2019 Suzuki et al.
10,510,871 B1 12/2019 More et al.
10,529,554 B2 1/2020 Ishikawa et al.
D876,504 S 2/2020 Lee et al.
10,590,531 B1 3/2020 Shirako et al.
10,590,535 B2 3/2020 Huggare
10,600,637 B2 3/2020 Suzuki et al.
D880,437 S 4/2020 Lee et al.
D881,338 S 4/2020 Chen
10,622,196 B2 4/2020 Nagayama et al.
10,622,236 B2 4/2020 Kuo et al.
10,648,788 B2 5/2020 Boyd et al.
10,662,525 B2 5/2020 Jang et al.
10,704,143 B1 7/2020 Hisamitsu et al.
10,714,335 B2 7/2020 Kim et al.
10,731,249 B2 8/2020 Hatanpää et al.
10,734,497 B2 8/2020 Zhu et al.
10,741,386 B2 8/2020 Chen et al.
10,763,139 B2 9/2020 Shindo
10,770,336 B2 9/2020 Hill et al.
D900,036 S 10/2020 Wuester et al.
D903,477 S 12/2020 Goratela et al.
D913,980 S 3/2021 Lee et al.
D914,620 S 3/2021 Rokkam et al.
10,950,477 B2 3/2021 Lin et al.
11,018,003 B2 5/2021 Huang et al.
D922,229 S 6/2021 Jun et al.
11,053,584 B2 7/2021 Hsieh et al.
2001/0000141 A1 4/2001 Zhou et al.
2001/0001953 A1 5/2001 Griffiths et al.
2001/0002581 A1 6/2001 Nishikawa et al.
2001/0003015 A1 6/2001 Chang et al.
2001/0003191 A1 6/2001 Kovacs et al.
2001/0003271 A1 6/2001 Otsuki
2001/0004880 A1 6/2001 Cho et al.
2001/0006070 A1 7/2001 Shang
2001/0007244 A1 7/2001 Matsuse
2001/0007246 A1 7/2001 Ueda et al.
2001/0007645 A1 7/2001 Honma
2001/0014267 A1 8/2001 Yamaga et al.
2001/0014514 A1 8/2001 Geusic
2001/0015343 A1 8/2001 Sprey et al.
2001/0016273 A1 8/2001 Narasimhan et al.
2001/0017103 A1 8/2001 Takeshita et al.
2001/0018267 A1 8/2001 Shinriki et al.
2001/0019347 A1 9/2001 Hauck
2001/0019777 A1 9/2001 Tanaka et al.
2001/0019900 A1 9/2001 Hasegawa
2001/0020715 A1 9/2001 Yamasaki
2001/0021591 A1 9/2001 Srinivasan et al.
2001/0022215 A1 9/2001 Donohoe
2001/0024387 A1 9/2001 Raaijmakers et al.
2001/0027026 A1 10/2001 Dhindsa et al.
2001/0027585 A1 10/2001 Lee
2001/0028924 A1 10/2001 Sherman
2001/0031535 A1 10/2001 Agnello et al.
2001/0031541 A1 10/2001 Madan et al.
2001/0034097 A1 10/2001 Lim et al.
2001/0038783 A1 11/2001 Nakashima et al.
2001/0039922 A1 11/2001 Nakahara
2001/0039966 A1 11/2001 Walpole et al.
2001/0040511 A1 11/2001 Bushner et al.
2001/0041250 A1 11/2001 Werkhoven et al.
2001/0042511 A1 11/2001 Liu et al.
2001/0042514 A1 11/2001 Mizuno et al.
2001/0042594 A1 11/2001 Shamouilian et al.
2001/0046765 A1 11/2001 Cappellani et al.
2001/0047761 A1 12/2001 Wijck et al.
2001/0048981 A1 12/2001 Suzuki
2001/0049080 A1 12/2001 Asano
2001/0049202 A1 12/2001 Maeda et al.
2001/0052556 A1 12/2001 Ting et al.
2001/0054381 A1 12/2001 Umotoy et al.
2001/0054388 A1 12/2001 Qian
2002/0000195 A1 1/2002 Bang et al.
2002/0000202 A1 1/2002 Yuda et al.
2002/0001971 A1 1/2002 Cho
2002/0001974 A1 1/2002 Chan
2002/0001976 A1 1/2002 Danek
2002/0005400 A1 1/2002 Gat et al.
2002/0005943 A1 1/2002 Voinalovich
2002/0008270 A1 1/2002 Marsh
2002/0009119 A1 1/2002 Matthew et al.
2002/0009560 A1 1/2002 Ozono
2002/0009861 A1 1/2002 Narwankar et al.
2002/0011210 A1 1/2002 Satoh et al.
2002/0011211 A1 1/2002 Halpin
2002/0011310 A1 1/2002 Kamarehi et al.
2002/0013792 A1 1/2002 Imielinski et al.
2002/0014204 A1 2/2002 Pyo
2002/0014483 A1 2/2002 Suzuki et al.
2002/0015853 A1 2/2002 Wataya et al.
2002/0016829 A1 2/2002 Defosse
2002/0020429 A1 2/2002 Selbrede et al.
2002/0022347 A1 2/2002 Park et al.
2002/0023677 A1 2/2002 Zheng
2002/0025688 A1 2/2002 Kato
2002/0027945 A1 3/2002 Hirano et al.
2002/0030047 A1 3/2002 Shao et al.
2002/0031644 A1 3/2002 Malofsky et al.
2002/0033183 A1 3/2002 Sun et al.
2002/0036065 A1 3/2002 Yamagishi et al.
2002/0041931 A1 4/2002 Suntola et al.
2002/0043337 A1 4/2002 Goodman et al.
2002/0045336 A1 4/2002 Locati et al.
2002/0047705 A1 4/2002 Tada et al.
2002/0048634 A1 4/2002 Basceri
2002/0050648 A1 5/2002 Kishida et al.
2002/0052119 A1 5/2002 Cleemput
2002/0061716 A1 5/2002 Korovin et al.
2002/0062633 A1 5/2002 Denker et al.
2002/0064592 A1 5/2002 Datta et al.
2002/0064598 A1 5/2002 Wang et al.
2002/0066532 A1 6/2002 Shih et al.
2002/0068458 A1 6/2002 Chiang et al.
2002/0069222 A1 6/2002 McNeely
2002/0073922 A1 6/2002 Frankel et al.
2002/0073923 A1 6/2002 Saito et al.
2002/0076490 A1 6/2002 Chiang et al.
2002/0076507 A1 6/2002 Chiang et al.
2002/0076944 A1 6/2002 Wang et al.
2002/0078893 A1 6/2002 Van Os et al.
2002/0079056 A1 6/2002 Kudo et al.

(56) References Cited

U.S. PATENT DOCUMENTS

2002/0079714 A1 6/2002 Soucy et al.
2002/0081826 A1 6/2002 Rotondaro et al.
2002/0086501 A1 7/2002 O'Donnell et al.
2002/0088542 A1 7/2002 Nishikawa et al.
2002/0090735 A1 7/2002 Kishkovich et al.
2002/0094378 A1 7/2002 O'Donnell et al.
2002/0094388 A1 7/2002 Fonash et al.
2002/0096211 A1 7/2002 Zheng
2002/0098627 A1 7/2002 Pomarede et al.
2002/0099470 A1 7/2002 Zinger et al.
2002/0100418 A1 8/2002 Sandhu et al.
2002/0104481 A1 8/2002 Chiang et al.
2002/0104751 A1 8/2002 Drewery et al.
2002/0106909 A1 8/2002 Kato et al.
2002/0108570 A1 8/2002 Lindfors
2002/0108670 A1 8/2002 Baker et al.
2002/0108714 A1 8/2002 Doering et al.
2002/0109115 A1 8/2002 Cederstav et al.
2002/0110695 A1 8/2002 Yang et al.
2002/0110991 A1 8/2002 Li
2002/0112114 A1 8/2002 Blair et al.
2002/0114886 A1 8/2002 Chou et al.
2002/0115252 A1 8/2002 Haukka et al.
2002/0117113 A1 8/2002 Tsuruno et al.
2002/0117262 A1 8/2002 Pang et al.
2002/0122885 A1 9/2002 Ahn
2002/0123200 A1 9/2002 Yamamoto et al.
2002/0123230 A1 9/2002 Hubacek
2002/0123237 A1 9/2002 Nguyen et al.
2002/0124883 A1 9/2002 Zheng
2002/0124906 A1 9/2002 Suzuki et al.
2002/0127350 A1 9/2002 Ishikawa et al.
2002/0127956 A1 9/2002 Ashjaee et al.
2002/0129768 A1 9/2002 Carpenter et al.
2002/0132408 A1 9/2002 Ma et al.
2002/0134511 A1 9/2002 Ushioda et al.
2002/0136214 A1 9/2002 Do et al.
2002/0136909 A1 9/2002 Yang
2002/0139775 A1 10/2002 Chang
2002/0146512 A1 10/2002 Rossman
2002/0151327 A1 10/2002 Levitt
2002/0152244 A1 10/2002 Dean et al.
2002/0155219 A1 10/2002 Wang et al.
2002/0155708 A1 10/2002 Lo et al.
2002/0157611 A1 10/2002 Bondestam et al.
2002/0160112 A1 10/2002 Sakai et al.
2002/0164420 A1 11/2002 Derderian et al.
2002/0164423 A1 11/2002 Chiang et al.
2002/0168870 A1 11/2002 Matsuki
2002/0170676 A1 11/2002 Mitrovic et al.
2002/0172768 A1 11/2002 Endo et al.
2002/0174106 A1 11/2002 Martin
2002/0179011 A1 12/2002 Jonnalagadda et al.
2002/0181612 A1 12/2002 Warble et al.
2002/0184111 A1 12/2002 Swanson
2002/0187650 A1 12/2002 Blalock et al.
2002/0187656 A1 12/2002 Tan et al.
2002/0188376 A1 12/2002 Derderian et al.
2002/0192370 A1 12/2002 Metzner et al.
2002/0197402 A1 12/2002 Chiang et al.
2002/0197849 A1 12/2002 Mandal
2003/0000647 A1 1/2003 Yudovsky et al.
2003/0002562 A1 1/2003 Yerlikaya et al.
2003/0003607 A1 1/2003 Kagoshima
2003/0003635 A1 1/2003 Paranjpe et al.
2003/0003696 A1 1/2003 Gelatos et al.
2003/0003719 A1 1/2003 Lim et al.
2003/0008528 A1 1/2003 Xia et al.
2003/0008602 A1 1/2003 Ashjaee et al.
2003/0010355 A1 1/2003 Nowak et al.
2003/0010451 A1 1/2003 Tzu
2003/0010452 A1 1/2003 Park et al.
2003/0012632 A1 1/2003 Saeki
2003/0013314 A1 1/2003 Ying et al.
2003/0015141 A1 1/2003 Takagi
2003/0015294 A1 1/2003 Wang
2003/0015596 A1 1/2003 Evans
2003/0017265 A1 1/2003 Basceri et al.
2003/0017266 A1 1/2003 Basceri et al.
2003/0017268 A1 1/2003 Hu
2003/0019428 A1 1/2003 Ku et al.
2003/0019580 A1 1/2003 Strang
2003/0022468 A1 1/2003 Shioya et al.
2003/0022523 A1 1/2003 Irino et al.
2003/0023338 A1 1/2003 Chin et al.
2003/0024901 A1 2/2003 Ishikawa
2003/0025146 A1 2/2003 Narwankar et al.
2003/0026904 A1 2/2003 Yadav et al.
2003/0027431 A1 2/2003 Sneh et al.
2003/0029303 A1 2/2003 Hasegawa et al.
2003/0029381 A1 2/2003 Nishibayashi
2003/0029475 A1 2/2003 Hua et al.
2003/0029563 A1 2/2003 Kaushal et al.
2003/0032297 A1 2/2003 Lindstrom et al.
2003/0035002 A1 2/2003 Moles
2003/0035705 A1 2/2003 Johnson
2003/0036272 A1 2/2003 Shamouilian et al.
2003/0037800 A1 2/2003 Bailey et al.
2003/0040120 A1 2/2003 Allen et al.
2003/0040158 A1 2/2003 Saitoh
2003/0040196 A1 2/2003 Lim et al.
2003/0040841 A1 2/2003 Nasr et al.
2003/0041971 A1 3/2003 Kido et al.
2003/0042419 A1 3/2003 Katsumata et al.
2003/0045961 A1 3/2003 Nakao
2003/0049372 A1* 3/2003 Cook ................ H01L 21/67757
118/724
2003/0049375 A1 3/2003 Nguyen et al.
2003/0049499 A1 3/2003 Murakawa et al.
2003/0049571 A1 3/2003 Hallock et al.
2003/0049580 A1 3/2003 Goodman
2003/0049937 A1 3/2003 Suzuki
2003/0054670 A1 3/2003 Wang et al.
2003/0056726 A1 3/2003 Holst et al.
2003/0057848 A1 3/2003 Yuasa et al.
2003/0059535 A1 3/2003 Luo et al.
2003/0059980 A1 3/2003 Chen et al.
2003/0062359 A1 4/2003 Ho et al.
2003/0065413 A1 4/2003 Liteplo et al.
2003/0066482 A1 4/2003 Pokharna et al.
2003/0066541 A1 4/2003 Sun et al.
2003/0066826 A1 4/2003 Lee et al.
2003/0070617 A1 4/2003 Kim et al.
2003/0071015 A1 4/2003 Chinn et al.
2003/0072882 A1 4/2003 Niinisto et al.
2003/0075107 A1 4/2003 Miyano et al.
2003/0075925 A1 4/2003 Lindfors et al.
2003/0077857 A1 4/2003 Xia et al.
2003/0077883 A1 4/2003 Ohtake
2003/0082296 A1 5/2003 Elers et al.
2003/0082307 A1 5/2003 Chung et al.
2003/0085663 A1 5/2003 Horsky
2003/0091938 A1 5/2003 Fairbairn et al.
2003/0094133 A1 5/2003 Yoshidome et al.
2003/0101938 A1 6/2003 Ronsse et al.
2003/0109107 A1 6/2003 Hsieh et al.
2003/0109951 A1 6/2003 Hsiung et al.
2003/0111012 A1 6/2003 Takeshima
2003/0111013 A1 6/2003 Oosterlaken et al.
2003/0111963 A1 6/2003 Tolmachev et al.
2003/0113995 A1 6/2003 Xia et al.
2003/0116087 A1 6/2003 Nguyen
2003/0121608 A1 7/2003 Chen
2003/0124792 A1 7/2003 Jeon et al.
2003/0124818 A1 7/2003 Luo et al.
2003/0124820 A1 7/2003 Johnsgard et al.
2003/0124842 A1 7/2003 Hytros et al.
2003/0127049 A1 7/2003 Han et al.
2003/0132319 A1 7/2003 Hytros et al.
2003/0133854 A1 7/2003 Tabata et al.
2003/0134038 A1 7/2003 Paranjpe
2003/0140851 A1 7/2003 Janakiraman et al.
2003/0141527 A1 7/2003 Joo et al.
2003/0141820 A1 7/2003 White et al.

(56) References Cited

U.S. PATENT DOCUMENTS

2003/0143328 A1 7/2003 Chen
2003/0143846 A1 7/2003 Sekiya et al.
2003/0145789 A1 8/2003 Bauch et al.
2003/0149506 A1 8/2003 Haanstra et al.
2003/0150386 A1 8/2003 Shimada
2003/0153177 A1 8/2003 Tepman et al.
2003/0153186 A1 8/2003 Bar-Gadda
2003/0157345 A1 8/2003 Beldi et al.
2003/0157432 A1 8/2003 Rottsegge
2003/0157436 A1 8/2003 Manger et al.
2003/0159653 A1 8/2003 Dando et al.
2003/0159656 A1 8/2003 Tan
2003/0162412 A1 8/2003 Chung
2003/0168001 A1 9/2003 Sneh
2003/0168008 A1 9/2003 Ohmi et al.
2003/0168012 A1 9/2003 Tamura et al.
2003/0168174 A1 9/2003 Foree
2003/0168699 A1 9/2003 Honda
2003/0168750 A1 9/2003 Basceri et al.
2003/0168948 A1 9/2003 Yamagishi et al.
2003/0170153 A1 9/2003 Bar-Gadda
2003/0170583 A1 9/2003 Nakashima
2003/0170945 A1 9/2003 Igeta et al.
2003/0173030 A1 9/2003 Ishii et al.
2003/0173490 A1 9/2003 Lappen
2003/0176074 A1 9/2003 Paterson et al.
2003/0178145 A1 9/2003 Anderson et al.
2003/0180458 A1 9/2003 Sneh
2003/0181065 A1 9/2003 O'Donnell
2003/0183156 A1 10/2003 Dando
2003/0183856 A1 10/2003 Wieczorek et al.
2003/0188682 A1 10/2003 Tois et al.
2003/0188685 A1 10/2003 Wang
2003/0190804 A1 10/2003 Glenn et al.
2003/0192875 A1 10/2003 Bieker et al.
2003/0198587 A1 10/2003 Kaloyeros
2003/0200926 A1 10/2003 Dando et al.
2003/0201541 A1 10/2003 Kim
2003/0205096 A1 11/2003 Gehner et al.
2003/0205202 A1 11/2003 Funaki et al.
2003/0205237 A1 11/2003 Sakuma
2003/0205327 A1 11/2003 Howald et al.
2003/0207032 A1 11/2003 Ahn et al.
2003/0209323 A1 11/2003 Yokogaki
2003/0209326 A1 11/2003 Lee et al.
2003/0209746 A1 11/2003 Horii
2003/0210901 A1 11/2003 Donald et al.
2003/0211735 A1 11/2003 Rossman
2003/0213435 A1 11/2003 Okuda et al.
2003/0213560 A1 11/2003 Wang et al.
2003/0213562 A1 11/2003 Gondhalekar et al.
2003/0215963 A1 11/2003 AmRhein et al.
2003/0217915 A1 11/2003 Ouellet
2003/0219972 A1 11/2003 Green
2003/0221780 A1 12/2003 Lei et al.
2003/0226840 A1 12/2003 Dalton
2003/0228772 A1 12/2003 Cowans
2003/0230233 A1* 12/2003 Fitzgerald ............... C23C 16/22
257/E21.103
2003/0230986 A1 12/2003 Horsky et al.
2003/0231698 A1 12/2003 Yamaguchi
2003/0232138 A1 12/2003 Tuominen et al.
2003/0232491 A1 12/2003 Yamaguchi
2003/0232497 A1 12/2003 Xi et al.
2003/0232511 A1 12/2003 Metzner et al.
2003/0234371 A1 12/2003 Ziegler
2004/0002224 A1 1/2004 Chono et al.
2004/0005147 A1 1/2004 Wang et al.
2004/0005753 A1 1/2004 Kostamo et al.
2004/0009307 A1 1/2004 Koh et al.
2004/0009679 A1 1/2004 Yeo et al.
2004/0010772 A1 1/2004 McKenna et al.
2004/0011504 A1 1/2004 Ku et al.
2004/0013577 A1 1/2004 Ganguli et al.
2004/0013818 A1 1/2004 Moon et al.
2004/0015300 A1 1/2004 Ganguli et al.
2004/0016637 A1 1/2004 Yang
2004/0018304 A1 1/2004 Chung et al.
2004/0018307 A1 1/2004 Park et al.
2004/0018694 A1 1/2004 Lee et al.
2004/0018723 A1 1/2004 Byun et al.
2004/0018750 A1 1/2004 Sophie et al.
2004/0023125 A1 2/2004 Nozawa et al.
2004/0023516 A1 2/2004 Londergan et al.
2004/0025786 A1 2/2004 Kontani et al.
2004/0025787 A1 2/2004 Selbrede et al.
2004/0026372 A1 2/2004 Takenaka et al.
2004/0029052 A1 2/2004 Park et al.
2004/0031564 A1 2/2004 Gottscho et al.
2004/0035358 A1 2/2004 Basceri et al.
2004/0036129 A1 2/2004 Forbes et al.
2004/0037339 A1 2/2004 Watson et al.
2004/0037675 A1 2/2004 Zinger et al.
2004/0038525 A1 2/2004 Meng et al.
2004/0043149 A1 3/2004 Gordon et al.
2004/0043544 A1 3/2004 Asai et al.
2004/0048439 A1 3/2004 Soman
2004/0048452 A1 3/2004 Sugawara et al.
2004/0048492 A1 3/2004 Ishikawa et al.
2004/0050325 A1 3/2004 Samoilov
2004/0050496 A1 3/2004 Iwai et al.
2004/0052972 A1 3/2004 Schmitt
2004/0056017 A1 3/2004 Renken
2004/0058517 A1 3/2004 Nallan et al.
2004/0062081 A1 4/2004 Drewes
2004/0063289 A1 4/2004 Ohta
2004/0065255 A1 4/2004 Yang et al.
2004/0069226 A1 4/2004 Yoshida et al.
2004/0071897 A1 4/2004 Verplancken et al.
2004/0077182 A1 4/2004 Lim et al.
2004/0079286 A1 4/2004 Lindfors
2004/0079960 A1 4/2004 Shakuda
2004/0080697 A1 4/2004 Song
2004/0082171 A1 4/2004 Shin et al.
2004/0083961 A1 5/2004 Basceri
2004/0083962 A1 5/2004 Bang et al.
2004/0083964 A1 5/2004 Ingle et al.
2004/0083975 A1 5/2004 Tong et al.
2004/0087141 A1 5/2004 Ramanathan et al.
2004/0087168 A1 5/2004 Granneman et al.
2004/0089078 A1 5/2004 Gehner et al.
2004/0089236 A1 5/2004 Yokogawa et al.
2004/0092073 A1 5/2004 Cabral et al.
2004/0092120 A1 5/2004 Wicker
2004/0093963 A1 5/2004 Gehner et al.
2004/0094206 A1 5/2004 Ishida
2004/0094402 A1 5/2004 Gopalraja
2004/0095074 A1 5/2004 Ishii et al.
2004/0099213 A1 5/2004 Adomaitis et al.
2004/0099635 A1 5/2004 Nishikawa
2004/0101622 A1 5/2004 Park et al.
2004/0103914 A1 6/2004 Cheng et al.
2004/0104439 A1 6/2004 Haukka et al.
2004/0105738 A1 6/2004 Ahn et al.
2004/0106249 A1 6/2004 Huotari
2004/0112288 A1 6/2004 Whitesell
2004/0115936 A1 6/2004 DePetrillo et al.
2004/0118342 A1 6/2004 Cheng et al.
2004/0121620 A1 6/2004 Pomarede et al.
2004/0124131 A1 7/2004 Aitchison
2004/0124549 A1 7/2004 Curran
2004/0126213 A1 7/2004 Pelzmann et al.
2004/0126929 A1 7/2004 Tang et al.
2004/0126990 A1 7/2004 Ohta
2004/0127069 A1 7/2004 Yamazaki et al.
2004/0129211 A1 7/2004 Blonigan et al.
2004/0129671 A1 7/2004 Ji et al.
2004/0134429 A1 7/2004 Yamanaka
2004/0137756 A1 7/2004 Li et al.
2004/0142577 A1 7/2004 Sugawara et al.
2004/0144311 A1 7/2004 Chen
2004/0144323 A1 7/2004 Kai
2004/0144980 A1 7/2004 Ahn et al.
2004/0146644 A1 7/2004 Xia et al.

(56) References Cited

U.S. PATENT DOCUMENTS

2004/0151844 A1 8/2004 Zhang et al.
2004/0151845 A1 8/2004 Nguyen et al.
2004/0152287 A1 8/2004 Sherrill et al.
2004/0154746 A1 8/2004 Park
2004/0159343 A1 8/2004 Shimbara et al.
2004/0163590 A1 8/2004 Tran et al.
2004/0168627 A1 9/2004 Conley et al.
2004/0168742 A1 9/2004 Kim et al.
2004/0168769 A1 9/2004 Matsuoka et al.
2004/0169032 A1 9/2004 Murayama et al.
2004/0185177 A1 9/2004 Basceri et al.
2004/0187304 A1 9/2004 Chen et al.
2004/0187777 A1 9/2004 Okamoto et al.
2004/0187784 A1 9/2004 Sferlazzo
2004/0187790 A1 9/2004 Bader
2004/0187928 A1 9/2004 Ambrosina
2004/0198069 A1 10/2004 Metzner et al.
2004/0200499 A1 10/2004 Harvey et al.
2004/0202786 A1 10/2004 Wongsenakhum et al.
2004/0203251 A1 10/2004 Kawaguchi et al.
2004/0206305 A1 10/2004 Choi et al.
2004/0208228 A1 10/2004 Hashikura et al.
2004/0209477 A1 10/2004 Buxbaum et al.
2004/0211357 A1 10/2004 Gadgil
2004/0212947 A1 10/2004 Nguyen
2004/0213921 A1 10/2004 Leu
2004/0214399 A1 10/2004 Ahn et al.
2004/0214445 A1 10/2004 Shimizu et al.
2004/0217217 A1 11/2004 Han et al.
2004/0219793 A1 11/2004 Hishiya et al.
2004/0220699 A1 11/2004 Heden et al.
2004/0221807 A1 11/2004 Verghese et al.
2004/0221808 A1 11/2004 Kawano
2004/0223893 A1 11/2004 Tabata et al.
2004/0224478 A1 11/2004 Chudzik et al.
2004/0226507 A1 11/2004 Carpenter et al.
2004/0226515 A1 11/2004 Yendler et al.
2004/0228968 A1 11/2004 Basceri
2004/0231600 A1 11/2004 Lee
2004/0231799 A1 11/2004 Lee et al.
2004/0238523 A1 12/2004 Kuibira et al.
2004/0241322 A1 12/2004 Basceri et al.
2004/0241341 A1 12/2004 Lin
2004/0241998 A1 12/2004 Hanson
2004/0245091 A1 12/2004 Karim et al.
2004/0247779 A1 12/2004 Selvamanickam et al.
2004/0250600 A1 12/2004 Bevers et al.
2004/0253790 A1 12/2004 Ootsuka
2004/0253867 A1 12/2004 Matsumoto
2004/0261492 A1 12/2004 Zarkar et al.
2004/0261706 A1 12/2004 Lindfors et al.
2004/0261712 A1 12/2004 Hayashi et al.
2004/0261946 A1 12/2004 Endoh et al.
2004/0266011 A1 12/2004 Lee et al.
2005/0000428 A1 1/2005 Shero et al.
2005/0001062 A1 1/2005 McCracken et al.
2005/0003089 A1 1/2005 Won et al.
2005/0003600 A1 1/2005 Kasai et al.
2005/0003662 A1 1/2005 Jurisch et al.
2005/0006682 A1 1/2005 Bae et al.
2005/0008799 A1 1/2005 Tomiyasu et al.
2005/0009325 A1 1/2005 Chung et al.
2005/0016452 A1 1/2005 Ryu et al.
2005/0016470 A1 1/2005 Kang et al.
2005/0016956 A1 1/2005 Liu et al.
2005/0017272 A1 1/2005 Yamashita et al.
2005/0019026 A1 1/2005 Wang et al.
2005/0019494 A1 1/2005 Moghadam et al.
2005/0019960 A1 1/2005 Lee et al.
2005/0020071 A1 1/2005 Sonobe et al.
2005/0023231 A1 2/2005 Huang et al.
2005/0023624 A1 2/2005 Ahn et al.
2005/0026402 A1 2/2005 Jurgensen
2005/0033075 A1 2/2005 Chi et al.
2005/0034664 A1 2/2005 Koh et al.
2005/0034674 A1 2/2005 Ono
2005/0037154 A1 2/2005 Koh et al.
2005/0037578 A1 2/2005 Chen et al.
2005/0037610 A1 2/2005 Cha
2005/0037619 A1 2/2005 Granneman et al.
2005/0040144 A1 2/2005 Sellers
2005/0042778 A1 2/2005 Peukert
2005/0046825 A1 3/2005 Powell et al.
2005/0048797 A1 3/2005 Fukazawa
2005/0051093 A1 3/2005 Makino et al.
2005/0051100 A1 3/2005 Chiang et al.
2005/0051854 A1 3/2005 Cabral et al.
2005/0054175 A1 3/2005 Bauer
2005/0054198 A1 3/2005 Um
2005/0054228 A1 3/2005 March
2005/0056218 A1 3/2005 Sun et al.
2005/0056780 A1 3/2005 Miller et al.
2005/0059261 A1 3/2005 Basceri et al.
2005/0059262 A1 3/2005 Yin et al.
2005/0059264 A1 3/2005 Cheung
2005/0061964 A1 3/2005 Nagano et al.
2005/0062773 A1 3/2005 Fouet
2005/0063451 A1 3/2005 Abe et al.
2005/0064207 A1 3/2005 Senzaki et al.
2005/0064719 A1 3/2005 Liu
2005/0066893 A1 3/2005 Soininen
2005/0069651 A1 3/2005 Miyoshi
2005/0070123 A1 3/2005 Hirano
2005/0070128 A1 3/2005 Xia et al.
2005/0070729 A1 3/2005 Kiyomori et al.
2005/0072357 A1 4/2005 Shero et al.
2005/0074576 A1 4/2005 Chaiken et al.
2005/0074983 A1 4/2005 Shinriki et al.
2005/0079124 A1 4/2005 Sanderson
2005/0079691 A1 4/2005 Kim et al.
2005/0081786 A1 4/2005 Kubista et al.
2005/0085090 A1 4/2005 Mui et al.
2005/0090123 A1 4/2005 Nishimura et al.
2005/0092247 A1 5/2005 Schmidt
2005/0092249 A1 5/2005 Kilpela et al.
2005/0092439 A1 5/2005 Keeton et al.
2005/0092733 A1 5/2005 Ito et al.
2005/0095770 A1 5/2005 Kumagai et al.
2005/0095779 A1 5/2005 Park et al.
2005/0095859 A1 5/2005 Chen et al.
2005/0098107 A1 5/2005 Du Bois et al.
2005/0100669 A1 5/2005 Kools et al.
2005/0101154 A1 5/2005 Huang
2005/0101843 A1 5/2005 Quinn et al.
2005/0104112 A1 5/2005 Haukka et al.
2005/0106762 A1 5/2005 Chakrapani et al.
2005/0106893 A1 5/2005 Wilk
2005/0107627 A1 5/2005 Dussarrat et al.
2005/0109461 A1 5/2005 Sun
2005/0110069 A1 5/2005 Kil et al.
2005/0112282 A1 5/2005 Gordon et al.
2005/0115946 A1 6/2005 Shim et al.
2005/0118804 A1 6/2005 Byun et al.
2005/0118837 A1 6/2005 Todd
2005/0120805 A1 6/2005 Lane
2005/0120962 A1 6/2005 Ushioda et al.
2005/0121145 A1 6/2005 Du Bois et al.
2005/0123690 A1 6/2005 Derderian et al.
2005/0130427 A1 6/2005 Seok-Jun
2005/0132957 A1 6/2005 El-Raghy
2005/0133160 A1 6/2005 Kennedy et al.
2005/0133161 A1 6/2005 Carpenter et al.
2005/0133166 A1 6/2005 Satitpunwaycha et al.
2005/0136188 A1 6/2005 Chang
2005/0136657 A1 6/2005 Yokoi et al.
2005/0139160 A1 6/2005 Lei et al.
2005/0141591 A1 6/2005 Sakano
2005/0142361 A1 6/2005 Nakanishi
2005/0145338 A1 7/2005 Park et al.
2005/0148162 A1 7/2005 Chen et al.
2005/0150601 A1 7/2005 Srivastava
2005/0151184 A1 7/2005 Lee et al.
2005/0153571 A1 7/2005 Senzaki
2005/0153573 A1 7/2005 Okudaira et al.

(56) References Cited

U.S. PATENT DOCUMENTS

2005/0160987 A1 7/2005 Kasai et al.
2005/0161434 A1 7/2005 Sugawara et al.
2005/0164469 A1 7/2005 Haupt
2005/0170306 A1 8/2005 Oosterlaken et al.
2005/0172895 A1 8/2005 Kijima et al.
2005/0173003 A1 8/2005 Laverdiere et al.
2005/0175789 A1 8/2005 Helms
2005/0178333 A1 8/2005 Loke et al.
2005/0181535 A1 8/2005 Yun et al.
2005/0181555 A1 8/2005 Haukka et al.
2005/0183827 A1 8/2005 White et al.
2005/0186688 A1 8/2005 Basceri
2005/0187647 A1 8/2005 Wang et al.
2005/0191828 A1 9/2005 Al-Bayati et al.
2005/0193948 A1 9/2005 Oohirabaru et al.
2005/0193952 A1 9/2005 Goodman et al.
2005/0199013 A1 9/2005 Vandroux et al.
2005/0199342 A1 9/2005 Shajii et al.
2005/0201908 A1 9/2005 Nakamura et al.
2005/0208217 A1 9/2005 Shinriki et al.
2005/0208219 A1 9/2005 Basceri
2005/0208718 A1 9/2005 Lim et al.
2005/0211167 A1 9/2005 Gunji
2005/0211384 A1 9/2005 Hayashi
2005/0212119 A1 9/2005 Shero
2005/0214445 A1* 9/2005 Wajda .................... C23C 16/52
118/712
2005/0214457 A1 9/2005 Schmitt et al.
2005/0214458 A1 9/2005 Meiere
2005/0208778 A1 10/2005 Li
2005/0218462 A1 10/2005 Ahn et al.
2005/0221021 A1 10/2005 Strang
2005/0221618 A1 10/2005 AmRhein et al.
2005/0223982 A1 10/2005 Park et al.
2005/0223994 A1 10/2005 Blomiley et al.
2005/0227502 A1 10/2005 Schmitt et al.
2005/0229848 A1 10/2005 Shinriki
2005/0229849 A1 10/2005 Silvetti et al.
2005/0229972 A1 10/2005 Hoshi et al.
2005/0233477 A1 10/2005 Yamazaki et al.
2005/0238807 A1 10/2005 Lin et al.
2005/0241176 A1 11/2005 Shero et al.
2005/0241763 A1 11/2005 Huang et al.
2005/0241765 A1 11/2005 Dhindsa et al.
2005/0245058 A1 11/2005 Lee et al.
2005/0249876 A1 11/2005 Kawahara et al.
2005/0250340 A1 11/2005 Chen et al.
2005/0251990 A1 11/2005 Choi
2005/0252447 A1 11/2005 Zhao et al.
2005/0252449 A1 11/2005 Nguyen et al.
2005/0252455 A1 11/2005 Moriya et al.
2005/0253061 A1 11/2005 Cameron et al.
2005/0255257 A1 11/2005 Choi et al.
2005/0255327 A1 11/2005 Chaney et al.
2005/0258280 A1 11/2005 Goto et al.
2005/0260347 A1 11/2005 Narwankar et al.
2005/0260837 A1 11/2005 Walther et al.
2005/0260850 A1 11/2005 Loke
2005/0263072 A1 12/2005 Balasubramanian et al.
2005/0263075 A1 12/2005 Wang et al.
2005/0263719 A1 12/2005 Ohdaira et al.
2005/0263932 A1 12/2005 Heugel
2005/0268856 A1 12/2005 Miller et al.
2005/0271812 A1 12/2005 Myo et al.
2005/0271813 A1 12/2005 Kher et al.
2005/0272247 A1 12/2005 Ikeda et al.
2005/0274323 A1 12/2005 Seidel et al.
2005/0276928 A1 12/2005 Okumura et al.
2005/0277271 A1 12/2005 Beintner
2005/0282101 A1 12/2005 Adachi
2005/0282350 A1 12/2005 Chou et al.
2005/0284573 A1 12/2005 Egley et al.
2005/0284991 A1 12/2005 Saez
2005/0285097 A1 12/2005 Shang et al.
2005/0285208 A1 12/2005 Ren et al.
2005/0287725 A1 12/2005 Kitagawa
2005/0287771 A1 12/2005 Seamons et al.
2006/0000411 A1 1/2006 Seo
2006/0006538 A1 1/2006 Allman et al.
2006/0008997 A1 1/2006 Jang et al.
2006/0009044 A1 1/2006 Igeta et al.
2006/0013674 A1 1/2006 Elliott et al.
2006/0013946 A1 1/2006 Park et al.
2006/0014384 A1 1/2006 Lee et al.
2006/0014397 A1 1/2006 Seamons et al.
2006/0016783 A1 1/2006 Wu et al.
2006/0019033 A1 1/2006 Muthukrishnan et al.
2006/0019495 A1 1/2006 Marcadal et al.
2006/0019502 A1 1/2006 Park et al.
2006/0021572 A1 2/2006 Wolden
2006/0021573 A1 2/2006 Monsma et al.
2006/0021703 A1 2/2006 Umotoy et al.
2006/0024439 A2 2/2006 Tuominen et al.
2006/0026314 A1 2/2006 Franchuk et al.
2006/0032443 A1 2/2006 Hasebe et al.
2006/0040054 A1 2/2006 Pearlstein et al.
2006/0040508 A1 2/2006 Ji
2006/0046518 A1 3/2006 Hill et al.
2006/0048710 A1 3/2006 Horiguchi et al.
2006/0051505 A1 3/2006 Kortshagen et al.
2006/0051520 A1 3/2006 Behle et al.
2006/0051925 A1 3/2006 Ahn et al.
2006/0057799 A1 3/2006 Horiguchi et al.
2006/0057828 A1 3/2006 Omura
2006/0057858 A1 3/2006 Chung et al.
2006/0060930 A1 3/2006 Metz et al.
2006/0062910 A1 3/2006 Meiere
2006/0063346 A1 3/2006 Lee et al.
2006/0068097 A1 3/2006 Yamasaki et al.
2006/0068104 A1 3/2006 Ishizaka
2006/0068121 A1 3/2006 Lee et al.
2006/0068125 A1 3/2006 Radhakrishnan
2006/0081558 A1 4/2006 Collins et al.
2006/0087638 A1 4/2006 Hirayanagi
2006/0090702 A1 5/2006 Koo et al.
2006/0093756 A1 5/2006 Rajagopalan et al.
2006/0094236 A1 5/2006 Elkins et al.
2006/0096540 A1 5/2006 Choi
2006/0097220 A1 5/2006 Kim et al.
2006/0097305 A1 5/2006 Lee
2006/0099782 A1 5/2006 Ritenour
2006/0102968 A1 5/2006 Bojarczuk et al.
2006/0105566 A1 5/2006 Waldfried et al.
2006/0107898 A1 5/2006 Blomberg
2006/0108221 A1 5/2006 Goodwin et al.
2006/0108331 A1 5/2006 Nozawa et al.
2006/0110930 A1 5/2006 Senzaki
2006/0110934 A1 5/2006 Fukuchi
2006/0113038 A1 6/2006 Gondhalekar et al.
2006/0113675 A1 6/2006 Chang et al.
2006/0113806 A1 6/2006 Tsuji et al.
2006/0115589 A1 6/2006 Vukovic
2006/0118240 A1 6/2006 Holber et al.
2006/0118241 A1 6/2006 Ohmi et al.
2006/0125099 A1 6/2006 Gordon et al.
2006/0127067 A1 6/2006 Wintenberger et al.
2006/0128142 A1 6/2006 Whelan et al.
2006/0128168 A1 6/2006 Ahn et al.
2006/0130751 A1 6/2006 Volfovski et al.
2006/0130767 A1 6/2006 Herchen
2006/0133955 A1 6/2006 Peters
2006/0137608 A1 6/2006 Choi et al.
2006/0137609 A1 6/2006 Puchacz et al.
2006/0141155 A1 6/2006 Gordon et al.
2006/0141758 A1 6/2006 Naumann et al.
2006/0144820 A1 7/2006 Sawin et al.
2006/0147626 A1 7/2006 Blomberg
2006/0148151 A1 7/2006 Murthy et al.
2006/0148180 A1 7/2006 Ahn et al.
2006/0151117 A1 7/2006 Kasanami et al.
2006/0154424 A1 7/2006 Yang et al.
2006/0156979 A1 7/2006 Thakur et al.
2006/0156981 A1 7/2006 Fondurulia
2006/0162658 A1 7/2006 Weidman

(56) References Cited

U.S. PATENT DOCUMENTS

| | | | |
|---|---|---|---|
| 2006/0162661 | A1 | 7/2006 | Jung et al. |
| 2006/0162863 | A1 | 7/2006 | Kim et al. |
| 2006/0163612 | A1 | 7/2006 | Kouvetakis et al. |
| 2006/0163683 | A1 | 7/2006 | Roth et al. |
| 2006/0165892 | A1 | 7/2006 | Weidman |
| 2006/0166428 | A1 | 7/2006 | Kamioka |
| 2006/0172531 | A1 | 8/2006 | Lin et al. |
| 2006/0175669 | A1 | 8/2006 | Kim et al. |
| 2006/0176928 | A1 | 8/2006 | Nakamura et al. |
| 2006/0177855 | A1 | 8/2006 | Utermohlen |
| 2006/0182885 | A1 | 8/2006 | Lei et al. |
| 2006/0185589 | A1 | 8/2006 | Zehavi et al. |
| 2006/0188360 | A1 | 8/2006 | Bonora et al. |
| 2006/0191555 | A1 | 8/2006 | Yoshida et al. |
| 2006/0193979 | A1 | 8/2006 | Meiere et al. |
| 2006/0193980 | A1 | 8/2006 | Hasegawa |
| 2006/0196418 | A1 | 9/2006 | Lindfors et al. |
| 2006/0196420 | A1 | 9/2006 | Ushakov et al. |
| 2006/0196421 | A1 | 9/2006 | Ronsse et al. |
| 2006/0199357 | A1 | 9/2006 | Wan et al. |
| 2006/0205194 | A1 | 9/2006 | Bauer |
| 2006/0205223 | A1 | 9/2006 | Smayling |
| 2006/0205231 | A1 | 9/2006 | Chou et al. |
| 2006/0208215 | A1 | 9/2006 | Metzner et al. |
| 2006/0211224 | A1 | 9/2006 | Matsuda |
| 2006/0211243 | A1 | 9/2006 | Ishizaka et al. |
| 2006/0211259 | A1 | 9/2006 | Maes |
| 2006/0213437 | A1 | 9/2006 | Ishizaka et al. |
| 2006/0213439 | A1 | 9/2006 | Ishizaka |
| 2006/0213441 | A1 | 9/2006 | Kobrin et al. |
| 2006/0216942 | A1 | 9/2006 | Kim et al. |
| 2006/0219169 | A1 | 10/2006 | Chen et al. |
| 2006/0219361 | A1 | 10/2006 | Wang et al. |
| 2006/0219363 | A1 | 10/2006 | Matsumoto et al. |
| 2006/0223301 | A1 | 10/2006 | Vanhaelemeersch et al. |
| 2006/0223337 | A1 | 10/2006 | Ahn et al. |
| 2006/0226117 | A1 | 10/2006 | Bertram et al. |
| 2006/0228496 | A1 | 10/2006 | Choi |
| 2006/0228863 | A1 | 10/2006 | Zhang et al. |
| 2006/0228888 | A1 | 10/2006 | Lee et al. |
| 2006/0228898 | A1 | 10/2006 | Wajda et al. |
| 2006/0236934 | A1 | 10/2006 | Choi et al. |
| 2006/0240187 | A1 | 10/2006 | Weidman |
| 2006/0240574 | A1 | 10/2006 | Yoshie |
| 2006/0240662 | A1 | 10/2006 | Conley et al. |
| 2006/0247404 | A1 | 11/2006 | Todd |
| 2006/0249175 | A1 | 11/2006 | Nowak et al. |
| 2006/0249253 | A1 | 11/2006 | Dando |
| 2006/0251827 | A1 | 11/2006 | Nowak |
| 2006/0252228 | A1 | 11/2006 | Jeng |
| 2006/0252244 | A1 | 11/2006 | Vaartstra et al. |
| 2006/0252351 | A1 | 11/2006 | Kundracik |
| 2006/0254514 | A1 | 11/2006 | Kang et al. |
| 2006/0257563 | A1 | 11/2006 | Doh et al. |
| 2006/0257584 | A1 | 11/2006 | Derderian et al. |
| 2006/0258078 | A1 | 11/2006 | Lee et al. |
| 2006/0258173 | A1 | 11/2006 | Xiao et al. |
| 2006/0260545 | A1 | 11/2006 | Ramaswamy et al. |
| 2006/0263522 | A1 | 11/2006 | Byun |
| 2006/0263540 | A1 | 11/2006 | Ramaswamy et al. |
| 2006/0264060 | A1 | 11/2006 | Ramaswamy et al. |
| 2006/0264066 | A1 | 11/2006 | Bartholomew |
| 2006/0266289 | A1 | 11/2006 | Verghese et al. |
| 2006/0269690 | A1 | 11/2006 | Watanabe et al. |
| 2006/0269692 | A1 | 11/2006 | Balseanu |
| 2006/0275710 | A1 | 12/2006 | Yamazaki et al. |
| 2006/0275933 | A1 | 12/2006 | Du Bois et al. |
| 2006/0278524 | A1 | 12/2006 | Stowell |
| 2006/0283629 | A1 | 12/2006 | Kikuchi et al. |
| 2006/0286774 | A1 | 12/2006 | Singh et al. |
| 2006/0286775 | A1 | 12/2006 | Singh et al. |
| 2006/0286817 | A1 | 12/2006 | Kato et al. |
| 2006/0286818 | A1 | 12/2006 | Wang et al. |
| 2006/0286819 | A1 | 12/2006 | Seutter |
| 2006/0291982 | A1 | 12/2006 | Tanaka |
| 2006/0292310 | A1 | 12/2006 | Le et al. |
| 2006/0292845 | A1 | 12/2006 | Chiang et al. |
| 2007/0004204 | A1 | 1/2007 | Fukazawa et al. |
| 2007/0006806 | A1 | 1/2007 | Imai |
| 2007/0010072 | A1 | 1/2007 | Bailey et al. |
| 2007/0012402 | A1 | 1/2007 | Sneh |
| 2007/0014919 | A1 | 1/2007 | Hamalainen et al. |
| 2007/0020160 | A1 | 1/2007 | Berkman et al. |
| 2007/0020167 | A1 | 1/2007 | Han et al. |
| 2007/0020830 | A1 | 1/2007 | Speranza |
| 2007/0020953 | A1 | 1/2007 | Tsai et al. |
| 2007/0022954 | A1 | 2/2007 | Iizuka et al. |
| 2007/0026148 | A1 | 2/2007 | Arai et al. |
| 2007/0026162 | A1 | 2/2007 | Wei et al. |
| 2007/0026540 | A1 | 2/2007 | Nooten et al. |
| 2007/0026654 | A1 | 2/2007 | Huotari et al. |
| 2007/0028842 | A1 | 2/2007 | Inagawa et al. |
| 2007/0031598 | A1 | 2/2007 | Okuyama et al. |
| 2007/0031599 | A1 | 2/2007 | Gschwandtner et al. |
| 2007/0032004 | A1 | 2/2007 | Ramaswamy et al. |
| 2007/0032045 | A1 | 2/2007 | Kasahara et al. |
| 2007/0032054 | A1 | 2/2007 | Ramaswamy et al. |
| 2007/0032082 | A1 | 2/2007 | Ramaswamy et al. |
| 2007/0032095 | A1 | 2/2007 | Ramaswamy et al. |
| 2007/0034477 | A1 | 2/2007 | Inui |
| 2007/0037343 | A1 | 2/2007 | Colombo et al. |
| 2007/0037412 | A1 | 2/2007 | Dip et al. |
| 2007/0042117 | A1 | 2/2007 | Kupurao et al. |
| 2007/0042581 | A1 | 2/2007 | Sano et al. |
| 2007/0044716 | A1 | 3/2007 | Tetsuka et al. |
| 2007/0045244 | A1 | 3/2007 | Lee et al. |
| 2007/0047384 | A1 | 3/2007 | McLaughlin et al. |
| 2007/0048953 | A1 | 3/2007 | Gealy et al. |
| 2007/0049053 | A1 | 3/2007 | Mahajani |
| 2007/0051299 | A1 | 3/2007 | Ong et al. |
| 2007/0051312 | A1 | 3/2007 | Sneh |
| 2007/0051471 | A1 | 3/2007 | Kawaguchi et al. |
| 2007/0054049 | A1 | 3/2007 | Lindfors et al. |
| 2007/0054499 | A1 | 3/2007 | Jang |
| 2007/0056843 | A1 | 3/2007 | Ye et al. |
| 2007/0056850 | A1 | 3/2007 | Ye et al. |
| 2007/0059948 | A1 | 3/2007 | Metzner et al. |
| 2007/0062439 | A1 | 3/2007 | Wada et al. |
| 2007/0062453 | A1 | 3/2007 | Ishikawa |
| 2007/0062646 | A1 | 3/2007 | Ogawa et al. |
| 2007/0065578 | A1 | 3/2007 | McDougall |
| 2007/0065597 | A1 | 3/2007 | Kaido et al. |
| 2007/0066010 | A1 | 3/2007 | Ando |
| 2007/0066038 | A1 | 3/2007 | Sadjadi et al. |
| 2007/0066079 | A1 | 3/2007 | Kolster et al. |
| 2007/0066084 | A1 | 3/2007 | Wajda et al. |
| 2007/0074665 | A1 | 4/2007 | Chacin et al. |
| 2007/0077355 | A1 | 4/2007 | Chacin et al. |
| 2007/0082132 | A1 | 4/2007 | Shinriki |
| 2007/0082500 | A1 | 4/2007 | Norman et al. |
| 2007/0082508 | A1 | 4/2007 | Chiang et al. |
| 2007/0084405 | A1 | 4/2007 | Kim |
| 2007/0087296 | A1 | 4/2007 | Kim et al. |
| 2007/0087515 | A1 | 4/2007 | Yieh et al. |
| 2007/0087579 | A1 | 4/2007 | Kitayama et al. |
| 2007/0089670 | A1 | 4/2007 | Ikedo |
| 2007/0092696 | A1 | 4/2007 | Tsukatani et al. |
| 2007/0095283 | A1 | 5/2007 | Galewski |
| 2007/0095286 | A1 | 5/2007 | Baek et al. |
| 2007/0096194 | A1 | 5/2007 | Streck et al. |
| 2007/0098527 | A1 | 5/2007 | Hall et al. |
| 2007/0107845 | A1 | 5/2007 | Ishizawa et al. |
| 2007/0111030 | A1 | 5/2007 | Nakano et al. |
| 2007/0111470 | A1 | 5/2007 | Smythe |
| 2007/0111545 | A1 | 5/2007 | Lee et al. |
| 2007/0113788 | A1 | 5/2007 | Nozawa et al. |
| 2007/0116872 | A1 | 5/2007 | Li et al. |
| 2007/0116873 | A1 | 5/2007 | Li et al. |
| 2007/0116887 | A1 | 5/2007 | Faguet |
| 2007/0116888 | A1 | 5/2007 | Faguet |
| 2007/0119370 | A1 | 5/2007 | Ma et al. |
| 2007/0120275 | A1 | 5/2007 | Liu |
| 2007/0123037 | A1 | 5/2007 | Lee et al. |
| 2007/0123060 | A1 | 5/2007 | Rahtu |

(56) References Cited

U.S. PATENT DOCUMENTS

| | | | |
|---|---|---|---|
| 2007/0123189 | A1 | 5/2007 | Saito et al. |
| 2007/0125762 | A1 | 6/2007 | Cui et al. |
| 2007/0128538 | A1 | 6/2007 | Fairbairn et al. |
| 2007/0128570 | A1 | 6/2007 | Goto et al. |
| 2007/0128858 | A1 | 6/2007 | Haukka et al. |
| 2007/0128876 | A1 | 6/2007 | Fukiage |
| 2007/0128888 | A1 | 6/2007 | Goto et al. |
| 2007/0129621 | A1 | 6/2007 | Kellogg et al. |
| 2007/0131168 | A1 | 6/2007 | Gomi et al. |
| 2007/0134821 | A1 | 6/2007 | Thakur et al. |
| 2007/0134919 | A1 | 6/2007 | Gunji et al. |
| 2007/0134942 | A1 | 6/2007 | Ahn et al. |
| 2007/0137794 | A1 | 6/2007 | Qiu et al. |
| 2007/0144442 | A1 | 6/2007 | Migita |
| 2007/0146621 | A1 | 6/2007 | Yeom |
| 2007/0148347 | A1 | 6/2007 | Hatanpaa et al. |
| 2007/0148350 | A1 | 6/2007 | Rahtu |
| 2007/0148990 | A1 | 6/2007 | Deboer et al. |
| 2007/0153625 | A1 | 6/2007 | Lundgren et al. |
| 2007/0155138 | A1 | 7/2007 | Tomasini et al. |
| 2007/0157466 | A1 | 7/2007 | Kida et al. |
| 2007/0157683 | A1 | 7/2007 | Li |
| 2007/0158026 | A1 | 7/2007 | Amikura |
| 2007/0163440 | A1 | 7/2007 | Kim et al. |
| 2007/0163490 | A1 | 7/2007 | Habel et al. |
| 2007/0163625 | A1 | 7/2007 | Lee |
| 2007/0163996 | A1 | 7/2007 | Horiguchi |
| 2007/0166457 | A1 | 7/2007 | Yamoto et al. |
| 2007/0166459 | A1 | 7/2007 | Chang et al. |
| 2007/0166966 | A1 | 7/2007 | Todd et al. |
| 2007/0166999 | A1 | 7/2007 | Vaarstra |
| 2007/0170372 | A1 | 7/2007 | Horsky |
| 2007/0173071 | A1 | 7/2007 | Afzali-Ardakani et al. |
| 2007/0175393 | A1 | 8/2007 | Nishimura et al. |
| 2007/0175397 | A1 | 8/2007 | Tomiyasu et al. |
| 2007/0178235 | A1 | 8/2007 | Yamada et al. |
| 2007/0181066 | A1 | 8/2007 | Cadwell et al. |
| 2007/0184179 | A1 | 8/2007 | Waghray et al. |
| 2007/0186849 | A1 | 8/2007 | Furuya |
| 2007/0186952 | A1 | 8/2007 | Honda et al. |
| 2007/0187362 | A1 | 8/2007 | Nakagawa et al. |
| 2007/0187363 | A1 | 8/2007 | Oka et al. |
| 2007/0190266 | A1 | 8/2007 | Fu et al. |
| 2007/0190362 | A1 | 8/2007 | Weidman |
| 2007/0190744 | A1 | 8/2007 | Hiraiwa et al. |
| 2007/0190782 | A1 | 8/2007 | Park |
| 2007/0199510 | A1 | 8/2007 | Weiner et al. |
| 2007/0202678 | A1 | 8/2007 | Plombon et al. |
| 2007/0205788 | A1 | 9/2007 | Natsuhara et al. |
| 2007/0207275 | A1 | 9/2007 | Nowak et al. |
| 2007/0209588 | A1 | 9/2007 | Li et al. |
| 2007/0209590 | A1 | 9/2007 | Li |
| 2007/0210890 | A1 | 9/2007 | Hsu et al. |
| 2007/0212484 | A1 | 9/2007 | Li |
| 2007/0212811 | A1 | 9/2007 | Hanawa et al. |
| 2007/0212827 | A1 | 9/2007 | Girotra et al. |
| 2007/0215048 | A1 | 9/2007 | Suzuki et al. |
| 2007/0215278 | A1 | 9/2007 | Furuse et al. |
| 2007/0215580 | A1 | 9/2007 | Koshiishi et al. |
| 2007/0218200 | A1 | 9/2007 | Suzuki et al. |
| 2007/0218705 | A1 | 9/2007 | Matsuki et al. |
| 2007/0222131 | A1 | 9/2007 | Fukumoto et al. |
| 2007/0224777 | A1 | 9/2007 | Hamelin |
| 2007/0224833 | A1 | 9/2007 | Morisada et al. |
| 2007/0227665 | A1 | 10/2007 | Matsumoto et al. |
| 2007/0231488 | A1 | 10/2007 | Von Kaenel |
| 2007/0232031 | A1 | 10/2007 | Singh et al. |
| 2007/0232071 | A1 | 10/2007 | Balseanu et al. |
| 2007/0232501 | A1 | 10/2007 | Tonomura |
| 2007/0234955 | A1 | 10/2007 | Suzuki et al. |
| 2007/0237697 | A1 | 10/2007 | Clark |
| 2007/0237698 | A1 | 10/2007 | Clark |
| 2007/0237699 | A1 | 10/2007 | Clark |
| 2007/0238305 | A1 | 10/2007 | Delgadino et al. |
| 2007/0241688 | A1 | 10/2007 | DeVancentis et al. |
| 2007/0243317 | A1 | 10/2007 | Du Bois et al. |
| 2007/0247075 | A1 | 10/2007 | Kim et al. |
| 2007/0248767 | A1 | 10/2007 | Okura |
| 2007/0248832 | A1 | 10/2007 | Maeda et al. |
| 2007/0249131 | A1 | 10/2007 | Allen et al. |
| 2007/0251444 | A1 | 11/2007 | Gros-Jean et al. |
| 2007/0251456 | A1 | 11/2007 | Herchen et al. |
| 2007/0252233 | A1 | 11/2007 | Yamazaki et al. |
| 2007/0252244 | A1 | 11/2007 | Srividya et al. |
| 2007/0252532 | A1 | 11/2007 | DeVancentis et al. |
| 2007/0254414 | A1 | 11/2007 | Miyanami |
| 2007/0258506 | A1 | 11/2007 | Schwagerman et al. |
| 2007/0258855 | A1 | 11/2007 | Turcot et al. |
| 2007/0259778 | A1 | 11/2007 | Spencer et al. |
| 2007/0261868 | A1 | 11/2007 | Gross |
| 2007/0264427 | A1 | 11/2007 | Shinriki et al. |
| 2007/0264793 | A1 | 11/2007 | Oh et al. |
| 2007/0264807 | A1 | 11/2007 | Leone et al. |
| 2007/0266932 | A1 | 11/2007 | Hiramatsu |
| 2007/0266945 | A1 | 11/2007 | Shuto et al. |
| 2007/0269983 | A1 | 11/2007 | Sneh |
| 2007/0275166 | A1 | 11/2007 | Thridandam et al. |
| 2007/0277735 | A1 | 12/2007 | Mokhesi et al. |
| 2007/0281082 | A1 | 12/2007 | Mokhesi et al. |
| 2007/0281105 | A1 | 12/2007 | Mokhesi et al. |
| 2007/0281106 | A1 | 12/2007 | Lubomirsky et al. |
| 2007/0281496 | A1 | 12/2007 | Ingle et al. |
| 2007/0286957 | A1 | 12/2007 | Suzuki et al. |
| 2007/0289534 | A1 | 12/2007 | Lubomirsky et al. |
| 2007/0292974 | A1 | 12/2007 | Mizuno et al. |
| 2007/0295602 | A1 | 12/2007 | Tiller et al. |
| 2007/0298362 | A1 | 12/2007 | Rocha-Alvarez et al. |
| 2007/0298565 | A1 | 12/2007 | Nieh et al. |
| 2008/0003425 | A1 | 1/2008 | Spencer et al. |
| 2008/0003824 | A1 | 1/2008 | Padhi et al. |
| 2008/0003838 | A1 | 1/2008 | Haukka et al. |
| 2008/0006208 | A1 | 1/2008 | Ueno et al. |
| 2008/0018004 | A1 | 1/2008 | Steidl |
| 2008/0020591 | A1 | 1/2008 | Balseanu et al. |
| 2008/0020593 | A1 | 1/2008 | Wang et al. |
| 2008/0023436 | A1 | 1/2008 | Gros-Jean et al. |
| 2008/0026162 | A1 | 1/2008 | Dickey et al. |
| 2008/0026574 | A1 | 1/2008 | Brcka |
| 2008/0026597 | A1 | 1/2008 | Munro et al. |
| 2008/0029790 | A1 | 2/2008 | Ahn et al. |
| 2008/0031708 | A1 | 2/2008 | Bonora et al. |
| 2008/0032514 | A1 | 2/2008 | Sano et al. |
| 2008/0035055 | A1 | 2/2008 | Dip et al. |
| 2008/0035306 | A1 | 2/2008 | White et al. |
| 2008/0035607 | A1 | 2/2008 | O'Hara et al. |
| 2008/0036354 | A1 | 2/2008 | Letz et al. |
| 2008/0038485 | A1 | 2/2008 | Fukazawa et al. |
| 2008/0038934 | A1 | 2/2008 | Vrtis et al. |
| 2008/0042165 | A1 | 2/2008 | Sugizaki |
| 2008/0042192 | A1 | 2/2008 | Park et al. |
| 2008/0043803 | A1 | 2/2008 | Bandoh |
| 2008/0044932 | A1 | 2/2008 | Samoilov et al. |
| 2008/0044938 | A1 | 2/2008 | England et al. |
| 2008/0050536 | A1 | 2/2008 | Aing et al. |
| 2008/0050538 | A1 | 2/2008 | Hirata |
| 2008/0054332 | A1 | 3/2008 | Kim et al. |
| 2008/0054813 | A1 | 3/2008 | Espiau et al. |
| 2008/0056860 | A1 | 3/2008 | Natume |
| 2008/0057659 | A1 | 3/2008 | Forbes et al. |
| 2008/0061667 | A1 | 3/2008 | Gaertner et al. |
| 2008/0063798 | A1 | 3/2008 | Kher et al. |
| 2008/0066778 | A1 | 3/2008 | Matsushita et al. |
| 2008/0067146 | A1 | 3/2008 | Onishi et al. |
| 2008/0069951 | A1 | 3/2008 | Chacin et al. |
| 2008/0069955 | A1 | 3/2008 | Hong et al. |
| 2008/0072821 | A1 | 3/2008 | Dalton et al. |
| 2008/0075562 | A1 | 3/2008 | Maria et al. |
| 2008/0075838 | A1 | 3/2008 | Inoue et al. |
| 2008/0075881 | A1 | 3/2008 | Won et al. |
| 2008/0076070 | A1 | 3/2008 | Koh et al. |
| 2008/0076266 | A1 | 3/2008 | Fukazawa et al. |
| 2008/0076281 | A1 | 3/2008 | Ciancanelli et al. |
| 2008/0081104 | A1 | 4/2008 | Hasebe et al. |
| 2008/0081113 | A1 | 4/2008 | Clark |

(56) References Cited

U.S. PATENT DOCUMENTS

| | | | |
|---|---|---|---|
| 2008/0081121 | A1 | 4/2008 | Morita et al. |
| 2008/0083710 | A1 | 4/2008 | Chen et al. |
| 2008/0083948 | A1 | 4/2008 | Lin et al. |
| 2008/0085226 | A1 | 4/2008 | Fondurulia et al. |
| 2008/0085610 | A1 | 4/2008 | Wang et al. |
| 2008/0087218 | A1 | 4/2008 | Shimada et al. |
| 2008/0087642 | A1 | 4/2008 | Sawin et al. |
| 2008/0087890 | A1 | 4/2008 | Ahn et al. |
| 2008/0092815 | A1 | 4/2008 | Chen et al. |
| 2008/0092821 | A1 | 4/2008 | Otsuka et al. |
| 2008/0099147 | A1 | 5/2008 | Myo et al. |
| 2008/0102203 | A1 | 5/2008 | Wu |
| 2008/0102205 | A1 | 5/2008 | Barry et al. |
| 2008/0102208 | A1 | 5/2008 | Wu et al. |
| 2008/0102603 | A1 | 5/2008 | Kobayashi et al. |
| 2008/0102630 | A1 | 5/2008 | Saito |
| 2008/0105276 | A1 | 5/2008 | Yeh et al. |
| 2008/0110401 | A1 | 5/2008 | Fujikawa et al. |
| 2008/0110568 | A1 | 5/2008 | Son et al. |
| 2008/0113094 | A1 | 5/2008 | Casper |
| 2008/0113096 | A1 | 5/2008 | Mahajani |
| 2008/0113097 | A1 | 5/2008 | Mahajani et al. |
| 2008/0118334 | A1 | 5/2008 | Bonora |
| 2008/0121177 | A1 | 5/2008 | Bang et al. |
| 2008/0121626 | A1 | 5/2008 | Thomas et al. |
| 2008/0121962 | A1 | 5/2008 | Forbes et al. |
| 2008/0124197 | A1 | 5/2008 | van der Meulen et al. |
| 2008/0124908 | A1 | 5/2008 | Forbes et al. |
| 2008/0124945 | A1 | 5/2008 | Miya et al. |
| 2008/0124946 | A1 | 5/2008 | Xiao et al. |
| 2008/0128726 | A1 | 6/2008 | Sakata et al. |
| 2008/0129209 | A1 | 6/2008 | Deakins et al. |
| 2008/0132046 | A1 | 6/2008 | Walther |
| 2008/0133154 | A1 | 6/2008 | Krauss et al. |
| 2008/0134887 | A1 | 6/2008 | Sherer |
| 2008/0135516 | A1 | 6/2008 | Yokogawa et al. |
| 2008/0135936 | A1 | 6/2008 | Nakajima |
| 2008/0142046 | A1 | 6/2008 | Johnson et al. |
| 2008/0142483 | A1 | 6/2008 | Hua |
| 2008/0146033 | A1 | 6/2008 | Park |
| 2008/0149031 | A1 | 6/2008 | Chu et al. |
| 2008/0149593 | A1 | 6/2008 | Bai et al. |
| 2008/0152463 | A1 | 6/2008 | Chidambaram et al. |
| 2008/0153308 | A1 | 6/2008 | Ogawa et al. |
| 2008/0153311 | A1 | 6/2008 | Padhi et al. |
| 2008/0156769 | A1 | 7/2008 | Weiner et al. |
| 2008/0157157 | A1 | 7/2008 | Tonomura |
| 2008/0157212 | A1 | 7/2008 | Lavoie et al. |
| 2008/0157365 | A1 | 7/2008 | Ott et al. |
| 2008/0173237 | A1 | 7/2008 | Collins |
| 2008/0173238 | A1 | 7/2008 | Nakashima et al. |
| 2008/0173240 | A1 | 7/2008 | Furukawahara |
| 2008/0173326 | A1 | 7/2008 | Gu et al. |
| 2008/0176335 | A1 | 7/2008 | Alberti et al. |
| 2008/0176375 | A1 | 7/2008 | Erben et al. |
| 2008/0176412 | A1 | 7/2008 | Komeda |
| 2008/0178608 | A1 | 7/2008 | Tandou et al. |
| 2008/0178805 | A1 | 7/2008 | Paterson et al. |
| 2008/0179104 | A1 | 7/2008 | Zhang |
| 2008/0179291 | A1 | 7/2008 | Collins et al. |
| 2008/0179715 | A1 | 7/2008 | Coppa |
| 2008/0182075 | A1 | 7/2008 | Chopra |
| 2008/0182390 | A1 | 7/2008 | Lemmi et al. |
| 2008/0182411 | A1 | 7/2008 | Elers |
| 2008/0191193 | A1 | 8/2008 | Li et al. |
| 2008/0193643 | A1 | 8/2008 | Dip |
| 2008/0194088 | A1 | 8/2008 | Srinivasan et al. |
| 2008/0194105 | A1 | 8/2008 | Dominguez et al. |
| 2008/0194113 | A1 | 8/2008 | Kim et al. |
| 2008/0194169 | A1 | 8/2008 | Sterling et al. |
| 2008/0199977 | A1 | 8/2008 | Weigel et al. |
| 2008/0202416 | A1 | 8/2008 | Provencher |
| 2008/0202689 | A1 | 8/2008 | Kim |
| 2008/0203487 | A1 | 8/2008 | Hohage et al. |
| 2008/0205483 | A1 | 8/2008 | Rempe et al. |
| 2008/0210162 | A1 | 9/2008 | Yonebayashi |
| 2008/0210278 | A1 | 9/2008 | Orii et al. |
| 2008/0211423 | A1 | 9/2008 | Shinmen et al. |
| 2008/0211526 | A1 | 9/2008 | Shinma |
| 2008/0213696 | A1 | 9/2008 | Meeus et al. |
| 2008/0214003 | A1 | 9/2008 | Xia et al. |
| 2008/0216077 | A1 | 9/2008 | Emani et al. |
| 2008/0216742 | A1 | 9/2008 | Takebayashi |
| 2008/0216958 | A1 | 9/2008 | Goto et al. |
| 2008/0220619 | A1 | 9/2008 | Matsushita et al. |
| 2008/0223130 | A1 | 9/2008 | Snell et al. |
| 2008/0223725 | A1 | 9/2008 | Han et al. |
| 2008/0224240 | A1 | 9/2008 | Ahn et al. |
| 2008/0228306 | A1 | 9/2008 | Yetter et al. |
| 2008/0229811 | A1 | 9/2008 | Zhao et al. |
| 2008/0230352 | A1 | 9/2008 | Hirata |
| 2008/0230371 | A1 | 9/2008 | McHugh |
| 2008/0233288 | A1 | 9/2008 | Clark |
| 2008/0237572 | A1 | 10/2008 | Chui et al. |
| 2008/0237604 | A1 | 10/2008 | Alshareef et al. |
| 2008/0241052 | A1 | 10/2008 | Hooper et al. |
| 2008/0241384 | A1 | 10/2008 | Jeong |
| 2008/0241387 | A1 | 10/2008 | Keto |
| 2008/0242116 | A1 | 10/2008 | Clark |
| 2008/0246101 | A1 | 10/2008 | Li et al. |
| 2008/0248310 | A1 | 10/2008 | Kim et al. |
| 2008/0248597 | A1 | 10/2008 | Qin et al. |
| 2008/0257102 | A1 | 10/2008 | Packer |
| 2008/0257494 | A1 | 10/2008 | Hayashi et al. |
| 2008/0260345 | A1 | 10/2008 | Mertesdorf et al. |
| 2008/0260963 | A1 | 10/2008 | Yoon et al. |
| 2008/0261405 | A1 | 10/2008 | Yang et al. |
| 2008/0261413 | A1 | 10/2008 | Mahajani |
| 2008/0264337 | A1 | 10/2008 | Sano et al. |
| 2008/0264443 | A1 | 10/2008 | Shrinivasan et al. |
| 2008/0267598 | A1 | 10/2008 | Nakamura |
| 2008/0268171 | A1 | 10/2008 | Ma et al. |
| 2008/0268635 | A1 | 10/2008 | Yu et al. |
| 2008/0272424 | A1 | 11/2008 | Kim et al. |
| 2008/0274369 | A1 | 11/2008 | Lee et al. |
| 2008/0276864 | A1 | 11/2008 | Koelmel et al. |
| 2008/0277647 | A1 | 11/2008 | Kouvetakis et al. |
| 2008/0277656 | A1 | 11/2008 | Park et al. |
| 2008/0277715 | A1 | 11/2008 | Ohmi et al. |
| 2008/0282970 | A1 | 11/2008 | Heys et al. |
| 2008/0283962 | A1 | 11/2008 | Dyer |
| 2008/0286463 | A1 | 11/2008 | Tiner et al. |
| 2008/0289574 | A1 | 11/2008 | Jacobs et al. |
| 2008/0289650 | A1 | 11/2008 | Arena |
| 2008/0289767 | A1 | 11/2008 | Tandou et al. |
| 2008/0291964 | A1 | 11/2008 | Shrimpling |
| 2008/0293198 | A1 | 11/2008 | Kojima et al. |
| 2008/0295872 | A1 | 12/2008 | Riker et al. |
| 2008/0298945 | A1 | 12/2008 | Cox |
| 2008/0299326 | A1 | 12/2008 | Fukazawa |
| 2008/0299758 | A1 | 12/2008 | Harada et al. |
| 2008/0302303 | A1 | 12/2008 | Choi et al. |
| 2008/0303744 | A1 | 12/2008 | Hirayama et al. |
| 2008/0305014 | A1 | 12/2008 | Honda |
| 2008/0305246 | A1 | 12/2008 | Choi et al. |
| 2008/0305443 | A1 | 12/2008 | Nakamura |
| 2008/0314319 | A1 | 12/2008 | Hamano et al. |
| 2008/0314892 | A1 | 12/2008 | Graham |
| 2008/0315292 | A1 | 12/2008 | Ji et al. |
| 2008/0317972 | A1 | 12/2008 | Hendriks |
| 2009/0000550 | A1 | 1/2009 | Tran et al. |
| 2009/0000551 | A1 | 1/2009 | Choi et al. |
| 2009/0000769 | A1 | 1/2009 | Lin et al. |
| 2009/0004875 | A1 | 1/2009 | Shen et al. |
| 2009/0011145 | A1 | 1/2009 | Yun |
| 2009/0011150 | A1 | 1/2009 | Jeon et al. |
| 2009/0011608 | A1 | 1/2009 | Nabatame |
| 2009/0014879 | A1 | 1/2009 | Park et al. |
| 2009/0017227 | A1 | 1/2009 | Fu et al. |
| 2009/0017631 | A1 | 1/2009 | Bencher |
| 2009/0017733 | A1 | 1/2009 | Takahashi et al. |
| 2009/0020072 | A1 | 1/2009 | Mizunaga et al. |
| 2009/0023229 | A1 | 1/2009 | Matsushita |
| 2009/0029503 | A1 | 1/2009 | Arai |

(56) References Cited

U.S. PATENT DOCUMENTS

2009/0029528 A1* 1/2009 Sanchez ............ H01L 21/02255
257/E21.191
2009/0029564 A1 1/2009 Yamashita et al.
2009/0031954 A1 2/2009 Nishikido et al.
2009/0033907 A1 2/2009 Watson
2009/0035463 A1 2/2009 Dip
2009/0035584 A1 2/2009 Tran et al.
2009/0035927 A1 2/2009 Olsen et al.
2009/0035946 A1 2/2009 Pierreux et al.
2009/0035947 A1 2/2009 Horii
2009/0036292 A1 2/2009 Sun et al.
2009/0039475 A1 2/2009 Shioya
2009/0041952 A1 2/2009 Yoon et al.
2009/0041984 A1 2/2009 Mayers et al.
2009/0042344 A1 2/2009 Ye et al.
2009/0042408 A1 2/2009 Maeda
2009/0045749 A1 2/2009 Ganachev et al.
2009/0045829 A1 2/2009 Awazu
2009/0047426 A1 2/2009 Park et al.
2009/0047433 A1 2/2009 Kim et al.
2009/0047447 A1 2/2009 Sawin et al.
2009/0050621 A1 2/2009 Awazu
2009/0052498 A1 2/2009 Halpin et al.
2009/0053023 A1 2/2009 Wakabayashi
2009/0053900 A1 2/2009 Nozawa et al.
2009/0053906 A1 2/2009 Miya et al.
2009/0056112 A1 3/2009 Kobayashi
2009/0056629 A1 3/2009 Katz et al.
2009/0057269 A1 3/2009 Katz et al.
2009/0060480 A1 3/2009 Herchen
2009/0061083 A1 3/2009 Chiang et al.
2009/0061644 A1 3/2009 Chiang et al.
2009/0061647 A1 3/2009 Mallick et al.
2009/0075490 A1 3/2009 Dussarrat
2009/0075491 A1 3/2009 Liu et al.
2009/0080136 A1 3/2009 Nagayama et al.
2009/0081879 A1 3/2009 Sukekawa et al.
2009/0084317 A1 4/2009 Wu
2009/0085156 A1 4/2009 Dewey et al.
2009/0087585 A1 4/2009 Lee et al.
2009/0087964 A1 4/2009 Maeda et al.
2009/0087967 A1 4/2009 Todd
2009/0090382 A1 4/2009 Morisada
2009/0093080 A1 4/2009 Choi et al.
2009/0093094 A1 4/2009 Ye et al.
2009/0093100 A1 4/2009 Xia et al.
2009/0095221 A1 4/2009 Tam et al.
2009/0104351 A1 4/2009 Kakegawa
2009/0104594 A1 4/2009 Webb
2009/0104789 A1 4/2009 Mallick et al.
2009/0107404 A1 4/2009 Ogliari et al.
2009/0108308 A1 4/2009 Yang et al.
2009/0112458 A1 4/2009 Nakai
2009/0115064 A1 5/2009 Sandhu et al.
2009/0116936 A1 5/2009 Marubayashi et al.
2009/0117717 A1 5/2009 Tomasini et al.
2009/0117723 A1 5/2009 Kim et al.
2009/0117746 A1 5/2009 Masuda
2009/0120580 A1 5/2009 Kagoshima et al.
2009/0122293 A1 5/2009 Shibazaki
2009/0122458 A1 5/2009 Lischer et al.
2009/0124131 A1 5/2009 Breunsbach et al.
2009/0130331 A1 5/2009 Asai
2009/0130859 A1 5/2009 Itatani et al.
2009/0136665 A1 5/2009 Choi et al.
2009/0136668 A1 5/2009 Gregg et al.
2009/0136683 A1 5/2009 Fukasawa et al.
2009/0137055 A1 5/2009 Bognar
2009/0139657 A1 6/2009 Lee et al.
2009/0142905 A1 6/2009 Yamazaki
2009/0142933 A1 6/2009 Yajima et al.
2009/0142935 A1 6/2009 Fukazawa et al.
2009/0146322 A1 6/2009 Weling et al.
2009/0147819 A1 6/2009 Goodman et al.
2009/0155488 A1 6/2009 Nakano et al.
2009/0156015 A1 6/2009 Park et al.
2009/0156017 A1 6/2009 Fukazawa et al.
2009/0159000 A1 6/2009 Aggarwal et al.
2009/0159002 A1 6/2009 Bera et al.
2009/0159424 A1 6/2009 Liu et al.
2009/0162647 A1 6/2009 Sun et al.
2009/0162996 A1 6/2009 Ramaswarmy et al.
2009/0163038 A1 6/2009 Miyoshi
2009/0165715 A1 7/2009 Oh
2009/0165721 A1 7/2009 Pitney et al.
2009/0165722 A1 7/2009 Ha
2009/0166616 A1 7/2009 Uchiyama
2009/0176018 A1 7/2009 Zou et al.
2009/0179365 A1 7/2009 Lerner et al.
2009/0183520 A1 7/2009 Yukimoto
2009/0186479 A1 7/2009 Okabe et al.
2009/0186571 A1 7/2009 Haro
2009/0194233 A1 8/2009 Tamura et al.
2009/0197015 A1 8/2009 Kudela et al.
2009/0197411 A1 8/2009 Dussarrat et al.
2009/0200494 A1 8/2009 Hatem
2009/0200547 A1 8/2009 Griffin et al.
2009/0204403 A1 8/2009 Hollander et al.
2009/0206056 A1 8/2009 Xu
2009/0209081 A1 8/2009 Matero
2009/0211523 A1 8/2009 Kuppurao et al.
2009/0211525 A1 8/2009 Sarigiannis et al.
2009/0214825 A1 8/2009 Sun et al.
2009/0217871 A1 9/2009 Kim et al.
2009/0221149 A1 9/2009 Hammond et al.
2009/0221151 A1 9/2009 Honda et al.
2009/0223441 A1 9/2009 Arena et al.
2009/0227094 A1 9/2009 Bateman
2009/0230211 A1 9/2009 Kobayashi et al.
2009/0232985 A1 9/2009 Dussarrat et al.
2009/0236014 A1 9/2009 Wilson
2009/0236276 A1 9/2009 Kurth et al.
2009/0236315 A1 9/2009 Willwerth et al.
2009/0239386 A1 9/2009 Suzaki et al.
2009/0242130 A1 10/2009 Tian et al.
2009/0242957 A1 10/2009 Ma et al.
2009/0246374 A1 10/2009 Vukovic
2009/0246399 A1 10/2009 Goundar
2009/0246971 A1 10/2009 Reid et al.
2009/0250004 A1 10/2009 Yamada et al.
2009/0250955 A1 10/2009 Aoki
2009/0255901 A1 10/2009 Okita
2009/0256127 A1 10/2009 Feist et al.
2009/0261331 A1 10/2009 Yang et al.
2009/0266296 A1 10/2009 Tachibana et al.
2009/0267135 A1 10/2009 Tanaka et al.
2009/0267225 A1 10/2009 Eguchi
2009/0269506 A1 10/2009 Okura et al.
2009/0269507 A1 10/2009 Yu et al.
2009/0269941 A1 10/2009 Raisanen
2009/0275205 A1 11/2009 Kiehlbauch et al.
2009/0275210 A1 11/2009 Shanker et al.
2009/0277510 A1 11/2009 Shikata
2009/0277874 A1 11/2009 Rui et al.
2009/0280248 A1 11/2009 Goodman et al.
2009/0283041 A1 11/2009 Tomiyasu et al.
2009/0283217 A1 11/2009 Lubomirsky et al.
2009/0284156 A1 11/2009 Banna et al.
2009/0286400 A1 11/2009 Heo et al.
2009/0286402 A1 11/2009 Xia et al.
2009/0286405 A1 11/2009 Okesaku et al.
2009/0289300 A1 11/2009 Sasaki et al.
2009/0291208 A1 11/2009 Gordon et al.
2009/0291566 A1 11/2009 Ueno et al.
2009/0297696 A1 12/2009 Pore et al.
2009/0297710 A1 12/2009 Lindfors
2009/0297731 A1 12/2009 Goundar
2009/0298257 A1 12/2009 Lee et al.
2009/0302002 A1 12/2009 Collins et al.
2009/0302434 A1 12/2009 Pallem et al.
2009/0304558 A1 12/2009 Patton
2009/0308315 A1 12/2009 de Ridder
2009/0308425 A1 12/2009 Yednak
2009/0311857 A1 12/2009 Todd et al.

(56) References Cited

U.S. PATENT DOCUMENTS

| | | | |
|---|---|---|---|
| 2009/0314208 | A1 | 12/2009 | Zhou et al. |
| 2009/0314309 | A1 | 12/2009 | Sankarakrishnan et al. |
| 2009/0315093 | A1 | 12/2009 | Li et al. |
| 2009/0317214 | A1 | 12/2009 | Hsiao et al. |
| 2009/0320754 | A1 | 12/2009 | Oya |
| 2009/0320881 | A1 | 12/2009 | Aitchison |
| 2009/0324971 | A1 | 12/2009 | De Vries et al. |
| 2009/0324989 | A1 | 12/2009 | Witz et al. |
| 2009/0325391 | A1 | 12/2009 | De Vusser et al. |
| 2009/0325469 | A1 | 12/2009 | Koo et al. |
| 2010/0000608 | A1 | 1/2010 | Goto et al. |
| 2010/0001409 | A1 | 1/2010 | Humbert et al. |
| 2010/0003406 | A1 | 1/2010 | Lam et al. |
| 2010/0006031 | A1 | 1/2010 | Choi et al. |
| 2010/0006923 | A1 | 1/2010 | Fujitsuka |
| 2010/0008656 | A1 | 1/2010 | Sorabji et al. |
| 2010/0012036 | A1 | 1/2010 | Silva et al. |
| 2010/0012153 | A1 | 1/2010 | Shigemoto et al. |
| 2010/0014479 | A1 | 1/2010 | Kim |
| 2010/0015813 | A1 | 1/2010 | McGinnis et al. |
| 2010/0018460 | A1 | 1/2010 | Singh et al. |
| 2010/0018913 | A1 | 1/2010 | Blum |
| 2010/0022097 | A1 | 1/2010 | Yamoto et al. |
| 2010/0024727 | A1 | 2/2010 | Kim et al. |
| 2010/0024872 | A1 | 2/2010 | Kishimoto |
| 2010/0025766 | A1 | 2/2010 | Nuttinck et al. |
| 2010/0025796 | A1 | 2/2010 | Dabiran |
| 2010/0031884 | A1 | 2/2010 | Aggarwal et al. |
| 2010/0032587 | A1 | 2/2010 | Hosch et al. |
| 2010/0032842 | A1 | 2/2010 | Herdt et al. |
| 2010/0034719 | A1 | 2/2010 | Dussarrat et al. |
| 2010/0038687 | A1 | 2/2010 | Klaus et al. |
| 2010/0040441 | A1 | 2/2010 | Obikane |
| 2010/0041179 | A1 | 2/2010 | Lee |
| 2010/0041212 | A1* | 2/2010 | Jinzu ................ H01L 21/67757 118/725 |
| 2010/0041243 | A1 | 2/2010 | Cheng et al. |
| 2010/0046321 | A1 | 2/2010 | McLaughlin et al. |
| 2010/0050943 | A1 | 3/2010 | Kato et al. |
| 2010/0051584 | A1 | 3/2010 | Okita et al. |
| 2010/0051597 | A1 | 3/2010 | Morita et al. |
| 2010/0055312 | A1 | 3/2010 | Kato et al. |
| 2010/0055316 | A1 | 3/2010 | Honma |
| 2010/0055318 | A1 | 3/2010 | Volf et al. |
| 2010/0055442 | A1 | 3/2010 | Kellock |
| 2010/0055898 | A1 | 3/2010 | Chang et al. |
| 2010/0058984 | A1 | 3/2010 | Marubayashi |
| 2010/0065758 | A1 | 3/2010 | Liu et al. |
| 2010/0068009 | A1 | 3/2010 | Kimura |
| 2010/0068383 | A1 | 3/2010 | Kato et al. |
| 2010/0068414 | A1 | 3/2010 | Takahashi et al. |
| 2010/0068891 | A1 | 3/2010 | Hatanaka et al. |
| 2010/0075037 | A1 | 3/2010 | Marsh et al. |
| 2010/0075488 | A1 | 3/2010 | Collins et al. |
| 2010/0075507 | A1 | 3/2010 | Chang et al. |
| 2010/0078601 | A1 | 4/2010 | Pallem et al. |
| 2010/0078746 | A1 | 4/2010 | Jung |
| 2010/0081094 | A1 | 4/2010 | Hasebe et al. |
| 2010/0081293 | A1 | 4/2010 | Mallick et al. |
| 2010/0086703 | A1 | 4/2010 | Mangum et al. |
| 2010/0087069 | A1 | 4/2010 | Miya et al. |
| 2010/0089320 | A1 | 4/2010 | Kim |
| 2010/0089870 | A1 | 4/2010 | Hiroshima et al. |
| 2010/0090149 | A1 | 4/2010 | Thompson et al. |
| 2010/0092679 | A1 | 4/2010 | Lee et al. |
| 2010/0092696 | A1 | 4/2010 | Shinriki |
| 2010/0093187 | A1 | 4/2010 | Lee et al. |
| 2010/0094430 | A1 | 4/2010 | Krumdieck |
| 2010/0098862 | A1 | 4/2010 | Xu et al. |
| 2010/0101728 | A1 | 4/2010 | Iwasaki |
| 2010/0102417 | A1 | 4/2010 | Ganguli et al. |
| 2010/0105936 | A1 | 4/2010 | Tada et al. |
| 2010/0111648 | A1 | 5/2010 | Tamura et al. |
| 2010/0112496 | A1 | 5/2010 | Nakajima et al. |
| 2010/0116207 | A1 | 5/2010 | Givens |
| 2010/0116208 | A1 | 5/2010 | Sangam |
| 2010/0116209 | A1 | 5/2010 | Kato |
| 2010/0119439 | A1 | 5/2010 | Shindou |
| 2010/0119727 | A1 | 5/2010 | Takagi |
| 2010/0119844 | A1 | 5/2010 | Sun et al. |
| 2010/0120261 | A1 | 5/2010 | Kim et al. |
| 2010/0121100 | A1 | 5/2010 | Shay |
| 2010/0124610 | A1 | 5/2010 | Aikawa et al. |
| 2010/0124618 | A1 | 5/2010 | Kobayashi et al. |
| 2010/0124621 | A1 | 5/2010 | Kobayashi et al. |
| 2010/0126415 | A1 | 5/2010 | Ishino et al. |
| 2010/0126539 | A1 | 5/2010 | Lee et al. |
| 2010/0126605 | A1 | 5/2010 | Stones |
| 2010/0126666 | A1 | 5/2010 | Tandou et al. |
| 2010/0129548 | A1 | 5/2010 | Sneh |
| 2010/0129670 | A1 | 5/2010 | Sun et al. |
| 2010/0129990 | A1 | 5/2010 | Nishizawa et al. |
| 2010/0130015 | A1 | 5/2010 | Nakajima et al. |
| 2010/0130017 | A1 | 5/2010 | Luo et al. |
| 2010/0130105 | A1 | 5/2010 | Lee |
| 2010/0133255 | A1 | 6/2010 | Bahng et al. |
| 2010/0134023 | A1 | 6/2010 | Mills |
| 2010/0136216 | A1 | 6/2010 | Tsuei et al. |
| 2010/0140221 | A1 | 6/2010 | Kikuchi et al. |
| 2010/0140684 | A1 | 6/2010 | Ozawa |
| 2010/0143609 | A1 | 6/2010 | Fukazawa et al. |
| 2010/0144150 | A1 | 6/2010 | Sills et al. |
| 2010/0144162 | A1 | 6/2010 | Lee et al. |
| 2010/0144968 | A1 | 6/2010 | Lee et al. |
| 2010/0145547 | A1 | 6/2010 | Darabnia et al. |
| 2010/0147396 | A1 | 6/2010 | Yamagishi et al. |
| 2010/0151206 | A1 | 6/2010 | Wu et al. |
| 2010/0159638 | A1 | 6/2010 | Jeong |
| 2010/0159707 | A1 | 6/2010 | Huang et al. |
| 2010/0162752 | A1 | 7/2010 | Tabata et al. |
| 2010/0162956 | A1 | 7/2010 | Murakami et al. |
| 2010/0163187 | A1 | 7/2010 | Yokogawa et al. |
| 2010/0163524 | A1 | 7/2010 | Arai |
| 2010/0163937 | A1 | 7/2010 | Clendenning |
| 2010/0166630 | A1 | 7/2010 | Gu et al. |
| 2010/0168404 | A1 | 7/2010 | Girolami et al. |
| 2010/0170441 | A1 | 7/2010 | Won et al. |
| 2010/0170868 | A1 | 7/2010 | Lin et al. |
| 2010/0173432 | A1 | 7/2010 | White et al. |
| 2010/0178137 | A1 | 7/2010 | Chintalapati et al. |
| 2010/0178423 | A1 | 7/2010 | Shimizu et al. |
| 2010/0180819 | A1 | 7/2010 | Hatanaka et al. |
| 2010/0183825 | A1 | 7/2010 | Becker et al. |
| 2010/0184302 | A1 | 7/2010 | Lee et al. |
| 2010/0186669 | A1 | 7/2010 | Shin et al. |
| 2010/0189923 | A1 | 7/2010 | Goundar et al. |
| 2010/0193501 | A1 | 8/2010 | Zucker et al. |
| 2010/0193955 | A1 | 8/2010 | Milligan et al. |
| 2010/0195392 | A1 | 8/2010 | Freeman |
| 2010/0195690 | A1 | 8/2010 | Moench et al. |
| 2010/0197107 | A1 | 8/2010 | Matsuzaki |
| 2010/0202860 | A1 | 8/2010 | Reed |
| 2010/0203242 | A1 | 8/2010 | Borden |
| 2010/0206767 | A1 | 8/2010 | Odashima et al. |
| 2010/0209598 | A1 | 8/2010 | Xu et al. |
| 2010/0210094 | A1* | 8/2010 | Furusawa ............... C23C 16/28 438/493 |
| 2010/0210108 | A1 | 8/2010 | Ishizaka et al. |
| 2010/0219757 | A1 | 9/2010 | Benzerrouk et al. |
| 2010/0221452 | A1 | 9/2010 | Kang |
| 2010/0224130 | A1 | 9/2010 | Smith et al. |
| 2010/0227458 | A1 | 9/2010 | Chung et al. |
| 2010/0229795 | A1* | 9/2010 | Tanabe ................... C30B 29/06 118/725 |
| 2010/0229965 | A1 | 9/2010 | Kashima et al. |
| 2010/0230051 | A1 | 9/2010 | Iizuka |
| 2010/0230863 | A1 | 9/2010 | Moench et al. |
| 2010/0233885 | A1 | 9/2010 | Kushibiki et al. |
| 2010/0233886 | A1 | 9/2010 | Yang et al. |
| 2010/0236691 | A1 | 9/2010 | Yamazaki |
| 2010/0243166 | A1 | 9/2010 | Hayashi et al. |
| 2010/0244688 | A1 | 9/2010 | Braun et al. |
| 2010/0248465 | A1 | 9/2010 | Yi et al. |
| 2010/0252434 | A1 | 10/2010 | Roy |

(56) References Cited

U.S. PATENT DOCUMENTS

2010/0255196 A1 10/2010 Geisler et al.
2010/0255198 A1 10/2010 Cleary et al.
2010/0255218 A1 10/2010 Oka et al.
2010/0255625 A1 10/2010 De Vries
2010/0255658 A1 10/2010 Aggarwal
2010/0258809 A1 10/2010 Muller
2010/0259152 A1 10/2010 Yasuda et al.
2010/0266765 A1 10/2010 White et al.
2010/0267224 A1 10/2010 Choi et al.
2010/0267248 A1 10/2010 Ma et al.
2010/0270675 A1 10/2010 Harada
2010/0246630 A1 11/2010 Kaszynski et al.
2010/0275846 A1 11/2010 Kitagawa
2010/0279008 A1 11/2010 Takagi
2010/0279512 A1 11/2010 Udea et al.
2010/0282163 A1 11/2010 Aggarwal et al.
2010/0282170 A1 11/2010 Nishizawa
2010/0282645 A1 11/2010 Wang
2010/0285237 A1 11/2010 Ditizio et al.
2010/0285319 A1 11/2010 Kwak et al.
2010/0294199 A1 11/2010 Tran et al.
2010/0297391 A1 11/2010 Kley
2010/0301752 A1 12/2010 Bakre et al.
2010/0304047 A1 12/2010 Yang et al.
2010/0307415 A1 12/2010 Shero et al.
2010/0317177 A1 12/2010 Huang et al.
2010/0317198 A1 12/2010 Antonelli
2010/0322604 A1 12/2010 Fondurulia et al.
2010/0322822 A1 12/2010 Fritchie et al.
2010/0326358 A1 12/2010 Choi
2011/0000619 A1 1/2011 Suh
2011/0003087 A1 1/2011 Soininen et al.
2011/0003450 A1 1/2011 Lee et al.
2011/0005684 A1 1/2011 Hayami et al.
2011/0006402 A1 1/2011 Zhou
2011/0006406 A1 1/2011 Urbanowicz et al.
2011/0008950 A1 1/2011 Xu
2011/0014359 A1 1/2011 Hashim
2011/0014795 A1 1/2011 Lee
2011/0017139 A1 1/2011 Chiang et al.
2011/0021033 A1 1/2011 Ikeuchi et al.
2011/0027725 A1 2/2011 Tsutsumi et al.
2011/0027999 A1 2/2011 Sparks et al.
2011/0031562 A1 2/2011 Lin et al.
2011/0034039 A1 2/2011 Liang et al.
2011/0039419 A1 2/2011 Date et al.
2011/0041764 A1 2/2011 Webb et al.
2011/0042200 A1 2/2011 Wilby
2011/0045610 A1 2/2011 van Schravendijk et al.
2011/0045676 A1 2/2011 Park et al.
2011/0046314 A1 2/2011 Klipp et al.
2011/0048642 A1 3/2011 Mihara et al.
2011/0048769 A1 3/2011 Fujiwara
2011/0049100 A1 3/2011 Han et al.
2011/0052833 A1 3/2011 Hanawa et al.
2011/0053383 A1 3/2011 Shero et al.
2011/0056513 A1 3/2011 Hombach et al.
2011/0056626 A1 3/2011 Brown et al.
2011/0057248 A1 3/2011 Ma et al.
2011/0061810 A1 3/2011 Ganguly et al.
2011/0065289 A1 3/2011 Asai
2011/0067522 A1 3/2011 Lai
2011/0070380 A1 3/2011 Shero et al.
2011/0070740 A1 3/2011 Bettencourt et al.
2011/0076401 A1 3/2011 Chao et al.
2011/0081519 A1 4/2011 Dillingh
2011/0083496 A1 4/2011 Lin et al.
2011/0086516 A1 4/2011 Lee et al.
2011/0089166 A1 4/2011 Hunter et al.
2011/0089419 A1 4/2011 Yamazaki et al.
2011/0089469 A1 4/2011 Merckling
2011/0091650 A1 4/2011 Noguchi et al.
2011/0092077 A1 4/2011 Xu et al.
2011/0097901 A1 4/2011 Banna et al.
2011/0098841 A1 4/2011 Tsuda
2011/0100489 A1 5/2011 Orito et al.
2011/0104395 A1 5/2011 Kumagai et al.
2011/0107512 A1 5/2011 Gilbert
2011/0108194 A1 5/2011 Yoshioka et al.
2011/0108424 A1 5/2011 Puget et al.
2011/0108741 A1 5/2011 Ingram
2011/0108929 A1 5/2011 Meng
2011/0114261 A1 5/2011 Matsumoto et al.
2011/0114601 A1 5/2011 Lubomirsky et al.
2011/0115378 A1 5/2011 Lubomirsky et al.
2011/0117490 A1 5/2011 Bae et al.
2011/0117492 A1 5/2011 Yamada et al.
2011/0117728 A1 5/2011 Su et al.
2011/0117732 A1 5/2011 Bauer et al.
2011/0117737 A1 5/2011 Agarwala et al.
2011/0117749 A1 5/2011 Sheu
2011/0121503 A1 5/2011 Burrows et al.
2011/0121736 A1 5/2011 Hirayama et al.
2011/0124196 A1 5/2011 Lee
2011/0127702 A1 6/2011 Gautam et al.
2011/0132542 A1 6/2011 Ilzuka
2011/0135842 A1 6/2011 Faguet et al.
2011/0139272 A1 6/2011 Matsumoto et al.
2011/0139748 A1 6/2011 Donnelly et al.
2011/0140172 A1 6/2011 Chu
2011/0140173 A1 6/2011 Ramdani
2011/0143032 A1 6/2011 Vrtis et al.
2011/0143461 A1 6/2011 Fish et al.
2011/0155264 A1 6/2011 Minami et al.
2011/0155322 A1 6/2011 Himori et al.
2011/0159200 A1 6/2011 Kogure
2011/0159202 A1 6/2011 Matsushita
2011/0159673 A1 6/2011 Hanawa et al.
2011/0159680 A1 6/2011 Yoo
2011/0168330 A1 7/2011 Sakaue et al.
2011/0171380 A1 7/2011 Higashi et al.
2011/0171775 A1 7/2011 Yamamoto et al.
2011/0175011 A1 7/2011 Ehrne et al.
2011/0177648 A1 7/2011 Tanner et al.
2011/0180233 A1 7/2011 Bera et al.
2011/0183079 A1 7/2011 Jackson et al.
2011/0183269 A1 7/2011 Zhu
2011/0183527 A1 7/2011 Cho
2011/0185969 A1 8/2011 Yang
2011/0186984 A1 8/2011 Saito et al.
2011/0192820 A1 8/2011 Yeom et al.
2011/0195574 A1 8/2011 Blasco et al.
2011/0198034 A1 8/2011 Sun et al.
2011/0198417 A1 8/2011 Detmar et al.
2011/0198736 A1 8/2011 Shero et al.
2011/0204025 A1 8/2011 Tahara
2011/0207332 A1 8/2011 Liu et al.
2011/0210468 A1 9/2011 Shannon et al.
2011/0212625 A1 9/2011 Toyoda et al.
2011/0217838 A1 9/2011 Hsieh et al.
2011/0220874 A1 9/2011 Hanrath
2011/0223334 A1 9/2011 Yudovsky et al.
2011/0226421 A1 9/2011 Hayashi
2011/0232678 A1 9/2011 Shih et al.
2011/0236201 A1 9/2011 Shende
2011/0236594 A1 9/2011 Haverkamp et al.
2011/0236600 A1 9/2011 Fox et al.
2011/0237040 A1 9/2011 Ng et al.
2011/0237082 A1 9/2011 Nakajima et al.
2011/0239936 A1 10/2011 Suzaki et al.
2011/0239940 A1 10/2011 Benvenuti et al.
2011/0244673 A1 10/2011 Cho et al.
2011/0253044 A1 10/2011 Tam et al.
2011/0254052 A1 10/2011 Kouvetakis
2011/0256675 A1 10/2011 Avouris
2011/0256692 A1 10/2011 Tam et al.
2011/0256724 A1 10/2011 Chandrasekharan et al.
2011/0256726 A1 10/2011 Lavoie et al.
2011/0256727 A1 10/2011 Beynet et al.
2011/0256734 A1 10/2011 Hausmann et al.
2011/0259519 A1 10/2011 Kenworthy et al.
2011/0262642 A1 10/2011 Xiao et al.
2011/0263107 A1 10/2011 Chung et al.
2011/0263115 A1 10/2011 Ganguli et al.

(56) References Cited

U.S. PATENT DOCUMENTS

2011/0264250 A1 10/2011 Nishimura et al.
2011/0265549 A1 11/2011 Cruse et al.
2011/0265715 A1 11/2011 Keller
2011/0265725 A1 11/2011 Tsuji
2011/0265951 A1 11/2011 Xu et al.
2011/0266611 A1 11/2011 Kim et al.
2011/0269314 A1 11/2011 Lee et al.
2011/0275018 A1 11/2011 Matteo et al.
2011/0275166 A1 11/2011 Shero et al.
2011/0277690 A1 11/2011 Rozenzon et al.
2011/0281417 A1 11/2011 Gordon et al.
2011/0283933 A1 11/2011 Makarov et al.
2011/0286819 A1 11/2011 Shibata et al.
2011/0291243 A1 12/2011 Seamons
2011/0294075 A1 12/2011 Chen et al.
2011/0294288 A1 12/2011 Lee et al.
2011/0297088 A1 12/2011 Song et al.
2011/0298062 A1 12/2011 Ganguli et al.
2011/0300720 A1 12/2011 Fu
2011/0305102 A1 12/2011 Berger et al.
2011/0305856 A1 12/2011 Bonn
2011/0308453 A1 12/2011 Su et al.
2011/0308460 A1 12/2011 Hong et al.
2011/0312191 A1 12/2011 Ohkura et al.
2011/0318142 A1 12/2011 Gage et al.
2011/0318888 A1 12/2011 Komatsu et al.
2011/0318935 A1 12/2011 Oyabu et al.
2012/0001172 A1 1/2012 Shang et al.
2012/0003500 A1 1/2012 Yoshida et al.
2012/0003599 A1 1/2012 Patalay et al.
2012/0003726 A1 1/2012 Jones et al.
2012/0003831 A1 1/2012 Kang et al.
2012/0006489 A1 1/2012 Okita
2012/0009802 A1 1/2012 Lavoie
2012/0012556 A1 1/2012 Matsumoto et al.
2012/0021252 A1 1/2012 Lee
2012/0024223 A1 2/2012 Torres et al.
2012/0024227 A1 2/2012 Takasuka et al.
2012/0024231 A1 2/2012 Horino
2012/0024478 A1 2/2012 Huang et al.
2012/0024479 A1 2/2012 Palagashvili et al.
2012/0027547 A1 2/2012 Jager et al.
2012/0028454 A1 2/2012 Swaminathan et al.
2012/0028469 A1 2/2012 Onizawa et al.
2012/0031333 A1 2/2012 Kurita et al.
2012/0031500 A1 2/2012 Hirose et al.
2012/0032311 A1 2/2012 Gates
2012/0033695 A1 2/2012 Hayashi et al.
2012/0034793 A1 2/2012 Narushima et al.
2012/0036732 A1 2/2012 Varadarajan
2012/0040097 A1 2/2012 Volf et al.
2012/0040528 A1 2/2012 Kim et al.
2012/0043556 A1 2/2012 Dube et al.
2012/0043617 A1 2/2012 Nakagawa et al.
2012/0046421 A1 2/2012 Darling et al.
2012/0052681 A1 3/2012 Marsh
2012/0055401 A1 3/2012 Tozawa
2012/0058270 A1 3/2012 Winter et al.
2012/0058630 A1 3/2012 Quinn
2012/0064690 A1 3/2012 Hirota et al.
2012/0064726 A1 3/2012 Nozawa et al.
2012/0064764 A1 3/2012 Islam
2012/0068242 A1 3/2012 Shin et al.
2012/0070136 A1 3/2012 Koelmel et al.
2012/0070997 A1 3/2012 Larson
2012/0073400 A1 3/2012 Wang
2012/0074533 A1 3/2012 Aoyama
2012/0077349 A1 3/2012 Li et al.
2012/0077350 A1 3/2012 Miya et al.
2012/0080756 A1 4/2012 Suzuki
2012/0083134 A1 4/2012 Wu et al.
2012/0088031 A1 4/2012 Neel
2012/0088369 A1 4/2012 Weidman et al.
2012/0090704 A1 4/2012 Laverdiere et al.
2012/0091522 A1 4/2012 Ozaki et al.
2012/0094010 A1 4/2012 Sugiura et al.
2012/0094468 A1 4/2012 Bhatia et al.
2012/0098107 A1 4/2012 Raisanen et al.
2012/0100464 A1 4/2012 Kageyama
2012/0103264 A1 5/2012 Choi et al.
2012/0103522 A1 5/2012 Hohenwarter
2012/0103939 A1 5/2012 Wu et al.
2012/0104514 A1 5/2012 Park et al.
2012/0107607 A1 5/2012 Takaki et al.
2012/0108039 A1 5/2012 Zajaji
2012/0108048 A1 5/2012 Lim et al.
2012/0111271 A1 5/2012 Begarney et al.
2012/0114877 A1 5/2012 Lee
2012/0115250 A1 5/2012 Ariga et al.
2012/0115257 A1 5/2012 Matsuyam et al.
2012/0119337 A1 5/2012 Sasaki et al.
2012/0121823 A1 5/2012 Chhabra
2012/0122275 A1 5/2012 Koo et al.
2012/0122302 A1 5/2012 Weisman et al.
2012/0122319 A1 5/2012 Shimizu
2012/0125258 A1 5/2012 Lee
2012/0126300 A1 5/2012 Park et al.
2012/0128897 A1 5/2012 Xiao et al.
2012/0135145 A1 5/2012 Je et al.
2012/0139009 A1 6/2012 Ning et al.
2012/0145078 A1 6/2012 Huang et al.
2012/0146113 A1 6/2012 Suzuki et al.
2012/0149207 A1 6/2012 Graff
2012/0149213 A1 6/2012 Nittala
2012/0156108 A1 6/2012 Fondurulia et al.
2012/0156890 A1 6/2012 Yim et al.
2012/0160172 A1 6/2012 Wamura et al.
2012/0160809 A1 6/2012 Ishibashi et al.
2012/0161126 A1 6/2012 Yamazaki
2012/0161405 A1 6/2012 Mohn
2012/0164327 A1 6/2012 Sato
2012/0164837 A1 6/2012 Tan et al.
2012/0164842 A1 6/2012 Watanabe
2012/0164846 A1 6/2012 Ha et al.
2012/0170170 A1 7/2012 Gros-Jean
2012/0171391 A1 7/2012 Won
2012/0171874 A1 7/2012 Thridandam et al.
2012/0175518 A1 7/2012 Godet et al.
2012/0175751 A1 7/2012 Gatineau et al.
2012/0177845 A1 7/2012 Odedra et al.
2012/0180719 A1 7/2012 Inoue et al.
2012/0180954 A1 7/2012 Yang et al.
2012/0183689 A1 7/2012 Suzuki et al.
2012/0186521 A1 7/2012 Iwasaki et al.
2012/0186573 A1 7/2012 Jdira et al.
2012/0187083 A1 7/2012 Hashizume
2012/0187305 A1 7/2012 Elam et al.
2012/0187375 A1 7/2012 Guo et al.
2012/0190178 A1 7/2012 Wang et al.
2012/0190185 A1 7/2012 Rogers
2012/0190208 A1 7/2012 Ozu et al.
2012/0196048 A1 8/2012 Ueda
2012/0196242 A1 8/2012 Volfovski et al.
2012/0196450 A1 8/2012 Balseanu et al.
2012/0202358 A1 8/2012 Gealy et al.
2012/0206033 A1 8/2012 Matsuyama
2012/0207456 A1 8/2012 Kim et al.
2012/0212121 A1 8/2012 Lin
2012/0213947 A1 8/2012 Lee
2012/0214318 A1 8/2012 Fukazawa et al.
2012/0216743 A1 8/2012 Itoh et al.
2012/0219735 A1 8/2012 Bakker et al.
2012/0219824 A1 8/2012 Prolier
2012/0220139 A1 8/2012 Lee et al.
2012/0222813 A1 9/2012 Pal et al.
2012/0222815 A1 9/2012 Sabri et al.
2012/0225192 A1 9/2012 Yudovsky et al.
2012/0225561 A1 9/2012 Watanabe
2012/0231611 A1 9/2012 Gatineau et al.
2012/0231771 A1 9/2012 Marcus
2012/0232340 A1 9/2012 Levy et al.
2012/0238074 A1 9/2012 Santhanam et al.
2012/0240858 A1 9/2012 Taniyama et al.
2012/0241089 A1 9/2012 Dielmann et al.

(56) References Cited

U.S. PATENT DOCUMENTS

2012/0241411 A1 9/2012 Darling et al.
2012/0244703 A1 9/2012 Nakayama et al.
2012/0247386 A1 10/2012 Sanchez et al.
2012/0252229 A1 10/2012 Timans et al.
2012/0258257 A1 10/2012 Nguyen et al.
2012/0263875 A1 10/2012 Brenninger et al.
2012/0263876 A1 10/2012 Haukka et al.
2012/0263887 A1 10/2012 Papasouliotis et al.
2012/0264051 A1 10/2012 Angelov et al.
2012/0264305 A1 10/2012 Nakano
2012/0267048 A1 10/2012 Moyama et al.
2012/0269962 A1 10/2012 Blomberg et al.
2012/0269967 A1 10/2012 Yudovsky et al.
2012/0270339 A1 10/2012 Xie et al.
2012/0270384 A1 10/2012 Sanchez et al.
2012/0270393 A1 10/2012 Pore et al.
2012/0270407 A1 10/2012 Werner et al.
2012/0273052 A1 11/2012 Ye et al.
2012/0273162 A1 11/2012 Mahadeswaraswamy
2012/0276306 A1 11/2012 Ueda
2012/0288625 A1 11/2012 Furuya et al.
2012/0289053 A1 11/2012 Holland et al.
2012/0289056 A1 11/2012 Bergman et al.
2012/0289057 A1 11/2012 DeDontney
2012/0295427 A1 11/2012 Bauer
2012/0295449 A1 11/2012 Fukazawa
2012/0302055 A1 11/2012 Pore et al.
2012/0303313 A1 11/2012 Moroi et al.
2012/0304935 A1 12/2012 Oosterlaken et al.
2012/0305026 A1 12/2012 Nomura et al.
2012/0305196 A1 12/2012 Mori et al.
2012/0305987 A1 12/2012 Hirler et al.
2012/0307588 A1 12/2012 Hanada et al.
2012/0309181 A1 12/2012 Machkaoutsan et al.
2012/0310440 A1 12/2012 Darabnia et al.
2012/0315113 A1 12/2012 Hiroki
2012/0315404 A1 12/2012 Li et al.
2012/0318334 A1 12/2012 Bedell et al.
2012/0318457 A1 12/2012 Nguyen et al.
2012/0318773 A1 12/2012 Wu et al.
2012/0319279 A1 12/2012 Isobayashi
2012/0320491 A1 12/2012 Doh et al.
2012/0321786 A1 12/2012 Satitpunwaycha et al.
2012/0322252 A1 12/2012 Son et al.
2012/0325148 A1 12/2012 Yamagishi et al.
2012/0328780 A1 12/2012 Yamagishi et al.
2012/0329208 A1 12/2012 Pore et al.
2013/0002121 A1 1/2013 Ma
2013/0005122 A1 1/2013 Schwarzenbach et al.
2013/0005147 A1 1/2013 Angyal et al.
2013/0008607 A1 1/2013 Matsumoto et al.
2013/0011630 A1 1/2013 Sullivan et al.
2013/0011983 A1 1/2013 Tsai
2013/0011984 A1 1/2013 Wang et al.
2013/0012003 A1 1/2013 Haukka et al.
2013/0012034 A1 1/2013 Ahn et al.
2013/0014697 A1 1/2013 Kanayama
2013/0014896 A1 1/2013 Shoji et al.
2013/0017503 A1 1/2013 de Ridder et al.
2013/0019944 A1 1/2013 Hekmatshoar-Tabai et al.
2013/0019945 A1 1/2013 Hekmatshoar-Tabai et al.
2013/0019960 A1 1/2013 Choi et al.
2013/0020246 A1 1/2013 Hoots et al.
2013/0023120 A1 1/2013 Yaehashi et al.
2013/0023124 A1 1/2013 Nemani et al.
2013/0023129 A1 1/2013 Reed
2013/0025538 A1 1/2013 Collins et al.
2013/0025786 A1 1/2013 Davidkovich et al.
2013/0026451 A1 1/2013 Bangsaruntip et al.
2013/0032085 A1 2/2013 Hanawa et al.
2013/0037532 A1 2/2013 Volfovski et al.
2013/0037858 A1 2/2013 Hong et al.
2013/0037886 A1 2/2013 Tsai et al.
2013/0040447 A1 2/2013 Swaminathan et al.
2013/0040481 A1 2/2013 Vallely et al.
2013/0042811 A1 2/2013 Shanker et al.
2013/0048606 A1 2/2013 Mao et al.
2013/0052585 A1 2/2013 Ayothi et al.
2013/0052836 A1 2/2013 Hirose et al.
2013/0059078 A1 3/2013 Gatineau et al.
2013/0059415 A1 3/2013 Kato et al.
2013/0061755 A1 3/2013 Frederick
2013/0062753 A1 3/2013 Nguyen et al.
2013/0062839 A1 3/2013 Tschinderle et al.
2013/0064973 A1 3/2013 Chen et al.
2013/0065189 A1 3/2013 Yoshii et al.
2013/0068391 A1 3/2013 Mazzocco et al.
2013/0068727 A1 3/2013 Okita
2013/0068970 A1 3/2013 Matsushita
2013/0069052 A1 3/2013 Sandhu
2013/0070456 A1 3/2013 Jang et al.
2013/0075746 A1 3/2013 Mallikarjunaswamy et al.
2013/0075788 A1 3/2013 Tomabechi
2013/0078376 A1 3/2013 Higashino et al.
2013/0078392 A1 3/2013 Xiao et al.
2013/0081702 A1 4/2013 Mohammed et al.
2013/0082274 A1 4/2013 Yang
2013/0084156 A1 4/2013 Shimamoto
2013/0084408 A1 4/2013 Nakao et al.
2013/0084711 A1 4/2013 Liang et al.
2013/0084714 A1 4/2013 Oka et al.
2013/0085618 A1 4/2013 Ding
2013/0089667 A1 4/2013 Lai et al.
2013/0089716 A1 4/2013 Krishnamurthy et al.
2013/0089988 A1 4/2013 Wang et al.
2013/0092085 A1 4/2013 Lee
2013/0093048 A1 4/2013 Chang et al.
2013/0093321 A1 4/2013 Yoshikawa et al.
2013/0095664 A1 4/2013 Matero et al.
2013/0095973 A1 4/2013 Kroneberger et al.
2013/0099318 A1 4/2013 Adam et al.
2013/0104988 A1 5/2013 Yednak et al.
2013/0104992 A1 5/2013 Yednak et al.
2013/0107415 A1 5/2013 Banna et al.
2013/0109172 A1 5/2013 Collins et al.
2013/0109192 A1 5/2013 Hawkins et al.
2013/0112251 A1 5/2013 Hang et al.
2013/0113085 A1 5/2013 Michaelson et al.
2013/0115383 A1 5/2013 Lu et al.
2013/0115763 A1 5/2013 Takamure et al.
2013/0115768 A1 5/2013 Pore et al.
2013/0118405 A1 5/2013 Ho et al.
2013/0118895 A1 5/2013 Roozeboom et al.
2013/0119018 A1 5/2013 Kanarik et al.
2013/0122712 A1 5/2013 Kim et al.
2013/0122722 A1 5/2013 Cissell et al.
2013/0126515 A1 5/2013 Shero et al.
2013/0129577 A1 5/2013 Halpin et al.
2013/0130490 A1 5/2013 Lee et al.
2013/0134148 A1 5/2013 Tachikawa
2013/0137279 A1 5/2013 Yamamoto et al.
2013/0143401 A1 6/2013 Yu et al.
2013/0143415 A1 6/2013 Yudovsky et al.
2013/0145587 A1 6/2013 Adhiprakasha
2013/0145984 A1 6/2013 Zhang et al.
2013/0147050 A1 6/2013 Bonner, III et al.
2013/0149874 A1 6/2013 Hirose et al.
2013/0152933 A1 6/2013 Lischer et al.
2013/0157409 A1 6/2013 Vaidya
2013/0157521 A1 6/2013 Aldrich et al.
2013/0160709 A1 6/2013 White et al.
2013/0161629 A1 6/2013 Han et al.
2013/0162142 A1 6/2013 Nishino et al.
2013/0164458 A1 6/2013 Soininen et al.
2013/0168353 A1 7/2013 Okita et al.
2013/0168354 A1 7/2013 Kanarik
2013/0171818 A1 7/2013 Kim et al.
2013/0175596 A1 7/2013 Cheng et al.
2013/0177706 A1 7/2013 Baluja et al.
2013/0180448 A1 7/2013 Sakaue et al.
2013/0183814 A1 7/2013 Huang et al.
2013/0186340 A1 7/2013 Omori et al.
2013/0189635 A1 7/2013 Lim et al.
2013/0189854 A1 7/2013 Hausmann et al.

(56) References Cited

U.S. PATENT DOCUMENTS

2013/0196502 A1 8/2013 Haukka et al.
2013/0196507 A1 8/2013 Ma et al.
2013/0200518 A1 8/2013 Ahmed et al.
2013/0202387 A1 8/2013 Hiroki
2013/0203258 A1 8/2013 Chen et al.
2013/0203266 A1 8/2013 Hintze
2013/0203267 A1 8/2013 Pomarede et al.
2013/0206066 A1 8/2013 Han et al.
2013/0209940 A1 8/2013 Sakamoto et al.
2013/0210241 A1 8/2013 Lavoie et al.
2013/0213300 A1 8/2013 Sung et al.
2013/0214232 A1 8/2013 Tendulkar et al.
2013/0216710 A1 8/2013 Masuda et al.
2013/0217239 A1 8/2013 Mallick et al.
2013/0217240 A1 8/2013 Mallick et al.
2013/0217241 A1 8/2013 Underwood et al.
2013/0217243 A1 8/2013 Underwood et al.
2013/0219853 A1 8/2013 Little et al.
2013/0220550 A1 8/2013 Koo et al.
2013/0224964 A1 8/2013 Fukazawa
2013/0228225 A1 9/2013 Leeser
2013/0228902 A1 9/2013 Tomizawa et al.
2013/0230814 A1 9/2013 Dunn et al.
2013/0230987 A1 9/2013 Draeger et al.
2013/0234203 A1 9/2013 Tsai et al.
2013/0242287 A1 9/2013 Schlezinger
2013/0247937 A1 9/2013 Nunomura et al.
2013/0256265 A1 10/2013 Darling et al.
2013/0256838 A1 10/2013 Sanchez et al.
2013/0256962 A1 10/2013 Ranish
2013/0260371 A1 10/2013 Holt
2013/0264659 A1 10/2013 Jung
2013/0267045 A1 10/2013 Lee et al.
2013/0269609 A1 10/2013 Leeser
2013/0269612 A1 10/2013 Cheng et al.
2013/0270600 A1 10/2013 Helander et al.
2013/0270676 A1 10/2013 Lindert et al.
2013/0273330 A1 10/2013 Wang et al.
2013/0276978 A1 10/2013 Bluck et al.
2013/0280891 A1 10/2013 Kim et al.
2013/0285155 A1 10/2013 Glass
2013/0287526 A1 10/2013 Bluck et al.
2013/0288427 A1 10/2013 Hung et al.
2013/0288471 A1 10/2013 Chi
2013/0288480 A1 10/2013 Sanchez et al.
2013/0288485 A1 10/2013 Liang et al.
2013/0292047 A1 11/2013 Tian et al.
2013/0292676 A1 11/2013 Milligan et al.
2013/0292807 A1 11/2013 Raisanen et al.
2013/0295779 A1 11/2013 Chandra et al.
2013/0299944 A1 11/2013 Lai et al.
2013/0302520 A1 11/2013 Wang et al.
2013/0302999 A1 11/2013 Won et al.
2013/0303803 A1 11/2013 Doerr et al.
2013/0309876 A1 11/2013 Ogawa
2013/0312663 A1 11/2013 Khosla et al.
2013/0313656 A1 11/2013 Tong
2013/0319290 A1 12/2013 Xiao et al.
2013/0320429 A1 12/2013 Thomas
2013/0323435 A1 12/2013 Xiao et al.
2013/0323859 A1 12/2013 Chen et al.
2013/0323935 A1 12/2013 Suzuki et al.
2013/0330165 A1 12/2013 Wimplinger
2013/0330911 A1 12/2013 Huang et al.
2013/0330933 A1 12/2013 Fukazawa et al.
2013/0333619 A1 12/2013 Omari
2013/0337172 A1 12/2013 Lee
2013/0337583 A1 12/2013 Kobayashi et al.
2013/0337639 A1 12/2013 Ivanstov et al.
2013/0337653 A1 12/2013 Kovalgin et al.
2013/0340619 A1 12/2013 Tammera
2013/0340678 A1 12/2013 Wamura et al.
2013/0344248 A1 12/2013 Clark
2014/0000843 A1 1/2014 Dunn et al.
2014/0001520 A1 1/2014 Glass
2014/0004274 A1 1/2014 Thompson
2014/0007808 A1 1/2014 Okabe et al.
2014/0014642 A1 1/2014 Elliot et al.
2014/0014644 A1 1/2014 Akiba et al.
2014/0015108 A1 1/2014 Kim et al.
2014/0015186 A1 1/2014 Wessel et al.
2014/0017408 A1 1/2014 Gandikota et al.
2014/0017414 A1 1/2014 Fukazawa et al.
2014/0017908 A1 1/2014 Beynet et al.
2014/0020619 A1 1/2014 Vincent et al.
2014/0020764 A1 1/2014 Woelk et al.
2014/0020839 A1 1/2014 Kenney et al.
2014/0023794 A1 1/2014 Mahajani et al.
2014/0024223 A1 1/2014 Kilpi et al.
2014/0027884 A1 1/2014 Tang et al.
2014/0030447 A1 1/2014 Lee
2014/0033978 A1 2/2014 Adachi et al.
2014/0034240 A1 2/2014 Kim et al.
2014/0034632 A1 2/2014 Pan et al.
2014/0036274 A1 2/2014 Marquardt et al.
2014/0045324 A1 2/2014 Brabant et al.
2014/0045342 A1 2/2014 Mallick et al.
2014/0047705 A1 2/2014 Singh
2014/0048765 A1 2/2014 Ma et al.
2014/0053866 A1 2/2014 Baluja et al.
2014/0056679 A1 2/2014 Yamabe et al.
2014/0056770 A1 2/2014 Bedard et al.
2014/0057187 A1 2/2014 Suzuki et al.
2014/0057454 A1 2/2014 Subramonium
2014/0058179 A1 2/2014 Stevens et al.
2014/0060147 A1 3/2014 Sarin et al.
2014/0060572 A1 3/2014 Yasumuro et al.
2014/0061770 A1 3/2014 Lee
2014/0062304 A1 3/2014 Nakano et al.
2014/0065841 A1 3/2014 Matero
2014/0067110 A1 3/2014 Lawson et al.
2014/0072710 A1 3/2014 Valle
2014/0072726 A1 3/2014 Kim
2014/0072925 A1 3/2014 Kaneko
2014/0073082 A1 3/2014 Song
2014/0073143 A1 3/2014 Alokozai et al.
2014/0076861 A1 3/2014 Cornelius et al.
2014/0077240 A1 3/2014 Roucka et al.
2014/0080314 A1 3/2014 Sasajima et al.
2014/0084341 A1 3/2014 Weeks
2014/0087490 A1 3/2014 Kahlon
2014/0087544 A1 3/2014 Tolle
2014/0087564 A1 3/2014 Shimizu et al.
2014/0094027 A1 4/2014 Azumo et al.
2014/0096716 A1 4/2014 Chung et al.
2014/0097468 A1 4/2014 Okita
2014/0099794 A1 4/2014 Ingle et al.
2014/0099798 A1 4/2014 Tsuji
2014/0103145 A1 4/2014 White et al.
2014/0106574 A1 4/2014 Kang et al.
2014/0110798 A1 4/2014 Cai
2014/0113457 A1 4/2014 Sims
2014/0116335 A1 5/2014 Tsuji et al.
2014/0117380 A1 5/2014 Loboda et al.
2014/0120312 A1 5/2014 He et al.
2014/0120487 A1 5/2014 Kaneko
2014/0120678 A1 5/2014 Shinriki et al.
2014/0120723 A1 5/2014 Fu et al.
2014/0120738 A1 5/2014 Jung
2014/0120750 A1 5/2014 Johnson
2014/0127422 A1 5/2014 Shao et al.
2014/0127907 A1 5/2014 Yang
2014/0130687 A1 5/2014 Shibusawa et al.
2014/0138779 A1 5/2014 Xie et al.
2014/0141165 A1 5/2014 Sato et al.
2014/0141625 A1 5/2014 Fukazawa et al.
2014/0141674 A1 5/2014 Galbreath et al.
2014/0144375 A1 5/2014 Kim et al.
2014/0144500 A1 5/2014 Cao et al.
2014/0145332 A1 5/2014 Ryan et al.
2014/0147587 A1 5/2014 Endo et al.
2014/0148924 A1 5/2014 Brak et al.
2014/0158154 A1 6/2014 Kondo et al.
2014/0158786 A1 6/2014 Santo

(56) References Cited

U.S. PATENT DOCUMENTS

2014/0159170 A1 6/2014 Raisanen et al.
2014/0162401 A1 6/2014 Kawano et al.
2014/0167187 A1 6/2014 Kuo et al.
2014/0170320 A1 6/2014 Yamamoto et al.
2014/0170335 A1 6/2014 Shao et al.
2014/0174354 A1 6/2014 Arai
2014/0174357 A1 6/2014 Kim et al.
2014/0174927 A1 6/2014 Bashir et al.
2014/0175054 A1 6/2014 Carlson et al.
2014/0179091 A1 6/2014 Clark
2014/0179092 A1 6/2014 Kim
2014/0182053 A1 7/2014 Huang
2014/0182689 A1 7/2014 Shareef et al.
2014/0187022 A1 7/2014 Falster et al.
2014/0187045 A1 7/2014 Hua et al.
2014/0190581 A1 7/2014 Nagase et al.
2014/0191389 A1 7/2014 Lee et al.
2014/0193983 A1 7/2014 Lavoie
2014/0202382 A1 7/2014 Kim et al.
2014/0202386 A1 7/2014 Taga
2014/0202388 A1 7/2014 Um et al.
2014/0209976 A1 7/2014 Yang et al.
2014/0213061 A1 7/2014 Huang et al.
2014/0217065 A1 8/2014 Winkler et al.
2014/0220247 A1 8/2014 Haukka et al.
2014/0225065 A1 8/2014 Rachmady et al.
2014/0227072 A1 8/2014 Lee et al.
2014/0227444 A1 8/2014 Winter et al.
2014/0227861 A1 8/2014 Wu et al.
2014/0227881 A1 8/2014 Lubomirsky et al.
2014/0231922 A1 8/2014 Kim et al.
2014/0234466 A1 8/2014 Gao et al.
2014/0234550 A1 8/2014 Winter et al.
2014/0234992 A1 8/2014 Kubota et al.
2014/0238607 A1 8/2014 Nozawa et al.
2014/0238608 A1 8/2014 Sabri et al.
2014/0242298 A1 8/2014 Lansalot-Matras et al.
2014/0242806 A1 8/2014 Knapp et al.
2014/0242808 A1 8/2014 Akiyama et al.
2014/0245948 A1 9/2014 Nguyen et al.
2014/0251788 A1 9/2014 Ge et al.
2014/0251953 A1 9/2014 Winkler et al.
2014/0251954 A1 9/2014 Winkler et al.
2014/0252134 A1 9/2014 Chen
2014/0252479 A1 9/2014 Utomo et al.
2014/0252710 A1 9/2014 Cuvalci et al.
2014/0256160 A1 9/2014 Wada et al.
2014/0260684 A1 9/2014 Christmann
2014/0262028 A1 9/2014 Kelekar
2014/0262034 A1 9/2014 Ishibashi et al.
2014/0262193 A1 9/2014 Im et al.
2014/0263172 A1 9/2014 Xie et al.
2014/0263272 A1 9/2014 Duan et al.
2014/0264297 A1 9/2014 Kumar et al.
2014/0264444 A1 9/2014 Guo et al.
2014/0264902 A1 9/2014 Ting et al.
2014/0265090 A1 9/2014 Hou
2014/0265832 A1 9/2014 Kenney et al.
2014/0271081 A1 9/2014 Lavitsky et al.
2014/0272194 A1 9/2014 Xiao et al.
2014/0272341 A1 9/2014 Duan et al.
2014/0273428 A1 9/2014 Shero
2014/0273477 A1 9/2014 Niskanen
2014/0273497 A1 9/2014 Payne et al.
2014/0273510 A1 9/2014 Chen et al.
2014/0273528 A1 9/2014 Niskanen
2014/0273530 A1 9/2014 Nguyen
2014/0273531 A1 9/2014 Niskanen
2014/0283747 A1 9/2014 Kasai et al.
2014/0287164 A1 9/2014 Xiao et al.
2014/0287595 A1 9/2014 Shimamoto et al.
2014/0290573 A1 10/2014 Okabe et al.
2014/0290578 A1 10/2014 Wamura et al.
2014/0306250 A1 10/2014 Gardner et al.
2014/0308108 A1 10/2014 Fosnight et al.
2014/0312767 A1 10/2014 Tian et al.
2014/0322862 A1 10/2014 Xie et al.
2014/0322885 A1 10/2014 Xie et al.
2014/0327117 A1 11/2014 Bencher et al.
2014/0339981 A1 11/2014 Komatsu et al.
2014/0346142 A1 11/2014 Chapuis et al.
2014/0346600 A1 11/2014 Cheng et al.
2014/0346650 A1 11/2014 Raisanen et al.
2014/0349033 A1 11/2014 Nonaka et al.
2014/0349068 A1 11/2014 Inglis et al.
2014/0357090 A1 12/2014 Knaepen et al.
2014/0360430 A1 12/2014 Armour et al.
2014/0363980 A1 12/2014 Kawamata et al.
2014/0363983 A1 12/2014 Nakano et al.
2014/0363985 A1 12/2014 Jang et al.
2014/0366804 A1 12/2014 Pak et al.
2014/0367043 A1 12/2014 Bishara et al.
2014/0367642 A1 12/2014 Guo
2014/0377960 A1 12/2014 Koiwa
2015/0004316 A1 1/2015 Thompson et al.
2015/0004317 A1 1/2015 Dussarrat et al.
2015/0004318 A1 1/2015 Alasaarela et al.
2015/0004798 A1 1/2015 Chandrasekharan et al.
2015/0004806 A1 1/2015 Ndiege et al.
2015/0007770 A1 1/2015 Chandrasekharan et al.
2015/0010381 A1 1/2015 Cai
2015/0011095 A1 1/2015 Chandrasekharan et al.
2015/0014632 A1 1/2015 Kim et al.
2015/0014823 A1 1/2015 Mallikarjunan et al.
2015/0017794 A1 1/2015 Takamure
2015/0021599 A1 1/2015 Ridgeway
2015/0024567 A1 1/2015 Tsai et al.
2015/0024609 A1 1/2015 Milligan et al.
2015/0030766 A1 1/2015 Lind et al.
2015/0030782 A1 1/2015 Ivanov et al.
2015/0031218 A1 1/2015 Karakawa
2015/0041431 A1 2/2015 Zafiropoulo et al.
2015/0048485 A1 2/2015 Tolle
2015/0056815 A1 2/2015 Fernandez
2015/0056821 A1 2/2015 Ishikawa et al.
2015/0061078 A1 3/2015 Abel et al.
2015/0064923 A1 3/2015 Matsumoto et al.
2015/0069354 A1 3/2015 Helander et al.
2015/0072509 A1 3/2015 Chi et al.
2015/0078874 A1 3/2015 Sansoni
2015/0079311 A1 3/2015 Nakano
2015/0086316 A1 3/2015 Greenberg
2015/0086716 A1 3/2015 Park et al.
2015/0087139 A1 3/2015 O'Neill et al.
2015/0087154 A1 3/2015 Guha et al.
2015/0091057 A1 4/2015 Xie et al.
2015/0091134 A1 4/2015 Amaratunga et al.
2015/0094470 A1 4/2015 Sanchez et al.
2015/0096973 A1 4/2015 Dunn et al.
2015/0099065 A1 4/2015 Canizares et al.
2015/0099072 A1 4/2015 Takamure et al.
2015/0099123 A1 4/2015 Barbee et al.
2015/0099342 A1 4/2015 Tsai
2015/0099374 A1 4/2015 Kakimoto et al.
2015/0099375 A1 4/2015 Haripin et al.
2015/0102466 A1 4/2015 Colinge
2015/0104574 A1 4/2015 Lee et al.
2015/0104575 A1 4/2015 Takoudis et al.
2015/0110147 A1 4/2015 Mizuno
2015/0110968 A1 4/2015 Lavoie et al.
2015/0111374 A1 4/2015 Bao
2015/0111395 A1 4/2015 Hashimoto et al.
2015/0114295 A1 4/2015 Kim et al.
2015/0118009 A1 4/2015 Hsieh et al.
2015/0118846 A1 4/2015 Isii et al.
2015/0118863 A1 4/2015 Rathod et al.
2015/0122180 A1 5/2015 Chang et al.
2015/0125628 A1 5/2015 Kim et al.
2015/0126036 A1 5/2015 Zhao
2015/0132212 A1 5/2015 Winkler et al.
2015/0132953 A1 5/2015 Nowling et al.
2015/0137315 A1 5/2015 Chen et al.
2015/0140210 A1 5/2015 Jung et al.
2015/0144060 A1 5/2015 Park

(56) References Cited

U.S. PATENT DOCUMENTS

2015/0147482 A1 5/2015 Kang et al.
2015/0147483 A1 5/2015 Fukazawa
2015/0147488 A1 5/2015 Choi et al.
2015/0147875 A1 5/2015 Takamure et al.
2015/0147877 A1 5/2015 Jung
2015/0152547 A1 6/2015 Nakamura et al.
2015/0152553 A1 6/2015 Popp et al.
2015/0155140 A1 6/2015 Lee et al.
2015/0155177 A1 6/2015 Zhang et al.
2015/0155370 A1 6/2015 Tsai et al.
2015/0162168 A1 6/2015 Oehrlien
2015/0162185 A1 6/2015 Pore
2015/0162214 A1 6/2015 Thompson
2015/0167159 A1 6/2015 Halpin et al.
2015/0167161 A1 6/2015 Canizares et al.
2015/0167162 A1 6/2015 Barik et al.
2015/0167165 A1 6/2015 Lindfors
2015/0167705 A1 6/2015 Lee et al.
2015/0170907 A1 6/2015 Haukka et al.
2015/0170914 A1 6/2015 Haukka et al.
2015/0170945 A1 6/2015 Segawa et al.
2015/0170947 A1 6/2015 Bluck
2015/0170954 A1 6/2015 Agarwal
2015/0170975 A1 6/2015 Blatchford et al.
2015/0171177 A1 6/2015 Cheng et al.
2015/0174768 A1 6/2015 Rodnick
2015/0175467 A1 6/2015 Denifl et al.
2015/0176124 A1 6/2015 Greer et al.
2015/0176126 A1 6/2015 Ge et al.
2015/0179415 A1 6/2015 Sasaki et al.
2015/0179501 A1 6/2015 Jhaveri et al.
2015/0179564 A1 6/2015 Lee et al.
2015/0179640 A1 6/2015 Kim et al.
2015/0184287 A1 7/2015 Tsung et al.
2015/0184291 A1 7/2015 Alokozai et al.
2015/0187559 A1 7/2015 Sano
2015/0187568 A1 7/2015 Pettinger et al.
2015/0187611 A1 7/2015 Sato
2015/0187908 A1 7/2015 Zhang et al.
2015/0203961 A1 7/2015 Ha et al.
2015/0203967 A1 7/2015 Dhas et al.
2015/0211124 A1 7/2015 Nozawa et al.
2015/0211125 A1 7/2015 Yoshikawa et al.
2015/0217330 A1 8/2015 Haukka
2015/0217456 A1 8/2015 Tsuji et al.
2015/0218695 A1 8/2015 Odedra
2015/0218698 A1 8/2015 Yoon et al.
2015/0218700 A1 8/2015 Nguyen et al.
2015/0221479 A1 8/2015 Chen et al.
2015/0221480 A1 8/2015 Duan et al.
2015/0221519 A1 8/2015 Marks et al.
2015/0225850 A1 8/2015 Arora et al.
2015/0228513 A1 8/2015 Parkhe et al.
2015/0228572 A1 8/2015 Yang et al.
2015/0228645 A1 8/2015 Chuang et al.
2015/0228749 A1 8/2015 Ando et al.
2015/0240357 A1 8/2015 Tachibana et al.
2015/0240359 A1 8/2015 Jdira et al.
2015/0240360 A1 8/2015 Leeser
2015/0241787 A1 8/2015 Yaegashi
2015/0243522 A1 8/2015 Kitagaito et al.
2015/0243542 A1 8/2015 Yoshihara et al.
2015/0243545 A1 8/2015 Tang
2015/0243563 A1 8/2015 Lee et al.
2015/0243658 A1 8/2015 Joshi et al.
2015/0247259 A1 9/2015 Hekmatshoar-Tabari et al.
2015/0249013 A1 9/2015 Arghavani et al.
2015/0255319 A1 9/2015 Kikuchi et al.
2015/0255324 A1 9/2015 Li et al.
2015/0255385 A1 9/2015 Lee et al.
2015/0259790 A1 9/2015 Newman
2015/0259801 A1 9/2015 Matsumoto et al.
2015/0262828 A1 9/2015 Brand et al.
2015/0263033 A1 9/2015 Aoyama
2015/0267294 A1 9/2015 Itatani
2015/0267295 A1 9/2015 Hill et al.
2015/0267297 A1 9/2015 Shiba
2015/0267298 A1 9/2015 Saitou et al.
2015/0267299 A1 9/2015 Hawkins
2015/0267301 A1 9/2015 Hill et al.
2015/0270140 A1 9/2015 Gupta et al.
2015/0270146 A1 9/2015 Yoshihara et al.
2015/0275355 A1 10/2015 Mallikarjunan et al.
2015/0275357 A1 10/2015 Kamakura et al.
2015/0279665 A1 10/2015 Zafiropoulo
2015/0279681 A1 10/2015 Knoops
2015/0279682 A1 10/2015 Nakatani et al.
2015/0279708 A1 10/2015 Kobayashi et al.
2015/0279956 A1 10/2015 Ozaki et al.
2015/0280051 A1 10/2015 Xu
2015/0284848 A1 10/2015 Nakano et al.
2015/0287591 A1 10/2015 Pore et al.
2015/0287612 A1 10/2015 Luere et al.
2015/0287626 A1 10/2015 Arai
2015/0287710 A1 10/2015 Yun et al.
2015/0291830 A1 10/2015 Galbreath et al.
2015/0292088 A1 10/2015 Canizares
2015/0299848 A1 10/2015 Haukka et al.
2015/0307982 A1 10/2015 Firouzdor et al.
2015/0307989 A1 10/2015 Lindfors
2015/0308586 A1 10/2015 Shugrue et al.
2015/0311043 A1 10/2015 Sun et al.
2015/0311151 A1 10/2015 Chi et al.
2015/0303056 A1 11/2015 Varadarajan et al.
2015/0315704 A1 11/2015 Nakano et al.
2015/0322569 A1 11/2015 Kilpi et al.
2015/0325432 A1 11/2015 Ishizaka
2015/0332921 A1 11/2015 Lee et al.
2015/0340247 A1 11/2015 Balakrishnan et al.
2015/0340266 A1 11/2015 Ngo et al.
2015/0340500 A1 11/2015 Brunco
2015/0340609 A1 11/2015 Banno et al.
2015/0343559 A1 12/2015 Morikazu et al.
2015/0343741 A1 12/2015 Shibata et al.
2015/0345018 A1 12/2015 Detavernier et al.
2015/0345022 A1 12/2015 Yudovsky et al.
2015/0348755 A1 12/2015 Han et al.
2015/0349073 A1 12/2015 Kang
2015/0353478 A1 12/2015 Hoshino et al.
2015/0354060 A1 12/2015 Yabe et al.
2015/0361550 A1 12/2015 Yabe et al.
2015/0361553 A1 12/2015 Murakawa
2015/0364347 A1 12/2015 Nguyen et al.
2015/0364371 A1 12/2015 Yen
2015/0364747 A1 12/2015 Elam et al.
2015/0367253 A1 12/2015 Kanyal et al.
2015/0368798 A1 12/2015 Kwong
2015/0371864 A1 12/2015 Hsu et al.
2015/0372056 A1 12/2015 Seong et al.
2015/0376211 A1 12/2015 Girard
2015/0376785 A1 12/2015 Knaapen et al.
2015/0380296 A1 12/2015 Antonelli et al.
2016/0002776 A1 1/2016 Nal et al.
2016/0002786 A1 1/2016 Gatineau et al.
2016/0005571 A1 1/2016 Della Rosa et al.
2016/0005595 A1 1/2016 Liu et al.
2016/0005596 A1 1/2016 Behera et al.
2016/0005839 A1 1/2016 Yieh et al.
2016/0010208 A1 1/2016 Huang et al.
2016/0013022 A1 1/2016 Ayoub
2016/0013024 A1 1/2016 Milligan et al.
2016/0013086 A1 1/2016 Yang et al.
2016/0017493 A1 1/2016 Dhas
2016/0020071 A1 1/2016 Khaja et al.
2016/0020092 A1 1/2016 Kang et al.
2016/0024655 A1 1/2016 Yudovsky et al.
2016/0024656 A1 1/2016 White et al.
2016/0032453 A1 2/2016 Qian et al.
2016/0035542 A1 2/2016 Hausmann
2016/0035566 A1 2/2016 LaVoie
2016/0035596 A1 2/2016 Kamiya
2016/0042954 A1 2/2016 Sung et al.
2016/0051964 A1 2/2016 Tolle et al.
2016/0056074 A1 2/2016 Na

(56) References Cited

U.S. PATENT DOCUMENTS

2016/0056156 A1 2/2016 Ghani et al.
2016/0060752 A1 3/2016 Jacques et al.
2016/0064208 A1 3/2016 Zafiropoulo et al.
2016/0064231 A1 3/2016 Agarwal et al.
2016/0069613 A1 3/2016 Colgan et al.
2016/0071750 A1 3/2016 de Ridder et al.
2016/0076949 A1 3/2016 Sabah et al.
2016/0079054 A1 3/2016 Chen et al.
2016/0085003 A1 3/2016 Jaiswal
2016/0086811 A1 3/2016 Mackedanz et al.
2016/0087028 A1 3/2016 Hirota et al.
2016/0097123 A1 4/2016 Shugrue et al.
2016/0099150 A1 4/2016 Tsai
2016/0099166 A1 4/2016 Yudovsky
2016/0099250 A1 4/2016 Rabkin et al.
2016/0102214 A1 4/2016 Dietz et al.
2016/0111272 A1 4/2016 Girard
2016/0111304 A1 4/2016 Takahashi et al.
2016/0111438 A1 4/2016 Tsutsumi et al.
2016/0115590 A1 4/2016 Haukka et al.
2016/0118224 A1 4/2016 Kohno et al.
2016/0133307 A1 5/2016 Lee et al.
2016/0133504 A1 5/2016 Chu et al.
2016/0133628 A1 5/2016 Xie
2016/0141172 A1 5/2016 Kang
2016/0145738 A1 5/2016 Liu et al.
2016/0148800 A1 5/2016 Henri et al.
2016/0148801 A1 5/2016 Yabe et al.
2016/0148806 A1 5/2016 Henri et al.
2016/0148811 A1 5/2016 Nakatani et al.
2016/0148821 A1 5/2016 Singh
2016/0152649 A1 6/2016 Gordon
2016/0153088 A1 6/2016 Tsuji et al.
2016/0155629 A1 6/2016 Hawryluk et al.
2016/0163556 A1 6/2016 Briggs et al.
2016/0163558 A1 6/2016 Hudson et al.
2016/0163561 A1 6/2016 Hudson et al.
2016/0163711 A1 6/2016 Arndt et al.
2016/0163972 A1 6/2016 Swaminathan et al.
2016/0168699 A1 6/2016 Fukazawa et al.
2016/0168704 A1 6/2016 Choi et al.
2016/0169766 A1 6/2016 Ishibashi et al.
2016/0172189 A1 6/2016 Tapily
2016/0172296 A1 6/2016 Lim et al.
2016/0175805 A1 6/2016 Catchpole et al.
2016/0177448 A1 6/2016 Ikeda
2016/0181117 A1 6/2016 Arghavani et al.
2016/0181128 A1 6/2016 Mori
2016/0181368 A1 6/2016 Weeks
2016/0190137 A1 6/2016 Tsai et al.
2016/0195331 A1 7/2016 Hyon et al.
2016/0196969 A1 7/2016 Berry et al.
2016/0196970 A1 7/2016 Takamure et al.
2016/0203995 A1 7/2016 Kanarik et al.
2016/0204005 A1 7/2016 Oki et al.
2016/0204436 A1 7/2016 Barker et al.
2016/0211135 A1 7/2016 Noda et al.
2016/0211147 A1 7/2016 Fukazawa
2016/0211166 A1 7/2016 Yan et al.
2016/0215387 A1 7/2016 Liu et al.
2016/0217857 A1 7/2016 Paudel
2016/0218028 A1 7/2016 Schaller et al.
2016/0222504 A1 8/2016 Haukka et al.
2016/0222509 A1 8/2016 Honma
2016/0222516 A1 8/2016 Ikeda et al.
2016/0225588 A1 8/2016 Shaikh et al.
2016/0225607 A1 8/2016 Yamamoto et al.
2016/0225632 A1 8/2016 Shaikh et al.
2016/0237559 A1 8/2016 Tsuji
2016/0245704 A1 8/2016 Osaka et al.
2016/0256187 A1 9/2016 Shelton et al.
2016/0268102 A1 9/2016 White
2016/0268107 A1 9/2016 White
2016/0273095 A1 9/2016 Lin et al.
2016/0273101 A1 9/2016 Komori et al.
2016/0273106 A1 9/2016 Kanjolia et al.
2016/0273128 A1 9/2016 Kang
2016/0276148 A1 9/2016 Qian et al.
2016/0276212 A1 9/2016 Horikoshi
2016/0276481 A1* 9/2016 Wu .................... H01L 21/3065
2016/0279629 A1 9/2016 Michishita et al.
2016/0281223 A1 9/2016 Sowa et al.
2016/0281230 A1 9/2016 Varadarajan et al.
2016/0284517 A1 9/2016 Saido
2016/0284542 A1 9/2016 Noda et al.
2016/0289828 A1 10/2016 Shero et al.
2016/0293398 A1 10/2016 Danek et al.
2016/0293609 A1 10/2016 Jha et al.
2016/0305015 A1 10/2016 Nakamura et al.
2016/0307739 A1 10/2016 Lee et al.
2016/0307740 A1 10/2016 Kim et al.
2016/0307766 A1 10/2016 Jongbloed et al.
2016/0312360 A1 10/2016 Rasheed et al.
2016/0314960 A1 10/2016 Cheng et al.
2016/0314962 A1 10/2016 Higashino et al.
2016/0314964 A1 10/2016 Tang et al.
2016/0314967 A1 10/2016 Tolle
2016/0315168 A1 10/2016 Dussarrat et al.
2016/0334709 A1 11/2016 Huli et al.
2016/0336178 A1 11/2016 Swaminathan et al.
2016/0336392 A1 11/2016 Tominaga et al.
2016/0343612 A1 11/2016 Wang et al.
2016/0345384 A1 11/2016 Zhang et al.
2016/0351413 A1 12/2016 Schmidt et al.
2016/0351747 A1 12/2016 Forrest et al.
2016/0358772 A1 12/2016 Xie
2016/0362783 A1 12/2016 Tolle et al.
2016/0362813 A1 12/2016 Bao et al.
2016/0365280 A1 12/2016 Brink et al.
2016/0365414 A1 12/2016 Peng et al.
2016/0372321 A1 12/2016 Krishnan et al.
2016/0372365 A1 12/2016 Tang et al.
2016/0372744 A1 12/2016 Essaki et al.
2016/0376700 A1 12/2016 Haukka
2016/0376701 A1 12/2016 Takewaki et al.
2016/0376704 A1 12/2016 Raisanen
2016/0379826 A9 12/2016 Arghavani et al.
2016/0379851 A1 12/2016 Swaminathan et al.
2016/0381732 A1 12/2016 Moench et al.
2017/0009347 A1 1/2017 Jang et al.
2017/0009367 A1 1/2017 Harris et al.
2017/0011889 A1 1/2017 Winkler et al.
2017/0011926 A1 1/2017 Harada et al.
2017/0011950 A1 1/2017 Schmotzer
2017/0018477 A1 1/2017 Kato
2017/0018570 A1 1/2017 Lue et al.
2017/0022612 A1 1/2017 Lei et al.
2017/0025280 A1 1/2017 Milligan
2017/0025291 A1 1/2017 Lin
2017/0029945 A1 2/2017 Kamakura
2017/0032942 A1 2/2017 Walfried
2017/0032943 A1 2/2017 Spaulding et al.
2017/0032992 A1 2/2017 Hoechbauer
2017/0033004 A1 2/2017 Siew et al.
2017/0037513 A1 2/2017 Haukka
2017/0040146 A1 2/2017 Huang et al.
2017/0040164 A1 2/2017 Wang et al.
2017/0040198 A1 2/2017 Lin et al.
2017/0040206 A1 2/2017 Schmotzer et al.
2017/0044664 A1 2/2017 Dussarrat et al.
2017/0044665 A1 2/2017 Shon et al.
2017/0044666 A1 2/2017 Jang et al.
2017/0047446 A1 2/2017 Margetis et al.
2017/0051402 A1 2/2017 Mori
2017/0051405 A1 2/2017 Fukazawa et al.
2017/0051406 A1 2/2017 Mori et al.
2017/0051408 A1 2/2017 Kosuke et al.
2017/0053811 A1 2/2017 Fung et al.
2017/0058402 A1 3/2017 Wenxu et al.
2017/0062204 A1 3/2017 Suzuki et al.
2017/0062209 A1 3/2017 Shiba
2017/0062210 A1 3/2017 Visser et al.
2017/0062218 A1 3/2017 Duan et al.
2017/0062224 A1 3/2017 Fu et al.

(56) References Cited

U.S. PATENT DOCUMENTS

2017/0062258 A1 3/2017 Bluck
2017/0069725 A1 3/2017 Bhimarasetti et al.
2017/0091320 A1 3/2017 Psota et al.
2017/0092469 A1 3/2017 Kurita et al.
2017/0092531 A1 3/2017 Coomer
2017/0092535 A1 3/2017 Kimihiko et al.
2017/0092847 A1 3/2017 Kim et al.
2017/0100742 A1 4/2017 Pore et al.
2017/0102612 A1 4/2017 Meyers et al.
2017/0103907 A1 4/2017 Chu et al.
2017/0104061 A1 4/2017 Peng et al.
2017/0107621 A1 4/2017 Suemori
2017/0110313 A1 4/2017 Tang et al.
2017/0110601 A1 4/2017 Blomberg et al.
2017/0114460 A1 4/2017 Kim et al.
2017/0114464 A1 4/2017 Iriuda et al.
2017/0114465 A1 4/2017 Kalutarage et al.
2017/0117141 A1 4/2017 Zhu et al.
2017/0117202 A1 4/2017 Tang et al.
2017/0117203 A1 4/2017 Tang et al.
2017/0117222 A1 4/2017 Kim et al.
2017/0121845 A1 5/2017 Grutzmacher et al.
2017/0130332 A1 5/2017 Stumpf
2017/0136578 A1 5/2017 Yoshimura
2017/0140924 A1 5/2017 Suzuki et al.
2017/0140925 A1 5/2017 Suzuki et al.
2017/0145564 A1 5/2017 Bertuch et al.
2017/0146909 A1 5/2017 Smith et al.
2017/0148918 A1 5/2017 Ye et al.
2017/0152968 A1 6/2017 Raj et al.
2017/0154757 A1 6/2017 Winkler et al.
2017/0154770 A1 6/2017 Margetis et al.
2017/0154895 A1 6/2017 Huo
2017/0159177 A1 6/2017 Monsma et al.
2017/0165624 A1 6/2017 Ravoin et al.
2017/0167023 A1 6/2017 Proia et al.
2017/0170033 A1 6/2017 Okabe et al.
2017/0173696 A1 6/2017 Sheinman
2017/0175290 A1 6/2017 Chen et al.
2017/0178899 A1 6/2017 Kabansky et al.
2017/0178939 A1 6/2017 Omori
2017/0178942 A1 6/2017 Sakata et al.
2017/0179036 A1 6/2017 Chen et al.
2017/0186621 A1 6/2017 Zaitsu
2017/0186754 A1 6/2017 Blomberg et al.
2017/0191159 A1 7/2017 Polyak et al.
2017/0191164 A1 7/2017 Alokozai et al.
2017/0191685 A1 7/2017 Ronne et al.
2017/0191861 A1 7/2017 Rondano et al.
2017/0196562 A1 7/2017 Shelton
2017/0200622 A1 7/2017 Shiokawa et al.
2017/0204516 A1 7/2017 Nguyen et al.
2017/0213960 A1 7/2017 de Araujo et al.
2017/0216762 A1 8/2017 Shugrue et al.
2017/0218515 A1 8/2017 Shin et al.
2017/0222008 A1 8/2017 Hsu et al.
2017/0226636 A1 8/2017 Xiao
2017/0232457 A1 8/2017 Toshiki et al.
2017/0233868 A1 8/2017 Donoso et al.
2017/0243734 A1 8/2017 Ishikawa et al.
2017/0250068 A1 8/2017 Ishikawa et al.
2017/0250075 A1 8/2017 Caymax et al.
2017/0253968 A1 9/2017 Yahata
2017/0256393 A1 9/2017 Kim et al.
2017/0256417 A1 9/2017 Chou
2017/0256429 A1 9/2017 Lawson et al.
2017/0260649 A1 9/2017 Coomer
2017/0263437 A1 9/2017 Li et al.
2017/0263438 A1 9/2017 Li et al.
2017/0267527 A1 9/2017 Kim et al.
2017/0267531 A1 9/2017 Huakka
2017/0271143 A1 9/2017 Fukiage et al.
2017/0271191 A1 9/2017 Yoo et al.
2017/0271256 A1 9/2017 Inatsuka
2017/0271501 A1 9/2017 Avci et al.
2017/0278705 A1 9/2017 Murakami et al.
2017/0278707 A1 9/2017 Margetis et al.
2017/0283312 A1 10/2017 Lee et al.
2017/0283313 A1 10/2017 Lee et al.
2017/0287681 A1 10/2017 Nitadori et al.
2017/0287744 A1 10/2017 Kobayashi et al.
2017/0294318 A1 10/2017 Yoshida et al.
2017/0294339 A1 10/2017 Tapily
2017/0294499 A1 10/2017 Lu et al.
2017/0301519 A1 10/2017 Naim et al.
2017/0301542 A1 10/2017 Maes et al.
2017/0303382 A1 10/2017 Smith et al.
2017/0306478 A1 10/2017 Raisanen et al.
2017/0306479 A1 10/2017 Raisanen et al.
2017/0306480 A1 10/2017 Zhu et al.
2017/0306494 A1 10/2017 Lin et al.
2017/0309490 A1 10/2017 Ogawa
2017/0309528 A1 10/2017 Bansal et al.
2017/0314125 A1 11/2017 Fenwick et al.
2017/0316933 A1 11/2017 Xie et al.
2017/0316940 A1 11/2017 Ishikawa et al.
2017/0317194 A1 11/2017 Tang et al.
2017/0323783 A1 11/2017 Sanchez et al.
2017/0323784 A1 11/2017 Faguet et al.
2017/0338111 A1 11/2017 Takamure et al.
2017/0338133 A1 11/2017 Tan et al.
2017/0338134 A1 11/2017 Tan et al.
2017/0338192 A1 11/2017 Lee et al.
2017/0342559 A1 11/2017 Fukazawa et al.
2017/0343896 A1 11/2017 Darling et al.
2017/0345674 A1 11/2017 Ranjan et al.
2017/0350688 A1 12/2017 Boyd et al.
2017/0358445 A1 12/2017 O'Shaugnessy et al.
2017/0358482 A1 12/2017 Chen et al.
2017/0358670 A1 12/2017 Kub et al.
2017/0362710 A1 12/2017 Ge et al.
2017/0365467 A1 12/2017 Shimamoto et al.
2017/0369993 A1 12/2017 Sun
2017/0372884 A1 12/2017 Margetis et al.
2017/0372919 A1 12/2017 Manna et al.
2017/0373188 A1 12/2017 Mochizuki et al.
2018/0005814 A1 1/2018 Kumar et al.
2018/0010243 A1 1/2018 Lee et al.
2018/0010247 A1 1/2018 Niskanen
2018/0011052 A1 1/2018 Andersson et al.
2018/0012792 A1 1/2018 Zhu
2018/0019165 A1 1/2018 Baum et al.
2018/0025890 A1 1/2018 Choi et al.
2018/0025907 A1 1/2018 Kalutarage et al.
2018/0025939 A1 1/2018 Kovalgin et al.
2018/0033614 A1 2/2018 Chandra et al.
2018/0033616 A1 2/2018 Masaru
2018/0033625 A1 2/2018 Yoo
2018/0033645 A1 2/2018 Saido et al.
2018/0033674 A1 2/2018 Jeong
2018/0033679 A1 2/2018 Pore
2018/0040746 A1 2/2018 Johnson et al.
2018/0044800 A1 2/2018 Hendrix et al.
2018/0047591 A1 2/2018 Ogo
2018/0047621 A1 2/2018 Armini
2018/0047749 A1 2/2018 Kim
2018/0053660 A1 2/2018 Jandl et al.
2018/0053769 A1 2/2018 Kim et al.
2018/0057931 A1 3/2018 Cha et al.
2018/0057934 A1 3/2018 Cooper et al.
2018/0057937 A1 3/2018 Lee et al.
2018/0061628 A1 3/2018 Ou et al.
2018/0061851 A1 3/2018 Ootsuka
2018/0068844 A1 3/2018 Chen et al.
2018/0068862 A1 3/2018 Terakura et al.
2018/0068950 A1 3/2018 Bruley et al.
2018/0069019 A1 3/2018 Kim et al.
2018/0076021 A1 3/2018 Fukushima et al.
2018/0083435 A1 3/2018 Redler
2018/0087152 A1 3/2018 Yoshida
2018/0087154 A1 3/2018 Pore et al.
2018/0087156 A1 3/2018 Kohei et al.
2018/0090583 A1 3/2018 Choi et al.
2018/0094350 A1 4/2018 Verghese et al.

(56) References Cited

U.S. PATENT DOCUMENTS

2018/0094351 A1 4/2018 Verghese et al.
2018/0096821 A1 4/2018 Lubomirsky
2018/0096844 A1 4/2018 Dutartre et al.
2018/0097076 A1 4/2018 Cheng et al.
2018/0102276 A1 4/2018 Zhu et al.
2018/0105701 A1 4/2018 Larsson et al.
2018/0105930 A1 4/2018 Kang et al.
2018/0108587 A1 4/2018 Jiang
2018/0114680 A1 4/2018 Kim et al.
2018/0119283 A1 5/2018 Fukazawa
2018/0122642 A1 5/2018 Raisanen
2018/0122709 A1 5/2018 Xie
2018/0122959 A1 5/2018 Calka et al.
2018/0126379 A1 5/2018 Ramsey et al.
2018/0127876 A1 5/2018 Tolle et al.
2018/0130652 A1 5/2018 Pettinger et al.
2018/0130701 A1 5/2018 Chun
2018/0135172 A1 5/2018 Nogami et al.
2018/0135173 A1 5/2018 Kim et al.
2018/0135179 A1 5/2018 Toshiyuki et al.
2018/0138036 A1 5/2018 Baldesseroni et al.
2018/0142353 A1 5/2018 Tetsuya et al.
2018/0142357 A1 5/2018 Yoshikazu
2018/0148832 A1 5/2018 Chatterjee et al.
2018/0151346 A1 5/2018 Blanquart
2018/0151358 A1 5/2018 Margetis et al.
2018/0151588 A1 5/2018 Tsutsumi et al.
2018/0155832 A1 6/2018 Hamalainen et al.
2018/0155836 A1 6/2018 Arai et al.
2018/0158688 A1 6/2018 Chen
2018/0158716 A1 6/2018 Konkola et al.
2018/0163305 A1 6/2018 Batzer et al.
2018/0166258 A1 6/2018 Kim et al.
2018/0166315 A1 6/2018 Coomer
2018/0171472 A1 6/2018 Yamada et al.
2018/0171475 A1 6/2018 Maes et al.
2018/0171477 A1 6/2018 Kim et al.
2018/0172172 A1 6/2018 Oehler et al.
2018/0173109 A1 6/2018 Gronheid et al.
2018/0174801 A1 6/2018 Chen et al.
2018/0174826 A1 6/2018 Raaijmakers et al.
2018/0179625 A1 6/2018 Takagi et al.
2018/0180509 A1 6/2018 Sawachi et al.
2018/0182613 A1 6/2018 Blanquart et al.
2018/0182618 A1 6/2018 Blanquart et al.
2018/0187303 A1 7/2018 Gatineau et al.
2018/0189923 A1 7/2018 Zhong et al.
2018/0190496 A1 7/2018 Ashihara et al.
2018/0195174 A1 7/2018 Kim et al.
2018/0204733 A1 7/2018 Sherpa et al.
2018/0209042 A1 7/2018 Wu et al.
2018/0211834 A1 7/2018 Takamure et al.
2018/0223047 A1 8/2018 Xiao et al.
2018/0223429 A1 8/2018 Fukazawa et al.
2018/0230595 A1 8/2018 Suda et al.
2018/0233372 A1 8/2018 Vayrynen et al.
2018/0245215 A1 8/2018 Lei et al.
2018/0246101 A1 8/2018 Sasisekharan et al.
2018/0254211 A1 9/2018 Kosakai et al.
2018/0258532 A1 9/2018 Kato et al.
2018/0265294 A1 9/2018 Hayashi
2018/0265972 A1 9/2018 Firouzdor et al.
2018/0265973 A1 9/2018 Firouzdor et al.
2018/0269057 A1 9/2018 Lei et al.
2018/0274098 A1 9/2018 Takagi et al.
2018/0277338 A1 9/2018 Fukada et al.
2018/0277423 A1 9/2018 Lottes
2018/0286638 A1 10/2018 Susa
2018/0286663 A1 10/2018 Kobayashi et al.
2018/0286668 A1 10/2018 Baum et al.
2018/0286672 A1 10/2018 Van Aerde et al.
2018/0286675 A1 10/2018 Blomberg et al.
2018/0286711 A1 10/2018 Oosterlaken et al.
2018/0294187 A1 10/2018 Thombare et al.
2018/0305247 A1 10/2018 Feng et al.
2018/0308686 A1 10/2018 Xie et al.
2018/0308701 A1 10/2018 Na et al.
2018/0312966 A1 11/2018 Chan et al.
2018/0315597 A1 11/2018 Varadarajan et al.
2018/0315838 A1 11/2018 Morrow et al.
2018/0323055 A1 11/2018 Woodruff et al.
2018/0323056 A1 11/2018 Woodruff et al.
2018/0323059 A1* 11/2018 Bhargava ................ C30B 29/06
2018/0325414 A1 11/2018 Marashdeh et al.
2018/0327892 A1 11/2018 Wu et al.
2018/0327898 A1 11/2018 Wu et al.
2018/0327899 A1 11/2018 Wu et al.
2018/0331117 A1 11/2018 Titus et al.
2018/0337087 A1 11/2018 Sandhu et al.
2018/0350587 A1 12/2018 Jia et al.
2018/0350588 A1 12/2018 Raisanen et al.
2018/0350620 A1 12/2018 Zaitsu et al.
2018/0350653 A1 12/2018 Jeong et al.
2018/0355480 A1 12/2018 Kondo
2018/0355484 A1 12/2018 Lansalot-Matras et al.
2018/0358222 A1 12/2018 Venkatasubramanian et al.
2018/0363131 A1 12/2018 Lee et al.
2018/0363139 A1 12/2018 Rajavelu et al.
2018/0366314 A1 12/2018 Niskanen et al.
2018/0371610 A1 12/2018 Banerjee et al.
2019/0003050 A1 1/2019 Dezelah et al.
2019/0003052 A1 1/2019 Shero et al.
2019/0006797 A1 1/2019 Paynter et al.
2019/0013199 A1 1/2019 Bhargava et al.
2019/0019670 A1 1/2019 Lin et al.
2019/0019714 A1 1/2019 Kosakai et al.
2019/0027573 A1 1/2019 Zhu et al.
2019/0027583 A1 1/2019 Margetis et al.
2019/0027584 A1 1/2019 Margetis et al.
2019/0027605 A1 1/2019 Tolle et al.
2019/0032209 A1 1/2019 Huggare
2019/0032998 A1 1/2019 Jdira et al.
2019/0035605 A1 1/2019 Suzuki
2019/0035647 A1 1/2019 Lee et al.
2019/0035698 A1 1/2019 Tanaka
2019/0035810 A1 1/2019 Chun et al.
2019/0040529 A1 2/2019 Verbaas et al.
2019/0046947 A1 2/2019 Strohm et al.
2019/0051544 A1 2/2019 Verbaas
2019/0051548 A1 2/2019 den Hartog Besselink et al.
2019/0051555 A1 2/2019 Hill et al.
2019/0057857 A1 2/2019 Ishikawa et al.
2019/0057858 A1 2/2019 Hausmann et al.
2019/0058043 A1 2/2019 Dewey et al.
2019/0062907 A1 2/2019 Kim et al.
2019/0062917 A1 2/2019 Sung et al.
2019/0066978 A1 2/2019 Um et al.
2019/0066997 A1 2/2019 Klaver et al.
2019/0067003 A1 2/2019 Zope et al.
2019/0067004 A1 2/2019 Kohen et al.
2019/0067014 A1 2/2019 Shrestha et al.
2019/0067016 A1 2/2019 Zhu et al.
2019/0067085 A1 2/2019 Kweskin
2019/0067094 A1 2/2019 Zope et al.
2019/0067095 A1 2/2019 Zhu et al.
2019/0078206 A1 3/2019 Wu et al.
2019/0080903 A1 3/2019 Abel et al.
2019/0081072 A1 3/2019 Chun et al.
2019/0085451 A1 3/2019 Lei et al.
2019/0086807 A1 3/2019 Kachel et al.
2019/0088555 A1 3/2019 Xie et al.
2019/0089143 A1 3/2019 Malone et al.
2019/0093221 A1 3/2019 Jdira et al.
2019/0096708 A1 3/2019 Sharma
2019/0106788 A1 4/2019 Hawkins et al.
2019/0109002 A1 4/2019 Mattinen et al.
2019/0109009 A1 4/2019 Longrie et al.
2019/0109043 A1 4/2019 Wang et al.
2019/0112711 A1 4/2019 Lyons et al.
2019/0115206 A1 4/2019 Kim et al.
2019/0115237 A1 4/2019 den Hartog Besselink et al.
2019/0115451 A1 4/2019 Lee et al.
2019/0131124 A1 5/2019 Kohen et al.
2019/0140067 A1 5/2019 Zhu et al.

(56) References Cited

U.S. PATENT DOCUMENTS

| | | | |
|---|---|---|---|
| 2019/0148177 | A1 | 5/2019 | Yin et al. |
| 2019/0148224 | A1 | 5/2019 | Kuroda et al. |
| 2019/0148398 | A1 | 5/2019 | Kim et al. |
| 2019/0148556 | A1 | 5/2019 | Wang et al. |
| 2019/0153593 | A1 | 5/2019 | Zhu et al. |
| 2019/0157054 | A1 | 5/2019 | White et al. |
| 2019/0157067 | A1 | 5/2019 | Bhuyan et al. |
| 2019/0163056 | A1 | 5/2019 | Maes et al. |
| 2019/0164763 | A1 | 5/2019 | Raisanen et al. |
| 2019/0172701 | A1 | 6/2019 | Jia et al. |
| 2019/0172714 | A1 | 6/2019 | Bobek et al. |
| 2019/0176435 | A1 | 6/2019 | Bellman et al. |
| 2019/0181002 | A1 | 6/2019 | Iijima et al. |
| 2019/0185999 | A1 | 6/2019 | Shanbhag et al. |
| 2019/0189447 | A1 | 6/2019 | Kamp et al. |
| 2019/0198297 | A1 | 6/2019 | Aramaki et al. |
| 2019/0198359 | A1 | 6/2019 | Kamimura et al. |
| 2019/0198571 | A1 | 6/2019 | Xu et al. |
| 2019/0204029 | A1 | 7/2019 | Tanabe |
| 2019/0211450 | A1 | 7/2019 | Adachi et al. |
| 2019/0217277 | A1 | 7/2019 | Jeon et al. |
| 2019/0221433 | A1 | 7/2019 | Raisanen et al. |
| 2019/0229008 | A1 | 7/2019 | Rokkam et al. |
| 2019/0233446 | A1 | 8/2019 | MacDonald et al. |
| 2019/0233940 | A1 | 8/2019 | Guo et al. |
| 2019/0237325 | A1 | 8/2019 | Wang et al. |
| 2019/0237327 | A1 | 8/2019 | Kohen et al. |
| 2019/0244803 | A1 | 8/2019 | Suzuki |
| 2019/0249300 | A1 | 8/2019 | Hatanpaa et al. |
| 2019/0249303 | A1 | 8/2019 | Kuroda et al. |
| 2019/0252195 | A1 | 8/2019 | Haukka |
| 2019/0252196 | A1 | 8/2019 | Vayrynen et al. |
| 2019/0259611 | A1 | 8/2019 | Nakano et al. |
| 2019/0259612 | A1 | 8/2019 | Nozawa et al. |
| 2019/0264324 | A1 | 8/2019 | Shugrue et al. |
| 2019/0271078 | A1 | 9/2019 | Raisanen et al. |
| 2019/0272981 | A1 | 9/2019 | Xu et al. |
| 2019/0272993 | A1 | 9/2019 | Mattinen et al. |
| 2019/0273133 | A1 | 9/2019 | Agrawal et al. |
| 2019/0276934 | A1 | 9/2019 | Verghese et al. |
| 2019/0287769 | A1 | 9/2019 | Blomberg et al. |
| 2019/0295837 | A1 | 9/2019 | Pore et al. |
| 2019/0301014 | A1 | 10/2019 | Pierreux et al. |
| 2019/0304776 | A1 | 10/2019 | Choi |
| 2019/0304780 | A1 | 10/2019 | Kohen et al. |
| 2019/0304790 | A1 | 10/2019 | Mousa et al. |
| 2019/0304821 | A1 | 10/2019 | Pierreux et al. |
| 2019/0311894 | A1 | 10/2019 | Girard et al. |
| 2019/0311897 | A1 | 10/2019 | Kang et al. |
| 2019/0311940 | A1 | 10/2019 | Choi et al. |
| 2019/0318910 | A1 | 10/2019 | Mori |
| 2019/0318923 | A1 | 10/2019 | Blanquart et al. |
| 2019/0319100 | A1 | 10/2019 | Chen et al. |
| 2019/0322812 | A1 | 10/2019 | Wojtecki et al. |
| 2019/0330740 | A1 | 10/2019 | Klaver |
| 2019/0333753 | A1 | 10/2019 | Ueda et al. |
| 2019/0333761 | A1 | 10/2019 | Tois et al. |
| 2019/0338418 | A1 | 11/2019 | Goradia et al. |
| 2019/0346300 | A1 | 11/2019 | Kim et al. |
| 2019/0348261 | A1 | 11/2019 | Lin et al. |
| 2019/0348273 | A1 | 11/2019 | Tang et al. |
| 2019/0348515 | A1 | 11/2019 | Li et al. |
| 2019/0362970 | A1 | 11/2019 | Wang et al. |
| 2019/0362989 | A1 | 11/2019 | Reuter et al. |
| 2019/0363006 | A1 | 11/2019 | Min |
| 2019/0363015 | A1 | 11/2019 | Cheng et al. |
| 2019/0368040 | A1 | 12/2019 | Kachel et al. |
| 2019/0368041 | A1 | 12/2019 | Sreeram et al. |
| 2019/0371594 | A1 | 12/2019 | Niskanen et al. |
| 2019/0371640 | A1 | 12/2019 | Raisanen et al. |
| 2019/0375638 | A1 | 12/2019 | Haukka |
| 2019/0376180 | A1 | 12/2019 | Niskanen |
| 2019/0378711 | A1 | 12/2019 | Suzuki et al. |
| 2019/0378916 | A1 | 12/2019 | Tang et al. |
| 2019/0385907 | A1 | 12/2019 | Gottheim et al. |
| 2019/0390338 | A1 | 12/2019 | Raisanen et al. |
| 2019/0390343 | A1 | 12/2019 | Min et al. |
| 2019/0393304 | A1 | 12/2019 | Guillorn et al. |
| 2019/0393308 | A1 | 12/2019 | Lo et al. |
| 2020/0002811 | A1 | 1/2020 | Sreeram et al. |
| 2020/0002812 | A1 | 1/2020 | Lee et al. |
| 2020/0012081 | A1 | 1/2020 | Komai |
| 2020/0013612 | A1 | 1/2020 | Blanquart et al. |
| 2020/0013613 | A1 | 1/2020 | Blanquart |
| 2020/0013626 | A1 | 1/2020 | Longrie et al. |
| 2020/0013629 | A1 | 1/2020 | de Roest et al. |
| 2020/0018421 | A1 | 1/2020 | Shugrue |
| 2020/0035489 | A1 | 1/2020 | Huang et al. |
| 2020/0040458 | A1 | 2/2020 | Ma et al. |
| 2020/0048768 | A1 | 2/2020 | Wiegers et al. |
| 2020/0052056 | A1 | 2/2020 | Park et al. |
| 2020/0052089 | A1 | 2/2020 | Yu et al. |
| 2020/0056282 | A1 | 2/2020 | Raisanen et al. |
| 2020/0056286 | A1 | 2/2020 | Shero et al. |
| 2020/0058469 | A1 | 2/2020 | Ranjan et al. |
| 2020/0063262 | A1 | 2/2020 | Katou et al. |
| 2020/0064737 | A1 | 2/2020 | de Roest |
| 2020/0066512 | A1 | 2/2020 | Tois et al. |
| 2020/0066552 | A1 | 2/2020 | Susa |
| 2020/0080200 | A1 | 3/2020 | Um et al. |
| 2020/0083054 | A1 | 3/2020 | Väyrynen et al. |
| 2020/0083375 | A1 | 3/2020 | Tolle et al. |
| 2020/0083469 | A1 | 3/2020 | Lhullier |
| 2020/0102649 | A1 | 4/2020 | Reed |
| 2020/0102653 | A1 | 4/2020 | Muralidhar et al. |
| 2020/0105579 | A1 | 4/2020 | Zhu |
| 2020/0105594 | A1 | 4/2020 | Cheng et al. |
| 2020/0105895 | A1 | 4/2020 | Tang et al. |
| 2020/0109472 | A1 | 4/2020 | Um et al. |
| 2020/0111669 | A1 | 4/2020 | Zaitsu et al. |
| 2020/0111690 | A1 | 4/2020 | Oosterlaken |
| 2020/0118811 | A1 | 4/2020 | Utsuno et al. |
| 2020/0118815 | A1 | 4/2020 | Fukazawa et al. |
| 2020/0118817 | A1 | 4/2020 | Blomberg et al. |
| 2020/0119038 | A1 | 4/2020 | Hopkins et al. |
| 2020/0126771 | A1 | 4/2020 | Roh et al. |
| 2020/0126840 | A1 | 4/2020 | Roh et al. |
| 2020/0131634 | A1 | 4/2020 | Gao et al. |
| 2020/0135512 | A1 | 4/2020 | Oosterlaken et al. |
| 2020/0135915 | A1 | 4/2020 | Savant et al. |
| 2020/0140995 | A1 | 5/2020 | Blanquart et al. |
| 2020/0141003 | A1 | 5/2020 | Lee et al. |
| 2020/0144058 | A1 | 5/2020 | Kohen |
| 2020/0152473 | A1 | 5/2020 | Tapily et al. |
| 2020/0152750 | A1 | 5/2020 | Morrow et al. |
| 2020/0161129 | A1 | 5/2020 | Mattinen et al. |
| 2020/0161438 | A1 | 5/2020 | Tang et al. |
| 2020/0168485 | A1 | 5/2020 | Fluit |
| 2020/0279758 | A1 | 5/2020 | Sharma |
| 2020/0173020 | A1 | 6/2020 | Huggare |
| 2020/0176244 | A1 | 6/2020 | Lee et al. |
| 2020/0176246 | A1 | 6/2020 | Huotari et al. |
| 2020/0181770 | A1 | 6/2020 | Longrie et al. |
| 2020/0185249 | A1 | 6/2020 | Rice et al. |
| 2020/0185257 | A1 | 6/2020 | Nishiwaki |
| 2020/0194253 | A1 | 6/2020 | Banerjee et al. |
| 2020/0194268 | A1 | 6/2020 | Sharma |
| 2020/0203157 | A1 | 6/2020 | Su |
| 2020/0224309 | A1 | 7/2020 | Sreeram et al. |
| 2020/0224311 | A1 | 7/2020 | Niskanen et al. |
| 2020/0227243 | A1 | 7/2020 | Kim et al. |
| 2020/0227250 | A1 | 7/2020 | Pore et al. |
| 2020/0227325 | A1 | 7/2020 | Xie et al. |
| 2020/0232096 | A1 | 7/2020 | Hatanpää et al. |
| 2020/0234989 | A1 | 7/2020 | Jeong |
| 2020/0251328 | A1 | 8/2020 | Zaitsu et al. |
| 2020/0258766 | A1 | 8/2020 | Garssen et al. |
| 2020/0266057 | A1 | 8/2020 | Lee et al. |
| 2020/0266097 | A1 | 8/2020 | Liu et al. |
| 2020/0266098 | A1 | 8/2020 | Pore et al. |
| 2020/0266208 | A1 | 8/2020 | Kim et al. |
| 2020/0270749 | A1 | 8/2020 | Li et al. |
| 2020/0270752 | A1 | 8/2020 | Pierreux et al. |
| 2020/0273728 | A1 | 8/2020 | Benjaminson et al. |

(56) References Cited

U.S. PATENT DOCUMENTS

2020/0273729 A1 8/2020 Verbaas et al.
2020/0279721 A1 9/2020 White et al.
2020/0283893 A1 9/2020 Byun et al.
2020/0283894 A1 9/2020 Lehn et al.
2020/0284467 A1 9/2020 Lindeboom et al.
2020/0286725 A1 9/2020 Sharma et al.
2020/0286726 A1 9/2020 Shero et al.
2020/0294789 A1 9/2020 Woodruff et al.
2020/0303180 A1 9/2020 Kim et al.
2020/0303196 A1 9/2020 Chen et al.
2020/0309455 A1 10/2020 Fluit
2020/0312652 A1 10/2020 Kang et al.
2020/0312681 A1 10/2020 Tanaka et al.
2020/0318237 A1 10/2020 Fukazawa
2020/0321209 A1 10/2020 Ishikawa et al.
2020/0332416 A1 10/2020 Fluit
2020/0340113 A1 10/2020 Hatanpää et al.
2020/0340138 A1 10/2020 Tolle et al.
2020/0343134 A1 10/2020 Kovalgin et al.
2020/0343358 A1 10/2020 Zhu et al.
2020/0350193 A1 11/2020 Garssen
2020/0354836 A1 11/2020 Yednak et al.
2020/0355296 A1 11/2020 Shugrue et al.
2020/0357631 A1 11/2020 Ueda
2020/0365391 A1 11/2020 Blanquart et al.
2020/0365433 A1 11/2020 de Ridder et al.
2020/0365434 A1 11/2020 de Ridder
2020/0365444 A1 11/2020 Hill et al.
2020/0373152 A1 11/2020 Blanquart
2020/0385861 A1 12/2020 Deye et al.
2020/0385867 A1 12/2020 Kim et al.
2020/0385868 A1 12/2020 Kim et al.
2020/0395199 A1 12/2020 Miyama
2020/0395209 A1 12/2020 Yoshimoto et al.
2020/0395444 A1 12/2020 Lo et al.
2020/0402846 A1 12/2020 Collins et al.
2021/0002762 A1 1/2021 Jun et al.
2021/0005449 A1 1/2021 Blanquart et al.
2021/0005450 A1 1/2021 Mattinen et al.
2021/0005723 A1 1/2021 Tang et al.
2021/0013010 A1 1/2021 Yoshikawa et al.
2021/0013034 A1 1/2021 Wu et al.
2021/0013037 A1 1/2021 Sun et al.
2021/0013042 A1 1/2021 Väyrynen et al.
2021/0013085 A1 1/2021 Roh et al.
2021/0020429 A1 1/2021 Khazaka et al.
2021/0020431 A1 1/2021 Blanquart et al.
2021/0020432 A1 1/2021 Blanquart
2021/0020467 A1 1/2021 Sekiguchi
2021/0020470 A1 1/2021 Lee
2021/0028021 A1 1/2021 Mousa et al.
2021/0017648 A1 2/2021 Kubota et al.
2021/0032754 A1 2/2021 White et al.
2021/0033977 A1 2/2021 Raaijmakers et al.
2021/0035785 A1 2/2021 Jeong et al.
2021/0035786 A1 2/2021 Jeong et al.
2021/0035802 A1 2/2021 Tolle et al.
2021/0035824 A1 2/2021 de Ridder
2021/0035839 A1 2/2021 de Ridder
2021/0035840 A1 2/2021 de Ridder et al.
2021/0035841 A1 2/2021 Fluit
2021/0035842 A1 2/2021 de Ridder
2021/0035854 A1 2/2021 Yoo et al.
2021/0040613 A1 2/2021 White et al.
2021/0040615 A1 2/2021 White et al.
2021/0043444 A1 2/2021 Blanquart
2021/0050231 A1 2/2021 Oosterlaken
2021/0054500 A1 2/2021 Zope et al.
2021/0054504 A1 2/2021 Wang et al.
2021/0057214 A1 2/2021 Kengoyama et al.
2021/0057223 A1 2/2021 Stevens et al.
2021/0057275 A1 2/2021 Pierreux et al.
2021/0057570 A1 2/2021 Lin et al.
2021/0066075 A1 3/2021 Zhang et al.
2021/0066079 A1 3/2021 Lima et al.
2021/0066080 A1 3/2021 Mattinen et al.
2021/0066083 A1 3/2021 Haukka
2021/0066084 A1 3/2021 Raisanen et al.
2021/0070783 A1 3/2021 Odedra et al.
2021/0071296 A1 3/2021 Watarai et al.
2021/0071298 A1 3/2021 Maes et al.
2021/0074527 A1 3/2021 Lee et al.
2021/0082692 A1 3/2021 Kikuchi
2021/0090878 A1 3/2021 Kang et al.
2021/0095372 A1 4/2021 Minjauw et al.
2021/0102289 A1 4/2021 Tsuji et al.
2021/0102290 A1 4/2021 Acosta et al.
2021/0102292 A1 4/2021 Lin et al.
2021/0104384 A1 4/2021 Parkhe
2021/0104399 A1 4/2021 Kuroda et al.
2021/0108328 A1 4/2021 Yanagisawa
2021/0111025 A1 4/2021 Zyulkov et al.
2021/0111053 A1 4/2021 De Ridder
2021/0118667 A1 4/2021 Fukazawa et al.
2021/0118679 A1 4/2021 Lima et al.
2021/0118687 A1 4/2021 Wang et al.
2021/0125827 A1 4/2021 Khazaka et al.
2021/0125832 A1 4/2021 Bhatnagar
2021/0134588 A1 5/2021 Kohen et al.
2021/0134959 A1 5/2021 Lima et al.
2021/0140043 A1 5/2021 Thombare et al.
2021/0143003 A1 5/2021 Fukuda et al.
2021/0151315 A1 5/2021 Pierreux et al.
2021/0151348 A1 5/2021 Utsuno et al.
2021/0151352 A1 5/2021 Zope et al.
2021/0156024 A1 5/2021 Roh et al.
2021/0156030 A1 5/2021 Shugrue
2021/0159077 A1 5/2021 Longrie et al.
2021/0166910 A1 6/2021 Kim et al.
2021/0166924 A1 6/2021 Moon et al.
2021/0166925 A1 6/2021 Moon et al.
2021/0166940 A1 6/2021 Nozawa
2021/0172064 A1 6/2021 Moon
2021/0175052 A1 6/2021 Takahashi et al.
2021/0180184 A1 6/2021 Verni et al.
2021/0180188 A1 6/2021 Kim et al.
2021/0180189 A1 6/2021 Shugrue et al.
2021/0193458 A1 6/2021 Salmi et al.
2021/0205758 A1 7/2021 Kimtee et al.
2021/0207269 A1 7/2021 Huang et al.
2021/0207270 A1 7/2021 de Ridder et al.
2021/0210373 A1 7/2021 Singu et al.
2021/0214842 A1 7/2021 Yoon et al.
2021/0225615 A1 7/2021 Yoshida
2021/0225622 A1 7/2021 Shoji
2021/0225642 A1 7/2021 Utsuno et al.
2021/0225643 A1 7/2021 Kuroda et al.
2021/0230744 A1 7/2021 Kimtee et al.
2021/0230746 A1 7/2021 Shiba
2021/0233772 A1 7/2021 Zhu et al.
2021/0238736 A1 8/2021 Butail et al.
2021/0238742 A1 8/2021 Susa et al.
2021/0239614 A1 8/2021 Muralidhar et al.
2021/0242011 A1 8/2021 Shero et al.
2021/0246556 A1 8/2021 Mori
2021/0247693 A1 8/2021 Maes et al.
2021/0249303 A1 8/2021 Blanquart
2021/0254216 A1 8/2021 Mori et al.
2021/0254238 A1 8/2021 Khazaka et al.
2021/0257213 A1 8/2021 Kikuchi et al.
2021/0257509 A1 8/2021 Nishiwaki
2021/0265134 A1 8/2021 Singh et al.
2021/0265158 A1 8/2021 Kaneko
2021/0268554 A1 9/2021 Mori
2021/0269914 A1 9/2021 Väyrynen et al.
2021/0272821 A1 9/2021 Oosterlaken
2021/0273109 A1 9/2021 Yamazaki et al.
2021/0280448 A1 9/2021 Ganguli et al.
2021/0285102 A1 9/2021 Yoon et al.
2021/0287878 A1 9/2021 Um et al.
2021/0287912 A1 9/2021 Shiba et al.
2021/0287928 A1 9/2021 Kim et al.
2021/0288476 A1 9/2021 Wei
2021/0292902 A1 9/2021 Kajbafvala et al.

(56) References Cited

U.S. PATENT DOCUMENTS

| | | | |
|---|---|---|---|
| 2021/0296130 | A1 | 9/2021 | Longrie et al. |
| 2021/0296144 | A1 | 9/2021 | Lin et al. |
| 2021/0310125 | A1 | 10/2021 | Ma et al. |
| 2021/0313150 | A1 | 10/2021 | Kang et al. |
| 2021/0313167 | A1 | 10/2021 | Pore et al. |
| 2021/0313170 | A1 | 10/2021 | Suzuki |
| 2021/0313178 | A1 | 10/2021 | Nakano |
| 2021/0313182 | A1 | 10/2021 | Zhu et al. |
| 2021/0317576 | A1 | 10/2021 | Väyrynen et al. |
| 2021/0319982 | A1 | 10/2021 | Kim et al. |
| 2021/0320003 | A1 | 10/2021 | Sugiura et al. |
| 2021/0320010 | A1 | 10/2021 | Wang et al. |
| 2021/0320020 | A1 | 10/2021 | Oosterlaken et al. |
| 2021/0324510 | A1 | 10/2021 | Kuwano et al. |
| 2021/0324518 | A1 | 10/2021 | de Ridder |
| 2021/0327704 | A1 | 10/2021 | Kajbafvala et al. |
| 2021/0327714 | A1 | 10/2021 | Lee et al. |
| 2021/0327715 | A1 | 10/2021 | Xie et al. |
| 2021/0328036 | A1 | 10/2021 | Li et al. |
| 2021/0041284 | A1 | 11/2021 | Yednak |

FOREIGN PATENT DOCUMENTS

| | | |
|---|---|---|
| CN | 2588350 | 11/2003 |
| CN | 1563483 | 1/2005 |
| CN | 1655362 | 8/2005 |
| CN | 1664987 | 9/2005 |
| CN | 1825535 | 8/2006 |
| CN | 101047143 | 10/2007 |
| CN | 101142012 | 3/2008 |
| CN | 101609858 | 12/2009 |
| CN | 101681873 | 3/2010 |
| CN | 102383106 | 3/2012 |
| CN | 103014846 | 4/2013 |
| CN | 103515222 | 1/2014 |
| CN | 102373440 | 7/2014 |
| CN | 203721699 | 7/2014 |
| CN | 104244620 | 12/2014 |
| CN | 104307264 | 1/2015 |
| CN | 204629865 | 9/2015 |
| CN | 105253917 | 1/2016 |
| CN | 205448240 | 8/2016 |
| CN | 206145834 | 5/2017 |
| CN | 104233226 | 6/2017 |
| CN | 106895521 | 6/2017 |
| CN | 104201108 | 11/2017 |
| CN | 107675144 | 2/2018 |
| CN | 108389798 | 8/2018 |
| CN | 109000352 | 12/2018 |
| DE | 8902307 | 8/1989 |
| DE | 3836696 | 12/1989 |
| DE | 3626724 | 6/1994 |
| DE | 10133013 | 1/2003 |
| DE | 102008052750 | 6/2009 |
| EP | 0058571 | 8/1982 |
| EP | 0499004 | 8/1992 |
| EP | 0634785 | 1/1995 |
| EP | 0550058 | 11/1998 |
| EP | 0887632 | 12/1998 |
| EP | 678909 | 7/1999 |
| EP | 1061567 | 12/2000 |
| EP | 1889817 | 2/2008 |
| EP | 2036600 | 3/2009 |
| EP | 2426233 | 7/2012 |
| FR | 686869 | 7/1930 |
| FR | 1408266 | 8/1965 |
| FR | 2233614 | 1/1975 |
| FR | 2517790 | 6/1983 |
| FR | 2610007 | 8/1990 |
| FR | 2708624 | 2/1995 |
| GB | 400010 | 10/1933 |
| GB | 752-277 | 7/1956 |
| GB | 1186889 | 6/1966 |
| GB | 1514921 | 6/1978 |
| GB | 2051875 | 1/1981 |
| JP | 58-19462 | 4/1983 |
| JP | S5979545 | 5/1984 |
| JP | S59127847 | 7/1984 |
| JP | 59-211779 | 11/1984 |
| JP | S60110133 | 6/1985 |
| JP | 61038863 | 2/1986 |
| JP | S62237236 | 10/1987 |
| JP | S63136532 | 6/1988 |
| JP | H0165766 | 6/1989 |
| JP | H01185176 | 7/1989 |
| JP | H01-296613 | 11/1989 |
| JP | H01-307229 | 12/1989 |
| JP | H01313954 | 12/1989 |
| JP | H02-93071 | 4/1990 |
| JP | H02-185038 | 7/1990 |
| JP | H02-217469 | 8/1990 |
| JP | H03-044472 | 2/1991 |
| JP | H03-155625 | 7/1991 |
| JP | H03211753 | 9/1991 |
| JP | H03-248427 | 11/1991 |
| JP | H04-29313 | 1/1992 |
| JP | H04-115531 | 4/1992 |
| JP | H05-6880 | 1/1993 |
| JP | H05-23079 | 3/1993 |
| JP | H05-118928 | 5/1993 |
| JP | H05-171446 | 7/1993 |
| JP | H05-291142 | 11/1993 |
| JP | H06-053210 | 2/1994 |
| JP | H06-84888 | 3/1994 |
| JP | H06-140399 | 5/1994 |
| JP | H06-16433 | 6/1994 |
| JP | 6204231 | 7/1994 |
| JP | H06-319177 | 11/1994 |
| JP | H06-338497 | 12/1994 |
| JP | H07-29836 | 1/1995 |
| JP | H07-297271 | 1/1995 |
| JP | H07-066267 | 3/1995 |
| JP | H07-74162 | 3/1995 |
| JP | H07-109576 | 4/1995 |
| JP | H07-034936 | 8/1995 |
| JP | H07-225214 | 8/1995 |
| JP | 7-272694 | 10/1995 |
| JP | H07-283149 | 10/1995 |
| JP | H07-209093 | 11/1995 |
| JP | H08-181135 | 7/1996 |
| JP | H08-335558 | 12/1996 |
| JP | H09-064149 | 3/1997 |
| JP | 9-89676 | 4/1997 |
| JP | H09-148322 | 6/1997 |
| JP | H10-41096 | 2/1998 |
| JP | H10-50635 | 2/1998 |
| JP | H10-50800 | 2/1998 |
| JP | H10-064696 | 3/1998 |
| JP | H10-153494 | 6/1998 |
| JP | H10-227703 | 8/1998 |
| JP | H10-0261620 | 9/1998 |
| JP | H11-097163 | 4/1999 |
| JP | H11-118615 | 4/1999 |
| JP | H11-183264 | 7/1999 |
| JP | H11-183265 | 7/1999 |
| JP | H11-195688 | 7/1999 |
| JP | H11-287715 | 10/1999 |
| JP | 2000068355 | 3/2000 |
| JP | 2000182949 | 6/2000 |
| JP | 2000269163 | 9/2000 |
| JP | 2001015698 | 1/2001 |
| JP | 2001023872 | 1/2001 |
| JP | 2001207265 | 7/2001 |
| JP | 2001207268 | 7/2001 |
| JP | 2001210602 | 8/2001 |
| JP | 2001220677 | 8/2001 |
| JP | 2001257199 | 9/2001 |
| JP | 2001287180 | 10/2001 |
| JP | 2002164342 | 6/2002 |
| JP | 2002170781 | 6/2002 |
| JP | 2002237375 | 8/2002 |
| JP | 2003035574 | 2/2003 |
| JP | 2003053688 | 2/2003 |
| JP | 2003133300 | 5/2003 |

(56) References Cited

FOREIGN PATENT DOCUMENTS

| | | |
|---|---|---|
| JP | 2003153706 | 5/2003 |
| JP | 2003303814 | 10/2003 |
| JP | 2004014952 | 1/2004 |
| JP | 2004023043 | 1/2004 |
| JP | 2004091848 | 3/2004 |
| JP | 2004113270 | 4/2004 |
| JP | 2004128019 | 4/2004 |
| JP | 2004134553 | 4/2004 |
| JP | 2004163293 | 6/2004 |
| JP | 2004244298 | 9/2004 |
| JP | 2004244661 | 9/2004 |
| JP | 2004294638 | 10/2004 |
| JP | 3589954 | 11/2004 |
| JP | 2004310019 | 11/2004 |
| JP | 2005033221 | 2/2005 |
| JP | 2005079254 | 3/2005 |
| JP | 2005507030 | 3/2005 |
| JP | 2005172489 | 6/2005 |
| JP | 3725100 | 12/2005 |
| JP | 2006028572 | 2/2006 |
| JP | 2006049352 | 2/2006 |
| JP | 2006059931 | 3/2006 |
| JP | 2006090762 | 4/2006 |
| JP | 2006124832 | 5/2006 |
| JP | 2006153706 | 6/2006 |
| JP | 2006186271 | 7/2006 |
| JP | 2006188729 | 7/2006 |
| JP | 2006278058 | 10/2006 |
| JP | 2006319261 | 11/2006 |
| JP | 2007027777 | 2/2007 |
| JP | 2007287902 | 11/2007 |
| JP | 3140111 | 3/2008 |
| JP | 2008060304 | 3/2008 |
| JP | 2008066159 | 3/2008 |
| JP | 2008085129 | 4/2008 |
| JP | 2008089320 | 4/2008 |
| JP | 2008172083 | 7/2008 |
| JP | 2008198629 | 8/2008 |
| JP | 2008202107 | 9/2008 |
| JP | 2009016815 | 1/2009 |
| JP | 2009088421 | 4/2009 |
| JP | 2009099938 | 5/2009 |
| JP | 2009194248 | 8/2009 |
| JP | 2009239082 | 10/2009 |
| JP | 2009251216 | 10/2009 |
| JP | 2009252851 | 10/2009 |
| JP | 2010067940 | 3/2010 |
| JP | 2010097834 | 4/2010 |
| JP | 2010205967 | 9/2010 |
| JP | 2010251444 | 10/2010 |
| JP | 2010255218 | 11/2010 |
| JP | 2011049592 | 3/2011 |
| JP | 2011162830 | 8/2011 |
| JP | 2011181681 | 9/2011 |
| JP | 2009010412 | 2/2012 |
| JP | 2012146939 | 8/2012 |
| JP | 2012164736 | 8/2012 |
| JP | 2012195513 | 10/2012 |
| JP | 2013026479 | 2/2013 |
| JP | 2013196822 | 9/2013 |
| JP | 2013235912 | 11/2013 |
| JP | D1422467 | 8/2014 |
| JP | 2014222693 | 11/2014 |
| JP | 2015115461 | 6/2015 |
| JP | 2016098406 | 5/2016 |
| JP | 2010123843 | 6/2016 |
| JP | 2016174158 | 9/2016 |
| JP | 2017183242 | 10/2017 |
| JP | 6519897 | 5/2019 |
| KR | 1998-0026850 | 7/1998 |
| KR | 20000000946 | 1/2000 |
| KR | 10-0253664 | 4/2000 |
| KR | 10-2000-0031098 | 6/2000 |
| KR | 10-2000-0045257 | 7/2000 |
| KR | 10-0273261 | 12/2000 |
| KR | 10-0295043 | 4/2001 |
| KR | 10-2002-0027695 | 4/2002 |
| KR | 10-2002-0064028 | 8/2002 |
| KR | 2002-0086763 | 11/2002 |
| KR | 10-0377095 | 3/2003 |
| KR | 2003-0092305 | 12/2003 |
| KR | 10-2005-0054122 | 6/2005 |
| KR | 10-0547248 | 1/2006 |
| KR | 10-0593960 | 6/2006 |
| KR | 10-2006-0129566 | 12/2006 |
| KR | 10-0688484 | 2/2007 |
| KR | 10-2007-0079797 | 8/2007 |
| KR | 10-2007-0084683 | 8/2007 |
| KR | 2008-0058620 | 6/2008 |
| KR | 10-2009-0039936 | 4/2009 |
| KR | 10-2009-0055443 | 6/2009 |
| KR | 10-2009-0056475 | 6/2009 |
| KR | 10-2009-0086790 | 8/2009 |
| KR | 10-2009-0105977 | 10/2009 |
| KR | 10-0936694 | 1/2010 |
| KR | 10-2010-0015073 | 2/2010 |
| KR | 10-2010-0020834 | 2/2010 |
| KR | 10-2010-0032812 | 3/2010 |
| KR | 10-2010-0077442 | 7/2010 |
| KR | 10-2010-0079920 | 7/2010 |
| KR | 10-2010-0122701 | 11/2010 |
| KR | 10-2010-0132779 | 12/2010 |
| KR | 10-2011-0058534 | 6/2011 |
| KR | 10-1114219 | 3/2012 |
| KR | 10-2012-0111060 | 10/2012 |
| KR | 10-2013-0007806 | 1/2013 |
| KR | 10-2013-0067600 | 6/2013 |
| KR | 10-1347962 | 1/2014 |
| KR | 10-1491726 | 2/2015 |
| KR | 10-1535573 | 7/2015 |
| KR | 10-2019-0032077 | 3/2019 |
| NL | 8600255 | 9/1987 |
| NL | 8701549 | 2/1989 |
| RU | 1786406 | 1/1993 |
| SU | 494614 | 2/1976 |
| SU | 1408319 | 7/1988 |
| TW | 538327 | 6/2003 |
| TW | 540093 | 7/2003 |
| TW | M292692 | 6/2006 |
| TW | 200731357 | 8/2007 |
| TW | 200903625 | 1/2009 |
| TW | 201213596 | 4/2012 |
| TW | 201234453 | 8/2012 |
| TW | 201247690 | 12/2012 |
| TW | M446412 | 2/2013 |
| TW | 201330086 | 7/2013 |
| TW | D162593 | 8/2014 |
| TW | D164568 | 12/2014 |
| TW | 201531587 | 8/2015 |
| TW | M512254 | 11/2015 |
| TW | I514509 | 12/2015 |
| TW | 201613231 | 4/2016 |
| TW | M553518 | 12/2017 |
| TW | D196097 | 2/2019 |
| WO | 1987001508 | 3/1987 |
| WO | 1990004045 | 4/1990 |
| WO | 1991004522 | 4/1991 |
| WO | 1991006975 | 5/1991 |
| WO | 1992000477 | 1/1992 |
| WO | 1994027315 | 11/1994 |
| WO | 1996017107 | 6/1996 |
| WO | 1997003223 | 1/1997 |
| WO | 1998032893 | 7/1998 |
| WO | 1999023690 | 5/1999 |
| WO | DM/048579 | 7/1999 |
| WO | 2004008491 | 7/2002 |
| WO | 2004007800 | 1/2004 |
| WO | 2004008827 | 1/2004 |
| WO | 2004010467 | 1/2004 |
| WO | 2004106584 | 12/2004 |
| WO | 2005112082 | 11/2005 |
| WO | 2006035281 | 4/2006 |
| WO | 2006054854 | 5/2006 |
| WO | 2006056091 | 6/2006 |

(56) References Cited

FOREIGN PATENT DOCUMENTS

| | | |
|---|---|---|
| WO | 2006078666 | 7/2006 |
| WO | 2006080782 | 8/2006 |
| WO | 2006097525 | 9/2006 |
| WO | 2006101857 | 9/2006 |
| WO | 2006114781 | 11/2006 |
| WO | 2007024720 | 3/2007 |
| WO | 2007027165 | 3/2007 |
| WO | 2007076195 | 7/2007 |
| WO | 2007117718 | 10/2007 |
| WO | 2007131051 | 11/2007 |
| WO | 2007140376 | 12/2007 |
| WO | 2008045972 | 4/2008 |
| WO | 2008091900 | 7/2008 |
| WO | 2008121463 | 10/2008 |
| WO | 2008147731 | 12/2008 |
| WO | 2009028619 | 3/2009 |
| WO | 2009029532 | 3/2009 |
| WO | 2009039251 | 3/2009 |
| WO | 2009099776 | 8/2009 |
| WO | 2009154889 | 12/2009 |
| WO | 2009154896 | 12/2009 |
| WO | 2010039363 | 4/2010 |
| WO | 2010077533 | 7/2010 |
| WO | 2010100702 | 9/2010 |
| WO | 2010110558 | 9/2010 |
| WO | 2010118051 | 10/2010 |
| WO | 2010129428 | 11/2010 |
| WO | 2010129430 | 11/2010 |
| WO | 2010129431 | 11/2010 |
| WO | 2011019950 | 2/2011 |
| WO | 2011149640 | 12/2011 |
| WO | 2012056592 | 5/2012 |
| WO | 2012077590 | 6/2012 |
| WO | 2013043330 | 3/2013 |
| WO | 2013078065 | 5/2013 |
| WO | 2013078066 | 5/2013 |
| WO | 2013177269 | 11/2013 |
| WO | 2014107290 | 7/2014 |
| WO | 2015026230 | 2/2015 |
| WO | 2015107009 | 7/2015 |
| WO | 2015112728 | 7/2015 |
| WO | 2015127614 | 9/2015 |
| WO | 2016019795 | 2/2016 |
| WO | 2018109553 | 6/2016 |
| WO | 2018109554 | 6/2016 |
| WO | 2017108713 | 6/2017 |
| WO | 2017108714 | 6/2017 |
| WO | 2017125401 | 7/2017 |
| WO | 2017212546 | 12/2017 |
| WO | 2018003072 | 1/2018 |
| WO | 2018008088 | 1/2018 |
| WO | 2018013778 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 2018105349 | 6/2018 |
| WO | 2018109551 | 6/2018 |
| WO | 2018109552 | 6/2018 |
| WO | 2018178771 | 10/2018 |
| WO | 2019030565 | 2/2019 |
| WO | 2019103610 | 5/2019 |
| WO | 2019103613 | 5/2019 |
| WO | 2019142055 | 7/2019 |
| WO | 2019158960 | 8/2019 |
| WO | 2019217749 | 11/2019 |
| WO | 2019229537 | 12/2019 |
| WO | 2020002995 | 1/2020 |
| WO | 2020003000 | 1/2020 |
| WO | 2020118100 | 6/2020 |
| WO | 2021072042 | 4/2021 |

OTHER PUBLICATIONS

CNIPA; Office Action dated Aug. 1, 2013 in Application No. 201080015699.9.
CNIPA; Office Action dated Jan. 21, 2014 in Application No. 201080015699.9.
CNIPA; Office Action dated Jul. 25, 2014 in Application No. 201080015699.9.
CNIPA; Office Action dated Jan. 12, 2015 in Application No. 201080015699.9.
CNIPA; Notice of Allowance dated May 8, 2015 in Application No. 201080015699.9.
CNIPA; Office Action dated Dec. 10, 2013 in Application No. 201080020267.7.
CNIPA; Notice of Allowance dated Aug. 22, 2014 in Application No. 201080020267.7.
CNIPA; Office Action dated Jan. 21, 2013 in Application No. 201080020268.1.
CNIPA; Office Action dated Sep. 26, 2013 in Application No. 201080020268.1.
CNIPA; Office Action dated Apr. 3, 2014 in Application No. 201080020268.1.
CNIPA; Office Action dated Sep. 23, 2014 in Application No. 201080020268.1.
CNIPA; Office Action dated Apr. 7, 2015 in Application No. 201080020268.1.
CNIPA; Notice of Allowance dated Oct. 16, 2015 in Application No. 201080020268.1.
CNIPA; Office Action dated May 24, 2013 in Application No. 201080036764.6.
CNIPA; Office Action dated Jan. 2, 2014 in Application No. 201080036764.6.
CNIPA; Office Action dated Jul. 1, 2014 in Application No. 201080036764.6.
CNIPA; Notice of Allowance dated Oct. 24, 2014 in Application No. 201080036764.6.
CNIPA; Office Action dated Feb. 8, 2014 in Application No. 201110155056.0.
CNIPA; Office Action dated Sep. 16, 2014 in Application No. 201110155056.0.
CNIPA; Office Action dated Feb. 9, 2015 in Application No. 201110155056.0.
CNIPA; Notice of Allowance dated Aug. 26, 2015 in Application No. 201110155056.0.
CNIPA; Office Action dated Dec. 4, 2015 in Application No. 201210201995.9.
CNIPA; Office Action dated Jul. 14, 2016 in Application No. 201210201995.9.
CNIPA; Office Action dated Jan. 20, 2017 in Application No. 201210201995.9.
CNIPA; Notice of Allowance dated Apr. 13, 2017 in Application No. 201210201995.9.
CNIPA; Office Action dated Dec. 24, 2015 in Application No. 201280057466.4.
CNIPA; Notice of Allowance dated Jun. 16, 2016 in Application No. 201280057466.4.
CNIPA; Office Action dated Dec. 4, 2015 in Application No. 201280057542.1.
CNIPA; Office Action dated May 16, 2016 in Application No. 201280057542.1.
CNIPA; Office Action dated Sep. 9, 2016 in Application No. 201280057542.1.
CNIPA; Notice of Allowance dated Jan. 3, 2017 in Application No. 201280057542.1.
CNIPA; Office Action dated Dec. 5, 2016 in Application No. 201310412808.6.
CNIPA; Notice of Allowance dated Jul. 20, 2017 in Application No. 201310412808.6.

(56) References Cited

OTHER PUBLICATIONS

CNIPA; Office Action dated Feb. 5, 2018 in Application No. 201410331047.6.
CNIPA; Office Action dated Dec. 14, 2018 in Application No. 201410331047.6.
CNIPA; Notice of Allowance dated Jun. 14, 2019 in Application No. 201410331047.6.
CNIPA; Office Action dated Oct. 19, 2018 in Application No. 201510765170.3.
CNIPA; Office Action dated Jun. 28, 2019 in Application No. 201510765170.3.
CNIPA; Notice of Allowance dated Sep. 30, 2019 in Application No. 201510765170.3.
CNIPA; Office Action dated Oct. 31, 2018 in Application No. 201510765406.3.
CNIPA; Office Action dated Jun. 28, 2019 in Application No. 201510765406.3.
CNIPA; Notice of Allowance dated Dec. 27, 2019 in Application No. 201510765406.3.
CNIPA; Office Action dated Jan. 21, 2020 in Application No. 201610028064.1.
CNIPA; Notice of Allowance dated May 22, 2020 in Application No. 201610028064.1.
CNIPA; Office Action dated Mar. 26, 2020 in Application No. 201610131743.1.
CNIPA; Office Action dated Oct. 16, 2020 in Application No. 201610131743.1.
CNIPA; Office Action dated Mar. 14, 2019 in Application No. 201610141027.1.
CNIPA; Notice of Allowance dated Sep. 3, 2019 in Application No. 201610141027.1.
CNIPA; Office Action dated Jul. 23, 2019 in Application No. 201610897958.4.
CNIPA; Office Action dated Feb. 28, 2020 in Application No. 201610897958.4.
CNIPA; Office Action dated Jun. 16, 2020 in Application No. 201610897958.4.
CNIPA; Office Action dated Nov. 4, 2019 in Application No. 201610898822.5.
CNIPA; Office Action dated Jul. 3, 2020 in Application No. 201610898822.5.
CNIPA; Notice of Allowance dated Oct. 9, 2020 in Application No. 201610898822.5.
CNIPA; Office Action dated May 18, 2020 in Application No. 201610982040.X.
CNIPA; Notice of Allowance dated Dec. 21, 2020 in Application No. 201610982040.X.
CNIPA; Office Action dated May 29, 2020 in Application No. 201710131319.1.
CNIPA; Office Action dated Jun. 1, 2020 in Application No. 201710173292.2.
CNIPA; Notice of Allowance dated Nov. 4, 2020 in Application No. 201710173292.2.
CNIPA; Office Action dated Dec. 20, 2018 in Application No. 201710738549.4.
CNIPA; Office Action dated Nov. 20, 2020 in Application No. 201710762817.6.
CNIPA; Office Action dated Jun. 20, 2019 in Application No. 201711120632.1.
CNIPA; Notice of Allowance dated May 25, 2017 in Application No. 201730010308.9.
CNIPA; Office Action dated Aug. 31, 2020 in Application No. 201780044761.9.
CNIPA; Office Action dated Nov. 11, 2019 in Application No. 201810379112.0.
CNIPA; Office Action dated Apr. 27, 2020 in Application No. 201810379112.0.
CNIPA; Office Action dated Apr. 27, 2020 in Application No. 201810836604.8.
CNIPA; Office Action dated Jul. 30, 2020 in Application No. 201810836604.8.
CNIPA; Office Action dated Apr. 22, 2020 in Application No. 201810994464.7.
CNIPA; Notice of Allowance dated Oct. 24, 2018 in Application No. 201830060972.9.
CNIPA; Notice of Allowance dated Nov. 1, 2018 in Application No. 201830397219.9.
CNIPA; Notice of Allowance dated May 14, 2020 in Application No. 201930615780.4.
CNIPA; Notice of Allowance dated Apr. 27, 2020 in Application No. 201930660355.7.
CNIPA; Notice of Allowance dated Dec. 28, 2020 in Application No. 201930704935.1.
CNIPA; Notice of Allowance dated Jun. 2, 2020 in Application No. 202030048819.1.
CNIPA; Notice of Allowance dated May 15, 2020 in Application No. 202030048854.3.
CNIPA; Notice of Allowance dated May 15, 2020 in Application No. 202030053560.X.
CNIPA; Notice of Allowance dated Aug. 7, 2020 in Application No. 202030053609.1.
CNIPA; Notice of Allowance dated May 20, 2020 in Application No. 202030053634.X.
CNIPA; Notice of Allowance dated Dec. 10, 2020 in Application No. 202030352604.9.
CNIPA; Office Action dated Jan. 25, 2021 in Application No. 202030579755.8.
EPO; Office Action dated Jul. 29, 2008 in Application No. 00902194.0.
EPO; Supplementary European Search Report and Opinion dated Nov. 9, 2012 in Application No. 08798519.8.
EPO; Office Action dated Jul. 18, 2016 in Application No. 08798519.8.
EPO; Extended European Search Report dated Dec. 9, 2016 in Application No. 09767208.3.
EPO; Office Action dated Aug. 10, 2018 in Application No. 09767208.3.
EPO; Notice of Allowance dated Aug. 1, 2019 in Application No. 09767208.3.
EPO; Office Action dated Jun. 27, 2003 in Application No. 97929595.3.
EPO; Office Action dated Feb. 18, 2004 in Application No. 97929595.3.
EPO; Notice of Allowance dated Apr. 29, 2004 in Application No. 97929595.3.
EPO; Supplementary European Search Report and Opinion dated Jan. 5, 2017 in Application No. 09836647.9.
EPO; Office Action dated Feb. 28, 2018 in Application No. 09836647.9.
EPO; Office Action dated Jan. 11, 2019 in Application No. 09836647.9.
EPO; Notice of Allowance dated Oct. 16, 2019 in Application No. 09836647.9.
EPO; Notice of Allowance dated Jan. 10, 2001 in Application No. 98911263.6.
EPO; Office Action dated Jun. 6, 2001 in Application No. 98911277.6.
EPO; Office Action dated Jun. 27, 2003 in Application No. 98967122.7.
EPO; Notice of Allowance dated Feb. 23, 2004 in Application No. 98967122.7.
EPO; Office Action dated Sep. 22, 2003 in Application No. 99946447.2.
EPO; Office Action dated Nov. 25, 2003 in Application No. 99946447.2.
EPO; Office Action dated Mar. 30, 2004 in Application No. 99946447.2.
EPO; Office Action dated Jul. 19, 2004 in Application No. 99946447.2.
EPO; Notice of Allowance dated Sep. 22, 2004 in Application No. 99946447.2.

(56) References Cited

OTHER PUBLICATIONS

EPO; Supplementary European Search Report dated May 27, 2002 in Application No. 99973123.
EPO; Notice of Allowance dated Jun. 11, 2004 in Application No. 99973123.
EPO; Extended European Search Report dated Apr. 28, 2014 in Application No. 11162225.4.
EPO; Notice of Allowance dated Feb. 3, 2015 in Application No. 11162225.4.
EPO; Extended European Search Report dated Nov. 29, 2019 in Application No. 19188826.2.
EPO; Extended European Search Report dated Mar. 3, 2020 in Application No. 19205558.0.
IPOS; Notice of Allowance dated Aug. 14, 2017 in Application No. 10201401237.
JPO; Office Action dated Aug. 10, 2009 in Application No. 2003029767.
JPO; Office Action dated Apr. 13, 2010 in Application No. 2003029767.
JPO; Notice of Allowance dated Jun. 24, 2010 in Application No. 2003029767.
JPO; Office Action dated Oct. 30, 2008 in Application No. 2004558313.
JPO; Office Action dated Feb. 19, 2009 in Application No. 2004558313.
JPO; Notice of Allowance dated Jun. 30, 2009 in Application No. 2004558313.
JPO; Office Action dated Mar. 16, 2012 in Application No. 2009-532567.
JPO; Notice of Allowance dated Jul. 23, 2012 in Application No. 2009-532567.
JPO; Notice of Allowance dated Mar. 29, 2013 in Application No. 2010-509478.
JPO; Office Action dated Dec. 20, 2011 in Application No. 2010-522075.
JPO; Office Action dated Apr. 11, 2012 in Application No. 2010-522075.
JPO; Office Action dated May 15, 2013 in Application No. 2010058415.
JPO; Office Action dated Oct. 30, 2013 in Application No. 2010058415.
JPO; Office Action dated Aug. 7, 2014 in Application No. 2010058415.
JPO; Notice of Allowance dated Dec. 18, 2014 in Application No. 2010058415.
JPO; Office Action dated Aug. 22, 2013 in Application No. 2010-153754.
JPO; Office Action dated Oct. 30, 2013 in Application No. 2010-193285.
JPO; Office Action dated Aug. 26, 2015 in Application No. 2011-284831.
JPO; Notice of Allowance dated Mar. 3, 2016 in Application No. 2011-284831.
JPO; Office Action dated May 31, 2012 in Application No. 2011-514650.
JPO; Office Action dated Sep. 11, 2012 in Application No. 2011-514650.
JPO; Notice of Allowance dated Dec. 10, 2012 in Application No. 2011-514650.
JPO; Office Action dated Dec. 10, 2014 in Application No. 2011090067.
JPO; Notice of Allowance dated Apr. 28, 2015 in Application No. 2011090067.
JPO; Office Action dated Jul. 14, 2016 in Application No. 2012-153698.
JPO; Notice of Allowance dated Oct. 21, 2016 in Application No. 2012-153698.
JPO; Office Action dated Dec. 20, 2013 in Application No. 2012-504786.
JPO; Office Action dated Jan. 25, 2014 in Application No. 2012-504786.
JPO; Office Action dated Dec. 1, 2014 in Application No. 2012-504786.
JPO; Notice of Allowance dated Jun. 12, 2015 in Application No. 2012504786.
JPO; Office Action dated Mar. 11, 2013 in Application No. 2012-509857.
JPO; Notice of Allowance dated Jun. 29, 2013 in Application No. 2012-509857.
JPO; Office Action dated May 19, 2017 in Application No. 2013-160173.
JPO; Notice of Allowance dated Aug. 23, 2017 in Application No. 2013-160173.
JPO; Office Action dated Aug. 14, 2017 in Application No. 2013-178344.
JPO; Office Action dated Jan. 23, 2018 in Application No. 2013-178344.
JPO; Notice of Allowance dated Jul. 24, 2018 in Application No. 2013-178344.
JPO; Office Action dated Apr. 3, 2018 in Application No. 2014-120675.
JPO; Notice of Allowance dated Jun. 6, 2018 in Application No. 2014-120675.
JPO; Office Action dated Mar. 28, 2018 in Application No. 2014-188835.
JPO; Notice of Allowance dated Jun. 6, 2018 in Application No. 2014-188835.
JPO; Office Action dated Apr. 12, 2018 in Application No. 2014-205548.
JPO; Notice of Allowance dated Dec. 19, 2019 in Application No. 2014205548.
JPO; Notice of Allowance dated May 14, 2018 in Application No. 2014-216540.
JPO; Office Action dated Jul. 20, 2018 in Application No. 2015-034774.
JPO; Office Action dated Jun. 27, 2019 in Application No. 2015034774.
JPO; Notice of Allowance dated Nov. 20, 2019 in Application No. 2015034774.
JPO; Office Action dated Jan. 30, 2019 in Application No. 2015052198.
JPO; Notice of Allowance dated Apr. 5, 2019 in Application No. 2015052198.
JPO; Office Action dated Aug. 29, 2019 in Application No. 2016001928.
JPO; Notice of Allowance dated Dec. 17, 2019 in Application No. 2016001928.
JPO; Office Action dated Jun. 1, 2020 in Application No. 2016-206625.
JPO; Notice of Allowance dated Nov. 27, 2020 in Application No. 2016-206625.
JPO; Office Action dated Aug. 28, 2020 in Application No. 2017-139817.
JPO; Office Action dated Jan. 26, 2021 in Application No. 2017-139817.
JPO; Notice of Allowance dated Jul. 1, 2020 in Application No. 2019-025168.
JPO; Office Action dated Aug. 24, 2020 in Application No. 2019-119908.
JPO; Office Action dated Jun. 29, 2020 in Application No. 2020-502653.
JPO; Notice of Allowance dated Nov. 26, 2020 in Application No. 2020-502653.
KIPO; Office Action dated Dec. 10, 2015 in Application No. 10-2010-0028336.
KIPO; Office Action dated Jun. 29, 2016 in Application No. 10-2010-0028336.
KIPO; Notice of Allowance dated Sep. 29, 2016 in Application No. 10-2010-0028336.
KIPO; Office Action dated Mar. 3, 2016 in Application No. 10-2010-0067768.
KIPO; Office Action dated Aug. 1, 2016 in Application No. 10-2010-0067768.
KIPO; Notice of Allowance dated Dec. 1, 2016 in Application No. 10-2010-0067768.
KIPO; Office Action dated May 2, 2016 in Application No. 10-2010-0082446.
KIPO; Office Action dated Sep. 19, 2016 in Application No. 10-2010-0082446.
KIPO; Notice of Allowance dated Mar. 7, 2017 in Application No. 10-2010-0082446.
KIPO; Office Action dated Mar. 13, 2017 in Application No. 20110034612.

(56) References Cited

OTHER PUBLICATIONS

KIPO; Office Action dated Jul. 20, 2017 in Application No. 20110034612.
KIPO; Notice of Allowance dated Sep. 1, 2017 in Application No. 20110034612.
KIPO; Office Action dated Nov. 24, 2017 in Application No. 10-2011-0036449.
KIPO; Office Action dated May 23, 2017 in Application No. 10-2011-0036449.
KIPO; Office Action dated Apr. 2, 2018 in Application No. 10-2011-0036449.
KIPO; Notice of Allowance dated Oct. 24, 2018 in Application No. 10-2011-0036449.
KIPO; Office Action dated Sep. 4, 2017 in Application No. 10-2011-0087600.
KIPO; Notice of Allowance dated Jan. 11, 2018 in Application No. 10-2011-0087600.
KIPO; Office Action dated Oct. 23, 2017 in Application No. 10-2011-0142924.
KIPO; Notice of Allowance dated Mar. 14, 2018 in Application No. 10-2011-0142924.
KIPO; Office Action dated Dec. 11, 2015 in Application No. 10-2011-7023416.
KIPO; Office Action dated Mar. 13, 2016 in Application No. 10-2011-7023416.
KIPO; Notice of Allowance dated Jun. 2, 0216 in Application No. 10-2011-7023416.
KIPO; Office Action dated Oct. 30, 2017 in Application No. 10-2012-0041878.
KIPO; Notice of Allowance dated Feb. 28, 2018 in Application No. 10-2012-0041878.
KIPO; Office Action dated Mar. 21, 2018 in Application No. 10-2012-0042518.
KIPO; Notice of Allowance dated May 30, 2018 in Application No. 10-2012-0042518.
KIPO; Office Action dated Mar. 21, 2018 in Application No. 10-2012-0064526.
KIPO; Office Action dated Sep. 18, 2018 in Application No. 10-2012-0064526.
KIPO; Office Action dated Dec. 13, 2018 in Application No. 10-2012-0064526.
KIPO; Office Action dated Jan. 12, 2019 in Application No. 10-2012-0064526.
KIPO; Notice of Allowance dated Jul. 5, 2019 in Application No. 10-2012-0064526.
KIPO; Office Action dated Mar. 30, 2018 in Application No. 10-2012-0076564.
KIPO; Office Action dated Sep. 27, 2018 in Application No. 10-2012-0076564.
KIPO; Office Action dated Mar. 27, 2019 in Application No. 10-2012-0076564.
KIPO; Decision of Intellectual Property Trial and Appeal Board dated Jun. 23, 2020 in Application No. 10-2012-0076564.
KIPO; Office Action dated Apr. 30, 2018 in Application No. 10-2012-0103114.
KIPO; Notice of Allowance dated Nov. 22, 2018 in Application No. 10-2012-0103114.
KIPO; Office Action dated Oct. 24, 2016 in Application No. 10-2012-7004062.
KIPO; Office Action dated Jul. 24, 2017 in Application No. 10-2012-7004062.
KIPO; Decision of Intellectual Property Trial and Appeal Board dated May 13, 2019 in Application No. 10-2012-7004062.
KIPO; Office Action dated May 30, 2019 in Application No. 10-2012-7004062.
KIPO; Notice of Allowance dated Sep. 27, 2019 in Application No. 10-2012-7004062.
KIPO; Office Action dated Apr. 24, 2019 in Application No. 10-2013-0036823.
KIPO; Notice of Allowance dated Aug. 29, 2019 in Application No. 10-2013-0036823.
KIPO; Office Action dated Aug. 27, 2019 in Application No. 10-2013-0049598.
KIPO; Office Action dated Feb. 28, 2020 in Application No. 10-2013-0049598.
KIPO; Notice of Allowance dated Sep. 25, 2020 in Application No. 10-2013-0049598.
KIPO; Office Action dated May 31, 2019 in Application No. 10-2013-0050740.
KIPO; Office Action dated Nov. 27, 2019 in Application No. 10-2013-0050740.
KIPO; Notice of Allowance dated Apr. 23, 2020 in Application No. 10-2013-0050740.
KIPO; Office Action dated Mar. 27, 2019 in Application No. 10-2013-0084459.
KIPO; Notice of Allowance dated Oct. 30, 2019 in Application No. 10-2013-0084459.
KIPO; Office Action dated Apr. 30, 2019 in Application No. 10-2013-0088450.
KIPO; Office Action dated Nov. 29, 2019 in Application No. 10-2013-0088450.
KIPO; Notice of Allowance dated Jan. 13, 2020 in Application No. 10-2013-0088450.
KIPO; Office Action dated Aug. 27, 2019 in Application No. 10-2013-0089998.
KIPO; Notice of Allowance dated Feb. 27, 2020 in Application No. 10-2013-0089998.
KIPO; Office Action dated Dec. 4, 2019 in Application No. 10-2013-0098575.
KIPO; Office Action dated Jun. 19, 2020 in Application No. 10-2013-0098575.
KIPO; Notice of Allowance dated Aug. 13, 2020 in Application No. 10-2013-0098575.
KIPO; Office Action dated Apr. 19, 2019 in Application No. 10-2013-0101944.
KIPO; Notice of Allowance dated Oct. 8, 2019 in Application No. 10-2013-0101944.
KIPO; Office Action dated Nov. 12, 2019 in Application No. 10-2013-0102026.
KIPO; Notice of Allowance dated May 14, 2020 in Application No. 10-2013-0102026.
KIPO; Office Action dated Aug. 15, 2019 in Application No. 10-2013-0109390.
KIPO; Notice of Allowance dated Oct. 21, 2019 in Application No. 10-2013-0109390.
KIPO; Office Action dated Oct. 7, 2019 in Application No. 10-2013-0114079.
KIPO; Notice of Allowance dated Mar. 4, 2020 in Application No. 10-2013-0114079.
KIPO; Office Action dated May 21, 2019 in Application No. 10-2013-0121554.
KIPO; Notice of Allowance dated Oct. 28, 2019 in Application No. 10-2013-0121554.
KIPO; Office Action dated Mar. 30, 2020 in Application No. 10-2014-0011764.
KIPO; Notice of Allowance dated Oct. 27, 2020 in Application No. 10-2014-0011764.
KIPO; Office Action dated Jul. 21, 2020 in Application No. 10-2014-0011765.
KIPO; Office Action dated Jan. 25, 2021 in Application No. 10-2014-0011765.
KIPO; Office Action dated Feb. 3, 2020 in Application No. 10-2014-0021615.
KIPO; Notice of Allowance dated Sep. 8, 2020 in Application No. 10-2014-0021615.
KIPO; Office Action dated Oct. 26, 2020 in Application No. 10-2014-0027217.
KIPO; Office Action dated Feb. 15, 2020 in Application No. 10-2014-0027305.
KIPO; Notice of Allowance dated Oct. 12, 2020 in Application No. 10-2014-0027305.

(56) References Cited

OTHER PUBLICATIONS

KIPO; Office Action dated Jul. 9, 2020 in Application No. 10-2014-0060120.
KIPO; Notice of Allowance dated Jan. 4, 2021 in Application No. 10-2014-0060120.
KIPO; Office Action dated Aug. 18, 2020 in Application No. 10-2014-0071653.
KIPO; Notice of Allowance dated Jan. 4, 2021 in Application No. 10-2014-0071653.
KIPO; Office Action dated May 21, 2020 in Application No. 10-2014-0086902.
KIPO; Notice of Allowance dated Oct. 19, 2020 in Application No. 10-2014-0086902.
KIPO; Office Action dated May 21, 2020 in Application No. 10-2014-0091092.
KIPO; Notice of Allowance dated Sep. 27, 2020 in Application No. 10-2014-0091092.
KIPO; Office Action dated Mar. 11, 2020 in Application No. 10-2014-0103853.
KIPO; Office Action dated Oct. 5, 2020 in Application No. 10-2014-0103853.
KIPO; Office Action dated Nov. 29, 2020 in Application No. 10-2014-0105478.
KIPO; Office Action dated Feb. 17, 2021 in Application No. 10-2014-0122903.
KIPO; Office Action dated Oct. 7, 2020 in Application No. 10-2014-0128626.
KIPO; Office Action dated Jan. 25, 2021 in Application No. 10-2014-0145220.
KIPO; Office Action dated Jan. 22, 2019 in Application No. 10-2014-7017110.
KIPO; Notice of Allowance dated Aug. 26, 2019 in Application No. 10-2014-7017110.
KIPO; Office Action dated Sep. 28, 2017 in Application No. 10-2014-7017112.
KIPO; Notice of Allowance dated Feb. 23, 2018 in Application No. 10-2014-7017112.
KIPO; Office Action dated Jan. 6, 2021 in Application No. 10-2015-0025314.
KIPO; Office Action dated Nov. 9, 2016 in Application No. 10-2016-7023913.
KIPO; Notice of Allowance dated May 30, 2017 in Application No. 10-2016-7023913.
KIPO; Office Action dated Jul. 21, 2020 in Application No. 10-2017-0087308.
KIPO; Notice of Allowance dated Oct. 26, 2020 in Application No. 10-2017-0087308.
KIPO; Notice of Allowance dated Feb. 27, 2018 in Application No. 10-2017-0175442.
KIPO; Office Action dated Sep. 28, 2017 in Application No. 10-2017-7023740.
KIPO; Final Office Action dated Jun. 17, 2019 in Application No. 10-2017-7023740.
KIPO; Notice of Allowance dated Jul. 19, 2018 in Application No. 20187013945.
KIPO; Office Action dated Jun. 30, 2020 in Application No. 10-2019-0044213.
KIPO; Office Action dated Dec. 23, 2020 in Application No. 10-2019-0044213.
KIPO; Notice of Allowance dated Nov. 29, 2019 in Application No. 10-2019-0127773.
KIPO; Offie Action dated Apr. 22, 2020 in Application No. 10-2020-0009462.
KIPO; Notice of Allowance dated Oct. 28, 2020 in Application No. 10-2020-0009462.
KIPO; Office Action dated Nov. 14, 2020 in Application No. 10-2020-0101096.
KIPO; Office Action dated Feb. 12, 2020 in Application No. 10-2020-7000992.
KIPO; Notice of Allowance dated Jul. 20, 2020 in Application No. 10-2020-7000992.
KIPO; Office Action dated Sep. 15, 2017 in Application No. 30-2017-0001320.
KIPO; Notice of Allowance dated Jan. 19, 2018 in Application No. 30-2017-0001320.
KIPO; Notice of Allowance dated Jul. 10, 2018 in Application No. 30-2017-0052872.
KIPO; Office Action dated Jul. 11, 2018 in Application No. 30-2018-0006016.
KIPO; Notice of Allowance dated Oct. 16, 2018 in Application No. 30-2018-0006016.
KIPO; Office Action dated Jan. 30, 2019 in Application No. 30-2018-0033442.
KIPO; Notice of Allowance dated Apr. 1, 2019 in Application No. 30-2018-0033442.
KIPO; Notice of Allowance dated Oct. 20, 2020 in Application No. 30-2019-0054013 M001.
KIPO; Notice of Allowance dated Oct. 20, 2020 in Application No. 30-2019-0054013 M002.
KIPO; Notice of Allowance dated Oct. 20, 2020 in Application No. 30-2019-0054642.
KIPO; Notice of Allowance dated Oct. 22, 2020 in Application No. 30-2019-0058076.
KIPO; Notice of Allowance dated Oct. 22, 2020 in Application No. 30-2019-0058566 (M001).
KIPO; Notice of Allowance dated Oct. 22, 2020 in Application No. 30-2019-0058566 (M002).
KIPO; Notice of Allowance dated Dec. 1, 2020 in Application No. 30-2019-0061607.
KIPO; Office Action dated Jan. 26, 2021 in Application No. 30-2020-0005953 (M001).
KIPO; Office Action dated Jan. 26, 2021 in Application No. 30-2020-0005953 (M002).
KIPO; Notice of Allowance dated Dec. 23, 2020 in Application No. 30-2020-0006059.
KIPO; Notice of Allownace dated Dec. 25, 2020 in Application No. 30-2020-0006223.
KIPO; Notice of Allowance dated Feb. 1, 2021 in Application No. 30-2020-0006385.
KIPO; Notice of Allowance dated Feb. 1, 2021 in Application No. 30-2020-0006391.
TIPO; Office Action dated Aug. 30, 2013 in Application No. 97132391.
TIPO; Office Action dated Dec. 20, 2013 in Application No. 98117513.
TIPO; Notice of Allowance dated Jun. 12, 2014 in Application No. 98117513.
TIPO; Office Action dated Jul. 4, 2014 in Application No. 99110511.
TIPO; Notice of Allowance dated Feb. 24, 2016 in Application No. 99110511.
TIPO; Office Action dated Aug. 27, 2014 in Application No. 99114329.
TIPO; Notice of Allowance dated Jan. 28, 2015 in Application No. 99114329.
TIPO; Office Action dated Dec. 26, 2014 in Application No. 99114330.
TIPO; Notice of Allowance dated Apr. 28, 2015 in Application No. 99114330.
TIPO; Office Action dated Aug. 14, 2014 in Application No. 99114331.
TIPO; Notice of Allowance dated Oct. 16, 2015 in Application No. 99114331.
TIPO; Office Action dated Dec. 19, 2014 in Application No. 99127063.
TIPO; Notice of Allowance dated Mar. 14, 2016 in Application No. 99127063.
TIPO; Notice of Allowance dated Oct. 2, 2015 in Application No. 100130472.
TIPO; Office Action dated Feb. 19, 2016 in Application No. 100113130.
TIPO; Notice of Allowance dated Jun. 29, 2016 in Applicaton No. 100113130.

(56) References Cited

OTHER PUBLICATIONS

TIPO; Notice of Allowance dated Nov. 2, 2016 in Application No. 101142581.
TIPO; Office Action dated Apr. 28, 2016 in Application No. 101142582.
TIPO; Notice of Allowance dated Aug. 19, 2016 in Application No. 101142582.
TIPO; Office Action dated Aug. 1, 2016 in Application No. 101124745.
TIPO; Notice of Allowance dated Oct. 19, 2016 in Application No. 101124745.
TIPO; Office Action dated Sep. 19, 2016 in Application No. 102113028.
TIPO; Notice of Allowance dated Feb. 13, 2017 in Application No. 102113028.
TIPO; Office Action dated Aug. 2016 in Application No. 102115605.
TIPO; Office Action dated Feb. 24, 2017 in Application No. 102115605.
TIPO; Notice of Allowance dated Dec. 26, 2017 in Application No. 102115605.
TIPO; Office Action dated Nov. 15, 2016 in Application No. 102125191.
TIPO; Office Action dated Jun. 20, 2017 in Application No. 102125191.
TIPO; Notice of Allowance dated Feb. 20, 2020 in Application No. 102125191.
TIPO; Office Action dated Dec. 6, 2016 in Application No. 102126071.
TIPO; Office Action dated May 17, 2018 in Application No. 102126071.
TIPO; Notice of Allowance dated Aug. 24, 2018 in Application No. 102126071.
TIPO; Office Action dated Feb. 10, 2017 in Application No. 102127065.
TIPO; Notice of Allowance dated Jul. 18, 2017 in Application No. 102127065.
TIPO; Office Action dated Nov. 3, 2016 in Application No. 102129262.
TIPO; Notice of Allowance dated Mar. 3, 2017 in Application No. 102129262.
TIPO; Office Action dated Dec. 29, 2016 in Application No. 102129397.
TIPO; Notice of Allowance dated Aug. 29, 2017 in Application No. 102129397.
TIPO; Office Action dated Nov. 3, 2016 in Application No. 102131839.
TIPO; Notice of Allowance dated Jan. 26, 2017 in Application No. 102131839.
TIPO; Office Action dated Dec. 2, 2016 in Application No. 102136496.
TIPO; Office Action dated Jan. 10, 2018 in Application No. 102136496.
TIPO; Office Action dated Aug. 16, 2019 in Application No. 102136496.
TIPO; Notice of Allowance dated Jan. 7, 2020 in Application No. 102136496.
TIPO; Office Action dated Nov. 11, 2016 in Application No. 102132952.
TIPO; Notice of Allowance dated Apr. 19, 2017 in Application No. 102132952.
TIPO; Office Action dated Jul. 17, 2017 in Application No. 103101400.
TIPO; Notice of Allowance dated Jan. 24, 2018 in Application No. 103101400.
TIPO; Office Action dated Feb. 23, 2017 in Application No. 103102563.
TIPO; Notice of Allowance dated Nov. 30, 2017 in Application No. 103102563.
TIPO; Office Action dated Mar. 3, 2017 in Application No. 103105251.
TIPO; Notice of Allowance dated Oct. 20, 2017 in Application No. 103105251.
TIPO; Office Action dated Nov. 1, 2017 in Application No. 103106021.
TIPO; Notice of Allowance dated Apr. 10, 2018 in Application No. 103106021.
TIPO; Office Action dated Oct. 31, 2017 in Application No. 103106022.
TIPO; Notice of Allowance dated Apr. 10, 2018 in Application No. 103106022.
TIPO; Office Action dated Jul. 5, 2017 in Application No. 103117477.
TIPO; Notice of Allowance dated Jan. 22, 2018 in Application No. 103117477.
TIPO; Office Action dated Nov. 22, 2017 in Application No. 103117478.
TIPO; Notice of Allowance dated Mar. 13, 2018 in Application No. 103117478.
TIPO; Office Action dated May 19, 2017 in Application No. 103120478.
TIPO; Notice of Allowance dated Sep. 25, 2017 in Application No. 103120478.
TIPO; Office Action dated Sep. 20, 2018 in Application No. 103123439.
TIPO; Notice of Allowance dated Jul. 10, 2019 in Application No. 103123439.
TIPO; Office Action dated Nov. 8, 2017 in Application No. 103124509.
TIPO; Notice of Allowance dated Apr. 25, 2018 in Application No. 103124509.
TIPO; Office Action dated Nov. 20, 2017 in Application No. 103127588.
TIPO; Notice of Allowance dated Jun. 19, 2018 in Application No. 103127588.
TIPO; Office Action dated Sep. 19, 2017 in Application No. 103127734.
TIPO; Notice of Allowance dated Dec. 11, 2017 in Application No. 103127734.
TIPO; Office Action dated Sep. 26, 2018 in Application No. 103132230.
TIPO; Notice of Allowance dated Jan. 29, 2019 in Application No. 103132230.
TIPO; Office Action dated Nov. 22, 2017 in Application No. 103134537.
TIPO; Notice of Allowance dated Apr. 19, 2018 in Application No. 103134537.
TIPO; Office Action dated Aug. 24, 2017 in Application No. 103136251.
TIPO; Notice of Allowance dated Oct. 17, 2017 in Application No. 103136251.
TIPO; Office Action dated Feb. 26, 2018 in Application No. 103138510.
TIPO; Notice of Allowance dated Jun. 13, 2018 in Application No. 103138510.
TIPO; Office Action dated May 21, 2018 in Application No. 103139014.
TIPO; Notice of Allowance dated Sep. 11, 2018 in Application No. 103139014.
TIPO; Office Action dated Jun. 22, 2018 in Application No. 104105533.
TIPO; Office Action dated Feb. 22, 2019 in Application No. 104105533.
TIPO; Notice of Allowance dated Sep. 27, 2019 in Application No. 104105533.
TIPO; Office Action dated Nov. 19, 2018 in Application No. 104105965.
TIPO; Notice of Allowance dated Sep. 23, 2019 in Application No. 104105965.
TIPO; Office Action dated Jul. 9, 2018 in Application No. 104107876.
TIPO; Notice of Allowance dated May 9, 2019 in Application No. 104107876.
TIPO; Office Action dated Aug. 7, 2018 Application No. 104107888.
TIPO; Notice of Allowance dated Apr. 26, 2019 in Application No. 104107888.
TIPO; Office Action dated May 6, 2019 in Application No. 104108277.
TIPO; Office Action dated Jan. 17, 2020 in Application No. 104108277.
TIPO; Office Action dated Jul. 9, 2018 in Application No. 104110326.
TIPO; Notice of Allowance dated May 8, 2019 in Application No. 104110326.
TIPO; Office Action dated Jun. 13, 2018 in Application No. 104111910.
TIPO; Notice of Allowance dated Sep. 18, 2018 in Application No. 104111910.
TIPO; Office Action dated Apr. 29, 2019 in Application No. 104122889.
TIPO; Notice of Allowance dated Oct. 4, 2019 in Application No. 104122889.

(56) References Cited

OTHER PUBLICATIONS

TIPO; Office Action dated Jan. 30, 2019 in Application No. 104122890.
TIPO; Notice of Allowance dated Jul. 19, 2019 in Application No. 104122890.
TIPO; Office Action dated Jul. 11, 2018 in Application No. 104124377.
TIPO; Notice of Allowance dated Jun. 19, 2019 in Application No. 104124377.
TIPO; Office Action dated Jan. 7, 2019 in Application No. 104132991.
TIPO; Notice of Allowance dated Apr. 12, 2019 in Application No. 104132991.
TIPO; Office Action dated Apr. 25, 2019 in Application No. 104141679.
TIPO; Notice of Allowance dated Nov. 27, 2019 in Application No. 104141679.
TIPO; Office Action dated Apr. 25, 2019 in Application No. 105101536.
TIPO; Office Action dated Dec. 13, 2019 in Application No. 105101536.
TIPO; Notice of Allowance dated May 4, 2020 in Application No. 105101536.
TIPO; Office Action dated Nov. 6, 2019 in Application No. 105101537.
TIPO; Notice of Allowance dated Jul. 1, 2020 in Application No. 105101537.
TIPO; Notice of Allowance dated May 7, 2019 in Application No. 105104453.
TIPO; Office Action dated Dec. 13, 2019 in Application No. 105111990.
TIPO; Notice of Allowance dated Sep. 4, 2020 in Application No. 105111990.
TIPO; Office Action dated Jul. 5, 2019 in Application No. 105112363.
TIPO; Notice of Allowance dated Dec. 10, 2019 in Application No. 105112363.
TIPO; Office Action dated Oct. 1, 2019 in Application No. 105114105.
TIPO; Notice of Allowance dated Jan. 15, 2020 in Application No. 105114105.
TIPO; Office Action dated Sep. 9, 2019 in Application No. 105115513.
TIPO; Notice of Allowance dated Feb. 10, 2020 in Application No. 105115513.
TIPO; Office Action dated Oct. 3, 2019 in Application No. 105119533.
TIPO; Notice of Allowance dated Mar. 13, 2020 in Application No. 105119533.
TIPO; Office Action dated Jan. 20, 2020 in Application No. 105122394.
TIPO; Office Action dated Sep. 7, 2020 in Application No. 105122394.
TIPO; Office Action dated Jan. 17, 2020 in Application No. 105122586.
TIPO; Notice of Allowance dated Aug. 31, 2020 in Application No. 105122586.
TIPO; Office Action dated Oct. 28, 2019 in Application No. 105122715.
TIPO; Notice of Allowance dated Feb. 13, 2020 in Application No. 105122715.
TIPO; Office Action dated Apr. 14, 2020 in Application No. 105129977.
TIPO; Office Action dated Sep. 18, 2020 in Application No. 105129977.
TIPO; Office Action dated Mar. 17, 2020 in Application No. 105130130.
TIPO; Notice of Allowance dated Sep. 25, 2020 in Application No. 105130130.
TIPO; Office Action dated Aug. 25, 2020 in Application No. 105131284.
TIPO; Office Action dated Aug. 25, 2020 in Application No. 105131896.
TIPO; Office Action dated Dec. 2, 2020 in Application No. 105131896.
TIPO; Office Action dated Sep. 30, 2020 in Application No. 105142668.
TIPO; Notice of Allowance dated Jan. 29, 2021 in Application No. 105142668.
TIPO; Notice of Allowance dated Dec. 5, 2017 in Application No. 105308015.
TIPO; Notice of Allowance dated Apr. 11, 2018 in Application No. 105308015D01.
TIPO; Office Action dated Aug. 11, 2020 in Application No. 106100823.
TIPO; Office Action dated Jun. 17, 2020 in Application No. 106108152.
TIPO; Notice of Allowance dated Dec. 10, 2020 in Application No. 106108152.
TIPO; Office Action dated Oct. 7, 2020 in Application No. 106108522.
TIPO; Office Action dated Aug. 21, 2020 in Application No. 106111548.
TIPO; Notice of Allowance dated Jan. 25, 2021 in Application No. 106111548.
TIPO; Office Action dated Oct. 8, 2020 in Application No. 106111693.
TIPO; Office Action dated Sep. 30, 2020 in Application No. 106113604.
TIPO; Office Action dated Jan. 6, 2021 in Application No. 106115126.
TIPO; Office Action dated Nov. 6, 2017 in Application No. 106117181.
TIPO; Notice of Allowance dated Jun. 5, 2018 in Application No. 106117181.
TIPO; Office Action dated Sep. 28, 2018 in Application No. 106119537.
TIPO; Office Action dated Jul. 15, 2020 in Application No. 106120365.
TIPO; Office Action dated Nov. 12, 2020 in Application No. 106120365.
TIPO; Office Action dated Nov. 18, 2020 in Application No. 106120902.
TIPO; Office Action dated Dec. 21, 2020 in Application No. 106122231.
TIPO; Office Action dated Oct. 8, 2020 in Application No. 106123203.
TIPO; Office Action dated Dec. 29, 2020 in Application No. 106124126.
TIPO; Office Action dated Dec. 9, 2020 in Application No. 106124128.
TIPO; Office Action dated Jan. 25, 2021 in Application No. 106124129.
TIPO; Office Action dated Dec. 9, 2020 in Application No. 106124130.
TIPO; Office Action dated Dec. 26, 2018 in Application No. 106127690.
TIPO; Office Action dated Jan. 20, 2021 in Application No. 106129491.
TIPO; Office Action dated Feb. 8, 2021 in Application No. 106133152.
TIPO; Office Action dated Aug. 31, 2018 in Application No. 106138119.
TIPO; Office Action dated Jun. 25, 2018 in Application No. 106138800.
TIPO; Office Action dated Jan. 7, 2019 in Application No. 106138800.
TIPO; Notice of Allowance dated Sep. 20, 2019 in Application No. 106138800.
TIPO; Office Action dated Oct. 3, 2018 in Application No. 106142731.
TIPO; Office Action dated Sep. 28, 2018 in Application No. 107112951.
TIPO; Office Action dated Aug. 27, 2019 in Application No. 107116804.
TIPO; Notice of Allowance dated Jan. 16, 2020 in Application No. 107116804.
TIPO; Office Action dated Nov. 20, 2018 in Application No. 107118271.
TIPO; Office Action dated Jun. 4, 2019 in Application No. 107123992.
TIPO; Office Action dated May 28, 2019 in Application No. 107125586.
TIPO; Office Action dated Jan. 17, 2020 in Application No. 107127688.
TIPO; Notice of Allowance dated Aug. 29, 2018 in Application No. 107300633.
TIPO; Notice of Allowance dated Feb. 21, 2019 in Application No. 107303723.
TIPO; Office Action dated Jun. 28, 2019 in Application No. 108102948.
TIPO; Office Action dated Dec. 24, 2019 in Application No. 108105002.
TIPO; Office Action dated Feb. 3, 2020 in Application No. 108114221.
TIPO; Office Action dated Nov. 13, 2019 in Application No. 108115406.
TIPO; Office Action dated Feb. 21, 2020 in Application No. 108120947.
TIPO; Notice of Allowance dated Mar. 12, 2020 in Application No. 108129100.
TIPO; Office Action dated Jun. 24, 2020 in Application No. 108135004.
TIPO; Office Action dated Jun. 29, 2020 in Application No. 108137226.

(56) References Cited

OTHER PUBLICATIONS

TIPO; Office Action dated Jul. 9, 2020 in Application No. 108137227.
TIPO; Office Action dated Aug. 17, 2020 in Application No. 108139018.
TIPO; Notice of Allowance dated Oct. 19, 2020 in Application No. 108306935.
TIPO; Notice of Allowance dated Oct. 19, 2020 in Application No. 108306935D01.
TIPO; Notice of Allowance dated Jul. 15, 2020 in Application No. 108307027.
TIPO; Notice of Allowance dated Oct. 19, 2020 in Application No. 108307027D01.
TIPO; Notice of Allowance dated Sep. 15, 2020 in Application No. 108307301.
TIPO; Notice of Allowance dated Nov. 24, 2020 in Application No. 108307599.
TIPO; Notice of Allowance dated Jan. 11, 2021 in Application No. 108307599D01.
TIPO; Notice of Allowance dated Sep. 25, 2020 in Application No. 108307759.
TIPO; Notice of Allowance dated Jan. 11, 2021 in Application No. 109300591.
TIPO; Notice of Allowance dated Jan. 11, 2021 in Application No. 109300593.
TIPO; Office Action dated Jan. 11, 2021 in Application No. 109300594.
USPTO; Non-Final Office Action dated Mar. 28, 2001 in U.S. Appl. No. 09/452,844.
USPTO; Final Office Action dated Sep. 11, 2001 in U.S. Appl. No. 09/452,844.
USPTO; Advisory Action dated Jan. 24, 2002 in U.S. Appl. No. 09/452,844.
USPTO; Non-Final Office Action dated Apr. 9, 2002 in U.S. Appl. No. 09/452,844.
USPTO; Final Office Action dated Sep. 27, 2002 in U.S. Appl. No. 09/452,844.
USPTO; Notice of Allowance dated Jun. 17, 2003 in U.S. Appl. No. 09/452,844.
USPTO; Non-Final Office Action dated Oct. 31, 2003 in U.S. Appl. No. 09/452,844.
USPTO; Notice of Allowance dated Mar. 26, 2004 in U.S. Appl. No. 09/452,844.
USPTO; Non-Final Office Action dated Dec. 10, 2002 in U.S. Appl. No. 09/771,673.
USPTO; Final Office Action dated May 29, 2003 in U.S. Appl. No. 09/771,673.
USPTO; Final Office Action dated Feb. 6, 2004 in U.S. Appl. No. 09/771,673.
USPTO; Advisory Action dated Apr. 20, 2004 in U.S. Appl. No. 09/771,673.
USPTO; Notice of Allowance dated Jul. 29, 2004 in U.S. Appl. No. 09/771,673.
USPTO; Non-Final Office Action dated Jan. 3, 2002 in U.S. Appl. No. 09/807,580.
USPTO; Final Office Action dated Jun. 21, 2002 in U.S. Appl. No. 09/807,580.
USPTO; Advisory Action dated Aug. 27, 2002 in U.S. Appl. No. 09/807,580.
USPTO; Non-Final Action dated Nov. 27, 2002 in U.S. Appl. No. 09/807,580.
USPTO; Final Office Action dated May 27, 2003 in U.S. Appl. No. 09/807,580.
USPTO; Advisory Action dated Oct. 22, 2003 in U.S. Appl. No. 09/807,580.
USPTO; Examiner's Answer to Appeal Brief dated May 6, 2004 in U.S. Appl. No. 09/807,580.
USPTO; Decision on Appeal dated Feb. 16, 2005 in U.S. Appl. No. 09/807,580.
USPTO; Non-Final Action dated May 19, 2005 in U.S. Appl. No. 09/807,580.
USPTO; Final Action dated Nov. 21, 2005 in U.S. Appl. No. 09/807,580.
USPTO; Notice of Allowance dated Feb. 23, 2006 in U.S. Appl. No. 09/807,580.
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated May 13, 2003 in U.S. Appl. No. 10/222,229.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Feb. 9, 2004 in U.S. Appl. No. 10/603,515.
USPTO; Notice of Allowance dated Jun. 18, 2004 in U.S. Appl. No. 10/603,515.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Non-Final Office Action dated Oct. 17, 2006 in U.S. Appl. No. 10/932,633.
USPTO; Non-Final Office Action dated Apr. 19, 2007 in U.S. Appl. No. 10/932,633.
USPTO; Notice of Allowance dated Sep. 10, 2007 in U.S. Appl. No. 10/932,633.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.

(56) References Cited

OTHER PUBLICATIONS

USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Advisory Action dated Oct. 1, 2014 in U.S. Appl. No. 12/436,306.
USPTO; Non-Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 27, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Non-Final Office Action dated Jun. 30, 2016 in U.S. Appl. No. 12/618,355.
USPTO; Final Office Action dated Feb. 10, 2017 in U.S. Appl. No. 12/618,355.
USPTO; Advisory Action dated May 16, 2017 in U.S. Appl. No. 12/618,355.
USPTO; Non-Final Office Action dated Nov. 29, 2017 in U.S. Appl. No. 12/618,355.
USPTO; Final Office Action dated Aug. 10, 2018 in U.S. Appl. No. 12/618,355.
USPTO; Notice of Allowance dated Apr. 4, 2019 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Advisory Action dated Aug. 9, 2012 in U.S. Appl. No. 12/618,419.
USPTO; Notice of Allowance dated Apr. 12, 2013 in U.S. Appl. No. 12/618,419.
USPTO; Non-Final Office Action dated Jun. 12, 2013 in U.S. Appl. No. 12/618,419.
USPTO; Notice of Allowance dated Oct. 9, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.

(56) References Cited

OTHER PUBLICATIONS

USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Non-Final Office Action dated Feb. 15, 2012 in U.S. Appl. No. 13/085,531.
USPTO; Notice of Allowance dated Jul. 12, 2012 in U.S. Appl. No. 13/085,531.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.
USPTO; Notice of Allowance dated Sep. 17, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Notice of Allowance dated Jun. 28, 2017 in U.S. Appl. No. 13/166,367.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.

(56) References Cited

OTHER PUBLICATIONS

USPTO; Non-Final Office Action dated Apr. 6, 2018 in U.S. Appl. No. 13/169,951.
USPTO; Final Office Action dated Nov. 2, 2018 in U.S. Appl. No. 13/169,951.
USPTO; Advisory Action dated Feb. 4, 2019 in U.S. Appl. No. 13/169,951.
USPTO; Notice of Allowance dated Apr. 4, 2019 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Final Office Action dated Dec. 28, 2018 in U.S. Appl. No. 13/184,351.
USPTO; Non-Final Office Action dated Aug. 19, 2019 in U.S. Appl. No. 13/184,351.
USPTO; Notice of Allowance dated Jul. 6, 2020 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Examiner's Answer to Appeal Brief dated Apr. 20, 2018 in U.S. Appl. No. 13/187,300.
USPTO; Patent Board Decision dated Sep. 23, 2019 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Advisory Action dated Mar. 28, 2016 in U.S. Appl. No. 13/283,408.
USPTO; Notice of Allowance dated Mar. 28, 2016 in U.S. Appl. No. 13/283,408.
USPTO; Non-Final Office Action dated Jul. 30, 2014 in U.S. Appl. No. 13/284,642.
USPTO; Notice of Allowance dated Feb. 11, 2015 in U.S. Appl. No. 13/284,642.
USPTO; Non-Final Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.

(56) References Cited

OTHER PUBLICATIONS

USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.
USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Non-Final Office Action dated Nov. 15, 2013 in U.S. Appl. No. 13/612,538.
USPTO; Non-Final Office Action dated Jul. 10, 2014 in U.S. Appl. No. 13/612,538.
USPTO; Notice of Allowance dated Feb. 25, 2015 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Non-Final Office Action dated May 28, 2015 in U.S. Appl. No. 13/651,144.
USPTO; Final Office Action dated Dec. 14, 2017 in U.S. Appl. No. 13/651,144.
USPTO; Final Office Action dated Nov. 19, 2015 in U.S. Appl. No. 13/651,144.
USPTO; Advisory Action dated Feb. 12, 2016 in U.S. Appl. No. 13/651,144.
USPTO; Non-Final Office Action dated May 10, 2016 in U.S. Appl. No. 13/651,144.

(56) References Cited

OTHER PUBLICATIONS

USPTO; Final Office Action dated Sep. 20, 2016 in U.S. Appl. No. 13/651,144.
USPTO; Advisory Action dated Dec. 29, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
USPTO; Non-Final Office Action dated Sep. 20, 2018 in U.S. Appl. No. 13/651,144.
USPTO; Final Office Action dated Mar. 15, 2019 in U.S. Appl. No. 13/651,144.
USPTO; Non-Final Office Action dated Sep. 18, 2019 in U.S. Appl. No. 13/651,144.
USPTO; Notice of Allowance dated Feb. 10, 2020 in U.S. Appl. No. 13/651,144.
USPTO; Advisory Action dated Jun. 26, 2015 in U.S. Appl. No. 13/791,246.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance dated Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.
USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.

(56) References Cited

OTHER PUBLICATIONS

USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Non-Final Office Action dated Oct. 30, 2014 in U.S. Appl. No. 13/948,055.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Advisory Action dated Nov. 10, 2015 in U.S. Appl. No. 14/079,302.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.

(56) References Cited

OTHER PUBLICATIONS

USPTO; Non-Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Notice of Allowance dated Aug. 29, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Notice of Allowance dated Apr. 22, 2016 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Notice of Allowance dated Aug. 31, 2015 in U.S. Appl. No. 14/183,187.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Final Office Action dated Jan. 25, 2019 in U.S. Appl. No. 14/188,760.
USPTO; Non-Final Office Action dated Aug. 8, 2019 in U.S. Appl. No. 14/188,760.
USPTO; Notice of Allowance dated Feb. 10, 2020 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Notice of Allowance dated Sep. 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl. No. 14/219,839.
USPTO; Final Office Action dated Nov. 1, 2018 in U.S. Appl. No. 14/219,839.
USPTO; Advisory Action dated Jan. 22, 2019 in U.S. Appl. No. 14/219,839.
USPTO; Non-Final Office Action dated Jul. 15, 2019 in U.S. Appl. No. 14/219,839.
USPTO; Final Office Action dated Jan. 27, 2020 in U.S. Appl. No. 14/219,839.
USPTO; Advisory Action dated Apr. 24, 2020 in U.S. Appl. No. 14/219,839.
USPTO; Advisory Action dated Apr. 24, 2020 in U.S. Appl. No. 14/219,879.
USPTO; Non-Final Office Action dated Nov. 25, 2015 in U.S. Appl. No. 14/219,879.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Final Office Action dated Nov. 2, 2018 in U.S. Appl. No. 14/219,879.
USPTO; Advisory Action dated Jan. 22, 2019 in U.S. Appl. No. 14/219,879.
USPTO; Non-Final Office Action dated Jun. 24, 2019 in U.S. Appl. No. 14/219,879.
USPTO; Final Office Action dated Jan. 13, 2020 in U.S. Appl. No. 14/219,879.
USPTO; Non-Final Office Action dated Dec. 1, 2020 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non-Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Non-Final Office Action dated Aug. 19, 2015 in U.S. Appl. No. 14/268,348.

(56) References Cited

OTHER PUBLICATIONS

USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 19, 2016 in U.S. Appl. No. 14/268,348.
USPTO; Notice of Allowance dated Aug. 30, 2016 in U.S. Appl. No. 14/268,348.
USPTO; Non-Final Office Action dated Oct. 20, 2015 in U.S. Appl. No. 14/281,477.
USPTO; Notice of Allowance dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.
USPTO; Non-Final Office Action Dated Jul. 27, 2018 in U.S. Appl. No. 14/444,744.
USPTO; Final Office Action dated Feb. 7, 2019 in U.S. Appl. No. 14/444,744.
USPTO; Non-Final Office Action dated Aug. 8, 2019 in U.S. Appl. No. 14/444,744.
USPTO; Final Office Action dated Feb. 20, 2020 in U.S. Appl. No. 14/444,744.
USPTO; Non-Final Office Action dated Apr. 28, 2020 in U.S. Appl. No. 14/444,744.
USPTO; Notice of Allowance dated Sep. 3, 2020 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Advisory Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.
USPTO; Non-Final Office Action dated Oct. 6, 2016 in U.S. Appl. No. 14/457,058.
USPTO; Final Office Acton dated May 4, 2017 in U.S. Appl. No. 14/457,058.
USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Jan. 11, 2019 in U.S. Appl. No. 14/457,058.
USPTO; Final Office Action dated Jun. 25, 2019 in U.S. Appl. No. 14/457,058.
USPTO; Non-Final Office Action dated Oct. 31, 2019 in U.S. Appl. No. 14/457,058.
USPTO; Final Office Action dated May 15, 2020 in U.S. Appl. No. 14/457,058.
USPTO; Notice of Allowance dated Aug. 6, 2020 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.
USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Final Office Action dated Nov. 28, 2018 in U.S. Appl. No. 14/508,489.
USPTO; Non-Final Office Action dated Apr. 4, 2019 in U.S. Appl. No. 14/508,489.
USPTO; Final Office Action dated Aug. 20, 2019 in U.S. Appl. No. 14/508,489.
USPTO; Advisory Action dated Oct. 28, 2019 in U.S. Appl. No. 14/508,489.
USPTO; Non-Final Office Action dated Mar. 5, 2020 in U.S. Appl. No. 14/508,489.
USPTO; Final Office Action dated Aug. 20, 2020 in U.S. Appl. No. 14/508,489.
USPTO; Notice of Allowance dated Nov. 3, 2020 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.

(56) References Cited

OTHER PUBLICATIONS

USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Notice of Allowance dated Aug. 16, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Notice of Allowance dated Aug. 15, 2019 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Notice of Allowance dated Nov. 19, 2018 in U.S. Appl. No. 14/656,588.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO; Non-Final Office Action dated Sep. 7, 2017 in U.S. Appl. No. 14/660,755.
USPTO; Notice of Allowance dated Oct. 2, 2017 in U.S. Appl. No. 14/660,755.
USPTO; Notice of Allowance dated Mar. 25, 2016 in U.S. Appl. No. 14/693,138.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Final Office Action dated Sep. 5, 2018 in U.S. Appl. No. 14/752,712.
USPTO; Non-Final Office Action dated Dec. 28, 2018 in U.S. Appl. No. 14/752,712.
USPTO; Notice of Allowance dated Jun. 11, 2019 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Final Office Action dated Feb. 25, 2019 in U.S. Appl. No. 14/793,323.
UPSTO; Non-Final Office Action dated Jun. 27, 2019 in U.S. Appl. No. 14/793,323.
USPTO; Notice of Allowance dated Nov. 14, 2019 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Acton dated Sep. 30, 2016 in U.S. Appl. No. 14/808,979.
USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Non-Final Office Action dated Sep. 1, 2016 in U.S. Appl. No. 14/827,177.
USPTO; Notice of Allowance dated Jan. 27, 2017 in U.S. Appl. No. 14/827,177.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Final Office Action dated Apr. 18, 2019 in U.S. Appl. No. 14/829,565.
USPTO; Advisory Action dated Jul. 22, 2019 in U.S. Appl. No. 14/829,565.

(56) References Cited

OTHER PUBLICATIONS

USPTO; Non-Final Office Action dated Sep. 19, 2019 in U.S. Appl. No. 14/829,565.
USPTO; Final Office Action dated Mar. 3, 2020 in U.S. Appl. No. 14/829,565.
USPTO; Advisory Action dated Jun. 22, 2020 in U.S. Appl. No. 14/829,565.
USPTO; Non-Final Office Action dated Aug. 3, 2020 in U.S. Appl. No. 14/829,565.
USPTO; Final Office Action dated Feb. 1, 2021 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Notice of Allowance dated Oct. 20, 2017 in U.S. Appl. No. 14/884,695.
USPTO; Non-Final Office Action dated May 18, 2017 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.
USPTO; Final Office Action dated May 11, 2018 in U.S. Appl. No. 14/919,536.
USPTO; Notice of Allowance dated Oct. 4, 2018 in U.S. Appl. No. 14/919,536.
USPTO; Notice of Allowance dated Nov. 19, 2018 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.
USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Notice of Allowance dated Nov. 21, 2016 in U.S. Appl. No. 14/981,434.
USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Final Office Action dated Jun. 10, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.
USPTO; Final Office Action dated Dec. 10, 2018 in U.S. Appl. No. 14/997,683.
USPTO; Notice of Allowance dated Mar. 25, 2019 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Final Office Action dated Oct. 19, 2018 in U.S. Appl. No. 15/060,412.
USPTO; Non-Final Office Action dated Jun. 3, 2019 in U.S. Appl. No. 15/060,412.
USPTO; Final Office Action dated Dec. 26, 2019 in U.S. Appl. No. 15/060,412.
USPTO; Notice of Allowance dated Mar. 5, 2020 in U.S. Appl. No. 15/060,412.
USPTO; Non-Final Office Action dated Aug. 27, 2018 in U.S. Appl. No. 15/067,028.
USPTO; Notice of Allowance dated Dec. 21, 2018 in U.S. Appl. No. 15/067,028.
USPTO; Non-Final Office Action dated Sep. 26, 2018 in U.S. Appl. No. 15/074,813.
USPTO; Notice of Allowance dated Feb. 25, 2019 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Nov. 23, 2018 in U.S. Appl. No. 15/135,258.
USPTO; Final Office Action dated Mar. 14, 2019 in U.S. Appl. No. 15/135,258.
USPTO; Non-Final Office Action dated Jul. 19, 2019 in U.S. Appl. No. 15/135,258.
USPTO; Final Office Action dated Oct. 24, 2019 in U.S. Appl. No. 15/135,258.
USPTO; Advisory Action dated Jan. 3, 2020 in U.S. Appl. No. 15/135,258.
USPTO; Non-Final Office Action dated Feb. 13, 2020 in U.S. Appl. No. 15/135,258.

(56) References Cited

OTHER PUBLICATIONS

USPTO; Final Office Action dated Jun. 1, 2020 in U.S. Appl. No. 15/135,258.
USPTO; Non-Final Office Action dated Jan. 9, 2018 in U.S. Appl. No. 15/135,333.
USPTO; Notice of Allowance dated Aug. 18, 2020 in U.S. Appl. No. 15/135,258.
USPTO; Notice of Allowance dated Sep. 14, 2018 in U.S. Appl. No. 15/135,333.
USPTO; Non-Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Mar. 26, 2018 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Notice of Allowance dated Mar. 13, 2019 in U.S. Appl. No. 15/144,506.
USPTO; Non-Final Office Action dated Oct. 9, 2018 in U.S. Appl. No. 15/182,504.
USPTO; Final Office Action dated Mar. 28, 2019 in U.S. Appl. No. 15/182,504.
USPTO; Notice of Allowance dated Jul. 17, 2019 in U.S. Appl. No. 15/182,504.
USPTO; Non-Final Office Action dated Nov. 28, 2016 in U.S. Appl. No. 15/203,632.
USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.
USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Final Office Action dated Oct. 9, 2018 in U.S. Appl. No. 15/205,827.
USPTO; Non-Final Office Action dated Mar. 28, 2019 in U.S. Appl. No. 15/205,827.
USPTO; Final Office Action dated Aug. 9, 2019 in U.S. Appl. No. 15/205,827.
USPTO; Advisory Action dated Oct. 22, 2019 in U.S. Appl. No. 15/205,827.
USPTO; Notice of Allowance dated Dec. 3, 2019 in U.S. Appl. No. 15/205,827.
USPTO; Non-Final Office Action dated Mar. 31, 2017 in U.S. Appl. No. 15/205,890.
USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 3, 2017 in U.S. Appl. No. 15/222,738.
USPTO; Notice of Allowance dated May 22, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO: Final Office Action dated Jun. 4, 2018 in U.S. Appl. No. 15/222,749.
USPTO; Notice of Allowance dated Aug. 30, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.
USPTO; Non-Final Office Action dated Oct. 1, 2018 in U.S. Appl. No. 15/222,780.
USPTO; Notice of Allowance dated Apr. 19, 2019 in U.S. Appl. No. 15/222,780.
USPTO; Notice of Allowance dated Jul. 12, 2018 in U.S. Appl. No. 15/254,605.
USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Sep. 13, 2018 in U.S. Appl. No. 15/262,990.
USPTO; Non-Final Office Action dated Jan. 30, 2019 in U.S. Appl. No. 15/262,990.
USPTO; Final Office Action dated May 13, 2019 in U.S. Appl. No. 15/262,990.
USPTO; Advisory Action dated Jul. 22, 2019 in U.S. Appl. No. 15/262,990.
USPTO; Non-Final Office Action dated Aug. 5, 2019 in U.S. Appl. No. 15/262,990.
USPTO; Final Office Action dated Nov. 19, 2019 in U.S. Appl. No. 15/262,990.
USPTO; Advisory Action dated Jan. 30, 2020 in U.S. Appl. No. 15/262,990.
USPTO; Non-Final Office Action dated Oct. 6, 2020 in U.S. Appl. No. 15/262,990.
USPTO; Non-Final Office Action dated Aug. 3, 2018 in U.S. Appl. No. 15/273,488.
USPTO; Final Office Action dated Jan. 11, 2019 in U.S. Appl. No. 15/273,488.
USPTO; Notice of Allowance dated Apr. 19, 2019 in U.S. Appl. No. 15/273,488.

(56) References Cited

OTHER PUBLICATIONS

USTPO; Non-Final Office Action dated Jul. 2, 2018 in U.S. Appl. No. 15/286,503.
USPTO; Final Office Action dated Feb. 7, 2019 in U.S. Appl. No. 15/286,503.
USPTO; Non-Final Office Action dated Jun. 27, 2019 in U.S. Appl. No. 15/286,503.
USPTO; Final Office Action dated Jan. 6, 2020 in U.S. Appl. No. 15/286,503.
USPTO; Advisory Action dated Mar. 31, 2020 in U.S. Appl. No. 15/286,503.
USPTO; Non-Final Office Action dated Apr. 16, 2020 in U.S. Appl. No. 15/286,503.
USPTO; Final Office Action dated Oct. 2, 2020 in U.S. Appl. No. 15/286,503.
USPTO; Non-Final Office Action dated Dec. 24, 2020 in U.S. Appl. No. 15/286,503.
USPTO; Non-Final Office Action dated Dec. 14, 2018 in U.S. Appl. No. 15/340,512.
USPTO; Notice of Allowance dated May 24, 2019 in U.S. Appl. No. 15/340,512.
USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Non-Final Office Action dated Nov. 14, 2018 in U.S. Appl. No. 15/377,439.
USPTO; Final Office Action dated Jun. 25, 2019 in U.S. Appl. No. 15/377,439.
USPTO; Non-Final Office Action dated Nov. 7, 2019 in U.S. Appl. No. 15/377,439.
USPTO; Final Office Action dated May 13, 2020 in U.S. Appl. No. 15/377,439.
USPTO; Non-Final Office Action dated Sep. 2, 2020 in U.S. Appl. No. 15/377,439.
USPTO; Final Office Action dated Feb. 12, 2021 in U.S. Appl. No. 15/377,439.
USPTO; Notice of Allowance dated Aug. 8, 2017 in U.S. Appl. No. 15/380,895.
USPTO; Notice of Allowance dated Oct. 11, 2017 in U.S. Appl. No. 15/380,895.
USPTO; Non-Final Office Action dated May 31, 2019 in U.S. Appl. No. 15/380,909.
USPTO; Final Office Action dated Dec. 12, 2019 in U.S. Appl. No. 15/380,909.
USPTO; Non-Final Office Action dated Jul. 1, 2020 in U.S. Appl. No. 15/380,909.
USPTO; Non-Final Office Action dated Jan. 4, 2018 in U.S. Appl. No. 15/380,921.
USPTO; Final Office Action dated Jun. 28, 2018 in U.S. Appl. No. 15/380,921.
USPTO; Non-Final Office Action dated Feb. 25, 2019 in U.S. Appl. No. 15/380,921.
USPTO; Final Office Action dated Sep. 18, 2019 in U.S. Appl. No. 15/380,921.
USPTO; Non-Final Office Action dated Jan. 15, 2020 in U.S. Appl. No. 15/380,921.
USPTO; Final Office Action dated Jul. 23, 2020 in U.S. Appl. No. 15/380,921.
USPTO Non-Final Office Action dated Dec. 10, 2020 in U.S. Appl. No. 15/380,921.
USPTO; Non-Final Office Action dated Oct. 3, 2017 in U.S. Appl. No. 15/388,410.
USPTO; Final Office Action dated May 15, 2018 in U.S. Appl. No. 15/388,410.
USPTO; Notice of Allowance dated Nov. 14, 2018 in U.S. Appl. No. 15/388,410.
USPTO; Notice of Allowance dated Dec. 28, 2018 in U.S. Appl. No. 15/388,410.
USPTO; Non-Final Office Action dated Aug. 11, 2017 in U.S. Appl. No. 15/397,237.
USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Feb. 5, 2019 in U.S. Appl. No. 15/402,993.
USPTO; Final Office Action dated May 21, 2019 in U.S. Appl. No. 15/402,993.
USPTO; Advisory Action dated Jul. 29, 2019 in U.S. Appl. No. 15/402,993.
USPTO; Non-Final Office Action dated Oct. 24, 2019 in U.S. Appl. No. 15/402,993.
USPTO; Final Office Action dated Feb. 19, 2020 in U.S. Appl. No. 15/402,993.
USPTO; Advisory Action dated Apr. 2, 2020 in U.S. Appl. No. 15/402,993.
USPTO; Non-Final Office Action dated May 27, 2020 in U.S. Appl. No. 15/402,993.
USPTO; Final Office Action dated Sep. 8, 2020 in U.S. Appl. No. 15/402,993.
USPTO; Advisory Action dated Nov. 9, 2020 in U.S. Appl. No. 15/402,993.
USPTO; Non-Final Office Action dated Sep. 20, 2018 in U.S. Appl. No. 15/410,503.
USPTO; Final Office Action dated Feb. 4, 2019 in U.S. Appl. No. 15/410,503.
USPTO; Non-Final Office Action dated Apr. 25, 2019 in U.S. Appl. No. 15/410,503.
USPTO; Notice of Allowance dated Aug. 14, 2019 in U.S. Appl. No. 15/410,503.
USPTO; Non-Final Office Action dated Aug. 7, 2018 in U.S. Appl. No. 15/428,808.
USPTO; Final Office Action dated Jan. 11, 2019 in U.S. Appl. No. 15/428,808.
USPTO; Notice of Allowance dated Apr. 25, 2019 in U.S. Appl. No. 15/428,808.
USPTO; Non-Final Office Action dated Apr. 6, 2018 in U.S. Appl. No. 15/434,051.
USPTO; Final Office Action dated Aug. 29, 2018 in U.S. Appl. No. 15/434,051.
USPTO; Advisory Action dated Dec. 4, 2018 in U.S. Appl. No. 15/434,051.
USPTO; Non-Final Office Action dated Jan. 25, 2019 in U.S. Appl. No. 15/434,051.
USPTO; Notice of Allowance dated Jun. 3, 2019 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Apr. 6, 2018 in U.S. Appl. No. 15/472,750.
USPTO; Notice of Allowance dated Nov. 30, 2018 in U.S. Appl. No. 15/472,750.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Non-Final Office Action dated Oct. 4, 2017 in U.S. Appl. No. 15/489,453.

(56) References Cited

OTHER PUBLICATIONS

USPTO; Final Office Action dated Apr. 19, 2018 in U.S. Appl. No. 15/489,453.
USPTO; Non-Final Office Action dated Sep. 10, 2018 in U.S. Appl. No. 15/489,453.
USPTO; Final Office Action dated Feb. 27, 2019 in U.S. Appl. No. 15/489,453.
USPTO; Non-Final Office Action dated Jun. 5, 2019 in U.S. Appl. No. 15/489,453.
USPTO; Notice of Allowance dated Oct. 7, 2019 in U.S. Appl. No. 15/489,453.
USPTO; Notice of Allowance dated Dec. 19, 2017 in U.S. Appl. No. 15/489,660.
USPTO; Final Office Action dated May 1, 2019 in U.S. Appl. No. 15/491,726.
USPTO; Non-Final Office Action dated May 31, 2018 in U.S. Appl. No. 15/491,726.
USPTO; Non-Final Office Action dated Oct. 3, 2019 in U.S. Appl. No. 15/491,726.
USPTO; Final Office Action dated Apr. 17, 2020 in U.S. Appl. No. 15/491,726.
USPTO; Non-Final Office Action dated Sep. 30, 2020 in U.S. Appl. No. 15/491,726.
USPTO; Non-Final Office Action dated Jan. 16, 2018 in U.S. Appl. No. 15/499,647.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Notice of Allowance dated Nov. 1, 2018 in U.S. Appl. No. 15/499,647.
USPTO; Notice of Allowance dated Nov. 15, 2018 in U.S. Appl. No. 15/499,647.
USPTO; Office Action dated Aug. 30, 2018 in U.S. Appl. No. 15/589,849.
USPTO; Final Office Action dated Mar. 6, 2019 in U.S. Appl. No. 15/589,849.
USPTO; Non-Final Office Action dated Jun. 28, 2019 in U.S. Appl. No. 15/589,849.
USPTO; Final Office Action dated Jan. 8, 2020 in U.S. Appl. No. 15/589,849.
USPTO; Notice of Allowance dated Feb. 28, 2020 in U.S. Appl. No. 15/589,849.
USPTO; Office Action dated May 3, 2018 in U.S. Appl. No. 15/589,861.
USPTO; Non-Final Office Action dated Dec. 21, 2018 in U.S. Appl. No. 15/589,861.
USPTO; Final Office Action dated Jun. 26, 2019 in U.S. Appl. No. 15/589,861.
USPTO; Advisory Action dated Sep. 20, 2019 in U.S. Appl. No. 15/589,861.
USPTO; Non-Final Office Action dated Jan. 13, 2020 in U.S. Appl. No. 15/589,861.
USPTO; Final Office Action dated Jul. 8, 2020 in U.S. Appl. No. 15/589,861.
USPTO; Notice of Allowance dated Oct. 16, 2020 in U.S. Appl. No. 15/589,861.
USPTO; Non-Final Office Action dated Apr. 4, 2018 in U.S. Appl. No. 15/592,730.
USPTO; Final Office Action dated Nov. 16, 2018 in U.S. Appl. No. 15/592,730.
USPTO; Advisory Action dated Mar. 15, 2019 in U.S. Appl. No. 15/592,730.
USPTO; Notice of Allowance dated Aug. 21, 2019 in U.S. Appl. No. 15/592,730.
USPTO; Non-Final Office Action dated Mar. 7, 2019 in U.S. Appl. No. 15/598,169.
USPTO; Final Office Action dated Jun. 25, 2019 in U.S. Appl. No. 15/598,169.
USPTO; Notice of Allowance dated Sep. 11, 2019 in U.S. Appl. No. 15/598,169.
USPTO; Non-Final Office Action dated Mar. 10, 2020 in U.S. Appl. No. 15/611,707.
USPTO; Final Office Action dated Sep. 16, 2020 in U.S. Appl. No. 15/611,707.
USPTO; Advisory Action dated Nov. 20, 2020 in U.S. Appl. No. 15/611,707.
USPTO; Non-Final Office Action dated Feb. 3, 2021 in U.S. Appl. No. 15/611,707.
USPTO; Ex Parte Quayle Action dated Mar. 21, 2019 in U.S. Appl. No. 15/615,489.
USPTO; Non-Final Office Action dated Sep. 4, 2019 in U.S. Appl. No. 15/615,489.
USPTO; Notice of Allowance dated Feb. 28, 2020 in U.S. Appl. No. 15/615,489.
USPTO; Non-Final Office Action dated Feb. 1, 2019 in U.S. Appl. No. 15/627,189.
USPTO; Notice of Allowance dated May 21, 2019 in U.S. Appl. No. 15/627,189.
USPTO; Non-Final Office Action dated Nov. 9, 2018 in U.S. Appl. No. 15/636,307.
USPTO; Final Office Action dated Mar. 6, 2019 in U.S. Appl. No. 15/636,307.
USPTO; Non-Final Office Action dated Jul. 16, 2019 in U.S. Appl. No. 15/636,307.
USPTO; Final Office Action dated Nov. 12, 2019 in U.S. Appl. No. 15/636,307.
USPTO; Advisory Action dated Jan. 17, 2020 in U.S. Appl. No. 15/636,307.
USPTO; Non-Final Office Action dated Mar. 11, 2020 in U.S. Appl. No. 15/636,307.
USPTO; Final Office Action dated Jun. 16, 2020 in U.S. Appl. No. 15/636,307.
USPTO; Non-Final Office Action dated Sep. 3, 2020 in U.S. Appl. No. 15/636,307.
USPTO; Final Office Action dated Jan. 19, 2021 in U.S. Appl. No. 15/636,307.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Jun. 5, 2018 in U.S. Appl. No. 15/650,686.
USPTO; Final Office Action dated Nov. 20, 2018 in U.S. Appl. No. 15/650,686.
USPTO; Notice of Allowance dated Jun. 24, 2019 in U.S. Appl. No. 15/650,686.
USPTO; Non-Final Office Action dated Sep. 21, 2018 in U.S. Appl. No. 15/659,631.
USPTO; Notice of Allowance dated Feb. 21, 2019 in U.S. Appl. No. 15/659,631.
USPTO; Non-Final Office Action dated Jul. 29, 2019 in U.S. Appl. No. 15/660,797.
USPTO; Notice of Allowance dated Nov. 7, 2019 in U.S. Appl. No. 15/660,797.
USPTO; Non-Final Office Action dated Aug. 9, 2018 in U.S. Appl. No. 15/660,805.
USPTO; Non-Final Office Action dated Mar. 1, 2019 in U.S. Appl. No. 15/660,805.
USPTO; Notice of Allowance dated Aug. 22, 2019 in U.S. Appl. No. 15/660,805.
USPTO; Non-Final Office Action dated Aug. 27, 2018 in U.S. Appl. No. 15/662,107.
USPTO; Notice of Allowance dated Feb. 21, 2019 in U.S. Appl. No. 15/662,107.
USPTO; Non-Final Office Action dated Dec. 4, 2018 in U.S. Appl. No. 15/672,063.
USPTO; Notice of Allowance dated Mar. 20, 2019 in U.S. Appl. No. 15/672,063.
USPTO; Non-Final Office Action dated Oct. 10, 2019 in U.S. Appl. No. 15/672,096.

(56) References Cited

OTHER PUBLICATIONS

USPTO; Final Office Action dated Mar. 27, 2020 in U.S. Appl. No. 15/672,096.
USPTO; Notice of Allowance dated May 20, 2020 in U.S. Appl. No. 15/672,096.
USPTO; Notice of Allowance dated Jul. 2, 2020 in U.S. Appl. No. 15/672,096.
USPTO; Non-Final Office Action dated Feb. 8, 2019 in U.S. Appl. No. 15/672,119.
USPTO; Final Office Action dated Jul. 16, 2019 in U.S. Appl. No. 15/672,119.
USPTO; Advisory Action dated Sep. 23, 2019 in U.S. Appl. No. 15/672,119.
USPTO; Notice of Allowance dated Feb. 7, 2020 in U.S. Appl. No. 15/672,119.
USPTO; Non-Final Office Action dated Jul. 27, 2018 in U.S. Appl. No. 15/673,110.
USPTO; Notice of Allowance dated Jan. 9, 2019 in U.S. Appl. No. 15/673,110.
USPTO; Non-Final Office Action dated Apr. 25, 2018 in U.S. Appl. No. 15/673,278.
USPTO; Notice of Allowance dated May 6, 2019 in U.S. Appl. No. 15/673,278.
USPTO; Non-Final Office Action dated Jan. 18, 2018 in U.S. Appl. No. 15/683,701.
USPTO; Notice of Allowance dated Jan. 9, 2019 in U.S. Appl. No. 15/683,701.
USPTO; Final Office Action dated Aug. 24, 2018 in U.S. Appl. No. 15/683,701.
USPTO; Advisory Action dated Nov. 26, 2018 in U.S. Appl. No. 15/683,701.
USPTO; Non-Final Office Action dated Dec. 18, 2018 in U.S. Appl. No. 15/690,017.
USPTO; Final Office Action dated Jul. 26, 2019 in U.S. Appl. No. 15/690,017.
USPTO; Non-Final Office Action dated Nov. 20, 2019 in U.S. Appl. No. 15/690,017.
USPTO; Final Office Action dated May 27, 2020 in U.S. Appl. No. 15/690,017.
USPTO; Advisory Action dated Aug. 6, 2020 in U.S. Appl. No. 15/690,017.
USPTO; Non-Final Office Action dated Aug. 24, 2020 in U.S. Appl. No. 15/690,017.
USPTO; Non-Final Office Action dated Aug. 9, 2018 in U.S. Appl. No. 15/691,241.
USPTO; Final Office Action dated Jan. 11, 2019 in U.S. Appl. No. 15/691,241.
USPTO; Non-Final Office Action dated Mar. 19, 2019 in U.S. Appl. No. 15/691,241.
USPTO; Final Office Action dated Jan. 24, 2020 in U.S. Appl. No. 15/691,241.
USPTO; Advisory Action dated Jun. 19, 2020 in U.S. Appl. No. 15/691,241.
USPTO; Non-Final Office Action dated Oct. 6, 2020 in U.S. Appl. No. 15/691,241.
USPTO; Non-Final Office Action dated Dec. 6, 2018 in U.S. Appl. No. 15/705,955.
USPTO; Notice of Allowance dated Apr. 16, 2019 in U.S. Appl. No. 15/705,955.
USPTO; Non-Final Office Action dated Feb. 11, 2019 in U.S. Appl. No. 15/707,786.
USPTO; Final Office Action dated Aug. 12, 2019 in U.S. Appl. No. 15/707,786.
USPTO; Notice of Allowance dated Nov. 7, 2019 in U.S. Appl. No. 15/707,786.
USPTO; Non-Final Office Action dated Jun. 14, 2018 in U.S. Appl. No. 15/711,989.
USPTO; Notice of Allowance dated Dec. 6, 2018 in U.S. Appl. No. 15/711,989.
USPTO; Non-Final Office Action dated May 29, 2018 in U.S. Appl. No. 15/719,208.
USPTO; Final Office Action dated Dec. 13, 2018 in U.S. Appl. No. 15/719,208.
USPTO; Non-Final Office Action dated Jun. 25, 2019 in U.S. Appl. No. 15/719,208.
USPTO; Notice of Allowance dated Jan. 29, 2020 in U.S. Appl. No. 15/719,208.
USPTO; Non-Final Office Action dated Oct. 4, 2018 in U.S. Appl. No. 15/726,222.
USPTO; Notice of Allowance dated Apr. 19, 2019 in U.S. Appl. No. 15/726,222.
USPTO; Non-Final Office Action dated Apr. 19, 2018 in U.S. Appl. No. 15/726,959.
USPTO; Final Office Action dated Nov. 14, 2018 in U.S. Appl. No. 15/726,959.
USPTO; Non-Final Office Action dated Jul. 8, 2019 in U.S. Appl. No. 15/726,959.
USPTO; Final Office Action dated Jan. 7, 2020 in U.S. Appl. No. 15/726,959.
USPTO; Advisory Action dated Mar. 16, 2020 in U.S. Appl. No. 15/726,959.
USPTO; Non-Final Office Action dated Apr. 3, 2020 in U.S. Appl. No. 15/726,959.
USPTO; Final Office Action dated Sep. 24, 2020 in U.S. Appl. No. 15/726,959.
USPTO; Non-Final Office Action dated Jan. 6, 2021 in U.S. Appl. No. 15/726,959.
USPTO; Non-Final Office Action dated Sep. 26, 2019 in U.S. Appl. No. 15/727,432.
USPTO; Notice of Allowance dated Jan. 6, 2020 in U.S. Appl. No. 15/727,432.
USPTO; Non-Final Office Action dated May 17, 2018 in U.S. Appl. No. 15/729,485.
USPTO; Notice of Allowance dated Jan. 23, 2019 in U.S. Appl. No. 15/729,485.
USPTO; Non-Final Office Action dated Nov. 28, 2018 in U.S. Appl. No. 15/795,056.
USPTO; Final Office Action dated Apr. 19, 2019 in U.S. Appl. No. 15/795,056.
USPTO; Final Office Action dated Jul. 31, 2019 in U.S. Appl. No. 15/795,056.
USPTO; Non-Final Office Action dated Nov. 20, 2019 in U.S. Appl. No. 15/795,056.
USPTO; Notice of Allowance dated Mar. 12, 2020 in U.S. Appl. No. 15/795,056.
USPTO; Non-Final Office Action dated Jun. 26, 2018 in U.S. Appl. No. 15/796,593.
USPTO; Final Office Action dated Feb. 21, 2019 in U.S. Appl. No. 15/796,593.
USPTO; Non-Final Office Action dated Jun. 14, 2019 in U.S. Appl. No. 15/796,593.
USPTO; Notice of Allowance dated Dec. 31, 2019 in U.S. Appl. No. 15/796,593.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Non-Final Office Action dated Dec. 21, 2018 in U.S. Appl. No. 15/798,150.
USPTO; Notice of Allowance dated May 14, 2019 in U.S. Appl. No. 15/798,150.
USPTO; Non-Final Office Action dated Aug. 9, 2018 in U.S. Appl. No. 15/798,201.
USPTO; Final Office Action dated Dec. 14, 2018 in U.S. Appl. No. 15/798,201.
UPSTO; Non-Final Office Action dated Oct. 2, 2019 in U.S. Appl. No. 15/798,201.
USPTO; Final Office Action dated Mar. 19, 2020 in U.S. Appl. No. 15/798,201.
USPTO; Advisory Action dated May 26, 2020 in U.S. Appl. No. 15/798,201.

(56) References Cited

OTHER PUBLICATIONS

USPTO; Non-Final Office Action dated Jul. 10, 2020 in U.S. Appl. No. 15/798,201.
USPTO; Notice of Allowance dated Oct. 21, 2020 in U.S. Appl. No. 15/798,201.
USPTO; Non-Final Office Action dated Nov. 15, 2019 in U.S. Appl. No. 15/802,154.
USPTO; Final Office Action dated Mar. 11, 2020 in U.S. Appl. No. 15/802,154.
USPTO; Advisory Action dated May 19, 2020 in U.S. Appl. No. 15/802,154.
USPTO; Non-Final Office Action dated Jul. 2, 2020 in U.S. Appl. No. 15/802,154.
USPTO; Notice of Allowance dated Oct. 26, 2020 in U.S. Appl. No. 15/802,154.
USPTO; Non-Final Office Action dated Jul. 2, 2018 in U.S. Appl. No. 15/815,483.
USPTO; Final Office Action dated Mar. 7, 2019 in U.S. Appl. No. 15/815,483.
USPTO; Non-Final Office Action dated Aug. 20, 2019 in U.S. Appl. No. 15/815,483.
USPTO; Final Office Action dated Jan. 13, 2020 in U.S. Appl. No. 15/815,483.
USPTO; Advisory Action dated Mar. 25, 2020 in U.S. Appl. No. 15/815,483.
USPTO; Non-Final Office Action dated Apr. 24, 2020 in U.S. Appl. No. 15/815,483.
USPTO; Notice of Allowance dated Sep. 30, 2020 in U.S. Appl. No. 15/815,483.
USPTO; Non-Final Office Action dated Sep. 26, 2018 in U.S. Appl. No. 15/832,188.
USPTO; Notice of Allowance dated Dec. 5, 2017 in U.S. Appl. No. 15/832,188.
USPTO; Non-Final Office Action dated Mar. 17, 2020 in U.S. Appl. No. 15/835,328.
USPTO; Final Office Action dated Sep. 17, 2020 in U.S. Appl. No. 15/835,328.
USPTO; Advisory Action dated Dec. 15, 2020 in U.S. Appl. No. 15/835,328.
USPTO; Non-Final Office Action dated Feb. 20, 2020 in U.S. Appl. No. 15/835,352.
USPTO; Final Office Action dated Aug. 6, 2020 in U.S. Appl. No. 15/835,352.
USPTO; Notice of Allowance dated Jan. 14, 2021 in U.S. Appl. No. 15/835,352.
USPTO; Non-Final Office Action dated Sep. 10, 2018 in U.S. Appl. No. 15/836,547.
USPTO; Non-Final Office Action dated Mar. 13, 2019 in U.S. Appl. No. 15/836,547.
USPTO; Notice of Allowance dated Aug. 16, 2019 in U.S. Appl. No. 15/836,547.
USPTO; Notice of Allowance dated Aug. 17, 2020 in U.S. Appl. No. 15/843,899.
USPTO; Non-Final Office Action dated Jul. 31, 2019 in U.S. Appl. No. 15/860,564.
USPTO; Final Office Action dated Nov. 13, 2019 in U.S. Appl. No. 15/860,564.
USPTO; Advisory Action dated Jan. 21, 2020 in U.S. Appl. No. 15/860,564.
USPTO; Non-Final Office Action dated Mar. 30, 2020 in U.S. Appl. No. 15/860,564.
USPTO; Notice of Allowance dated Jun. 30, 2020 in U.S. Appl. No. 15/860,564.
USPTO; Non-Final Office Action dated Mar. 20, 2020 in U.S. Appl. No. 15/861,418.
USPTO; Final Office Action dated Jun. 11, 2020 in U.S. Appl. No. 15/861,418.
USPTO; Notice of Allowance dated Aug. 19, 2020 in U.S. Appl. No. 15/861,418.
USPTO; Non-Final Office Action dated Jul. 23, 2018 in U.S. Appl. No. 15/863,340.
USPTO; Notice of Allowance dated Dec. 10, 2018 in U.S. Appl. No. 15/863,340.
USPTO; Non-Final Office Action dated Jan. 11, 2019 in U.S. Appl. No. 15/879,209.
USPTO; Non-Final Office Action dated Jan. 22, 2019 in U.S. Appl. No. 15/879,209.
USPTO; Final Office Action dated Aug. 21, 2019 in U.S. Appl. No. 15/879,209.
USPTO; Advisory Action dated Nov. 5, 2019 in U.S. Appl. No. 15/879,209.
USPTO; Notice of Allowance dated Jan. 16, 2020 in U.S. Appl. No. 15/879,209.
USPTO; Non-Final Office Action dated Apr. 17, 2019 in U.S. Appl. No. 15/886,225.
USPTO; Notice of Allowance dated Sep. 23, 2019 in U.S. Appl. No. 15/886,225.
USPTO; Non-Final Office Action dated Nov. 15, 2018 in U.S. Appl. No. 15/890,037.
USPTO; Final Office Action dated May 2, 2019 in U.S. Appl. No. 15/890,037.
USPTO; Non-Final Office Action dated Oct. 24, 2019 in U.S. Appl. No. 15/890,037.
USPTO; Final Office Action dated Feb. 26, 2020 in U.S. Appl. No. 15/890,037.
USPTO; Advisory Action dated Jun. 5, 2020 in U.S. Appl. No. 15/890,037.
USPTO; Non-Final Office Action dated Sep. 2, 2020 in U.S. Appl. No. 15/890,037.
USPTO; Final Office Action dated Jan. 11, 2021 in U.S. Appl. No. 15/890,037.
USPTO; Notice of Allowance dated Feb. 8, 2019 in U.S. Appl. No. 15/892,756.
USPTO; Non-Final Office Action dated Apr. 24, 2019 in U.S. Appl. No. 15/896,986.
USPTO; Final Office Action dated Nov. 19, 2019 in U.S. Appl. No. 15/896,986.
USPTO; Advisory Action dated Feb. 7, 2020 in U.S. Appl. No. 15/896,986.
USPTO; Non-Final Office Action dated Mar. 24, 2020 in U.S. Appl. No. 15/896,986.
USPTO; Final Office Action dated Jun. 15, 2020 in U.S. Appl. No. 15/896,986.
USPTO; Notice of Allowance dated Aug. 26, 2020 in U.S. Appl. No. 15/896,986.
USPTO; Non-Final Office Action dated Sep. 19, 2019 in U.S. Appl. No. 15/897,578.
USPTO; Notice of Allowance dated Mar. 27, 2020 in U.S. Appl. No. 15/897,578.
USPTO; Non-Final Office Action dated May 30, 2019 in U.S. Appl. No. 15/900,425.
USPTO; Notice of Allowance dated Dec. 17, 2019 in U.S. Appl. No. 15/900,425.
USPTO; Non-Final Office Action dated Sep. 9, 2020 in U.S. Appl. No. 15/909,705.
USPTO; Non-Final Office Action dated Mar. 8, 2019 in U.S. Appl. No. 15/917,224.
USPTO; Final Office Action dated Aug. 28, 2019 in U.S. Appl. No. 15/917,224.
USPTO; Advisory Action dated Nov. 27, 2019 in U.S. Appl. No. 15/917,224.
USPTO; Non-Final Office Action dated May 1, 2020 in U.S. Appl. No. 15/917,224.
USPTO; Final Office Action dated Sep. 24, 2020 in U.S. Appl. No. 15/917,224.
USPTO; Non-Final Office Action dated Feb. 8, 2019 in U.S. Appl. No. 15/917,262.
USPTO; Final Office Action dated Jun. 14, 2019 in U.S. Appl. No. 15/917,262.
USPTO; Notice of Allowance dated Aug. 30, 2019 in U.S. Appl. No. 15/917,262.

(56) References Cited

OTHER PUBLICATIONS

USPTO; Non-Final Office Action dated Dec. 23, 2019 in U.S. Appl. No. 15/923,834.
USPTO; Final Office Action dated Mar. 12, 2020 in U.S. Appl. No. 15/923,834.
USPTO; Advisory Action dated May 15, 2020 in U.S. Appl. No. 15/923,834.
USPTO; Non-Final Office Action dated Jul. 6, 2020 in U.S. Appl. No. 15/923,834.
USPTO; Final Office Action dated Oct. 19, 2020 in U.S. Appl. No. 15/923,834.
USPTO; Advisory Action dated Jan. 8, 2021 in U.S. Appl. No. 15/923,834.
USPTO; Non-Final Office Action dated May 8, 2019 in U.S. Appl. No. 15/925,532.
USPTO; Final Office Action dated Nov. 27, 2019 in U.S. Appl. No. 15/925,532.
USPTO; Non-Final Office Action dated May 1, 2020 in U.S. Appl. No. 15/925,532.
USPTO; Final Office Action dated Oct. 15, 2020 in U.S. Appl. No. 15/925,532.
USPTO; Advisory Action dated Dec. 24, 2020 in U.S. Appl. No. 15/925,532.
USPTO; Non-Final Office Action dated Jan. 25, 2021 in U.S. Appl. No. 15/925,532.
USPTO; Non-Final Office Action dated Oct. 6, 2020 in U.S. Appl. No. 15/940,729.
USPTO; Final Office Action dated Feb. 18, 2021 in U.S. Appl. No. 15/940,729.
USPTO; Non-Final Office Action dated Jul. 22, 2019 in U.S. Appl. No. 15/940,759.
USPTO; Final Office Action dated Feb. 19, 2020 in U.S. Appl. No. 15/940,759.
USPTO; Advisory Action dated Apr. 23, 2020 in U.S. Appl. No. 15/940,759.
USPTO; Non-Final Office Action dated Aug. 3, 2020 in U.S. Appl. No. 15/940,759.
USPTO; Final Office Action dated Jan. 12, 2021 in U.S. Appl. No. 15/940,759.
USPTO; Non-Final Office Action dated Mar. 29, 2019 in U.S. Appl. No. 15/940,801.
USPTO; Notice of Allowance dated Aug. 26, 2019 in U.S. Appl. No. 15/940,801.
USPTO; Non-Final Rejection dated Nov. 29, 2019 in U.S. Appl. No. 15/949,990.
USPTO; Notice of Allowance dated Mar. 12, 2020 in U.S. Appl. No. 15/949,990.
USPTO; Notice of Allowance dated May 31, 2019 in U.S. Appl. No. 15/957,565.
USPTO; Non-Final Office Action dated Jan. 31, 2020 in U.S. Appl. No. 15/962,980.
USPTO; Final Office Action dated Apr. 30, 2020 in U.S. Appl. No. 15/962,980.
USPTO; Advisory Action dated Jul. 2, 2020 in U.S. Appl. No. 15/962,980.
USPTO; Non-Final Office Action dated Sep. 14, 2020 in U.S. Appl. No. 15/962,980.
USPTO; Final Office Action dated Dec. 15, 2020 in U.S. Appl. No. 15/962,980.
USPTO; Non-Final Office Action dated Oct. 6, 2020 in U.S. Appl. No. 15/967,146.
USPTO; Non-Final Office Action dated Apr. 2, 2020 in U.S. Appl. No. 15/974,948.
USPTO; Final Office Action dated Sep. 3, 2020 in U.S. Appl. No. 15/974,948.
USPTO; Advisory Action dated Oct. 27, 2020 in U.S. Appl. No. 15/974,948.
USPTO; Non-Final Office Action dated May 15, 2020 in U.S. Appl. No. 15/974,988.
USPTO; Notice of Allowance dated Oct. 14, 2020 in U.S. Appl. No. 15/974,988.
USPTO; Non-Final Office Action dated Jan. 16, 2020 in U.S. Appl. No. 15/985,261.
USPTO; Notice of Allowance dated Apr. 3, 2020 in U.S. Appl. No. 15/985,261.
USPTO; Non-Final Office Action dated Apr. 19, 2019 in U.S. Appl. No. 15/985,298.
USPTO; Notice of Allowance dated Aug. 22, 2019 in U.S. Appl. No. 15/985,298.
USPTO; Non-Final Office Action dated Jun. 12, 2020 in U.S. Appl. No. 15/985,539.
USPTO; Final Office Action dated Nov. 25, 2020 in U.S. Appl. No. 15/985,539.
USPTO; Non-Final Office Action dated Feb. 21, 2019 in U.S. Appl. No. 15/987,755.
USPTO; Notice of Allowance dated Jul. 31, 2019 in U.S. Appl. No. 15/987,755.
USPTO; Non-Final Office Action dated Feb. 20, 2020 in U.S. Appl. No. 15/996,286.
USPTO; Final Office Action dated Jul. 24, 2020 in U.S. Appl. No. 15/996,286.
USPTO; Advisory Action dated Oct. 7, 2020 in U.S. Appl. No. 15/996,286.
USPTO; Non-Final Office Action dated Apr. 1, 2020 in U.S. Appl. No. 15/997,445.
USPTO; Final Office Action dated Oct. 2, 2020 in U.S. Appl. No. 15/997,445.
USPTO; Notice of Allowance dated Jul. 10, 2020 in U.S. Appl. No. 15/998,775.
USPTO; Non-Final Office Action dated Mar. 3, 2020 in U.S. Appl. No. 16/000,109.
USPTO; Final Office Action dated Sep. 14, 2020 in U.S. Appl. No. 16/000,109.
USPTO; Advisory Action dated Dec. 10, 2020 in U.S. Appl. No. 16/000,109.
USPTO; Non-Final Office Action dated Jul. 29, 2019 in U.S. Appl. No. 16/000,125.
USPTO; Final Office Action dated Jan. 13, 2020 in U.S. Appl. No. 16/000,125.
USPTO; Advisory Action dated Apr. 3, 2020 in U.S. Appl. No. 16/000,125.
USPTO; Non-Final Office Action dated Jun. 5, 2020 in U.S. Appl. No. 16/000,125.
USPTO; Final Office Action dated Oct. 6, 2020 in U.S. Appl. No. 16/000,125.
USPTO; Advisory Action dated Dec. 15, 2020 in U.S. Appl. No. 16/000,125.
USPTO; Non-Final Office Action dated Apr. 22, 2020 in U.S. Appl. No. 16/000,156.
USPTO; Final Office Action dated Oct. 22, 2020 in U.S. Appl. No. 16/000,156.
USPTO; Advisory Action dated Dec. 14, 2020 in U.S. Appl. No. 16/000,156.
USPTO; Non-Final Office Action dated May 7, 2020 in U.S. Appl. No. 16/004,041.
USPTO; Final Office Action dated Oct. 15, 2020 in U.S. Appl. No. 16/004,041.
USPTO; Advisory Action dated Dec. 22, 2020 in U.S. Appl. No. 16/004,041.
USPTO; Non-Final Office Action dated Jul. 16, 2019 in U.S. Appl. No. 16/014,981.
USPTO; Non-Final Office Action dated Jan. 16, 2020 in U.S. Appl. No. 16/014,981.
USPTO; Notice of Allowance dated Jun. 24, 2020 in U.S. Appl. No. 16/014,981.
USPTO; Non-Final Office Action dated Jan. 24, 2019 in U.S. Appl. No. 16/018,692.
USPTO; Final Office Action dated Aug. 23, 2019 in U.S. Appl. No. 16/018,692.
USPTO; Non-Final Office Action dated Dec. 11, 2019 in U.S. Appl. No. 16/018,692.

(56) References Cited

OTHER PUBLICATIONS

USPTO; Notice of Allowance dated Jan. 30, 2020 in U.S. Appl. No. 16/018,692.
USPTO; Non-Final Office Action dated Aug. 7, 2019 in U.S. Appl. No. 16/024,390.
USPTO; Notice of Allowance dated Nov. 26, 2019 in U.S. Appl. No. 16/024,390.
USPTO; Notice of Allowance dated Apr. 9, 2019 in U.S. Appl. No. 16/026,711.
USPTO; Non-Final Office Action dated Mar. 4, 2020 in U.S. Appl. No. 16/036,692.
USPTO; Notice of Allowance dated May 26, 2020 in U.S. Appl. No. 16/036,692.
USPTO; Non-Final Office Action dated Apr. 25, 2019 in U.S. Appl. No. 16/038,024.
USPTO; Final Office Action dated Nov. 29, 2019 in U.S. Appl. No. 16/038,024.
USPTO; Advisory Action dated Feb. 28, 2020 in U.S. Appl. No. 16/038,024.
USPTO; Notice of Allowance dated Mar. 23, 2020 in U.S. Appl. No. 16/038,024.
USPTO; Non-Final Office Action dated Sep. 8, 2020 in U.S. Appl. No. 16/039,817.
USPTO; Non-Final Office Action dated Jul. 25, 2019 in U.S. Appl. No. 16/039,867.
USPTO; Final Office Action dated Jan. 28, 2020 in U.S. Appl. No. 16/039,867.
USPTO; Notice of Allowance dated Apr. 3, 2020 in U.S. Appl. No. 16/039,867.
USPTO; Non-Final Office Action dated Nov. 24, 2020 in U.S. Appl. No. 16/039,938.
USPTO; Non-Final Office Action dated Aug. 4, 2020 in U.S. Appl. No. 16/042,791.
USPTO; Notice of Allowance dated Jul. 10, 2019 in U.S. Appl. No. 16/046,218.
USPTO; Non-Final Office Action dated Apr. 30, 2020 in U.S. Appl. No. 16/055,532.
USPTO; Final Office Action dated Jul. 30, 2020 in U.S. Appl. No. 16/055,532.
USPTO; Final Office Action dated Nov. 3, 2020 in U.S. Appl. No. 16/055,532.
USPTO; Advisory Action dated Jan. 14, 2021 in U.S. Appl. No. 16/055,532.
USPTO; Non-Final Office Action dated May 27, 2020 in U.S. Appl. No. 16/100,012.
USPTO; Notice of Allowance dated Sep. 14, 2020 in U.S. Appl. No. 16/100,012.
USPTO; Non-Final Office Action dated Feb. 20, 2020 in U.S. Appl. No. 16/105,745.
USPTO; Final Office Action dated Jun. 23, 2020 in U.S. Appl. No. 16/105,745.
USPTO; Advisory Action dated Aug. 25, 2020 in U.S. Appl. No. 16/105,745.
USPTO; Non-Final Office Action dated Nov. 25, 2020 in U.S. Appl. No. 16/105,745.
USPTO; Non-Final Office Action dated Feb. 24, 2020 in U.S. Appl. No. 16/105,761.
USPTO; Final Office Action dated Apr. 21, 2020 in U.S. Appl. No. 16/105,761.
USPTO; Advisory Action dated Jul. 8, 2020 in U.S. Appl. No. 16/105,761.
USPTO; Non-Final Office Action dated Nov. 25, 2020 in U.S. Appl. No. 16/105,761.
USPTO; Non-Final Office Action dated Mar. 19, 2020 in U.S. Appl. No. 16/105,802.
USPTO; Final Office Action dated Jun. 26, 2020 in U.S. Appl. No. 16/105,802.
USPTO; Final Office Action dated Nov. 17, 2020 in U.S. Appl. No. 16/105,802.
USPTO; Non-Final Office Action dated Sep. 8, 2020 in U.S. Appl. No. 16/108,950.
USPTO; Final Office Action dated Dec. 15, 2020 in U.S. Appl. No. 16/108,950.
USPTO; Non-Final Office Action dated Mar. 16, 2020 in U.S. Appl. No. 16/116,708.
USPTO; Final Office Action dated Sep. 2, 2020 in U.S. Appl. No. 16/116,708.
USPTO; Advisory Action dated Nov. 17, 2020 in U.S. Appl. No. 16/116,708.
USPTO; Non-Final Office Action dated Feb. 6, 2020 in U.S. Appl. No. 16/117,530.
USPTO; Final Office Action dated Jan. 6, 2021 in U.S. Appl. No. 16/117,530.
USPTO; Non-Final Office Action dated Jun. 22, 2020 in U.S. Appl. No. 16/128,282.
USPTO; Final Office Action dated Nov. 19, 2020 in U.S. Appl. No. 16/128,282.
USPTO; Notice of Allowance dated Feb. 12, 2021 in U.S. Appl. No. 16/128,282.
USPTO; Non-Final Office Action dated Apr. 21, 2020 in U.S. Appl. No. 16/130,798.
USPTO; Notice of Allowance dated Aug. 5, 2020 in U.S. Appl. No. 16/130,798.
USPTO; Non-Final Office Action dated Jan. 6, 2020 in U.S. Appl. No. 16/132,142.
USPTO; Final Office Action dated Jun. 5, 2020 in U.S. Appl. No. 16/132,142.
USPTO; Advisory Action dated Aug. 24, 2020 in U.S. Appl. No. 16/132,142.
USPTO; Non-Final Office Action dated Oct. 16, 2020 in U.S. Appl. No. 16/132,142.
USPTO; Notice of Allowance dated Feb. 8, 2021 in U.S. Appl. No. 16/132,142.
USPTO; Non-Final Office Action dated Feb. 28, 2020 in U.S. Appl. No. 16/137,974.
USPTO; Final Office Action dated Aug. 20, 2020 in U.S. Appl. No. 16/137,974.
USPTO; Notice of Allowance dated Nov. 3, 2020 in U.S. Appl. No. 16/137,974.
USPTO; Non-Final Office Action dated Apr. 2, 2019 in U.S. Appl. No. 16/147,047.
USPTO; Final Office Action dated Sep. 25, 2019 in U.S. Appl. No. 16/147,047.
USPTO; Notice of Allowance dated Jan. 3, 2020 in U.S. Appl. No. 16/147,047.
USPTO; Non-Final Office Action dated Jul. 30, 2020 in U.S. Appl. No. 16/151,074.
USPTO; Final Office Action dated Dec. 14, 2020 in U.S. Appl. No. 16/151,074.
USPTO; Advisory Action dated Feb. 16, 2021 in U.S. Appl. No. 16/151,074.
USPTO; Non-Final Office Action dated Nov. 5, 2019 in U.S. Appl. No. 16/152,260.
USPTO; Advisory Action dated Sep. 16, 2020 in U.S. Appl. No. 16/152,260.
USPTO; Final Office Action dated Jul. 15, 2020 in U.S. Appl. No. 16/152,260.
USPTO; Non-Final Office Action dated Nov. 9, 2020 in U.S. Appl. No. 16/152,260.
USPTO; Non-Final Office Action dated Aug. 6, 2019 in U.S. Appl. No. 16/158,077.
USPTO; Final Office Action dated Mar. 2, 2020 in U.S. Appl. No. 16/158,077.
USPTO; Advisory Action dated Jun. 9, 2020 in U.S. Appl. No. 16/158,077.
USPTO; Notice of Allowance dated Jul. 24, 2020 in U.S. Appl. No. 16/158,077.
USPTO; Non-Final Office Action dated Aug. 29, 2019 in U.S. Appl. No. 16/161,744.
USPTO; Final Office Action dated Mar. 17, 2020 in U.S. Appl. No. 16/161,744.

(56) References Cited

OTHER PUBLICATIONS

USPTO; Notice of Allowance dated Jun. 19, 2020 in U.S. Appl. No. 16/161,744.
USPTO; Non-Final Office Action dated Jul. 23, 2020 in U.S. Appl. No. 16/167,164.
USPTO; Final Office Action dated Dec. 18, 2020 in U.S. Appl. No. 16/167,164.
USPTO; Non-Final Office Action dated Aug. 16, 2019 in U.S. Appl. No. 16/167,225.
USPTO; Final Office Action dated Dec. 16, 2019 in U.S. Appl. No. 16/167,225.
USPTO; Notice of Allowance dated Mar. 5, 2020 in U.S. Appl. No. 16/167,225.
USPTO; Notice of Allowance dated Apr. 17, 2019 in U.S. Appl. No. 16/171,098.
USPTO; Notice of Allowance dated May 1, 2019 in U.S. Appl. No. 16/171,098.
USPTO; Non-Final Office Action dated Aug. 7, 2020 in U.S. Appl. No. 16/172,535.
USPTO; Final Office Action dated Oct. 16, 2020 in U.S. Appl. No. 16/172,535.
USPTO; Advisory Action dated Dec. 21, 2020 in U.S. Appl. No. 16/172,535.
USPTO; Non-Final Office Action dated Nov. 4, 2020 in U.S. Appl. No. 16/176,517.
USPTO; Final Office Action dated Jan. 29, 2021 in U.S. Appl. No. 16/176,517.
USPTO; Non-Final Office Action dated Oct. 29, 2020 in U.S. Appl. No. 16/183,258.
USPTO; Non-Final Office Action dated Apr. 2, 2019 in U.S. Appl. No. 16/188,690.
USPTO; Final Office Action dated Sep. 26, 2019 in U.S. Appl. No. 16/188,690.
USPTO; Notice of Allowance dated Dec. 16, 2019 in U.S. Appl. No. 16/188,690.
USPTO; Notice of Allowance dated Jul. 28, 2020 in U.S. Appl. No. 16/193,789.
USPTO; Notice of Allowance dated Jul. 7, 2020 in U.S. Appl. No. 16/194,041.
USPTO; Notice of Allowance dated Oct. 3, 2019 in U.S. Appl. No. 16/200,100.
USPTO; Non-Final Office Action dated Dec. 11, 2021 in U.S. Appl. No. 16/202,941.
USPTO; Non-Final Office Action dated May 29, 2020 in U.S. Appl. No. 16/205,899.
USPTO; Final Office Action dated Nov. 27, 2020 in U.S. Appl. No. 16/205,899.
USPTO; Non-Final Office Action dated Aug. 19, 2019 in U.S. Appl. No. 16/208,062.
USPTO; Notice of Allowance dated Jan. 28, 2020 in U.S. Appl. No. 16/208,062.
USPTO; Non-Final Office Action dated Jul. 15, 2020 in U.S. Appl. No. 16/210,922.
USPTO; Final Office Action dated Dec. 9, 2020 in U.S. Appl. No. 16/210,922.
USPTO; Non-Final Office Action dated Sep. 16, 2019 in U.S. Appl. No. 16/213,702.
USPTO; Notice of Allowance dated Dec. 9, 2019 in U.S. Appl. No. 16/213,702.
USPTO; Non-Final Office Action dated Jan. 8, 2020 in U.S. Appl. No. 16/219,555.
USPTO; Final Office Action dated Jun. 19, 2020 in U.S. Appl. No. 16/219,555.
USPTO; Advisory Action dated Sep. 11, 2020 in U.S. Appl. No. 16/219,555.
USPTO; Non-Final Office Action dated Sep. 30, 2020 in U.S. Appl. No. 16/219,555.
USPTO; Non-Final Office Action dated Feb. 19, 2020 in U.S. Appl. No. 16/242,829.
USPTO; Final Office Action dated Jun. 15, 2020 in U.S. Appl. No. 16/242,829.
USPTO; Advisory Action dated Aug. 11, 2020 in U.S. Appl. No. 16/242,829.
USPTO; Notice of Allowance dated Sep. 23, 2020 in U.S. Appl. No. 16/242,829.
USPTO; Non-Final Office Action dated Sep. 3, 2020 in U.S. Appl. No. 16/242,852.
USPTO; Notice of Allowance dated Dec. 15, 2020 in U.S. Appl. No. 16/242,852.
USPTO; Non-Final Office Action dated Jan. 30, 2020 in U.S. Appl. No. 16/245,006.
USPTO; Notice of Allowance dated May 29, 2020 in U.S. Appl. No. 16/245,006.
USPTO; Non-Final Office Action dated Sep. 24, 2019 in U.S. Appl. No. 16/251,534.
USPTO; Final Office Action dated Jan. 10, 2020 in U.S. Appl. No. 16/251,534.
USPTO; Advisory Action dated Apr. 3, 2020 in U.S. Appl. No. 16/251,534.
USPTO; Non-Final Office Action dated Apr. 24, 2020 in U.S. Appl. No. 16/251,534.
USPTO; Final Office Action dated Oct. 14, 2020 in U.S. Appl. No. 16/251,534.
USPTO; Non-Final Office Action dated May 27, 2020 in U.S. Appl. No. 16/252,567.
USPTO; Final Office Action dated Nov. 18, 2020 in U.S. Appl. No. 16/252,567.
USPTO; Advisory Action dated Jan. 22, 2021 in U.S. Appl. No. 16/252,567.
USPTO; Non-Final Office Action dated Apr. 16, 2020 in U.S. Appl. No. 16/255,639.
USPTO; Notice of Allowance dated Aug. 6, 2020 in U.S. Appl. No. 16/255,639.
USPTO; Non-Final Office Action dated Jun. 30, 2020 in U.S. Appl. No. 16/258,187.
USPTO; Notice of Allowance dated Aug. 5, 2020 in U.S. Appl. No. 16/258,187.
USPTO; Non-Final Office Action dated Dec. 18, 2019 in U.S. Appl. No. 16/280,964.
USPTO; Notice of Allowance dated May 21, 2020 in U.S. Appl. No. 16/280,964.
USPTO; Non-Final Office Action dated Jan. 9, 2020 in U.S. Appl. No. 16/317,774.
USPTO; Notice of Allowance dated Apr. 15, 2020 in U.S. Appl. No. 16/317,774.
USPTO; Non-Final Office Action dated Mar. 2, 2020 in U.S. Appl. No. 16/356,394.
USPTO; Final Office Action dated Jun. 30, 2020 in U.S. Appl. No. 16/356,394.
USPTO; Notice of Allowance dated Aug. 31, 2020 in U.S. Appl. No. 16/356,394.
USPTO; Notice of Allowance dated Jun. 13, 2019 in U.S. Appl. No. 16/396,475.
USPTO; Non-Final Office Action dated Aug. 5, 2020 in U.S. Appl. No. 16/397,045.
USPTO; Final Office Action dated Dec. 8, 2020 in U.S. Appl. No. 16/397,045.
USPTO; Advisory Action dated Jan. 27, 2021 in U.S. Appl. No. 16/397,045.
USPTO; Non-Final Office Action dated Aug. 19, 2020 in U.S. Appl. No. 16/400,814.
USPTO; Final Office Action dated Dec. 14, 2020 in U.S. Appl. No. 16/400,814.
USPTO; Non-Final Office Action dated Dec. 26, 2019 in U.S. Appl. No. 16/417,938.
USPTO; Notice of Allowance dated Mar. 30, 2020 in U.S. Appl. No. 16/417,938.
USPTO; Non-Final Office Action dated Dec. 31, 2019 in U.S. Appl. No. 16/427,288.
USPTO; Notice of Allowance dated Apr. 16, 2020 in U.S. Appl. No. 16/427,288.

(56) References Cited

OTHER PUBLICATIONS

USPTO; Non-Final Office Action dated Jan. 12, 2021 in U.S. Appl. No. 16/453,249.
USPTO; Non-Final Office Action dated May 12, 2020 in U.S. Appl. No. 16/454,063.
USPTO; Notice of Allowance dated Sep. 18, 2020 in U.S. Appl. No. 16/454,063.
USPTO; Non-Final Office Action dated Dec. 31, 2019 in U.S. Appl. No. 16/455,406.
USPTO; Notice of Allowance dated Apr. 17, 2020 in U.S. Appl. No. 16/455,406.
USPTO; Non-Final Office Action dated Nov. 27, 2020 in U.S. Appl. No. 16/468,258.
USPTO; Non-Final Office Action dated Dec. 28, 2020 in U.S. Appl. No. 16/517,122.
USPTO; Non-Final Office Action dated Nov. 5, 2020 in U.S. Appl. No. 16/546,543.
USPTO; Non-Final Office Action dated Feb. 11, 2021 in U.S. Appl. No. 16/565,460.
USPTO; Non-Final Office Action dated Jun. 11, 2020 in U.S. Appl. No. 16/598,768.
USPTO; Notice of Allowance dated Sep. 16, 2020 in U.S. Appl. No. 16/598,768.
USPTO; Final Office Action dated Jan. 10, 2020 in U.S. Appl. No. 16/674,894.
USPTO; Notice of Allowance dated Apr. 21, 2020 in U.S. Appl. No. 16/674,894.
USPTO; Non-Final Office Action dated Oct. 16, 2020 in U.S. Appl. No. 16/679,885.
USPTO; Notice of Allowance dated Jan. 25, 2021 in U.S. Appl. No. 16/679,885.
USPTO; Non-Final Office Action dated Feb. 8, 2021 in U.S. Appl. No. 16/685,787.
USPTO; Non-Final Office Action dated Nov. 16, 2020 in U.S. Appl. No. 16/713,311.
USPTO; Non-Final Office Action dated Jan. 8, 2021 in U.S. Appl. No. 16/752,514.
USPTO; Non-Final Office Action dated Apr. 13, 2020 in U.S. Appl. No. 16/833,279.
USPTO; Final Office Action dated Oct. 2, 2020 in U.S. Appl. No. 16/833,279.
USPTO; Notice of Allowance dated Dec. 28, 2020 in U.S. Appl. No. 16/833,279.
USPTO; Non-Final Office Action dated Jul. 9, 2020 in U.S. Appl. No. 16/897,158.
USPTO; Notice of Allowance dated Nov. 12, 2020 in U.S. Appl. No. 16/897,158.
USPTO; Non-Final Office Action dated Aug. 4, 2020 in U.S. Appl. No. 16/926,192.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Dec. 19, 2013 in U.S. Appl. No. 29/448,094.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Non-Final Office Action dated Apr. 16, 2019 in U.S. Appl. No. 29/604,101.
USPTO; Notice of Allowance dated Oct. 30, 2019 in U.S. Appl. No. 29/604,101.
USPTO; Notice of Allowance dated Jun. 26, 2018 in U.S. Appl. No. 29/604,288.
USPTO; Ex Parte Quayle Action dated Dec. 17, 2019 in U.S. Appl. No. 29/615,000.
USPTO; Notice of Allowance dated Jun. 10, 2020 in U.S. Appl. No. 29/615,000.
USPTO; Non-Final Office Action dated Aug. 21, 2019 in U.S. Appl. No. 29/634,768.
USPTO; Notice of Allowance dated Jan. 23, 2020 in U.S. Appl. No. 29/634,768.
USPTO; Non-Final Office Action dated Feb. 20, 2019 in U.S. Appl. No. 29/646,377.
USPTO; Final Office Action dated Jul. 15, 2019 in U.S. Appl. No. 29/646,377.
USPTO; Notice of Allowance dated Nov. 14, 2019 in U.S. Appl. No. 29/646,377.
USPTO; Non-Final Office Action dated Apr. 24, 2020 in U.S. Appl. No. 29/726,623.
USPTO; Final Office Action dated Sep. 9, 2020 in U.S. Appl. No. 29/726,623.
USPTO; Notice of Allowance dated Nov. 23, 2020 in U.S. Appl. No. 29/726,623.
WIPO; International Search Report dated Oct. 13, 1998 in Application No. PCT/FI1998/000571.
WIPO; International Search Report and Written Opinion dated Nov. 16, 2017 in Application No. PCT/IB2017/001015.
WIPO; International Search Report and Written Opinion dated Nov. 13, 2017 in Application No. PCT/IB2017/001050.
WIPO; International Search Report and Written Opinion dated Nov. 30, 2017 in Application No. PCT/IB2017/001070.
WIPO; International Search Report and Written Opinion dated Jan. 25, 2018 in Application No. PCT/IB2017/001262.
WIPO; International Search Report and Written Opinion dated Sep. 14, 2018 in Application No. PCT/IB2017/001640.
WIPO: International Search Report and Written Opinion dated Jun. 1, 2018 in Application No. PCT/IB2017/001644.
WIPO; International Search Report and Written Opinion dated Nov. 6, 2018 in Application No. PCT/IB2017/001652.
WIPO: International Search Report and Written Opinion dated Jun. 1, 2018 in Application No. PCT/IB2017/001656.
WIPO; International Search Report and Written Opinion dated Jan. 25, 2019 in Application No. PCT/IB2018/000192.
WIPO; International Search Report and Written Opinion dated Jul. 9, 2018 in Application No. PCT/IB2018/000419.
WIPO; International Search Report and Written Opinion dated Jan. 4, 2019 in Application No. PCT/IB2018/000936.
WIPO; International Search Report and Written Opinion dated Dec. 20, 2018 in Application No. PCT/IB2018/001003.
WIPO; International Search Report and Written Opinion dated Dec. 20, 2018 in Application No. PCT/IB2018/001022.
WIPO; International Search Report and Written Opinion dated Jun. 28, 2019 in Application No. PCT/IB2019/000084.
WIPO; International Search Report and Written Opinion dated Nov. 19, 2019 in Application No. PCT/IB2019/000127.
WIPO; International Search Report and Written Opinion dated Jan. 10, 2020 in Application No. PCT/IB2019/000729.
WIPO; International Search Report and Written Opinion dated Dec. 20, 2019 in Application No. PCT/IB2019/000805.
WIPO; International Search Report and Written Opinion dated Dec. 20, 2019 in Application No. PCT/IB2019/000817.
WIPO; International Search Report and Written Opinion dated May 23, 2019 in Application No. PCT/IB2019/050974.

(56) References Cited

OTHER PUBLICATIONS

WIPO; International Search Report dated Jul. 13, 1990 in Application No. PCT/NL1990/000027.
WIPO; International Search Report dated Jan. 11, 1990 in Application No. PCT/NL1990/000042.
WIPO; International Search Report dated Feb. 26, 1991 in Application No. PCT/NL1990/000166.
WIPO; International Search Report dated Oct. 25, 1991 in Application No. PCT/NL1991/000108.
WIPO; International Search Report dated Oct. 17, 1997 in Application No. PCT/NL1997/000398.
WIPO; International Preliminary Examination Report dated Oct. 2, 1998 in Application No. PCT/NL1997/000398.
WIPO; International Search Report dated Apr. 24, 1998 in Application No. PCT/NL1998/000055.
WIPO; International Preliminary Examination Report dated Feb. 24, 1999 in Application No. PCT/NL1998/000055.
WIPO; International Search Report dated May 27, 1998 in Application No. PCT/NL1998/000105.
WIPO; International Search Report dated May 8, 1998 in Application No. PCT/NL1998/000151.
WIPO; International Preliminary Examination Report dated Mar. 23, 1999 in Application No. PCT/NL1998/000151.
WIPO; International Search Report dated May 27, 1998 in Application No. PCT/NL1998/000167.
WIPO; International Preliminary Examination Report dated Jul. 13, 1999 in Application No. PCT/NL1998/000167.
WIPO; International Search Report dated Jul. 8, 1998 in Application No. PCT/NL1998/000204.
WIPO; International Search Report dated Aug. 21, 1998 in Application No. PCT/NL1998/000246.
WIPO; International Search Report dated Oct. 16, 1998 in Application No. PCT/NL1998/000383.
WIPO; International Preliminary Examination Report dated Sep. 16, 1999 in Application No. PCT/NL1998/000383.
WIPO; International Search Report dated Apr. 15, 1999 in Application No. PCT/NL1999/000047.
WIPO; International Search Report dated Oct. 12, 1999 in Application No. PCT/NL1999/000487.
WIPO; International Search Report dated Dec. 16, 1999 in Application No. PCT/NL1999/000583.
WIPO; Written Opinion dated Jul. 24, 2000 in Application No. PCT/NL1999/000583.
WIPO; International Preliminary Examination Report dated Jan. 22, 2001 in Application No. PCT/NL1999/000583.
WIPO; International Search Report dated Apr. 19, 2000 in Application No. PCT/NL2000/000020.
WIPO; Written Opinion dated Oct. 17, 2000 in Application No. PCT/NL2000/000020.
WIPO; International Search Report and Written Opinion dated Apr. 17, 2019 in Application No. PCT/NL2018/050787.
WIPO; International Search Report and Written Opinion dated Apr. 29, 2019 in Application No. PCT/NL2018/050791.
WIPO; International Search Report dated Dec. 16, 1999 in Application No. PCT/RU1999/000328.
WIPO; International Preliminary Examination Report dated Jun. 29, 2001 in Application No. PCT/RU1999/000328.
WIPO; International Preliminary Report on Patentability dated Nov. 24, 2009 and International Search Report dated Jul. 31, 2008 in Application No. PCT/US2008/063919.
WIPO; International Preliminary Report on Patentability dated Feb. 24, 2010 in Application No. PCT/US2008/074063.
WIPO; International Preliminary Report on Patentability dated Nov. 26, 2009 in Application No. PCT/US2009/043454.
WIPO; International Preliminary Report on Patentability dated Jun. 14, 2011 in Application No. PCT/US2009/066377.
WIPO; International Search report and Written Opinion dated Nov. 12, 2010 in Application No. PCT/US2010/030126.
WIPO; International Preliminary Report on Patentability dated Oct. 11, 2011 Application No. PCT/US2010/030126.
WIPO; International Preliminary Report on Patentability dated Nov. 9, 2011 in Application No. PCT/US2010/033244.
WIPO; International Preliminary Report on Patentability dated Nov. 9, 2011 in Application No. PCT/US2010/033248.
WIPO; International Preliminary Report on Patentability dated Nov. 9, 2011 in Application No. PCT/US2010/033252.
WIPO; International Search report and Written Opinion dated Jan. 20, 2011 in Application No. PCT/US2010/045368.
WIPO; International Search report and Written Opinion dated Feb. 6, 2013 in Application No. PCT/US2012/065343.
WIPO; International Search report and Written Opinion dated Feb. 13, 2013 in Application No. PCT/US2012/065347.
Akiyama et al. "Macro- and micro-scale simulation of growth rate and composition in MOCVD of yttria-stabilized zirconia" J. Crystal Growth 241, pp. 352-362 (2002).
Alen, "Atomic layer deposition of TaN, NbN and MoN films for Cu Metallizations," University of Helsinki Finland, 72 pages, (2005).
Altiere et al. "Review Article: Plasma-surface interactions at the atomic scale for patterning metals" J. Vac. Sci. Technol. A 35, 05C203, 13 pages (2017).
Ande et al. "Role of Surface Termination in Atomic Layer Deposition of Silicon Nitride" J. Phys. Chem. Lett., 6(18), 16 pages (2015).
Aoyagi et al. "Laser-assisted atomic layer epitaxy" Materials Science and Engineering, pp. 121-132 (1991).
Arita et al. "Electrical and optical properties of germanium-doped zinc oxide thin films" Materials Transactions, vol. 45, No. 11, pp. 3180-3183 (2004).
Arnold et al., "Novel single-layer vanadium sulphide phases" 2D Materials, 5, 045009, 11 pages (2018).
Athavale et al., "Realization of Atomic Layer Etching of Silicon", Journal of Vacuum Science and Technology B, vol. 14, pp. 3702-3705 (1996).
Atta et al. "The Catalytic Activity of Ruthenates ARuO3 (A=Ca, Sr or Ba) for the Hydrogen Evolution Reaction in Acidic Medium" Int. J. Electrochem. Sci. 7, pp. 725-746 (2012).
Ballal "Mass Transfer in Porous Solids under Pulsating Pressure Conditions" SLJ International, vol. 35, Nov. 4, pp. 446-448 (1995).
Bark et al. "Large-area niobium disulfide thin films as transparent electrodes for devices based on two-dimensional materials," Nanoscale, published online, 7 pages (2012).
Barreca et al. "Cobalt oxide nanomaterials by vapor phase synthesis for fast and reversible lithium storage" J Phys Chem C,114, 10054-10060 (2010).
Basuvalingam et al. "NS-WeA6—Low Temperature ALD for Phase-controlled Synthesis of 2D Transition Metal (M=Ti, Nb) di-(MX2) and Tri-(MX3) Sulfides," AVS 19th International Conference on Atomic Layer Deposition (ALD 2019)), Jul. 22, 2019, Abstract, 1 page (2019).
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Beynet et al. "Low temperature plasma-enhanced ALD enables cost-effective spacer defined double patterning," Proceedings of SPIE, 7520, (2009).
Bhatnagar et al., "Copper Interconnect Advances to Meet Moore's Law Milestones," Solid State Technology, 52, 10 (2009).
Boscher et al., "Atmosphere Pressure Chemical Vapour Deposition of NbSe2 Thin Films on Glass" Eur. J. Inorg. Chem., pp. 1255-1259 (2006).
Brewin et al. "UPS to deploy Bluetooth, wireless LAN network" Internet, pp. 1-5 (2001).
Bulletin Plasma Source—Dec. 2002: Type AX7610—Downstream Plasma Source. Source location: MKS Instruments, Inc. http://www.mksinst.com/. Accessed: Aug. 6, 2015. pp. 1-4 (2002).
Bulletin ASTRONe—Apr. 2002: Type AX7680—Reactive Gas Generator. Source location: MKS Instruments, Inc. http://www.mksinst.com/. Accessed: Aug. 6, 2015. pp. 1-2 (2002).
Bulletin ASTRONex—Jul. 2009: Type AX7685—Reactive Gas Generator. Source location: MKS Instruments, Inc. http://www.mksinst.com/. Accessed: Aug. 6, 2015. pp. 1-2 (2002).

(56) References Cited

OTHER PUBLICATIONS

Bulletin ASTRON hf-s—Mar. 2005: Type AX7645—Reactive Gas Generator. Source location: MKS Instruments, Inc. http://www.mksinst.com/. Accessed: Aug. 6, 2015. pp. 1-2 (2005).
Bulletin ENG-XSTREAM-340-09 OM Aug. 2006: Xstream with Active Matching Network Remote Plasma Source. Advanced Energy Industries, Inc. http://www.advanced-energy.net.cn/upload/File/Sources/ENG-Xstream-340-09. pdf. Accessed: Jul. 19, 2016. pp. 1-4 (2006).
Bulletin R*evolution—Sep. 2006: Type AX7690—Remote Plasma Source. Source location: MKS Instruments, Inc. http://www.mksinst.com/. Accessed: Aug. 6, 2015. pp. 1-2 (2006).
Buriak, "Organometallic Chemistry on Silicon and Germanium Surfaces," Chemical Reviews, 102, 5 (2002).
Cahiez et al. "Cobalt-Catalyzed cross coupling reaction between functionalized primary and secondary alkyl halides and aliphatic grignard reagents" Adv. Synth. Catal, 350, 1484-1488 (2008).
Callaghan et al. "Magnetic Interactions in Ternary Ruthenium Oxides" Inorganic Chemistry, vol. 5, No. 9, pp. 1572-1576 (1966).
Cant et al., "Chemisorption Sites on Porous Silica Glass and on Mixed-Oxide Catalysis," Can. J. Chem. 46, 1373 (1968).
Carmalt et al., "Chemical Vapor Deposition of Niobium Disulfide Thin Films" Eur. J. Inorg. Chem., pp. 4470-4476 (2004).
Casey et al. "Chemical Vapor Deposition of Mo onto Si" J. Electrochem. Soc.: Solid State Science, 114 (2), pp. 201-204 (1967).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al. "Chemical Vapor Deposition of Boron Nitride Nanosheets on Metallic Substrates via Decaborane/Ammonia Reactions", Chem. Mater. 23, pp. 4414-4416 (2011).
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Chen et al., "Develop Gap-fill Process of Shallow Trench Isolation in 450mm Wafer by Advanced Flowable CVD Technology for Sub-20nm Node," 2016 27th Annual Semi Advanced Semiconductor.
Cheng et al., "Effect of carrier gas on the structure and electric properties of low dielectric constant SiCOH film using trimethylsilane prepared by plasma enhanced chemical vapor deposition," Thin Solid Films vol. 469-470, pp. 178-183 (2004).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) P114-P116 (2013).
Choi et al. "UV irradiation effects on the bonding structure and electrical properties of ultra low-k SiOC(—H) thin films for 45 nm technology node" Current Applied Physics, 11, S109-S113 (2011).
Closser et al., "Molecular Layer Deposition of a Highly Stable Silicon Oxycarbide Thin Film Using an Organic Chlorosilane and Water," ACS Applied Materials & Interfaces 10, pp. 24266-24274 (2018).
Coates, "Process Analytical Technology: Spectroscopic Tools and Implementation Strategies for the Chemical and Pharmaceutical Industries." Blackwell Publishing Ltd, 91-132, (2005).
Conroy et al., "The Preparation and Properties of Single Crystals of the 1S and 2S Polymorphs of Tantalum Disulfide" J. Solid State Chemistry, 4, pp. 345-350 (1972).
Crowell, "Chemical methods of thin film deposition: Chemical vapor deposition, atomic layer deposition, and related technologies," Journal of Vacuum Science & Technology A 21.5, (2003): S88-S95.
Cui et al., "Impact of Reductive N2/H2 Plasma on Porous Low-Dielectric Constant SiCOH Thin Films," Journal of Applied Physics 97, 113302, 1-8 (2005).
Crystal IS "Application Note: Using UV Reflective Materials to Maximize Disinfection"; AN011; Jun. 16, 2016, found at https://www.klaran.com/using-uv-reflective-materials-to-maximize-disinfection.
De Silva et al., "Inorganic Hardmask Development for Extreme Ultraviolet Patterning," Journal of Micro/Nanolithography, MEMS, and MOEMS 18(1) (2018).
Dingemans et al., "Comparison Between Aluminum Oxide Surface Passivation Films Deposited with Thermal Aid," Plasma Aid and Pecvd, 35th IEEE PVCS, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Duffey et al., "Raman Scattering from 1T-TaS2" Solid State Communications 20, pp. 617-621 (1976).
Dufond et al. "Quantifying the Extent of Ligand Incorporation and the Effect on Properties of TiO 2 Thin Films Grown by Atomic Layer Deposition Using an Alkoxide or an Alkylamide" Chemistry of Material, American Chemical Society 32(4), pp. 1393-1407 (2020).
Dultsev et al. "Effect of UV radiation on the reactivity of porous methyl-doped SiO2 layers" Phys. Status Solidi C, 8, No. 6, pp. 1946-1949 (2011).
Easley et al., "Thermal Isolation of Microchip Reaction Chambers for Rapid Non-Contact DNA Amplification," J. Micromech. Microeng. 17, 1758-1766 (2007).
Elam et al., "New Insights into Sequential Infiltration Synthesis", ECS Transactions, vol. 69, pp. 147-157 (2015).
Elers et al. "Film Uniformity in Atomic Layer Deposition," Chemical Vapor Deposition, 12, pp. 13-24 (2006).
Ellis et al. "Nitrous Oxide (N2O) Processing for Silicon Oxynitride Gate Dielectrics." IBM Journal of Research and Development. 1999. 43[3]. pp. 287-300. (1999).
Esposito et al. "Preparation and characterization of lead ruthenate based composite cathodes for SOFC applications" Mater. Res. Soc. Symp. Proc., vol. 835, 6 pages (2005).
Fallica et al., "Dynamic Absorption Coefficients of Chemically Amplified Resists and Nonchemically Amplified Resists at Extreme Ultraviolet", J. Micro/Nanolith. MEMS MOEMS 15(3), pp. 033506-1-033506-7 (2016).
"Fiji F200 200mm Thermal/Plasma ALD Systems: Installation and Use Manual." CAW-02635 Rev. 0.6 (Mar. 13, 2012). Cambridge NanoTech Inc. pp. 1-164 (2012).
Fray et al. "Aspects of the Application of Electrochemistry to the Extraction of Titanium and Its Applications" Materials Transactions, vol. 58, No. 3, pp. 306-312 (2017).
Freund et al. "Single crystal growth from separated educts and its application to lithum transition-metal oxides" Sci. Rep. 6, 35362, pp. 1-5 (2016).
Frequestly Asked Question, "What is a load lock chamber?", Kurt J. Lesker Company, www.lesker.com, p. 1 (2020).
Fu et al., "Controlled Synthesis of Atomically Thin 1T-TaS2 for Tunable Charge Density Wave Phase Transitions" Chem. Mater. 28, pp. 7613-7618 (2016).
Galesic et al. "Formation of vanadium nitride by rapid thermal processing" Thin Solid Films 349(1), 7 pages (1999).
Ge et al., "Carbon Nanotube-Based Synthetic Gecko Tapes," Department of Polymer Science, PNAS, 10792-10795 (2007).
Ge et al. "Large-scale synthesis of NbS2 nanosheets with controlled orientation on graphene by ambient pressure CVD," Nanoscale, vol. 5, 5773-5778 (2013).
George et al., "Atomic Layer Deposition: An Overview," Chem. Rev. 110, 111-131 (2010).
Gesheva et al. "Composition and Microstructure of Black Molybdenum Photothermal Converter Layers Deposited by the Pyrolytic Hydrogen Reduction of $MoO_2Cl_2$" Thin Solid Films, 79, pp. 39-49 (1981).
Glass et al. "The Chemical Vapor Deposition of Metal Boride Thin Films from Polyhedral Cluster Species", Winter and Hoffman,

(56) References Cited

OTHER PUBLICATIONS

Inorganic Materials Synthesis. ACS Symposium Series; American Cemical Society: Washington DC, Chapter 10, pp. 130-143 (1999).
Gole et al. "Preparation of Nickel Sulfide Thin Films and Nanocrystallites Using Nickel Furfuraldehyde Thiosemicarbazone as Single-source Precursor," Advanced Materials Research, vols. 383-390, pp. 3828-3834 (2012).
Gordon et al. "A Kinetic Model for Step Coverage by Atomic Layer Deposition in Narrow Holes or Trenches." Chemical Vapor Deposition. 9 [2]. pp. 73-78 (2003).
Grill et al., "The Effect of Plasma Chemistry on the Damage Induced Porous SiCOH Dielectrics," IBM Research Division, RC23683 (W0508-008), Materials Science, 1-19 (2005).
Guan et al., "Voltage gated ion and molecule transport in engineered nanochannels: theory, fabrication and applications," Nanotechnology 25 (2014) 122001.
Gupta et al., "Charge carrier transport and electroluminescence in atomic layer deposited poly-GaN/c—Si heterojunction diodes," Journal of Applied Physics, 124, 084503 (2018).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Habib et al. "Atmospheric oxygen plasma activation of silicon (100) surfaces," American Vacuum Society, 28(3), pp. 476-485 (2010).
Hamalainen et al., "Atomic Layer Deposition of Rhenium Disulfide," Adv. Mater. 30.24, 6 pages (2018).
Han et al., "van der Waals Metallic Transition Metal Dichalcogenides" Chem. Rev. 118, pp. 6297-6336 (2018).
Hansen. "A Primer on Vacuum Pressure Measurement." Vacuum Technology & Coating. Jun. 2009. pp. 36-42 (2009).
Hansen. "Speed, Pressure and Throughput: Part 1 System Diagnostics." Vacuum Technology & Coating. Sep. 2011. pp. 14-17 (2011).
Hansen. "Speed, Pressure and Throughput: Part 2 Managing Gas Flow in High Vacuum Systems." Vacuum Technology & Coating. Oct. 2011. pp. 19-22 (2011).
Hansen. "Speed, Pressure and Throughput: Part 3 Automating the Pressure Control Process." Vacuum Technology & Coating. Nov. 2011. pp. 22-25 (2011).
Hansen. "Speed, Pressure and Throughput: Part 4 Outgassing and Base Pressure." Vacuum Technology & Coating. Dec. 2011. pp. 22-25 (2011).
Hansen. "Speed, Pressure and Throughput: Part 5 Leaks and Gas Flow in Leak Detection." Vacuum Technology & Coating. Jan. 2012. pp. 18-21 (2011).
Hargreaves et al., "New Fluorides and Oxyfluorides of Rhenium," J. Chem. Soc., pp. 1099-1103 (1960).
Harrison et al., "Poly-gate Replacement Through Contact Hole (PRETCH): A New Method for High-K/ Metal Gate and Multi-Oxide Implementation on Chip," IEEE (2004).
Hayashi et al. "Spectroscopic properties of nitrogen doped hydrogenated amorphous carbon films grown by radio frequency plasma-enhanced chemical vapor deposition," Journal of Applied Physics. vol. 89, No. 12, pp. 7924-7931 (2001).
Heo et al., "Structural Characterization of Nanoporous Low-Dielectric Constant SiCOH Films Using Organosilane Precursors," NSTI—Nanotech, vol. 4, 122-123 (2007).
Henke et al.., "X-Ray Interactions: Photo absorption, Scattering, Transmission, and Reflection at E=50-30,000 eV, Z=1-92," Atomic Data and Nuclear Data Tables, 54, 181-342 (1993).
Heyne et al., "The conversion mechanism of amorphous silicon to stoichiometric WS2" J. Materials Chemistry C, 6, pp. 4122-4130 (2018).
Hong et al. "Ultralow-dielectric-constant amoprhous boron nitride" Nature, vol. 582, 16 pages (2020).
Hossain et al., "Recent Advances in Two-Dimensional Materials with Charge Density Waves: Synthesis, Characterization and Applications" Crystals 7, 298, 19 pages (2017).
Hubert et al., "A Stacked Sonos Technology, up to 4 Levels and 6nm Crystalline Nanowires, With Gate-All-Around or Independent Gates (-Flash), Suitable for Full 3D Integration," Minatec, IEDM09-637-640 (2009).
Hudis, "Surface Crosslinking of Polyethylene Using a Hydrogen Glow Discharge," J. Appl. Polym. Sci., 16 (1972) 2397.
Ivanova et al. "ALD of Sc2O3 using Sc(Cp)3 and a Novel Heteroleptic Precursors" Presented on the AVS 19th International Conference on Atomic Layer Deposition, Jul. 23, 2019, Abstract, 1 page (2019).
Jensen et al. "Titanium, Zirconium, and Hafnium Tetrahydroborates as "Tailored" CVD Precursors for Metal Diboride Thin Films", J. Am. Chem. Soc. 110, pp. 1643-1644 (1988).
Johansson et al. "Towards absolute asymmetric synthesis. Synthesis and crystal structure of stereochemically labile MCl2 (M=Co, Ni, Cu, Zn) complexes with diamine ligands," Inorganica Chimica Acta 358, pp. 3293-3302 (2005).
Johnson et al. "A brief review of atomic layer deposition: from fundamentals to applications" Materials Today, vol. 17, Issue 5, pp. 236-246 (2014).
Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. of SPIE, 6924, 69240C, 1-10 (2008).
Jung et al. "New Mechanisms for Ozone-Based ALO Growth of High-k Dielectrics via Nitrogen-Oxygen Species" ECS Transactions, 33(2), pp. 91-99 (2010).
Juppo et al. "Deposition of molybdenum thin films by an alternate supply of MoCl 5 and Zn" J of Vacuumn Science & Technology A, 16, pp. 2845-2850 (1998).
Katamreddy et al., "ALD and Characterization of Aluminum Oxide Deposited on Si(100) using Tris(diethylamino) Aluminum and Water Vapor," Journal of the Electrochemical Society, 153 (10) C701-C706 (2006).
Kern et al., "Chemically Vapor-Deposited Borophosphosilicate Glasses for Silicon Device Applications" RCE Review, 43, 3, pp. 423-457 (1982).
Kerrigan et al. "Low Temperature, Selective Atomic Layer Deposition of Cobalt Metal Films Using Bis(1,4-di-tert-butyl-1,3-diazadienyl)cobalt and Alkylamine Precursors," Chem. Materials, 29, pp. 7458-7466 (2017).
Khandelwal et al. "Low-temperature Ar/N2 remote plasma nitridation of SiO2 thin films," J. Vacuum Science & Technology A, 20(6), pp. 1989-1996 (2002).
Kim et al. "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).
Kim et al. "High Growth Rate in Atomic Layer Deposition of TiO2 Thin Films by UV Irradiation" Electrochemical and Solid-State Letters, 14(4), pp. H146-H148 (2011).
Kim et al. "Novel Flowable CVD Process Technology for sub-20nm Interlayer Dielectrics," IEEE International Interconnect Technology Conference (IITC 2012), San Jose, California, USA, Jun. 4-6, 2012, pp. 1-3 (2012).
Kim et al. "Passivation Effect on Low-k S/OC Dielectrics by H2 Plasma Treatment," Journal of the Korean Physical Society, 40, 1, 94-98 (2002).
Kim et al. "Thermal Decomposition of Tetrakis(ethylmethylamido) Titanium for Chemical Vapor Deposition of Titanium Nitride" Bull. Korean Chem. Soc., vol. 27, No. 2, 5 pages (2006).
King, Plasma Enhanced Atomic Layer Deposition of SiNx: H and SiO2, J. Vac. Sci. Technol., A29(4) (2011).
Kirsch et al. "Dipole model explaining high-k/metal gate field effect transistor threshold voltage tuning" Applied Physics Letters 92, 092901, 3 pages (2008).
Kjesbu, ABB Corporate Research, Internet, pp. 1-37 (2002).

(56) References Cited

OTHER PUBLICATIONS

Kliem et al. "Silyl Group Migrations Between Oxygen and Nitrogen in Aminosiloxanes"; Organosilicon Chemistry VI: from Molecules to Materials; pp. 216-221 (2005).
Klug et al., "Atomic Layer Deposition of Amorphous Niobium Carbide-Based Thin Film Superconductors," The Journal of Physical Chemistry C, vol. 115, pp. 25063-25071, (2011).
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Kofuji et al. "Line-edge roughness increase due to wiggling enhanced by initial pattern waviness" Jpn. J. Appl. Phys. 53, 03DE01, pp. 1-7 (2014).
Kofuji et al. "Mechanism of wiggling enhancement due to HBr gas addition during amorphous carbon etching" Jpn. J. Appl. Phys. 54, 06FH04, pp. 107 (2015).
Kogelschatz et al. "Ozone Generation from Oxygen and Air: Discharge Physics and Reaction Mechanisms" Ozone Science & Engineering, 10, pp. 367-378 (1998).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Koutsokeras et al. "Texture and Microstructure Evolution in Single-Phase TixTa1—xN Alloys of Rocksalt Structure," Journal of Applied Physics, 110, pp. 043535-1-043535-6, (2011).
Kovalgin et al. "Hot-Wire Assisted ALD: A Study Powered by In Situ Spectroscopic Ellipsometry" Adv. Mater. Interfaces 4, 1700058, 11 pages (2017).
Knoops et al., "Atomic Layer Deposition of Silicon Nitride from Bis(tert-butyloamino) silane and N2 Plasma," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Krumdieck et al. "Experimental Characterization and Modeling of Pulsed MOCVD with Ultrasonic Atomization of Liquid Precusor" Chem. Vap. Deposition, 7 (2), pp. 85-90 (2001).
Krumdieck "Kinetic Model of Low Pressure Film Deposition from Single Precursor Vapor in a Well-Mixed, Cold-Wall Reactor" Acta mater., 49, pp. 583-588 (2001).
Kucheyev et al. "Mechanisms of Atomic Layer Deposition on Substrates with Ultrahigh Aspect Ratios." Langmuir. 24 [3]. pp. 943-948 (2008).
Kuchumov et al. "Pulsed MO CVD Processes of MgO Layer Deposition from Mg(thd)2" ECS Trans. 25, pp. 927-934 (2009).
Kukli et al. "Atomic Layer Deposition and Chemical Vapor Deposition of Tantalum Oxide by Successive and Simultaneous Pulsing of Tantalum Ethoxide and Tantalum Chloride" Chem. Mater. 12, pp. 1914-1920 (2000).
Kukli et al. "Atomic Layer Epitaxy Growth of Tantalum Oxide Thin Films from Ta(OC2H5)5 and H20" The Electrochemical Society, vol. 142, No. 5, pp. 1670-1674 (1995).
Kukli et al., "Influence of atomic layer deposition parameters on the phase content of Ta2O5 films" J. Crystal Growth, 212, pp. 459-468 (2000).
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703 (2002).
Kukli et al. "Properties of tantalum oxide thin films grown by atomic layer deposition" Thin Solid Films, 260, pp. 135-142 (1995).
Kumar et al. "Bringing the benefits of Java to Bluetooth" http://www.allembedded.com/story/OEG20020519S001, pp. 1-3 (2002).
Kurosawa et al. "Synthesis and Characterization of Plasma-Polymerized Hexamethyldisiloxane Films," Thin Solid Films, 506-507, 176-179 (2006).
Kwon et al. "Substrate Selectivity of (tBu-Allyl)Co(CO)3 during Thermal Atomic Layer Deposition of Cobalt," Chem. Materials, 24, pp. 1025-1030 (2012).
Lanford et al., "The Hydrogen Content of Plasmadeposited Silicon Nitride," J. Appl. Phys., 49, 2473 (1978).
Lee et al. "Characteristics of Low-K Sioc Films Deposited via Atomic Layer Deposition," Thin Solid Films 645, pp. 334-339 (2018).
Lee et al. "Enahancement of Iodine Adsorption on Ruthenium Glue Layer for Seedless CECVD of Cu" Electrochemical and Solid-State Letters, 8(2) C39-C42 (2005).
Lee et al. "Growth without Postannealing of Monoclinic VO2 Thin Film by Atomic Layer Deposition Using VCl4 as Precursor" Coatings, 8, 431, pp. 1-11 (2018).
Lee et al. "Layer Selection by Multi-Level Permutation in 3-D Stacked NAND Flash Memory," IEEE Electron Device Letters, vol. 37, No. 7, 866-869 (2016).
Lee et al. "Photo-Induced Atomic Layer Deposition of Tantalum Oxide Thin Films from Ta(OC2H5)5 and O2" J of the Electrochemical Society. 151(1) pp. C52-C55 (2004).
Levy et al., "Reflow Mechanisms of Contact Vias in VLSI Processing" J. Electrochem. Soc.: Solid-State Science and Technology, 133, 7, pp. 1417-1424 (1986).
Lewis et al. "Hawley's Condensed Chemical Dictionary" 12th Edition; excerpt pp. 1027-1038 (2005).
Li et al. "Metallic Transition-Metal Dichalcogenide Nanocatalysts for Energy Conversion" Chem. 4, pp. 1510-1537 (2018).
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2 (2006).
Lieberman, et al., "Principles of Plasma Discharges and Materials Processing," Second Edition, 368-381 (2005).
Lim et al., "Low-Temperature Growth of SiO2 Films by Plasma-Enhanced Atomic Layer Deposition," ETRI Journal, 27 (1), 118-121 (2005).
Lim et al. "Synthesis and Characterization of Volatile, Thermally Stable, Reactive Transistion Metal Amidinates," Inorg. Chem., 42, pp. 7951-7958 (2003).
Liu et al., "Research, Design, and Experiment of End Effector for Wafer Transfer Robot," Industrial Robot: An International Journal, 79-91 (2012).
Liu et al., "Van der Waals metal-semiconductor junction: Weak Fermi level pinning enables effective tuning of Schottky barrier" Sci. Adv. 2: e1600069, 7 pages (2016).
Londergan et al. "Engineered Low Resistivity Titanium-Tantalum Nitride Films by Atomic Layer Deposition," Mat. Res. Soc. Symp. Proc., vol. 714E, pp. L5.3.1-L5.3.6 (2001).
Longrie et al., "Plasma-Enhanced ALD of Platinum with O2, N2 and NH3 Plasmas", ECS Journal of Solid State Science and Technology, vol. 1, pp. Q123-Q129 (2012).
Mackenzie et al. "Stress Control of Si-Based PEVCD Dielectrics," Proc. Symp. Silicon Nitrode and Silicon Dioxide Thin Insulating Films & Other Emerging Dielectrics VIII, 148-159 (2005).
Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea (2008).
Maeno, "Gecko Tape Using Carbon Nanotubes," Nitto Denko Gihou, 47, 48-51 (2009).
Makela et al. "Thermal Atomic Layer Deposition of Continuous and Highly Conducting Gold Thin Films," Chem. Materials, 29, pp. 6130-6136 (2017).

(56) References Cited

OTHER PUBLICATIONS

Mameli et al. "Area-Selective Atomic Layer Deposition of SiO2 Using Acetylacetone as a Chemoselective Inhibitor in an ABC-Type Cycle" ACS Nano 11, pp. 9303-9311 (2017).
Mameli et al. "Isotropic Atomic Layer Etching of ZnO Using Acetylacetone and O2 Plama" ACS Appl. Mater. Interfaces 10, pp. 38588-38595 (2018).
Marsik et al., "Effect of Ultraviolet Curing Wavelength on Low-k Dielectric Material Properties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2Al)2O]n and (RAlO)n," J. American Chemical Society, vol. 115, No. 12, pp. 4971-4984 (1993).
Massachusetts Institute of Technology Lincoln Laboratory, "Solid State Research," Quarterly Technical Report (1995).
Mattinen et al., "Crystalline tungsten sulfide thin films by atomic layer deposition and mild annealing" J. Vac. Sci. Tech. 37, 020921, 35 pages (2019).
Maydannik et al., "Spatial atomic layer deposition: Performance of low temperature H2O and 03oxidant chemistry for flexible electronics encapsulation", Journal of Vacuum Science and Technology: Part A AVS/ AIP, vol. 33 (1901).
Meng et al., "Atomic Layer of Deposition of Silicon Nitride Thin Films: A Review of Recent Progress, Challenges, and Outlooks," Materials, 9, 1007 (2016).
Merdrignac-Conanec et al. "Nitridation under ammonia of high surface area vanadium aerogels" Journal of Solid State Chemistry 178(1), 8 pages (2005).
Miller et al. "Carbon nitrides: synthesis and characterization of a new class of functional materials," Phys.Chem.Chem.Phys., 19, pp. 15613-15638 (2017).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnCl4 Precursor," ECS Transactions, 69 (5), 279-285 (2015).
Mukai et al., "A Study of CD Budget in Spacer Patterning Technology," Proc. of SPIE, 6924, 1-8 (2008).
Naito et al. "Electrical Transport Properties in 2H—NbS2, —NbSe2, —TaS2 and —TaSe2," J. of Physical Society of Japan, vol. 51, No. 1, 219-227 (1982).
Nakano et al., "Layer-by-Layer Epitaxial Growth of Scalable WSe2 on Sapphire by Molecular Beam Epitaxy" Nano. Lett. 17, pp. 5595-5599 (2017).
Naslain et al. "Synthesis of highly tailored ceramic matrix composites by pressure-pulsed CVI" Solid State Ionics, 141-142, pp. 541-548 (2001).
Ngo et al. "Atomic layer deposition of photoactive CoO/SrTiO3 and CoO/TiO2 on Si(001) for visible light driven photoelectrochemical water oxidation," J. Applied Physics, 114, 9 pages (2013).
Niinisto et al. "Advanced electronic and optoelectronic materials by Atomic Layer Deposition: An overview with special emphasis on recent progress in processing of high-k dielectrics and other oxide materials" Pus. Stat. Sol. (a) 201, No. 7, pp. 1443-1452 (2004).
Nikolic et al. "The dependence of the work function of rare earth metals on their electron structure" Microelectronics Journal 27, 93-96 (1996).
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 p. 2337-2351.
Ohchi et al. "Reducing damage to Si substrates during gate etching processes." Japanese Journal of Applied Physics 47.7R 5324 (2008).
Ohtsu et al. "Influences of Gap Distance on Plasma Characteristics in Narrow Gap Capacitatively Coupled Radio-Frequency Discharge," vol. 43, No. 2, pp. 795-799 (2004).
Ohzawa et al. "Preparation of fibrous SiC shape using pressure-pulsed chemical vapour infiltration and its properties as a high-temperature filter" J. of Materials Processing Technology, 96, pp. 151-156 (1999).
Okamoto et al., "Luminescent Properties of Pr3+—sensitized LaPO4: Gd3+ Ultraviolet-B Phosphor Under Vacuum-Ultraviolet Light Excitation," J. App. Phys. 106, 013522 (2009).
O'Malley et al. "Structure and properties of ordered Li2IrO3 and Li2PtO3" Journal of Solid State Chemistry 181, pp. 1803-1809 (2008).
Park et al. "Atomic layer deposition of Y2O3 films using hetroleptic liquid (iPrCp)2Y(iPr-amd) precursor" J. Mater. Chem. C, 2, 9 pages (2014).
Park, "Substituted Aluminum Metal Gate on High-K Dielectric for Low Work-Function and Fermi-Level Pinning Free," 4 pages, IEEE 0-7803-8684-1/04 (2004).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179-4185 (2005).
Pichler. "Intrinsic Point Defects, Impurities and Their Diffusion in Silicon," Springer-Verlag Wien, p. 367 (2004).
Portet et al., "Impact of Synthesis Conditions on Surface Chemistry and Structure of Carbide-Derived Carbons," Thermochimica Acta, 497, 137-142 (2010).
Posseme et al. "Alternative process for thin layer etching: Application to nitride spacer etching stopping on silicon germanium" Apply. Phys. Lett. 105, 051604, pp. 1-4 (2014).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature ALD of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Provine et al. "Atomic Layer Deposition: Introduction to the Theory and Cambridge Nanotech Savannah & Fiji" NNIN ALD Roadshow Presentation, 49 pages (2012).
Provine et al., "Correlation of Film Density and Wet Etch Rate in Hydrofluoric Acid of Plasma Enhanced Atomic Layer Deposited Silicon Nitride," AIP Advances, 6 (2016).
Putkonen et al. "Low-Temperature ALE Deposition of Y2O3 Thin Films from β-Diketonate Precursors" Chemical Vapor Deposition 7(1) pp. 44-50 (2001).
Qin et al., "Chemical Vapor Deposition Growth of Degenerate p-Type Mo-Doped ReS2 Films and Their Homojunction," ACS Appl. Mater. Interfaces, 9(18), pp. 15583-15591 (2007).
Radamson et al. "Growth of Sn-alloyed Group IV Materials for Photonic and Electronic Applications" Chapter 5 pp. 129-144, Manufacturing Nano Structures (2014).
Roddy, "Transport Reactions and Vaporization Studies of Some Vanadium Halides", Iowa State university of Science and Technology dissertation, 207 pages (1962).
Rosemount 1199 Diaphragm Seal Systems, Product Data Sheet, 92 pages (2008).
Rossing et al. "Acoustics of Eastern and Western bells, Old and New" J of Acoustical Society of Japan; 10(5); pp. 241-252 (1989).
Ryu et al., "Persistent Charge-Density-Wave Order in Single-Layer TaSe2" Nano. Lett. 18, pp. 689-694 (2018).
Saeki et al. "Reaction Process of Vanadium Tetrachloride with Ammonia in the Vapor Phase and Properties of the Vanadium Nitride Formed" Bull. Chem. Soc. Jpn., 55, pp. 3446-3449 (1982).

(56) References Cited

OTHER PUBLICATIONS

Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).

Salim, "In-situ Fourier Transform Infrared Spectroscopy of Chemistry and Growth in Chemical Vapor Deposition," Massachusetts Institute of Technology, 187 pages (1995).

Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).

Samal et al., "Low-Temperature (<200° C.) Plasma Enhanced Atomic Deposition of Dense Titanium Nitride Thin Films" (2012).

Sanders et al., "Crystalline and electronic structure of single-layer $TaS_2$" Phys. Rev. B. 94, 081404, 6 pages (2016).

Schindler, Dissertation, Next Generation High-k Dielectrics for DRAM Produced by Atomic Layer Deposition Studied by Transmission Electron Microscopy (2015).

Schmatz et al., "Unusual Isomerization Reactions in 1.3-Diaza-2-Silcyclopentanes," Organometallics, 23, 1180-1182 (2004).

Sellers, Making Your Own Timber Dogs, Paul Sellers blog, Published on Nov. 18, 2014, [online], [site visted Jun. 10, 2017]. Available from Internet, <URL: https://paulsellers.com/2014/11/making-your-own-timber-dogs/>.

Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).

Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).

Senateur et al. "Pulsed Injection MOCVD of Functional Electronic Oxides" Adv. Mater. Opt. Electron, 10, pp. 155-161 (2000).

Seshadri et al., "Ultrathin Extreme Ultraviolet Patterning Stack Using Polymer Brush as an Adhesion Promotion Layer," Journal of Micro/Nanolithography, MEMS, and MOEMS 16(3) (2017).

Shamma et al., "PDL Oxide Enabled Doubling," Proc. of SPIE, 6924, 69240D, 1-10 (2008).

Shevtsov et al. "An Apparatus for Pulse Chemical Vapor Deposition of Layers" Instruments and Experimental Techniques, vol. 56, No. 3, pp. 353-357 (2013).

Shevtsov et al. "Effect of Spatial Image Transfer in a Pulse MOCVD Process" Physics Procedia 46, pp. 27-32 (2013).

Simchi et al., "Sulfidation of 2D transition metals (Mo, W, Re, Nb, Ta): thermodynamics, processing, and characterization" J. Materials Science 52: 17, 9 pages (2017).

Spear et al., "Chemical Transport Reactions in the Vanadium-Silicon-Oxygen System and the Ternary Phase Diagram", Journal of the Less-Common Metals, 14, pp. 69-75 (1968).

Stanley et al. "Feedgas for Modern High-Performance Ozone Generators" Ozonia Ltd., Duebendorf, Switzerland. 7 pages. Available Jul. 14, 2017 online at: http://www.degremont-technologies.com/cms_medias/pdf/tech_ozonia_feedgas.pdf (1999).

Stannowski et al. "Growth process and properties of silicon nitride deposited by hot-wire chemical vapor deposition" J Applied Physics, vol. 93 No. 5, 9 pages (2013).

Su et al. "A Polymer Precursor Route to Metal Borides", Chem. Mater., 5, pp. 1659-1668 (1993).

Svetin et al., "Three-dimensional resistivity and switching between correlated electronic states in 1T-$TaS_2$" Nature, Scientific Reports Apr. 12, 2017, 7:46048, 10 pages (2017).

Tatehaba et al., "Adhesion Energy of Polystyrene and Substrate in Function Water," 5th International Symposium of Cleaning Technology in Semiconductor Device Manufacturing, pp. 560-565 (1998).

Tidman et al. "Resistivity of thin TaS2 crystals," Can. J. Phys., vol. 54, 2306-2309 (1976).

Todi et al., "Characterization of Pt—Ru Binary Alloy Thin Films for Work Function Tuning," IEEE Electron Device Letters, vol. 27, No. 7, pp. 542-545 (2006).

Tomozeiu et al. "Effects of UV photon irradiation on SiOx (0<x<2) structural properties" Applied Surface Science 253, pp. 376-380 (2006).

Trumbore et al. "Solid solubilities of aluminum and gallium in germanium," J. of Physics and Chemistry of Solids, vol. 11, Issues 3-4, 239-240 (1959).

Tseng et al., "Etch Properties of Resists Modified by Sequential Infiltration Synthesis," American Vacuum Society (2011).

Tseng et al., "Enhanced Block Copolymer Lithography Using Sequntial Infiltration Synthesis," Journal of Physical Chemistry, vol. 5, 17725-17729 (2011).

Ueda et al. "Enhanced Sidewall Grown (ESG) process: towards PEALD with conformality above 100%," Extended Abstracts of the 2011 International Conference on Solid State Devices and Materials, Nagoya, pp. 34-35 (2011).

U.S. Appl. No. 60/394,086, filed Jul. 3, 2002 in the name of Jacques Schmitt, and entitled "ALD on a Rotary Susceptor" pp. 1-23 (2002).

U.S. Appl. No. 62/274,238, filed Jan. 1, 2016 in the names of Alexander S. Polyak et al., and entitled "Non-Metallic Thermal CVD/ALD Gas Injector and Purge System" pp. 1-63 (2016).

U.S. Appl. No. 62/293,897, filed Feb. 11, 2016 in the names of Bernardo Donoso et al., and entitled "Vapor Based Site-Isolated Processing Systems and Methods" pp. 1-51 (2016).

Vallat et al. "Area selective deposition of TiO2 by intercalation of plasma etching cycles in PEALD process: A bottom up approach for the simplification of 3D integration scheme" Journal of Vacuum Science & Technology A 37(2), 12 pages (2019).

Vallat et al. "Selective deposition of Ta2O5 by adding plasma etching super-cycles in plasma enhanced atomic layer deposition steps" Journal of Vacuum Science & Technology A 35(1), 7 pages (2016).

Varma, et al., "Effect of Metal Halides on Thermal, Mechanical, and Electrical Properties of Polypyromelitimide Films," Journal of Applied Polymer Science, vol. 32, pp. 3987-4000, (1986).

Vasilev, "Borophosphosilicate Glass Films in Silicon Microelectronics, Part 1: Chemical Vapor Deposition, Composition, and Properties" Russian Microelectronics, vol. 33, No. 5, pp. 271-284 (2004).

Vayrynen et al. "Photo-Assisted Atomic Layer Deposition and Chemical Vapor Deposition of Metal and Metal Oxide Thin Films" Thesis, Oct. 2015, 146 pages (2005).

Venkatesan et al. "A rugged lead-ruthenate pyrochlore membrane catalyst for highly seelctive oxidation of alcohols" J. Molecular Catalysis A: Chemical 250, pp. 87-93 (2006).

Voltaix, "Meterial Safety Data Sheet for: Trisilylamine", pp. 1-8, (2014).

Wang et al., "Tritertiarybutylaluminum as an Organometallic Source for Epitaxial Growth of AlGaSb," Appl. Phys. Lett. 67 (10), Sep. 4, pp. 1384-1386, American Institute of Physics (1995).

Wirths, et al., "SiGeSn Growth tudies Using Reduced Pressure Chemical Vapor Deposition Towards Optoeleconic Applications," This Soid Films, 557, 183-187 (2014).

Xiao "Introduction to Semiconductor Manufacturing Technology" SPIE Press, ISBN 978-0-08194-9092-6, pp. 237-245 (2012).

Xing et al., "Ising Superconductivity and Quantum Phase Transition in Macro-Size Monolayer NbSe2" Nano. Lett. 17, pp. 6802-6807 (2017).

Xu et al., "14NM Metal Gate Film Stack Development and Challenges," SMIC et al. (2016).

Xu et al., "Contacts between Two- and Three-Dimensional Materials: Ochmic, Schottky, and p-n Heterojunctions" ACS Nano 10, pp. 4895-4919 (2016).

Yoshida, et al., Threshold Voltage Tuning for 10NM and Beyond CMOS Integration, Solid State Technology, 57(7): 23-25 (2014).

Yu et al., "Modulation of the Ni FUSI Workfunction by Yb Doping: from Midgap to N-Type Band-Edge," 4 pages, IEEE 0-7803-9269-8/05 (2005).

Yuan et al. "A Bifunctional Air Electrode Catalyzed by Lead Ruthenate for Li-Air Batteries" ECS Transactions 69(19), pp. 23-32 (2015).

(56) References Cited

OTHER PUBLICATIONS

Yuan et al., "Facile Synthesis of Single Crystal Vanadium Disulfide Nanosheets by Chemical Vapor Deposition for Efficient Hydrogen Evolution Reaction" Adv. Mater. 27, pp. 5605-5609 (2015).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Comparison of Atomic Scale Etching of Poly-Si in Inductively Coupled Ar and He Plasmas", Korean Journal of Chemical Engineering, vol. 24, 670-673 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Zhao et al. "Surface Chemistry of Thermal Dry Etching of Cobalt Thin Films Using Hexafluoroacetylacetone (hfacH)" Appl Surf Sci. 455, pp. 438-445 (2018).
Zhao et al. "Thermal and Plasma-Enhanced Atomic Layer Deposition of Yttrium Oxide Films and the Properties of Water Wettability" Appl. Mater. Interfac. 12(2), 9 pages (2019).
Zhou et al., "A library of atomically thin metal chalcogenides" Nature 556, pp. 355-361 (2018).
Chemistry Stack Exchange, "Why is CF4 Non-Polar and CHF Polar," https://chemistry.stackexchange.com/questions/31604/why-is-cf4-non-polar-and-chf3-polar, (2015).
Crystal IS "Application Note: Using UV Reflective Materials to Maximize Disinfection"; AN011; Jun. 16, 2016.
IPS Water Heater Pan Adapter Kit, Nov. 1, 2015, [online], [site visited Dec. 4, 2019]; URL: http://es.ipscorp.com/watertite/protectivesystem/whpanadapter (2015).
"Polyurethane_HF"; webpage; no date. Cited in Notice of References dated May 18, 2017 in U.S. Appl. No. 14/884,695.
Rhenium trioxide; https://en.wikipedia.org/wiki/Rhenium_trioxide [online]; last edited on Feb. 18, 2017.
Scientific and Technical Information Center EIC 2800 Search Report dated Feb. 16, 2012.
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.
CNIPA; Office Action dated Sep. 13, 2021 in Application No. 201780076321.1.
CNIPA; Office Action dated Apr. 30, 2021 in Application No. 201810018936.5.
CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.
CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.
JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903.
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.
KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated in Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.
KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
TIPO; Office Action dated Jun. 22, 2021 in Application No. 104108277.
TIPO; Notice of Allowance dated Sep. 22, 2021 in Application No. 104108277.
TIPO; Office Action dated Jun. 2, 2021 in Application No. 105129977.

(56) References Cited

OTHER PUBLICATIONS

TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.
TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.
TIPO; Notice of Allowance dated Jun. 9, 2021 in Application No. 109303437.
TIPO; Notice of Allowance dated Oct. 1, 2021 in Application No. 110118827.
TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.
USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in U.S. Appl. No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.
USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.
USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.
USPTO; Non-Final Office Action dated Oct. 22, 2021 in U.S. Appl. No. 16/042,791.
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.
USPTO; Final Office Action dated Jul. 27, 2021 in U.S. Appl. No. 16/108,950.
USPTO; Advisory Action dated Oct. 1, 2021 in U.S. Appl. No. 16/108,950.

(56) References Cited

OTHER PUBLICATIONS

USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.
USPTO; Non-Final Office Action dated Aug. 25, 2021 in U.S. Appl. No. 16/210,922.
USPTO; Final Office Action dated Sep. 1, 2021 in U.S. Appl. No. 16/240,392.
USPTO; Notice of Allowance dated Oct. 15, 2021 in U.S. Appl. No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Jul. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Final Office Action dated May 12, 2021 in U.S. Appl. No. 16/546,543.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.
USPTO; Notice of Allowance dated Oct. 18, 2021 in U.S. Appl. No. 16/601,593.
USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.
USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.
USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.
USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Office Action dated Jul. 23, 2021 in U.S. Appl. No. 17/009,093.
USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.
USPTO; Non-Final Office Action dated Sep. 10, 2021 in U.S. Appl. No. 17/038,514.

(56) References Cited

OTHER PUBLICATIONS

USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of the Electrochemical Society, 152(5) G361-G366 (2005).
Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/ (2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.
Hayashi et al. "2,2-Difluoro-1,3-dimethylimidazolidine (DFI). A new fluorinating agent" Chem. Commun. pp. 1618-1619 (2002).
Imai et al. "Energetic stability and magnetic moment of tri-, tetra-, and octa-ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).
Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pp. G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2Cl6 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).
Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
Puurunen "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1—xO2-d (x=0.25) high-k dielectrics for advanced gate stacks" Applied Physics Letters, 94, 3 pages (2009).
U.S. Appl. No. 60/545,181, filed Feb. 13, 2004 in the names of Matthew G. Goodman et al., and entitled "Forced Flow Susceptor with Exit Holes and Veins for Improvided Process" pp. 1-15 (2004).
U.S. Appl. No. 60/591,258, filed Jul. 26, 2004 in the names of Jeroen Stoutyesdijk et al., and entitled "Susceptor Support for Eliminating Backside Nodules" pp. 1-71 (2004).
U.S. Appl. No. 62/504,470, filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).
Vesters et al. "Sensitizers in EUV Chemically Amplified Resist: Mechanism of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct.-Dec. 2018, 9 pages (2018).
Zhang et al. "Mechanical Stability of Air-gap Interconnects" Proc. Future Fab International, pp. 81-87 (2008).

(56) References Cited

OTHER PUBLICATIONS

Zientara et al. Journal of the European Ceramic Society, 27, Abstract, 1 page (2007).
TIPO; Notice of Allowance dated Jan. 30, 2019 in Application No. 103132230.
TIPO; Notice of Allowance dated May 7, 2019 in Application No. 105114105.
CNIPA; Office Action dated Mar. 30, 2021 in Application No. 201610131743.1.
CNIPA; Office Action dated Mar. 1, 2021 in Application No. 201710131319.1.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Apr. 19, 2021 in Application No. 201711328250.8.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Mar. 24, 2021 in Application No. 201880048547.5.
CNIPA; Office Action dated Dec. 22, 2020 in Application No. 201910378791.4.
CNIPA; Notice of Allowance dated Apr. 7, 2021 in Application No. 202030579755.8.
EPO; Extended European Search Report dated Apr. 6, 2021 in Application No. 21150514.4.
JPO; Notice of Allowance dated Apr. 6, 2021 in Application No. 2017-139817.
JPO; Office Action dated Mar. 31, 2021 in Application No. 2018-024655.
JPO; Notice of Allowance dated Mar. 17, 2021 in Application No. 2020-010953.
KIPO; Office Action dated Mar. 23, 2021 in Application No. 10-2014-0011765.
KIPO; Office Action dated Apr. 27, 2021 in Application No. 10-2014-0027217.
KIPO; Notice of Allowance dated Apr. 15, 2021 in Application No. 10-2014-0103853.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Apr. 5, 2021 in Application No. 10-2015-0031720.
KIPO; Office Action dated Apr. 19, 2021 in Application No. 10-2015-0035094.
KIPO; Office Action dated Mar. 8, 2021 in Application No. 10-2017-0054647.
KIPO; Office Action dated Mar. 10, 2021 in Application No. 10-2017-0055703.
KIPO; Notice of Allowance dated May 24, 2021 in Application No. 10-2020-0101096.
KIPO; Notice of Allowance dated Apr. 1, 2021 in Application No. 30-2020-0030139 (M001).
KIPO; Notice of Allowance dated Apr. 1, 2021 in Application No. 30-2020-0030139 (M002).
TIPO; Notice of Allowance dated May 13, 2021 in Application No. 105122394.
TIPO; Notice of Allowance dated Mar. 5, 2021 in Application No. 105131284.
TIPO; Office Action dated Feb. 25, 2021 in Application No. 105134275.
TIPO; Notice of Allowance dated Mar. 4, 2021 in Application No. 106100823.
TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 2021 in Application No. 108143562.
TIPO; Notice of Allowance dated May 18, 2021 in Application No. 109300595.
TIPO; Notice of Allowance dated Mar. 30, 2021 in Application No. 109305460.
USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.
USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.
USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.

(56) References Cited

OTHER PUBLICATIONS

USPTO; Non-Final Office Action dated Feb. 18, 2021 in U.S. Appl. No. 15/923,834.
USPTO; Advisory Action dated Apr. 28, 2021 in U.S. Appl. No. 15/940,729.
USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.
USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Non-Final Office Action dated Feb. 1, 2021 in U.S. Appl. No. 16/563,473.
USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Final Office Action dated Feb. 22, 2021 in U.S. Appl. No. 16/713,311.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.

(56) References Cited

OTHER PUBLICATIONS

Aubin et al. "Very low temperature (450° C.) selective epitaxial growth of heavily in situ boron-doped SiGe layers" Semiconductor Science and Technology, 30, 10 pages (2015).
Barnscheidt et al. "Highly boron-doped germanium layers on Si(001) grown by carbon-mediated epitaxy" Semiconductor Science and Technology, 33, 9 pages (2018).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Cheremisin et al. "UV-laser modification and selective ion-beam etching of amorphous vanadium pentoxide thin films" Phys. Status Solidi A, Applications and materials science, 206 (7), pp. 1484-1487 (2009).
Dingemans et al. "Plasma-Assisted ALD for the Conformal Deposition of SiO2: Process, Material and Electronic Properties" J of the Electrochemical Society, 159(3), H277-H285 (2012).
G02-1152 "Atomic Layer Deposition of Al2O3 with Alcohol Oxidants for Impeding Substrate Oxidation" Abstract. Oct. 16, 2019 (2019).
Imamura et al. "Cyclic C4F8 and O2 plasma etching of TiO2 for high-aspect-ratio three-dimensional devices" Template for JJAP Regular Papers, Jan. 2014, pp. 29 (2014).
Kim et al. "A process for topographically selective deposition on 3D nanostructures by ion implantation" ACS Nano, 10, 4, 4451-4458 (2016).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).
Musschoot et al. "Atomic layer deposition of titanium nitride from TDMAT precursor" Microelectronic Engineering, 86, pp. 72-77 (2009).
Noircler et al. "Transmission electron microscopy characterization of low temperature boron doped silicon epitaxial films" CrystEngComm, 22(33), pp. 5464-5472 (2020).
Oyama et al. "Topotactic synthesis of vanadium nitride solid foams" Journal of Materials Research vol. 8. No. 6, pp. 1450-1454 (1993).
Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).
Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).
Tao et al. "Improved performance of GeON as charge storage layer in flash memory by optimal annealing" Microelectronics Reliability, vol. 52, pp. 2597-2601 (2012).
Wirths et al. "Low temperature RPCVD epitaxial growth of Si1xGex using Si2H6 and Ge2H6" Solid-State Electronics, 88, pp. 2-9 (2013).
Yanguas-Gil et al. "Modulation of the Growth per Cycle in Atomic Layer Deposition Using Reversible Surface Functionalization" Chemistry of Materials, 25, pp. 4849-4860 (2013).

* cited by examiner

METHODS FOR SILICON GERMANIUM UNIFORMITY CONTROL USING MULTIPLE PRECURSORS

CROSS-REFERENCE TO RELATED APPLICATIONS

This application is a Nonprovisional of, and claims priority to and the benefit of, U.S. Provisional Patent Application No. 63/025,499, filed May 15, 2020 and entitled "METHODS FOR SILICON GERMANIUM UNIFORMITY CONTROL USING MULTIPLE PRECURSORS," which is hereby incorporated by reference herein.

FIELD OF THE DISCLOSURE

The present disclosure generally relates to gas-phase reactor systems and methods. More particularly, the disclosure relates to methods and systems for forming silicon germanium layers.

BACKGROUND OF THE DISCLOSURE

Gas-phase reactors, such as chemical vapor deposition (CVD) reactors, can be used for a variety of applications, including depositing materials on a substrate surface. For example, gas-phase reactors can be used to deposit layers on a substrate to form semiconductor devices, flat panel display devices, photovoltaic devices, microelectromechanical systems (MEMS), and the like.

By way of examples, such reactors can be used to form silicon germanium layers on a surface of a substrate. The silicon germanium layers can be used fora variety of applications, including the formation of three-dimensional devices, such as gate-all-around devices and/or as channel, source, and/or drain regions in metal oxide semiconductor (MOS) devices, and particularly complimentary MOS (CMOS) devices.

A typical gas-phase reactor system includes a reactor including a reaction chamber, a precursor gas source fluidly coupled to the reaction chamber, a carrier and/or purge gas source fluidly coupled to the reaction chamber, a gas delivery system to deliver gases (e.g., precursors and/or carrier/purge gas(es)) to the reaction chamber, and an exhaust source fluidly coupled to the reaction chamber.

Generally, it is desirable to have uniform film properties (e.g., film thickness and film composition) across a surface of a substrate and/or to have control over any desired variation of the film properties. As sizes of features formed on a substrate surface decrease, it becomes increasingly important to control film properties, such as film thickness, composition, and resistivity. For example, in the case of silicon germanium layers, it is often desirable to control the silicon and germanium concentration in the layer, as well as the layer thickness across a surface of a substrate. However, with many processes, a thickness and/or composition of a film can undesirably vary across a surface of a substrate, particularly at an edge of a substrate. Accordingly, improved methods and systems for forming silicon germanium layers on a surface of a substrate are desired.

Any discussion, including discussion of problems and solutions, set forth in this section has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

Various embodiments of the present disclosure relate to methods of forming a silicon germanium layer on a surface of a substrate. While the ways in which various embodiments of the present disclosure address drawbacks of prior methods of forming silicon germanium layers are discussed in more detail below, in general, various embodiments of the disclosure provide multiple silicon precursors to the reaction chamber to provide improved silicon germanium layer composition and/or thickness uniformity in silicon germanium films formed using the methods.

In accordance with exemplary embodiments of the disclosure, a method of forming a silicon germanium layer on a surface of a substrate is provided. The method can include providing a substrate within a reaction chamber, providing a first silicon precursor to the reaction chamber, providing a second silicon precursor to the reaction chamber, and providing a germanium precursor to the reaction chamber. Before any of the foregoing method steps, a precoating layer may be disposed on a surface(s) within the reaction chamber (e.g., the reaction chamber inner walls, the susceptor, thermocouple ring, getter plate, or any other surfaces within the reaction chamber). The precoating layer may comprise a substance or compound comprised in one or more of the precursors for the main deposition process, or in the resulting silicon germanium layer. Accordingly, the precoating layer may comprise silicon and/or germanium. The steps of providing the first silicon precursor to the reaction chamber, providing the second silicon precursor to the reaction chamber, and providing the germanium precursor to the reaction chamber can overlap, such that all three steps of providing the first silicon precursor to the reaction chamber, providing the second silicon precursor to the reaction chamber, and providing the germanium precursor to the reaction chamber occur for a time period. In accordance with examples of these embodiments, the first silicon precursor comprises a halogenated silicon precursor. In accordance with further examples, the second silicon precursor comprises a nonhalogenated silicon precursor.

In accordance with further examples of the disclosure, a structure comprising the silicon germanium layer is provided. The silicon germanium layer can be formed according to a method disclosed herein.

In accordance with further examples of the disclosure, a device comprising the silicon germanium layer is provided. The device can be formed using a structure as described herein. The silicon germanium layer can be formed according to a method disclosed herein.

In accordance with yet further embodiments of the disclosure, a system is provided. The system can include one or more reaction chambers, a first silicon precursor source, a second silicon precursor source, a germanium precursor source, an exhaust source, and a controller. In accordance with examples of these embodiments, the controller is configured to control gas flow of a first silicon precursor, a second silicon precursor, and a germanium precursor into at least one of the one or more reaction chambers to form a layer comprising silicon germanium overlying a surface of a substrate using a deposition process. Exemplary systems can be used to perform methods as disclosed herein and/or to form structures as disclosed herein.

These and other embodiments will become readily apparent to those skilled in the art from the following detailed description of certain embodiments having reference to the attached figures; the disclosure not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 3:
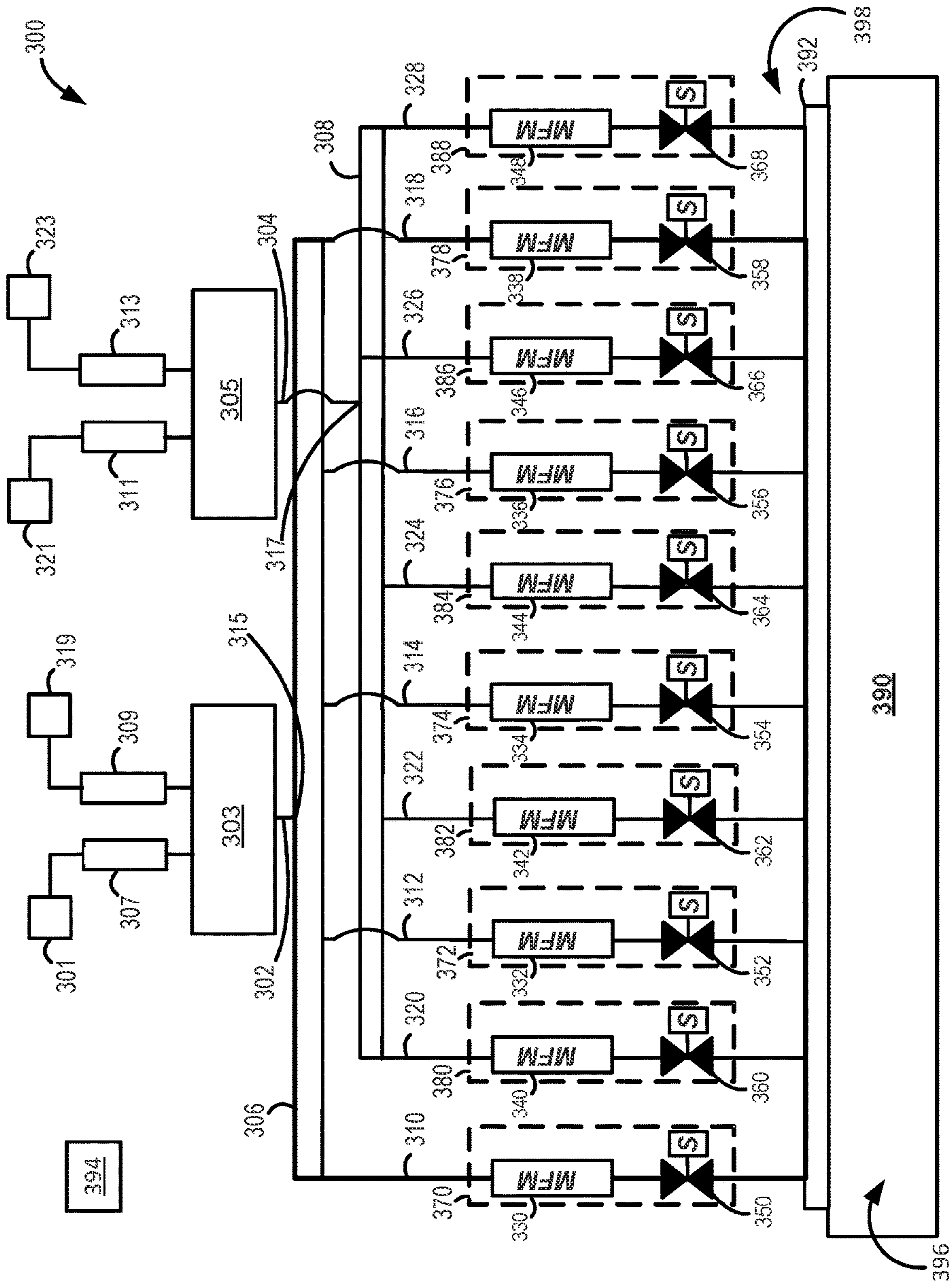

FIG. 3 schematically illustrates a gas injection system for use in accordance with at least one exemplary embodiment of the disclosure.

Figure 4:
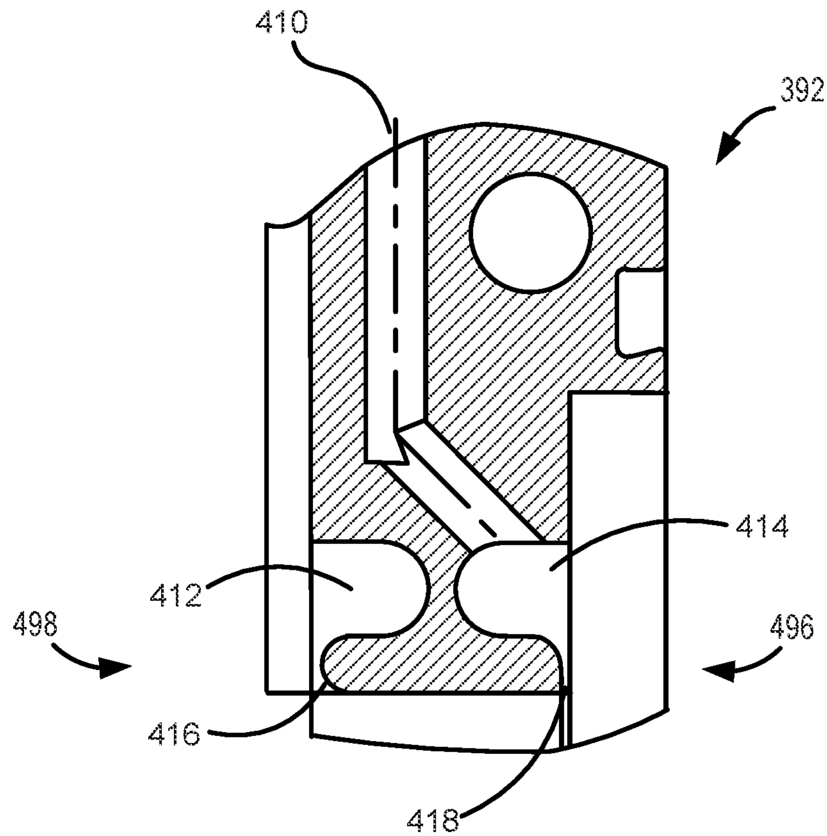

FIG. 4 illustrates a cross-sectional view of a flange for use in accordance with at least one exemplary embodiment of the disclosure.

Figure 5:
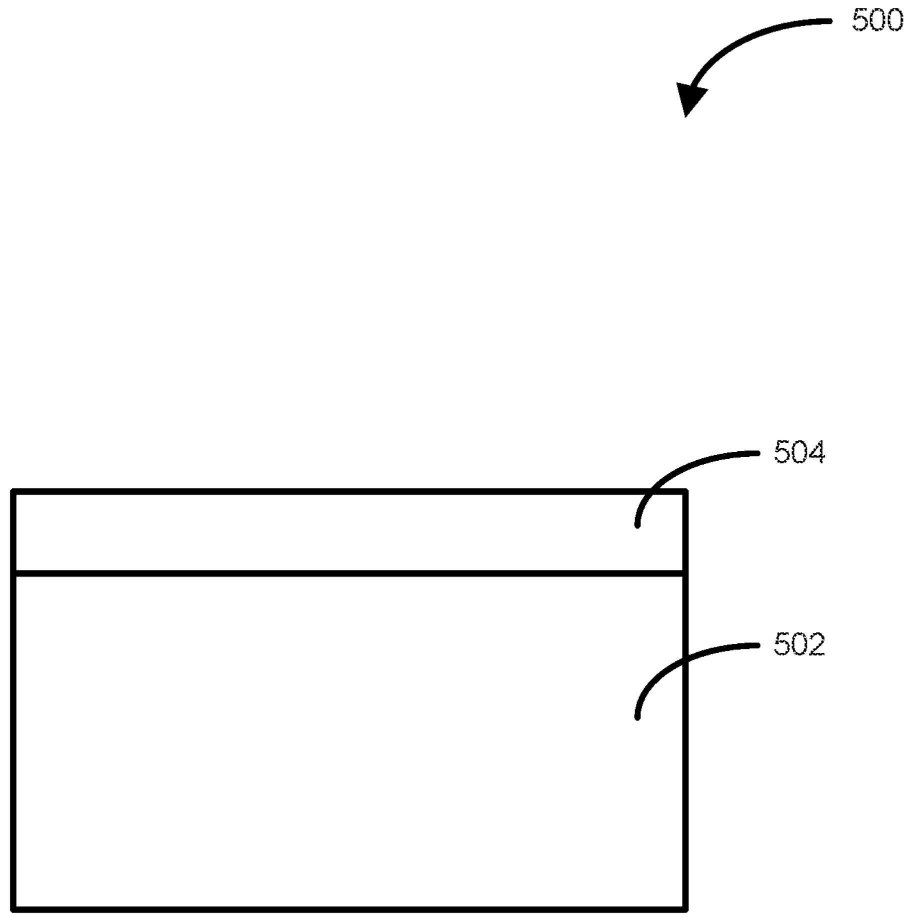

FIG. 5 illustrates a structure in accordance with at least one exemplary embodiment of the disclosure.

Figure 6:
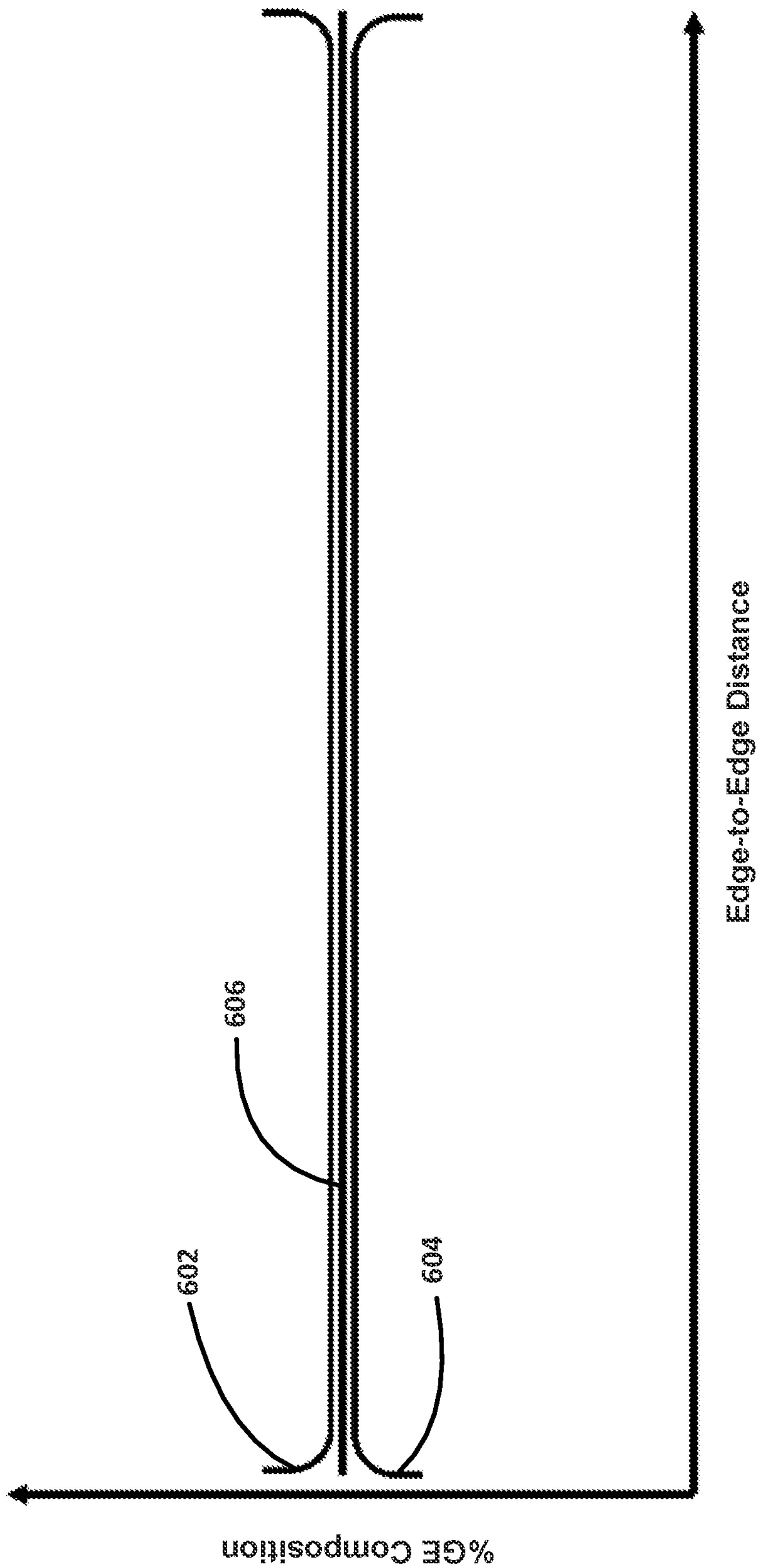

FIG. 6 illustrates a composition profile of a silicon germanium layer formed using a method in accordance with at least one embodiment of the disclosure.

Figure 7A:
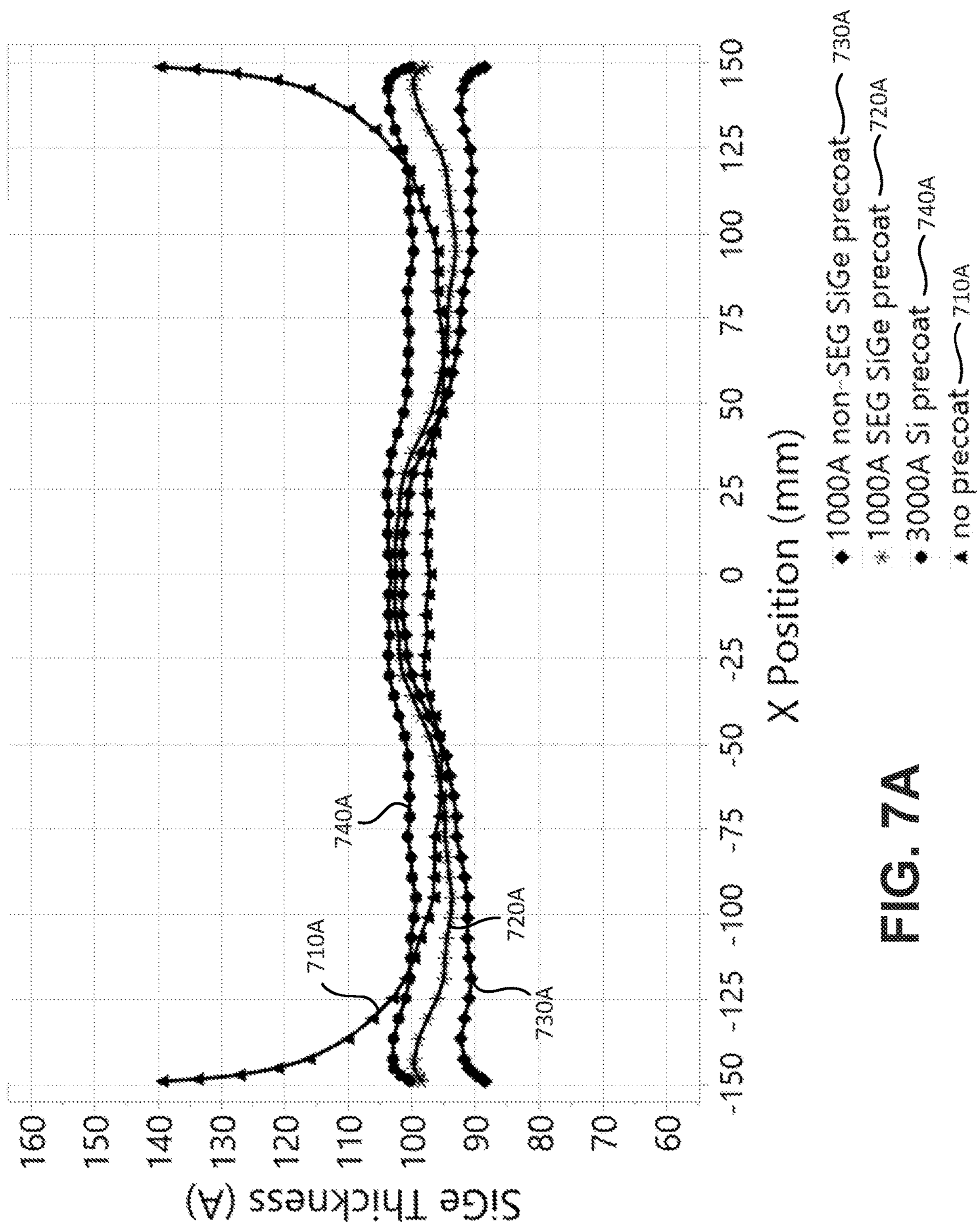

FIG. 7A illustrates a thickness profile of silicon germanium layers formed using methods in accordance with at least one embodiment of the disclosure.

Figure 7B:
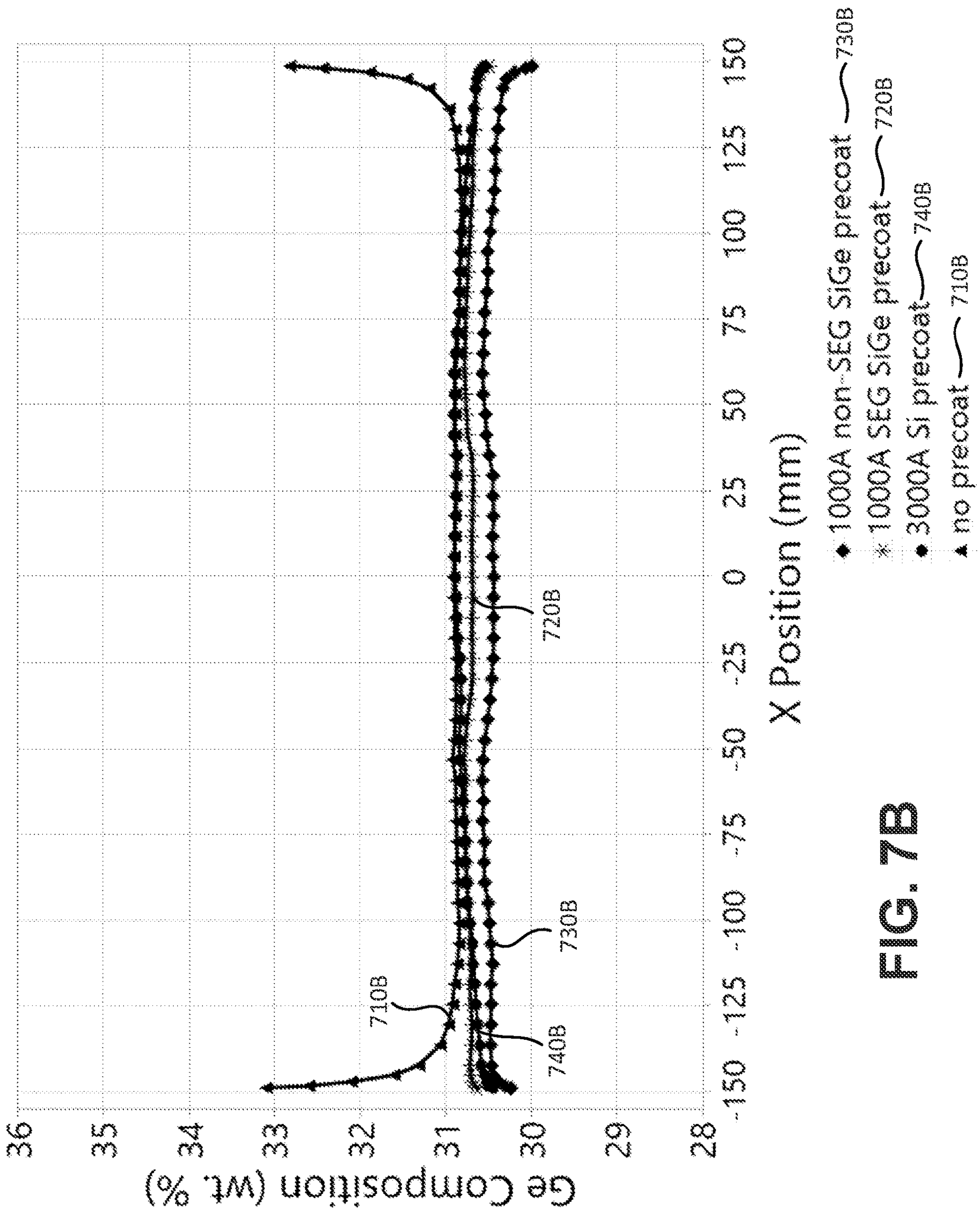

FIG. 7B illustrates a composition profile of silicon germanium layers formed using methods in accordance with at least one embodiment of the disclosure.

Figure 8A:
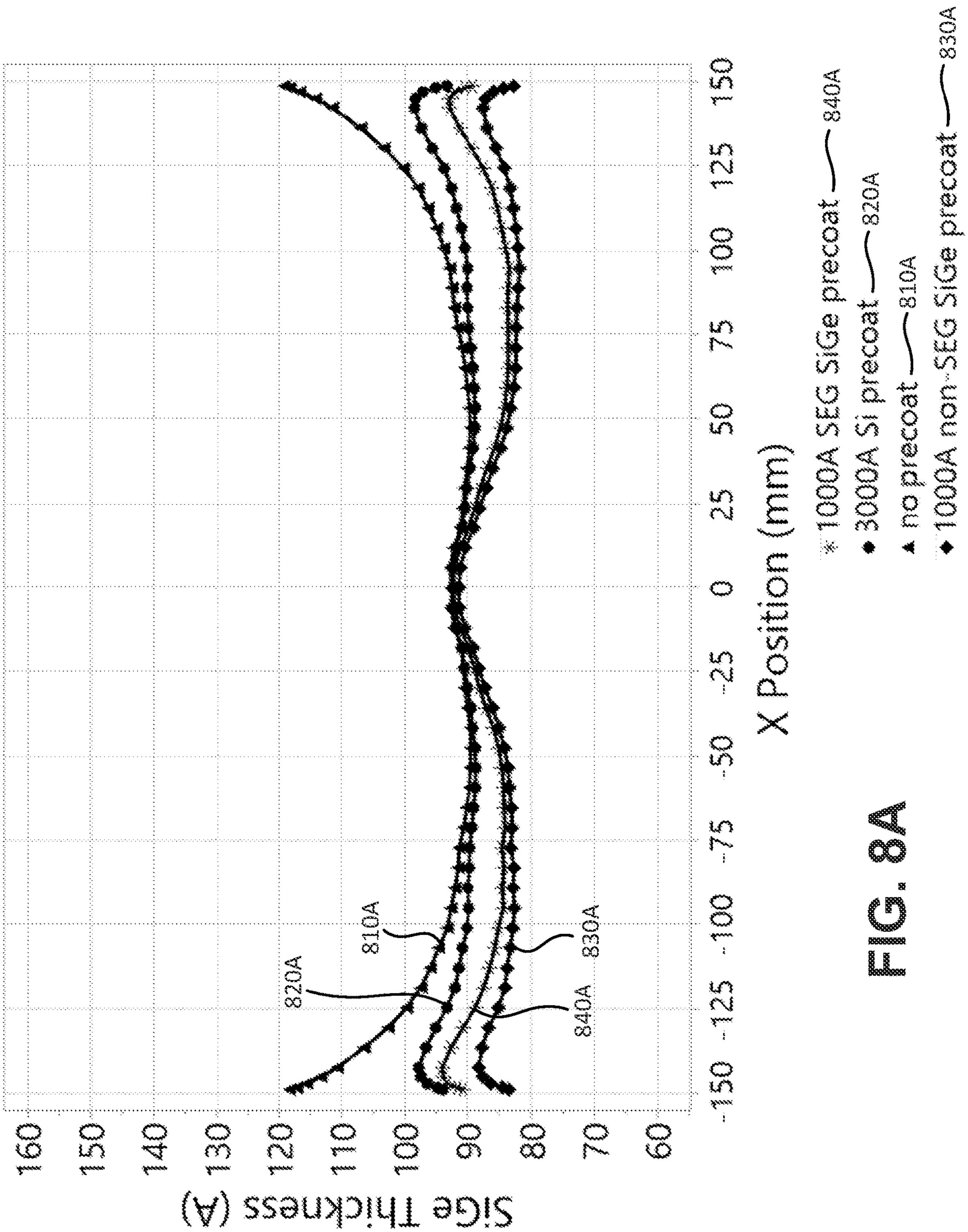

FIG. 8A illustrates a thickness profile of silicon germanium layers formed using methods in accordance with at least one embodiment of the disclosure.

Figure 8B:
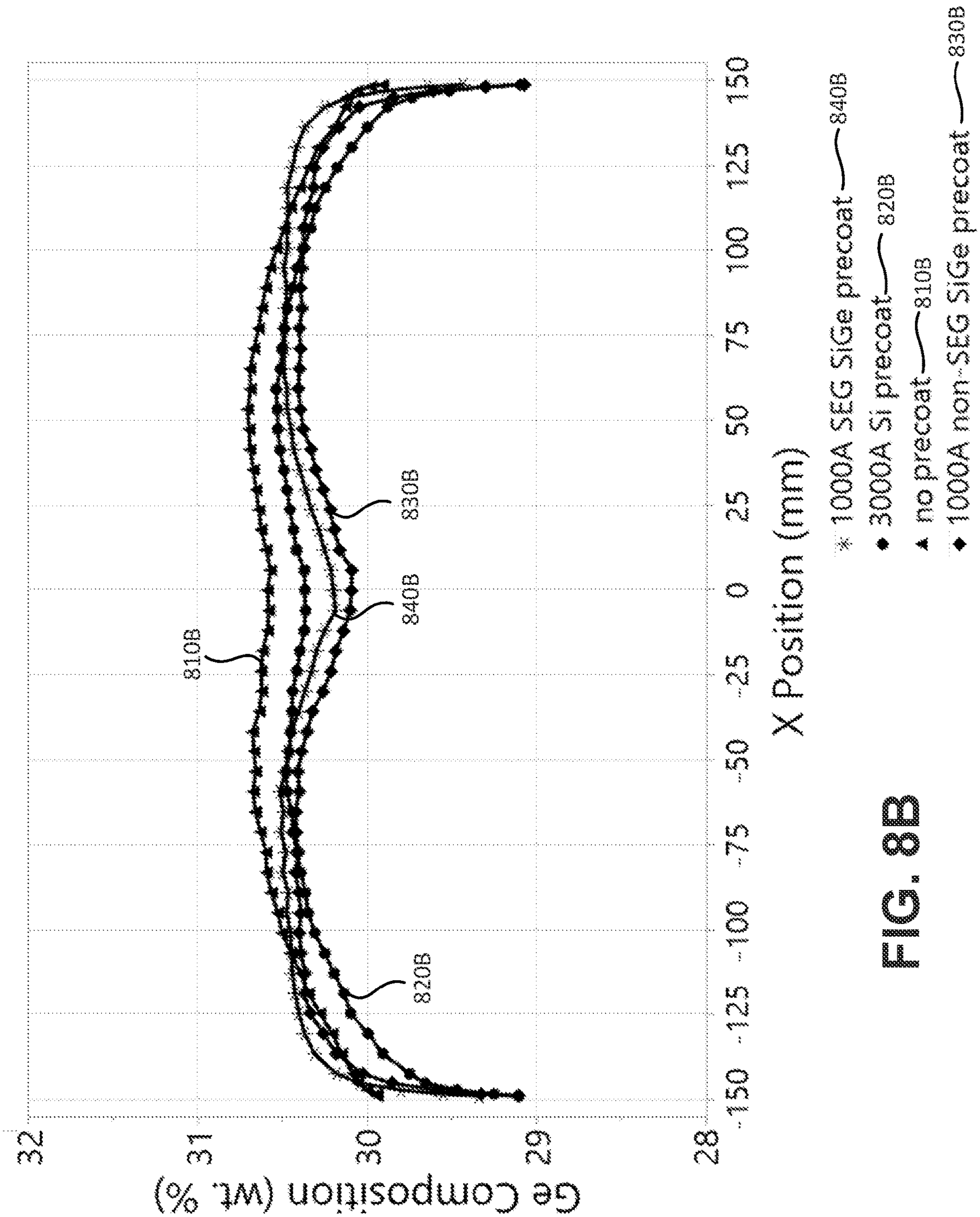

FIG. 8B illustrates a composition profile of silicon germanium layers formed using methods in accordance with at least one embodiment of the disclosure.

Figure 9A:
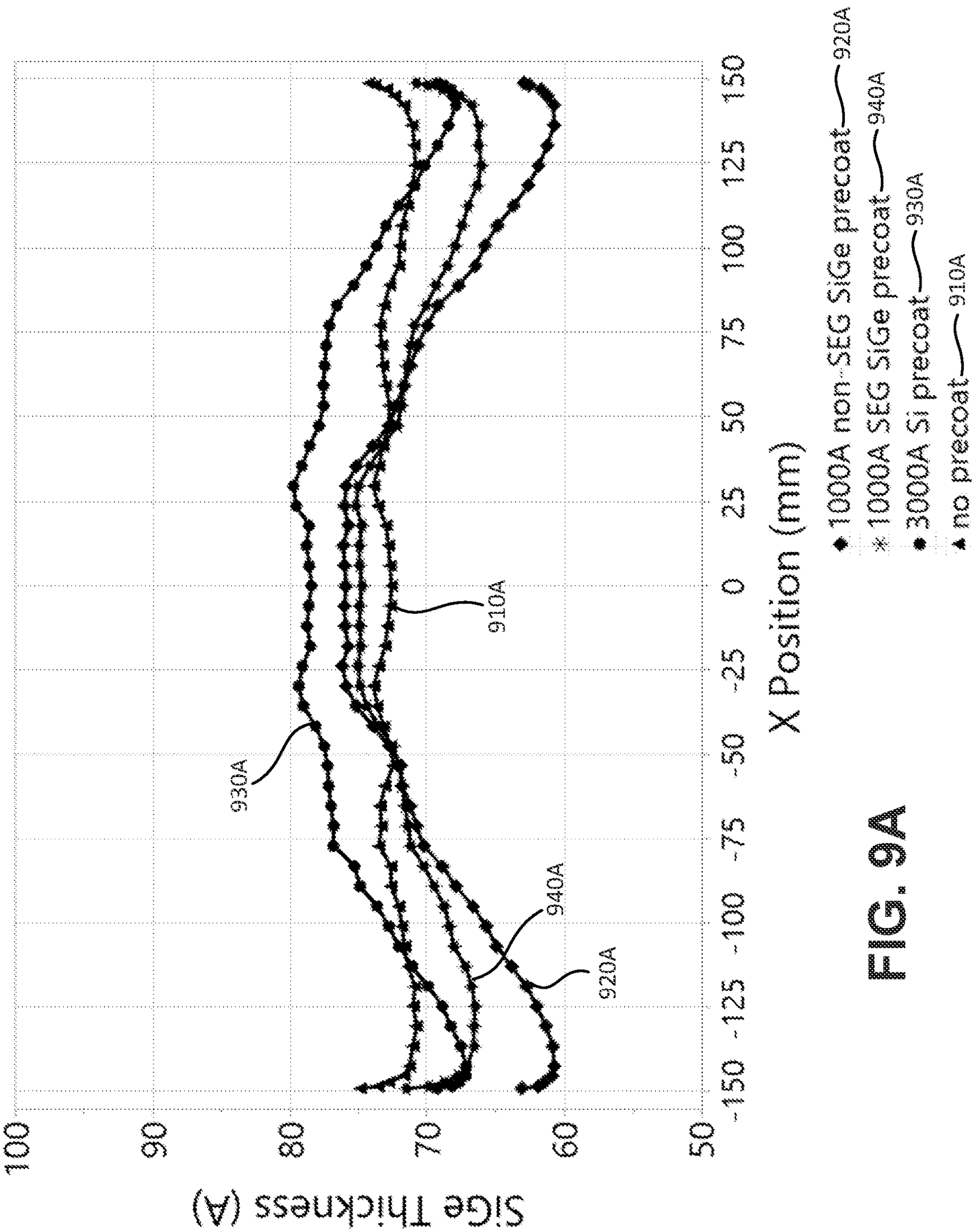

FIG. 9A illustrates a thickness profile of silicon germanium layers formed using methods in accordance with at least one embodiment of the disclosure.

Figure 9B:
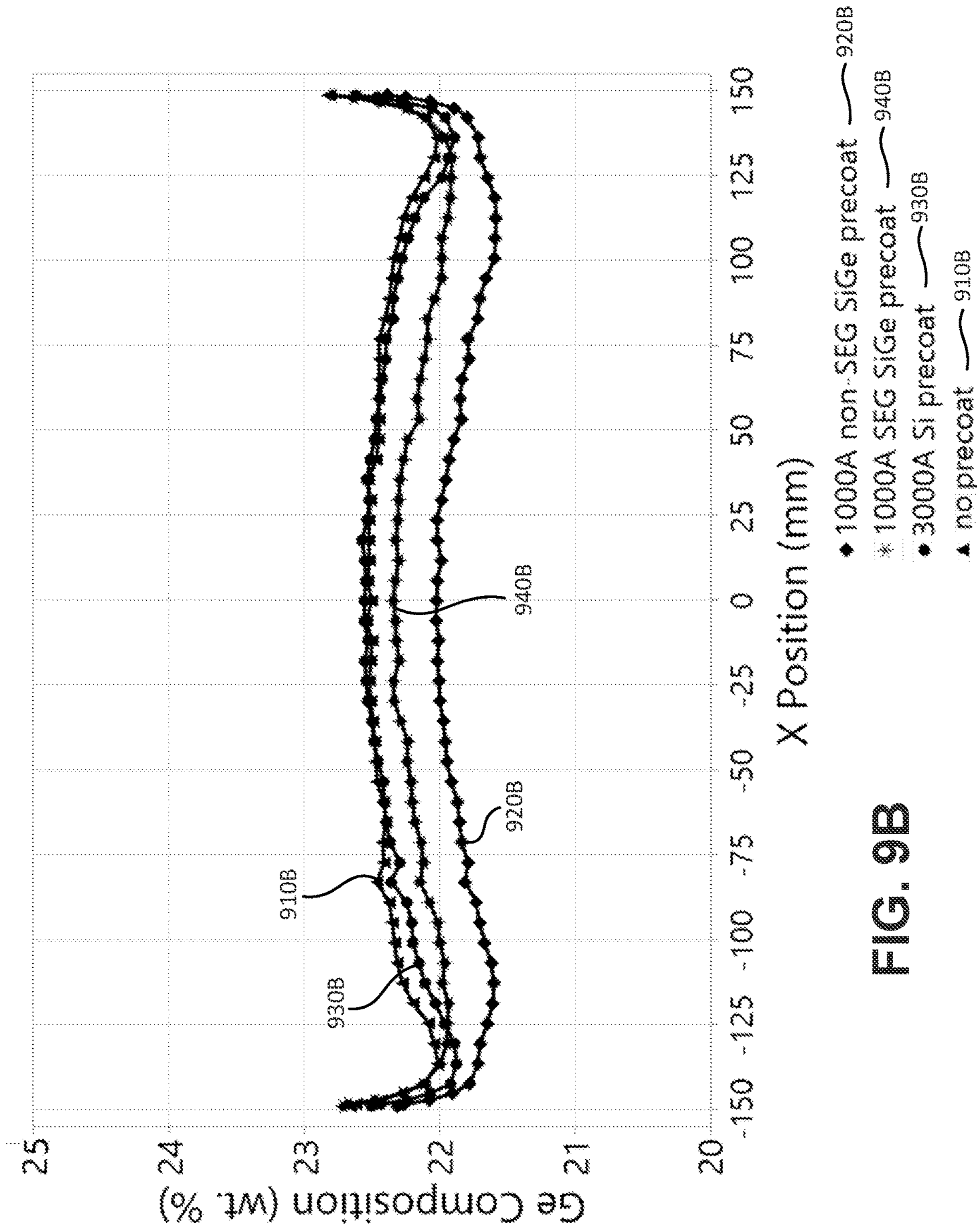

FIG. 9B illustrates a composition profile of silicon germanium layers formed using methods in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to methods and systems of forming a silicon germanium layer (i.e., a film) on a surface of a substrate and to structures and devices including such layers. Exemplary methods and systems can be used to form the silicon germanium layer with relatively low variation of film thickness and/or composition across the layer, even near the edge (e.g., within 1 mm of the edge) of a substrate, such as a wafer, compared to traditional techniques for forming such layers.

Examples described herein can be used to form or grow epitaxial (e.g., two-component and/or additionally doped) silicon germanium layers on a surface of a substrate. Exemplary methods described herein may be particularly useful in forming films having relatively high germanium concentrations (e.g., greater than about 30 percent, about 20 percent or about 10 percent) and/or in applications in which variation of germanium concentration of the silicon germanium layer is desirably low.

As used herein, the terms precursor and/or reactant can refer to one or more gases/vapors that take part in a chemical reaction or from which a gas-phase substance that takes part in a reaction is derived. The chemical reaction can take place in the gas phase and/or between a gas phase and a surface of a substrate and/or a species on a surface of a substrate.

In this disclosure, the term gas can refer to material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, such as a multi-port injection system, or the like, can be used for, e.g., sealing the reaction space, and can include a seal gas, such as a rare gas. In some cases, the term precursor can refer to a compound that participates in the chemical reaction that produces another compound. The term inert gas can refer to a gas that does not take part in a chemical reaction and/or does not become a part of a film to an appreciable extent. Exemplary inert (e.g., carrier or purge) gases include He, Ar, $H_2$, $N_2$, and any combination thereof.

As used herein, the term substrate can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as a Group II-VI or Group III-V semiconductor, and can include one or more layers overlying or underlying the bulk material. Further, the substrate can include various features, such as recesses, protrusions, and the like formed within or on at least a portion of a layer or surface of the substrate.

As used herein, the term epitaxial layer can refer to a substantially single crystalline layer upon an underlying substantially single crystalline substrate or layer.

As used herein, the term chemical vapor deposition can refer to any process wherein a substrate is exposed to one or more gas-phase precursors, which react and/or decompose on a substrate surface to produce a desired deposition.

As used herein, the terms film and/or layer can refer to any continuous or non-continuous structures and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, the term structure can refer to a substrate as described herein, and/or a substrate including one or more layers overlying the substrate, such as one or more layers formed according to a method as described herein.

As used herein, the term silicon germanium layer can refer to a layer that includes silicon and germanium. In some cases, the layer can consist essentially of silicon and germanium. In some cases, the silicon germanium layer can include additional dopants, such as p-type dopants and/or n-type dopants. In accordance with various examples of the disclosure, a composition of a silicon germanium layer can be represented as $Si_{1-x}Ge_x$ wherein $1 \geq x \geq 0$, or $0.8 \leq x \leq 0.1$, or $0.6 \leq x \leq 0.2$, or materials comprising silicon and germanium having compositions as set forth herein.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Figure 1:
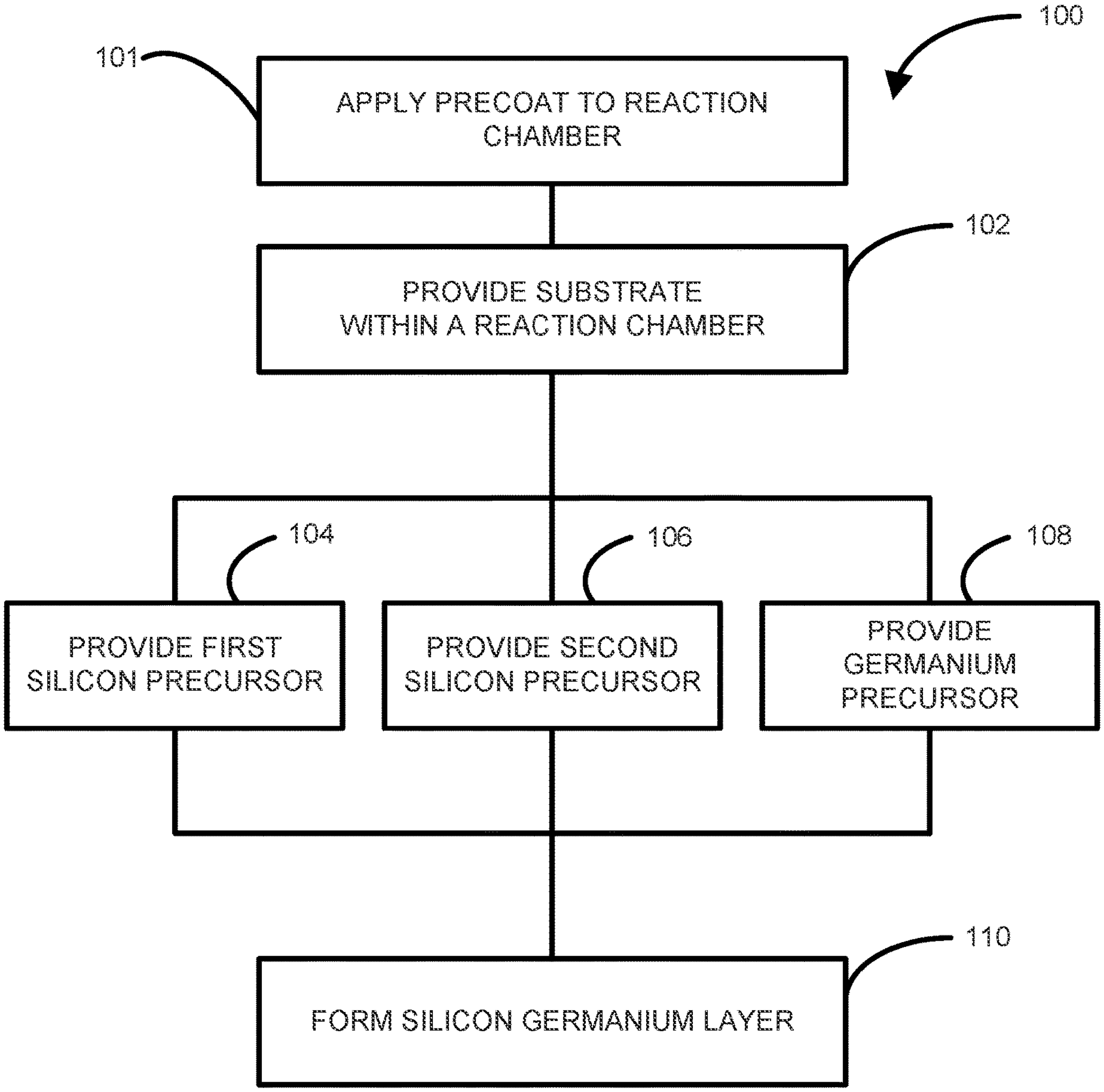
FIG. 1 illustrates a method in accordance with at least one exemplary embodiment of the present disclosure.

Turning now to the figures, FIG. 1 illustrates a method 100 in accordance with examples of the disclosure. Method 100 includes the steps of providing a substrate within a reaction chamber (step 102), providing a first silicon precursor to the reaction chamber (step 104), providing a second silicon precursor to the reaction chamber (step 106), providing a germanium precursor to the reaction chamber (step 108), and forming the silicon germanium layer (step 110). In various embodiments, method 100 may further comprising precoating the reaction chamber (step 101). The precoat, as discussed in further detail herein, may be applied to the reaction chamber such that any or all surfaces within the reaction chamber (and surfaces of any components within the reaction chamber, such as susceptor 216, thermocouple ring 217, and/or getter plate 219) receives a precoat disposed thereon. The precoat may be applied before or after a substrate is disposed or provided in the reaction chamber.

During step 102, a substrate is provided within a reaction chamber. As a non-limiting example, the reaction chamber used during step 102 may comprise a reaction chamber of a chemical vapor deposition (e.g., epitaxial) system. However, it is also contemplated that other reaction chambers and alternative chemical vapor deposition systems may also be utilized to perform the embodiments of the present disclosure. The reaction chamber can be a stand-alone reaction chamber or part of a cluster tool.

Step 102 can include heating the substrate to a desired deposition temperature within the reaction chamber. In some embodiments of the disclosure, step 102 includes heating the substrate to a temperature of less than approximately 1100° C., or to a temperature of less than approximately 850° C., or to a temperature of less than approximately 700° C., or to a temperature of less than approximately 650° C., or to a temperature of less than approximately 600° C., or to a temperature of less than approximately 550° C., or to a temperature of less than approximately 500° C., or to a temperature of less than approximately 450° C., or to a temperature of less than approximately 400° C., or even to a temperature of less than approximately 300° C. For example, in some embodiments of the disclosure, heating the substrate to a deposition temperature may comprise heating the substrate to a temperature between approximately 400° C. and approximately 1100° C. or approximately 400° C. and approximately 700° C.

In addition to controlling the temperature of the substrate, a pressure within the reaction chamber may also be regulated. For example, in some embodiments of the disclosure, the pressure within the reaction chamber during step 102 may be less than 760 Torr, or less than 350 Torr, or less than 100 Torr, or less than 50 Torr, or less than 25 Torr, or less than 10 Torr, or even less than 5 Torr. In some embodiments, the pressure in the reaction chamber may be between 5 Torr and 760 Torr, between 10 Torr and 200 Torr, or between 10 Torr and 100 Torr. A temperature and/or pressure for steps 104-110 can be the same or similar to the temperature and/or pressure of step 102.

During steps 104-108, precursors are flowed to the reaction chamber. In accordance with examples of the disclosure, steps 104-108 overlap in time, and can substantially overlap, such that steps 104, 106, and 108 each start at about the same time and each end at about the same time. In various embodiments, steps 104-108 may occur at different times (e.g., sequentially).

During step 104, the first silicon precursor is provided to the reaction chamber. Exemplary silicon precursors suitable for use as the first silicon precursor include a halogenated silicon precursor. In this context, a halogenated silicon precursor includes a silicon precursor that includes a halogen, such as one or more of fluorine, chlorine, bromine, and iodine. Exemplary halogenated silicon precursors can be represented by a formula $Si_xW_yH_z$, wherein W is a halide selected from the group consisting of fluorine, chlorine, bromine, and iodine, x and y are integers greater than zero, and z is an integer greater than or equal to zero. Halogenated silicon precursors can include a single species of halogens, such as of fluorine, chlorine, bromine, or iodine (e.g., chlorine), or can include two or more different species of halogens, such as chlorine and bromine, or the like. By way of particular examples, the halogenated silicon precursor can include the halogenated silicon precursor comprising a compound selected from the group consisting of trichlorosilane, dichlorosilane, silicon tetrachloride, a silicon bromide, a silicon iodide, or the like. In accordance with examples of the disclosure, the halogenated silicon precursor does not contain fluorine.

A flowrate of the first silicon precursor to the reaction chamber during step 104 can range from about 100 to about 1500 sccm, about 100 to about 1000, about 100 to about 300, about 10 to about 100 sccm, or 1 to about 10 sccm, alone or with a carrier gas, such as hydrogen or helium.

During step 106, the second silicon precursor is provided to the reaction chamber. The second silicon precursor can include a nonhalogenated silicon precursor. In this context, a nonhalogenated silicon precursor is a silicon precursor that does not include a halogen. Exemplary nonhalogenated silicon precursors can include, for example, a compound that includes, or in some cases consists essentially of, silicon and hydrogen. In some cases, the second silicon precursor comprises a silane, such as silane, disilane, trisilane, or the like. Silanes can be represented by the general formula $Si_nH_{2n+2}$, wherein n is an integer.

A flowrate of the second silicon precursor to the reaction chamber during step 106 can range from about 100 to about 1500 sccm, about 100 to about 1000, about 100 to about 300, about 10 to about 100 sccm, or 1 to about 10 sccm, alone or with a carrier gas, such as hydrogen or helium.

During step 108, the germanium precursor is provided to the reaction chamber. The germanium precursor can include a nonhalogenated, or in some cases can include a halogenated germanium precursor. In this context, halogenated germanium precursors include one or more halogens (of like or different species) and nonhalogenated germanium precursors do not include a halogen. Exemplary nonhalogenated germanium precursors can include, for example, a compound that includes, or in some cases consists essentially of, germanium and hydrogen. In some cases, the germanium precursor can be or include a germane, such as germane, digermane, trigermane or the like. Germanes can be represented by the general formula $Ge_nH_{2n+2}$, wherein n is an integer. Exemplary halogenated germanium precursors include one or more of germanium tetrachloride, germanium chlorohydride, germanium chlorobromide, or the like.

A flowrate of the germanium precursor to the reaction chamber during step 108 can range from about 100 to about 1000 sccm, about 10 to about 100 sccm, or 1 to about 10 sccm, alone or with a carrier gas, such as hydrogen or helium.

A volumetric amount of the first silicon precursor, the second silicon precursor, and/or the germanium precursor can be manipulated to obtain desired layer properties (e.g., composition and/or thickness uniformity). By way of examples, a volumetric flow can include about 10 to about 90, about 1 to about 10, or about 0.1 to about 1 volumetric percent first silicon precursor, about 10 to about 90, about 1 to about 10, or about 0.1 to about 1 volumetric percent second silicon precursor, and/or about 10 to about 90, about 1 to about 10, or about 0.1 to about 1 volumetric percent germanium precursor.

In accordance with further examples of the disclosure, method 100 can include a step of mixing two or more of the first silicon precursor, the second silicon precursor, and the germanium precursor prior to the precursors entering the reaction chamber. For example, the first silicon precursor and the germanium precursor can be mixed to form a mixture prior to flowing the mixture into the reaction chamber. Further, as set forth in more detail below, flowrates of the mixture and/or individual precursors can be controlled into various channels of a gas injection system. This allows further tuning of desired precursor flowrates to particular areas within the reaction chamber, which in turn, allows for additional control of silicon germanium layer properties, such as thickness and/or composition.

During step 110, silicon germanium layer is formed on a surface of the substrate. Although illustrated as a separate step, step 110 can occur as steps 104-108 begin. During step 110, the silicon germanium layer can be epitaxially formed—e.g., overlying a silicon or another silicon germanium or other layer.

In various embodiments, a precoating may be applied to the reaction chamber (step 101) to form a precoat layer (i.e., a seasoning layer) prior to the substrate being processed with the precursors discussed in steps 104-108. The precoat may be applied to the reaction chamber before the substrate is provided therein. The precoat may be applied to any or all surfaces within the reaction chamber. For example, the substrate support surface of a susceptor may receive a precoat layer, as well as the thermocouple ring surrounding the susceptor, the reaction chamber inner walls, and/or a getter plate. In various embodiments, a sacrificial substrate may be disposed on the susceptor before the precoat is applied, and removed after precoating (to be replaced by a substrate for deposition processing). Therefore, in various embodiments, a precoating may be applied to only the portion of the substrate support surface that extends beyond the surface occupied by the substrate (i.e., a rim of the susceptor).

In various embodiments, a precoat layer (or reactants to form a precoat layer) may comprise any suitable composition. For example, in preparation for processing involving silicon germanium deposition on a substrate, the precoat layer (or the reactants therefor) may comprise silicon germanium and/or polycrystalline silicon. In various embodiments, the precoat layer may comprise a compound or substance comprised in at least one of the reactants of a deposition process, or comprised in the resulting deposited material on a substrate. For example, as discussed above, for a silicon germanium deposition process, the precoat layer (or the reactants to form the precoat layer) may comprise silicon and/or germanium, or compounds comprising one or both (for a silicon germanium precoat layer, the germanium concentration may be between 5% and 90% by weight germanium). As another example, for a deposition process to deposit a silicon phosphorus layer on a substrate, the precoat layer (or the reactants to form the precoat layer) may comprise silicon and/or phosphorus, or compounds comprising one or both. In various embodiments, a precoat layer (or the reactants to form the precoat layer) may comprise boron, phosphorus, arsenic, and/or the like, and/or compounds comprising any of the foregoing, depending on the deposition process following the precoat.

The precoating (i.e., the compounds used to form the precoat layer) may be applied to the reaction chamber in any suitable manner. For example, the precoating may be applied to the reaction chamber in a similar manner to the precursors discussed herein to form a silicon germanium film (or in a different manner). The compounds in the precoating may be one or more of the compounds comprised in the first silicon precursor, the second silicon precursor, and/or the germanium precursor, as discussed herein. The precoating may be applied to the reaction chamber for deposition on surfaces therein (including on any surfaces of components within the reaction chamber) in any suitable manner, including spraying, brushing, ALD, CVD, or the like. Based on the desired thickness of the precoating layer, conditions during the precoat deposition (e.g., temperature, pressure, etc.) may be varied to achieve faster or slower deposition of the precoat layer. For example, an environment within the reaction chamber may comprise an elevated temperature and/or pressure during precoat deposition to achieve faster deposition and/or a thicker precoat layer. As another example, an environment within the reaction chamber may comprise a relatively lower temperature and/or pressure during precoat deposition to achieve slower deposition and/or a thinner precoat layer. In various embodiments, the temperature during precoating deposition may be between a range of 400° C. to 1250° C. The pressuring during precoating deposition may be between a range of 2 Torr to 760 Torr. The flow rate of a precursor for precoat deposition (e.g., a silicon and/or germanium precursor) may comprise 5 sccm to 5000 sccm, again depending on the desired thickness of the precoat. The substrate may be heated after the precoating is applied thereto to form the precoat layer. The precoat layer may comprise any suitable thickness, such as between 20 Angstroms and 30 micrometers, between 20 Angstroms and 20 micrometers, between 1000 and 3000 Angstroms, or about 1000 Angstroms, or about 3000 Angstroms (the term "about" in this context means plus or minus ten percent of the subject value). In various embodiments, the thickness of the precoat may be less than, equal to, or greater than the desired thickness of the layer to be deposited on a substrate. The thickness of the precoat layer may depend on the desired effect of the precoat layer on the deposition of the film on a substrate (e.g., the desired effect on a silicon germanium layer deposited on a substrate, as discussed herein).

The precoat layer may improve the consistency or uniformity of the film thickness and/or germanium composition of the silicon germanium layer disposed on, and across, the substrate, including proximate the substrates edge(s) (e.g., as close as 1.2 millimeters (mm) or 1.0 mm, or even closer, from a substrate edge). Without being bound by theory, application of a precoat to surfaces within a reaction chamber may adjust the emissivity of such surfaces. Thus, the emissivity of surfaces surrounding the susceptor and/or substrate being processed within a reaction chamber may be adjusted by applying a precoat layer. Accordingly, the thermal radiation emission (e.g., infrared radiation) from the surfaces surrounding the substrate (e.g., on the susceptor, thermocouple ring, or the like) may be adjusted by precoat application. This change in the emissivity of surfaces surrounding the substrate being processed may change the temperature around different portions of the substrate, thus changing the deposition occurring at such portions of the substrate. For example, if the deposition of a film on a substrate is greater than desired in a certain substrate portion, a precoat may be applied to the surfaces of the reaction chamber to decrease the emissivity of surfaces proximate to such a substrate portion (or to all surfaces), thus lowering the temperature proximate to such substrate portion during processing. The decreased temperature (from decreased emitted thermal radiation) may slow deposition on that substrate portion relative to reaction chamber surfaces without a precoat layer. Likewise, to increase deposition on a certain substrate portion, a precoat may be applied to surfaces of the reaction chamber proximate to such substrate portion (or all surfaces) to increase the emissivity of those surfaces. Thus, the increased thermal radiation will increase the temperature proximate the substrate portion, increasing film deposition thereon during processing. Accordingly, the ability to add a precoat allows the adjustment of reaction conditions (e.g., temperature) at specific portions within a reaction chamber. Additionally, the amount of emissivity change of a surface can be adjusted to a desired level by the amount of precoat applied to the surface (e.g., by adjusting the thickness of the precoat layer, the precoat compositional makeup, and/or the concentration of one or more materials therein), or by using precoatings comprising different materials or compounds.

The precoat layer may further affect processing conditions because mass transfer between the precoat layer and the precursor flow and film deposition may occur. Therefore, to add more of one substance in a deposition process, a precoat may be applied to the reaction chamber comprising such substance. In various embodiments, as discussed above, a precoat may comprise one or more compounds or substances comprised in at least one of the reactants of a deposition process, or comprised in the resulting deposited material on a substrate, because then mass transfer from the precoat will not add unwanted compounds or contaminants into the deposited film or processing environment.

By utilizing a precoat layer, as discussed herein, the benefits of increased film uniformity (thickness and/or concentration) across a substrate may be achieved without need to change the compounds (e.g., precursors), temperature, pressure, flow rate, or other aspects of a process or recipe used to form a silicon germanium layer (or other film) on a substrate. That is, rather than adjusting the recipe for depositing a desired film on a substrate (i.e., the main deposition process) to change the deposition thereof (to increase uniformity), the precoat may be applied to the reaction chamber separately from the main deposition process, leaving the main deposition process unchanged. Therefore, better film/layer uniformity across a substrate may be achieved without having to adjust pre-established deposition processes or recipes.

These benefits of increased film uniformity, especially at the substrate edges, provide great value, for example, within the semiconductor industry. As electronic devices get smaller and smaller, die yield of the film deposited on a substrate has become more important. Relative uniformity of the deposited film is desired or required to produce sufficiently effective dies. Therefore, achieving greater uniformity of the film deposited on the substrate (e.g., the silicon germanium layer) allows greater die yield from the edges of the substrate film.

Figure 2:
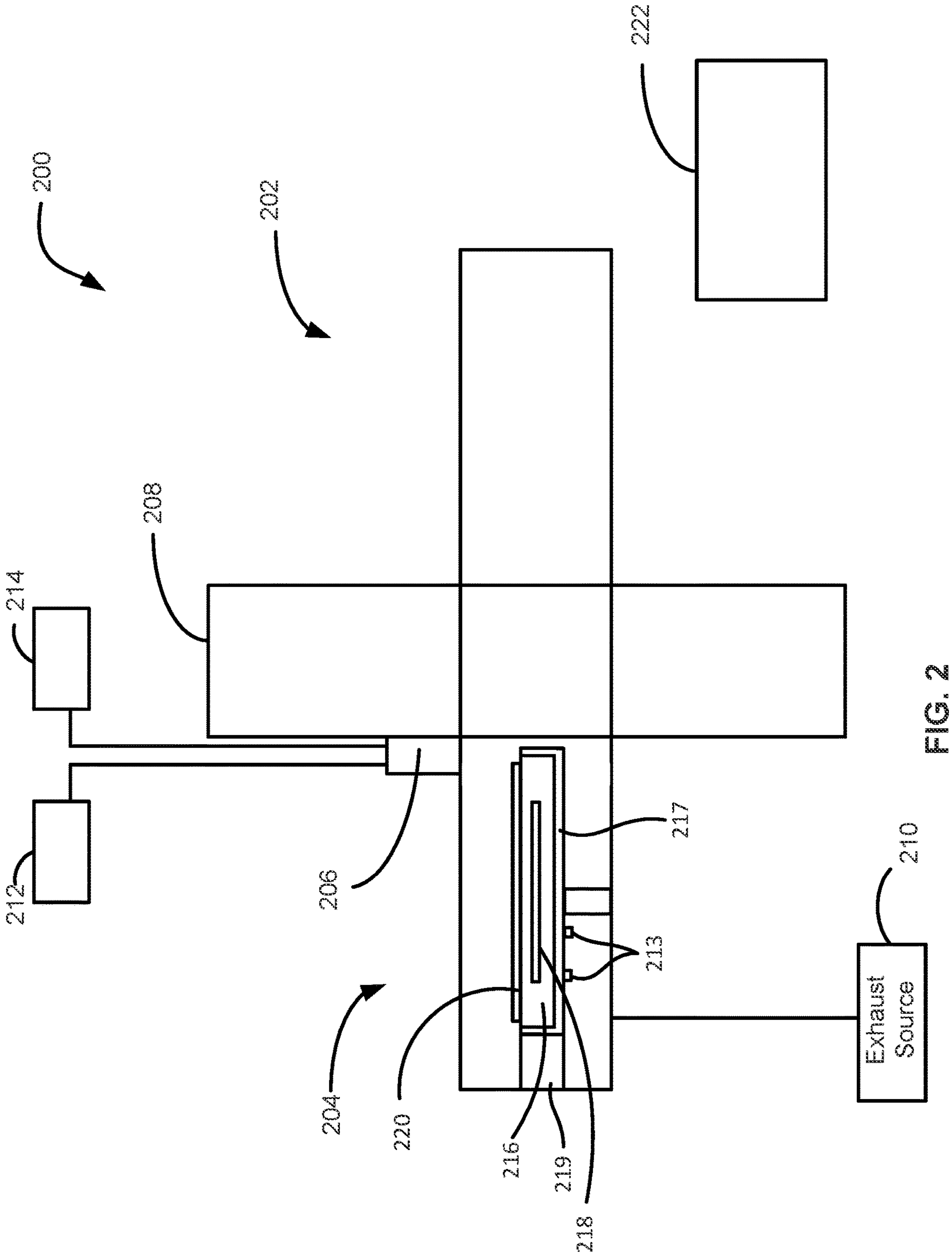
FIG. 2 illustrates a system in accordance with at least one exemplary embodiment of the present disclosure.

FIG. 2 illustrates an exemplary reactor system 200. Reactor system 200 can be used for a variety of applications, such as, for example, chemical vapor deposition (CVD) and the like. Although exemplary embodiments are described below in connection with epitaxial reactor systems, embodiments and the disclosure are not so limited, unless stated otherwise.

In the illustrated example, reactor system 200 includes an optional substrate handling system 202, a reaction chamber 204, a gas injection system 206, and optionally a wall 208 disposed between reaction chamber 204 and substrate handling system 202. System 200 can also include a first gas source 212, a second gas source 214, an exhaust source 210, a susceptor or substrate support 216, a thermocouple ring 217, and/or a getter plate 219. Although illustrated with two gas sources 212, 214, reactor system 200 can include any suitable number of gas sources. Further, reactor system 200 can include any suitable number of reaction chambers 204, which can each be coupled to a gas injection system 206. In the case in which reactor system 200 includes multiple reaction chambers, each gas injection system can be coupled to the same gas sources 212, 214 or to different gas sources.

Gas sources 212, 214 can include, for example, various combinations of one or more precursors, one or more dopant sources, one or more etchants, and mixtures of gases, including mixtures of one or more precursors, dopant sources, and/or etchants with one or more carrier gases.

By way of examples, first gas source 212 can include a first silicon precursor. In some cases, first gas source 212 can include a dopant and/or a carrier gas. Second gas source 214 can include the second silicon precursor or a mixture of the second silicon precursor and the germanium precursor. The first and second silicon precursors and the germanium precursor can be as described above.

Exemplary dopant sources include gases that include one or more of As, P, C, Ge, and B. By way of examples, the dopant source can include germane, diborane, phosphine, arsine, or phosphorus trichloride. The reactor systems and methods described herein may be particularly useful in forming p-type doped films, such as p-type doped films comprising silicon, silicon germanium, or the like.

Carrier gases can be or include one or more inert gases and/or hydrogen. Exemplary carrier gases include one or more gases selected from the group consisting of hydrogen, nitrogen, argon, helium, or the like.

Reactor system 200 can include any suitable number of reaction chambers 204 and substrate handling systems 202.

Reaction chamber 204 of reactor system 200 can be or include, for example, a cross flow, cold wall epitaxial reaction chamber.

Susceptor 216 may comprise a substrate support surface upon which the substrate 220 rests for deposition processing. The substrate support surface may comprise a surface area that is equal to or larger than the size (or surface area) of the substrate. In embodiments in which the substrate support surface is larger than the substrate 220, a rim of susceptor 216 may protrude outside the surface area occupied by substrate 220 when substrate 220 is disposed on susceptor 216 (as shown in FIG. 2). Susceptor or substrate support 216 can include one or more heaters 218 to heat a substrate 220—e.g., to a temperature of about 500 to about 600, about 600 to about 700, or about 700 to about 800 degrees Celsius or other temperatures noted herein. Susceptor or substrate support 216 can also be configured to rotate during processing. In accordance with examples of the disclosure, susceptor or substrate support 216 rotates at a speed of about 90 to about 60, about 60 to about 30, about 30 to about 15, or about 15 to about 5 rotations per minute.

Thermocouple ring 217 may comprise an opening or cavity in which susceptor 216 may be disposed. Thermocouple ring 217 may surround susceptor 216, such that the thermocouple ring 217 and/or its opening or cavity is concentric with susceptor 216. In embodiments in which susceptor 216 is configured to rotate during processing, thermocouple ring 217 may remain static. Thermocouple ring 217 comprise one or more thermocouples 213 coupled thereto and/or disposed therein. Thermocouples may be disposed on or within thermocouple ring 217 in any suitable position. Thermocouple ring 217 may be configured to be heated or cooled (e.g., by thermocouples 213) to provide temperature control of susceptor 216 and/or substrate 220 to achieve desired thermal reaction conditions during deposition processing.

Getter plate 219 may attract unused reactants during processing, thus lowering deposition on other surfaces within reaction chamber 204. Getter plate may also play a role in temperature modulation within reaction chamber 204 during processing.

During operation of reactor system 200, substrates 220, such as semiconductor wafers, are transferred from, e.g., substrate handling system 202, to reaction chamber 204. Once substrate(s) 220 are transferred to reaction chamber 204, one or more gases from first and second gas sources 212, 214, such as precursors, dopants, carrier gases, etchants, and/or purge gases, are introduced into reaction chamber 204 via gas injection system 206. As set forth in more detail below, gas injection system 206 can be used to meter and control gas flow of one or more gases from first gas source 212 and second gas source 214 during substrate processing and to provide desired flows of such gas(es) to multiple sites or channels within reaction chamber 204.

System 200 can also include a controller 222. Controller 222 can be configured to control gas flow of a first silicon precursor, a second silicon precursor, and a germanium precursor (e.g., from one or more of first gas source 212 and second gas source 214) into at least one of the one or more reaction chambers 204 to form a layer comprising silicon germanium overlying a surface of a substrate using a deposition process (e.g., method 100, described above). As noted below, controller 222 can also be used to control a flow of one or more gasses into one or more channels of a gas injection system.

FIG. 3 schematically illustrates a gas injection system 300, suitable for use as gas injection system 206, in accordance with exemplary embodiments of the disclosure. Gas injection system 300 includes a first gas supply line 302 coupled to a first gas source 303, which can be the same or similar to gas source 212, and a second gas supply line 304 coupled to a second gas source 305, which can be the same or similar to gas source 214. When referring to gas lines and fluid components of gas injection system 300, the term coupled refers to fluidly coupled, and, unless stated otherwise, the lines or components need not be directly fluidly coupled, but rather gas injection system 300 can include other intervening elements, such as connectors, valves, meters, or the like.

Gas injection system 300 includes a first gas manifold 306 coupled to first gas supply line 302 via a first gas inlet 315 and a second gas manifold 308 coupled to second gas supply line 304 via a second gas inlet 317. First gas manifold 306 includes a plurality of first gas outlets 310-318. Similarly, second gas manifold 308 includes a plurality of second gas outlets 320-328. First gas manifold 306 and second gas manifold 308 are configured to receive gas from one or more gas lines (e.g., first and second gas lines 302, 304) and distribute the gas into one or more channels, which are respectively defined, in part, by first gas outlets 310-318 and second gas outlets 320-328. In the illustrated example, each of the first and second gas streams from first gas source 303 and second gas source 305 is divided into five gas channels. Although illustrated with five of each of first gas outlets 310-318 and second gas outlets 320-328, gas injection systems in accordance with this disclosure can include any suitable number of first, second, and/or other gas outlets, corresponding to a number of channels for the respective gases. For example, exemplary systems can include, for example, about 1-10 channels or include 5, 6, 7, 9, or more channels for each gas. As illustrated, first gas manifold 306 and/or second gas manifold 308 can include a loop configuration to facilitate even flow distribution through the gas channels. Additionally or alternatively, first gas manifold 306 and/or second gas manifold 308 can have a relatively large diameter relative to gas lines 302, 304—e.g., the diameter of first gas manifold 306 and/or second gas manifold 308 can be greater than 2, 3, 4, or 5 times larger than the diameter of line 302 and/or line 304. In the illustrated examples, first gas channels and second gas channels are alternatingly adjacent each other. However, this need not be the case.

As noted above, first gas source 303 and/or second gas source 305 can be a mixture of two or more gases. In such cases, one or more gases, which may, in turn, include a mixture of gases—or not, can be supplied from other sources (e.g., sources 301, 319, 321, 323), to first gas source 303 and/or second gas source 305 via flow controllers 307-313. When the source gases upstream of flow controllers 307-313 are not mixtures of gases, flow controllers 307-309 can suitably be mass flow controllers. One or more of flow controllers 307-313 can control a flow rate of a carrier gas to first gas source 303 and/or second gas source 305.

Gas injection system 300 additionally includes a plurality of flow sensors 330-348 coupled to first and second gas outlets 310-328. In the illustrated example, each first and second gas outlets 310-328 is coupled to a single flow sensor 330-348. However, in some cases, it may be desirable to have some gas outlets that are not coupled to a flow sensor and/or to have some gas outlets that are coupled to more than one flow sensor.

Flow sensors 330-348 can be used to monitor flow rates of gas mixtures and to provide real-time and/or historical flow rate information to a user for each channel—e.g., using a graphical user interface. Additionally or alternatively, flow sensors 330-348 can be coupled to a controller (e.g., controller 394, which can be the same or different from controller 222) and to gas valves 350-368 to provide controlled flow ratio of the gases through gas valves 350-368. By placing at least one flow sensor 330-348 in each gas channel, the flow ratio (e.g., relative flow rate) of gas through each channel can be measured and controlled, regardless of the gas composition. Exemplary flow sensors 330-348 can be or include various flow sensors, e.g., thermal mass flow sensors, pressure drop based flow sensors, or the like.

Gas valves 350-368 can include any suitable device to meter flow of a gas. In accordance with various embodiments of the disclosure, gas valves 350-368 each comprise proportional valves, such as solenoid valves, pneumatic valves, or piezoelectric valves. A valve with a relatively high (e.g., 0.021-0.14) flow coefficient (Cv) may be selected to reduce chocking downstream. Gas valves 350-368 may desirably operate under closed-loop control, but may also be capable (e.g., additionally) of operating under open-loop control.

Flow sensors 330-348 and gas valves 350-368 can initially form part of, for example, a mass flow controller (e.g., an off-the-shelf mass flow controller), wherein the control function of the valve is replaced by controller 394. For example, flow meter 330 and gas valve 350 can form or be part of a mass flow controller 370 that is set to operate in open-loop mode and wherein controller 394 provides closed-loop control of valves 350-368. Flow sensors 332-348 and gas valves 352-368 can similarly form or be part of a mass flow controller 372-388. This configuration allows for implementation in standard reactor configurations and/or for use of readily-available mass flow controllers and flow sensors and valves.

Gas valves 350-368 can be coupled to a reaction chamber 390 (which can be the same or similar to reaction chamber 204) via a flange 392. Additional line (e.g., tubing) and suitable connectors can be used to couple gas valves 350-368 to flange 392. Exemplary flange 392 includes flange gas channels to maintain the channels until the respective gases exit into reaction chamber 390; one exemplary flange gas channel 410 is illustrated in FIG. 4. Flange gas channels can include expansion areas 412, 414 and respective outlets 416, 418, which terminate at opposite sides of the flange and adjacent each other. For example, the first gas channels, corresponding to first gas streams, can terminate at a first side 496 of flange 392 and the second gas channels, corresponding to second gas streams, can terminate at a second side 498 of flange 392.

Systems and methods described herein improve the concentration profile components (e.g., silicon and germanium) within a film deposited using the systems and/or methods. In accordance with examples of the disclosure, a non-uniformity of a concentration of a component from center to edge (or a distance of about 1 mm from the edge) of the substrate (formed in a reaction chamber without a precoat layer disposed on the surfaces therein) varied less than 10%, less than 2%, and less than 1%—even with the relatively high concentrations of germanium.

As noted above, in accordance with at least one embodiment of the disclosure, first gas inlet 315 can receive a first gas comprising a first silicon precursor (e.g., halogenated silicon precursor) and optionally an additional dopant source, and second gas inlet 304 can receive a second gas comprising a second silicon precursor (e.g., nonhalogenated silicon precursor) and a germanium precursor.

Turning now to FIG. 5, a structure 500 in accordance with examples of the disclosure is illustrated. Structure 500 includes a substrate 502 and a silicon germanium layer 504. Substrate 502 can be or include a substrate as described herein. Silicon germanium layer 504 can be formed using a method and/or system as described herein. Silicon germanium layer 504 may be used for a variety of applications, including, for example channel, source, and/or drain regions in a MOS or CMOS device, such as, for example, a PMOS device.

As noted above, methods and systems described herein can be used to form silicon germanium layers with improved composition and/or thickness uniformity (less variability). FIG. 6 illustrates data 602 corresponding to a silicon germanium layer formed on a substrate (in a reaction chamber without a precoat layer disposed on the surfaces therein) using a nonhalogenated silicon precursor and a germanium precursor; data 604 corresponding to a silicon germanium layer formed using a halogenated silicon precursor and a germanium precursor; and data 606 corresponding to a silicon germanium layer formed using a halogenated silicon precursor and a nonhalogenated silicon precursor and a germanium precursor (e.g., mixed with the nonhalogenated silicon precursor). As shown, using a plurality of silicon precursors significantly improves edge-to-edge composition uniformity of the silicon germanium layer.

In various embodiments, the presence of a precoat layer on the surfaces within a reaction chamber prior to disposing a silicon germanium layer on a substrate therein may further facilitate improved germanium composition and/or thickness uniformity (or less variability thereof) of a silicon germanium layer on and along a substrate (e.g., edge-to-edge thickness and/or composition uniformity). In various embodiments, such an improvement may be the result of the adjusted emissivities of surfaces within the reaction chamber resulting from such surfaces comprising a precoat layer, as discussed herein. Additionally, the precoat layer may be adjusted (e.g., the layer thickness, concentration of certain components, etc.) to further adjust the deposition results on a substrate.

In various embodiments, nonuniformities of a film disposed on a substrate may be most significant at the edge of the substrate. Therefore, because surfaces proximate the edge of the substrate (e.g., a rim of the susceptor extending past the area occupied by the substrate, the thermocouple ring surrounding the susceptor, and/or the like) comprise a precoat, such surfaces comprise adjusted emissivities, thus adjusting the thermal radiation in such areas, which, in turn, modifies the deposition processing result on the substrate edge (e.g., making the film more uniform in thickness and/or component composition at the substrate edge).

In various embodiments, the presence of a precoat layer on surfaces within a reaction chamber prior to disposing a silicon germanium layer on a substrate therein may result in the concentration of a component (e.g., weight percentage germanium) within the silicon germanium layer varying from center to edge of the substrate (or to a distance of about 1 mm from the edge) less than 1%, less than 0.5%, between 0.2% and 0.5%, or about 0.3%. That is, the presence of a precoat layer on surfaces within a reaction chamber prior to disposing a silicon germanium layer on a substrate therein during a deposition process may result in significantly improved edge-to-edge germanium composition uniformity of the silicon germanium layer.

FIGS. 7A-9B illustrate germanium composition and thickness data for silicon germanium layers formed on a substrate in a reaction chamber having a precoat layer disposed on surfaces within the reaction chamber, in accordance with various embodiments.

FIG. 7A illustrates silicon germanium layer thicknesses (i.e., a thickness profile) across a substrate (e.g., a wafer) (i.e., FIG. 7A illustrates the effects of a precoat layer on a co-flow silicon germanium film thickness profile uniformity). In the thickness profiles described herein, the x-axis represents the position along the substrate, where the zero position is the center of the substrate, and extending in either direction along the x-axis indicates a position toward a respective edge of the substrate. Data sets 710A-740A represent silicon germanium layer thicknesses for silicon germanium layers prepared with a first silicon precursor comprising a halogenated silicon precursor (e.g., dichlorosilane) and a second silicon precursor comprising a nonhalogenated silicon precursor (e.g., silane) (the two silicon precursors being referred to as "co-flow" in FIGS. 7A and 7B), and a germanium precursor, in accordance with various embodiments. As shown by data set 710A (representing a co-flow silicon germanium process without a precoat), the represented silicon germanium layer on a substrate (formed in a reaction chamber without a precoat layer) has a significant increase in thickness toward the edges of the substrate. This creates undesirable variability of the silicon germanium layer along the substrate. Data sets 720A-740A, however, indicate how including a precoat layer on the surfaces within a reaction chamber, in which a silicon germanium layer will be formed on a substrate, improves (i.e., decreases) the thickness variability of the silicon germanium layer on or across the substrate. Data set 720A represents a substrate having a silicon germanium layer deposited thereon (e.g., produced by a co-flow process) within a reaction chamber having a 1000-Angstrom selective epitaxial growth (SEG) precoat layer comprising silicon germanium disposed on surfaces therein (i.e., on the surfaces within the reaction chamber, including on surfaces of components within the reaction chamber such as a susceptor, thermocouple ring, getter plate, and/or the like). Data set 730A represents a substrate having a silicon germanium layer deposited thereon (e.g., produced by a co-flow process) within a reaction chamber having a 1000-Angstrom non-SEG precoat layer comprising silicon germanium disposed on surfaces therein. Data set 740A represents a substrate having a silicon germanium layer deposited thereon (e.g., produced by a co-flow process) within a reaction chamber having a 3000-Angstrom precoat layer comprising silicon (e.g., polycrystalline silicon) disposed on surfaces therein. As data sets 720A-740A indicate, the presence of a precoat layer (whether comprising silicon germanium or silicon) within the reaction chamber in which the silicon germanium layer is deposited greatly reduces the edge roll-up (i.e., the increase in thickness toward the substrate edges), and thus reduces the variability in the silicon germanium layer thickness across the substrate and increases the thickness uniformity, wherein the silicon germanium layer is formed with the two silicon precursors (halogenated and nonhalogenated) and the germanium precursor described above.

FIG. 7B illustrates the germanium composition percentage within silicon germanium layers across a substrate (i.e., FIG. 7B illustrates the effects of a precoat layer on a co-flow silicon germanium film germanium composition profile uniformity). In the germanium percentage profiles described herein, the x-axis represents the position along the substrate, where the zero position is the center of the substrate, and extending in either direction along the x-axis indicates a position toward a respective edge of the substrate. Data sets 710B-740B represent the percent (e.g., weight percent) of silicon germanium layers comprising germanium, wherein the silicon germanium layers are prepared with a first silicon precursor comprising a halogenated silicon precursor (e.g., dichlorosilane) and a second silicon precursor comprising a nonhalogenated silicon precursor (e.g., silane), and the germanium precursor, in accordance with various embodiments. As shown by data set 710B (representing a co-flow silicon germanium process without a precoat), the represented silicon germanium layer on a substrate formed in a reaction chamber without a precoat layer comprises a significant increase in germanium content toward the edges of the substrate. This creates undesirable variability of germanium content or composition within the silicon germanium layer along the substrate. In this case, a germanium composition percentage within the silicon germanium layer varies about 2.4% across the substrate. Data sets 720B-740B however, indicate how including a precoat layer on the surfaces within a reaction chamber, in which a silicon germanium layer will be formed on a substrate, improves (i.e., decreases) the germanium composition variability within or across the wafer. Data set 720B represents a substrate having a silicon germanium layer deposited thereon (e.g., produced by a co-flow process) within a reaction chamber having a 1000-Angstrom SEG precoat layer comprising silicon germanium disposed on surfaces therein. Data set 730B represents a substrate having a silicon germanium layer deposited thereon (e.g., produced by a co-flow process) within a reaction chamber having a 1000-Angstrom non-SEG precoat layer comprising silicon germanium disposed on surfaces therein. Data set 740B represents a substrate having a silicon germanium layer deposited thereon (e.g., produced by a co-flow process) within a reaction chamber having a 3000-Angstrom precoat layer comprising silicon (e.g., polycrystalline silicon) disposed on surfaces therein. As data sets 720B-740B indicate, the presence of a precoat layer (whether comprising silicon germanium or silicon) within the reaction chamber in which the silicon germanium layer is deposited greatly reduces the edge roll-up (i.e., the increase in germanium composition percentage of the silicon germanium layer toward the substrate edges), and thus reduces the variability in the silicon germanium layer composition across the substrate and increases composition uniformity. For example, the variability of the germanium percentage in the silicon germanium layer composition for data set 720B was about 0.3%, which is a significant improvement from the 2.4% variability without the precoat layer (shown in data set 710B).

FIG. 8A illustrates the silicon germanium layer thicknesses (i.e., a thickness profile) across a substrate (e.g., a wafer). i.e., FIG. 8A illustrates the effects of a precoat layer on a DCS-based silicon germanium film thickness profile uniformity). Data sets 810A-840A represent silicon germanium layer thicknesses for silicon germanium layers prepared with the silicon precursor comprising a halogenated silicon compound (e.g., dichlorosilane (DCS)) (no second silicon precursor) and a germanium precursor, in accordance with various embodiments. As shown by data set 810A (representing a DCS-based silicon germanium process without a precoat), the represented silicon germanium layer on a substrate formed in a reaction chamber without a precoat layer has a significant increase in thickness toward the edges of the substrate. This creates undesirable thickness variability of the silicon germanium layer along the substrate. Data sets 820A-840A however, indicate how including a precoat layer on the surfaces within a reaction chamber, in which a silicon germanium layer will be formed on a substrate, improves (i.e., decreases) the thickness variability within or across the wafer or substrate. Data set 820A represents a substrate having a silicon germanium layer deposited thereon (e.g., produced by a DCS-based process) within a reaction chamber having a 3000-Angstrom precoat layer comprising silicon (e.g., polycrystalline silicon) disposed on surfaces therein. Data set 830A represents a substrate having a silicon germanium layer deposited thereon (e.g., produced by a DCS-based process) within a reaction chamber having a 1000-Angstrom non-SEG precoat layer comprising silicon germanium disposed on surfaces therein. Data set 840A represents a substrate having a silicon germanium layer deposited thereon (e.g., produced by a DCS-based process) within a reaction chamber having a 1000-Angstrom SEG precoat layer comprising silicon germanium disposed on surfaces therein. As data sets 820A-840A indicate, the presence of a precoat layer (whether comprising silicon germanium or silicon) within the reaction chamber in which the silicon germanium layer is deposited greatly reduces the edge roll-up (i.e., increase in thickness toward the substrate edges), and thus reduces the variability in the silicon germanium layer thickness across the substrate and improves the thickness uniformity.

In various embodiments, the presence of a precoat layer within the reaction chamber may not significantly improve uniformity of the germanium composition percentage in the silicon germanium layer. FIG. 8B illustrates the effects of a precoat layer on a DCS-based silicon germanium film germanium composition profile uniformity. As shown in FIG. 8B, data sets 810B-840B represent the weight percent of silicon germanium layers comprising germanium, wherein the silicon germanium layers are prepared with the silicon precursor comprising a halogenated silicon compound (e.g., dichlorosilane) (no second silicon precursor) and the germanium precursor, in accordance with various embodiments. Data set 810B represents a silicon germanium layer on a substrate (e.g., produced by a DCS-based process) formed in a reaction chamber without a precoat layer. Data set 820B represents a silicon germanium layer on a substrate (e.g., produced by a DCS-based process) formed in a reaction chamber having a 3000-Angstrom precoat layer comprising silicon (e.g., polycrystalline silicon) disposed on the surfaces therein. Data set 830B represents a silicon germanium layer on a substrate (e.g., produced by a DCS-based process) formed in a reaction chamber having a 1000-Angstrom non-SEG precoat layer comprising silicon germanium disposed on the surfaces therein. Data set 840B represents a silicon germanium layer on a substrate (e.g., produced by a DCS-based process) formed in a reaction chamber having a 1000-Angstrom SEG precoat layer comprising silicon germanium disposed on the surfaces therein. As shown by data sets 810B-840B, the presence of a precoat layer on surfaces within the reaction chamber in which the silicon germanium layer is deposited does not significantly affect or improve the roll-down (i.e., the decrease in germanium percentage within the silicon germanium layer) near the substrate edges.

FIG. 9A illustrates the silicon germanium layer thicknesses (i.e., a thickness profile) across a substrate (e.g., a wafer) (i.e., FIG. 9A illustrates the effects of a precoat layer on a silane-based silicon germanium film thickness profile uniformity). Data sets 910A-940A represent silicon germanium layer thicknesses for silicon germanium layers prepared with the silicon precursor comprising a nonhalogenated silicon compound (e.g., silane) (no second silicon precursor), and the germanium precursor, in accordance with various embodiments. Data set 910A represents a silicon germanium layer on a substrate (e.g., produced by a silane-based process) formed in a reaction chamber without a precoat layer. Data set 920A represents a silicon germanium layer on a substrate (e.g., produced by a silane-based process) formed in a reaction chamber having a 1000-Angstrom non-SEG precoat layer comprising silicon germanium disposed on the surfaces therein. Data set 930A represents a silicon germanium layer on a substrate (e.g., produced by a silane-based process) formed in a reaction chamber having a 3000-Angstrom precoat layer comprising silicon (e.g., polycrystalline silicon) disposed on the surfaces therein. Data set 940A represents a silicon germanium layer on a substrate (e.g., produced by a silane-based process) formed in a reaction chamber having a 1000-Angstrom SEG precoat layer comprising silicon germanium disposed on the surfaces therein. As shown by data set 910A-940A, the presence of a precoat layer on surfaces within the reaction chamber in which the silicon germanium layer is deposited may not significantly improve the thickness uniformity of the represented silicon germanium layer along the substrate.

FIG. 9B illustrates the germanium composition percentage of silicon germanium layers across a substrate (i.e., FIG. 9B illustrates the effects of a precoat layer on a silane-based silicon germanium film germanium composition profile uniformity). Data sets 910B-940B represent the weight percent of the respective silicon germanium layers comprising germanium, wherein the silicon germanium layer is prepared with the silicon precursor comprising a nonhalogenated silicon compound (e.g., silane) (no second silicon precursor), and a germanium precursor, in accordance with various embodiments. Data set 910B represents a silicon germanium layer on a substrate (e.g., produced by a silane-based process) formed in a reaction chamber without a precoat layer. Data set 920B represents a silicon germanium layer on a substrate (e.g., produced by a silane-based process) formed in a reaction chamber having a 1000-Angstrom non-SEG precoat layer comprising silicon germanium disposed on the surfaces therein. Data set 930B represents a silicon germanium layer on a substrate (e.g., produced by a silane-based process) formed in a reaction chamber having a 3000-Angstrom precoat layer comprising silicon (e.g., polycrystalline silicon) disposed on the surfaces therein. Data set 940B represents a silicon germanium layer on a substrate (e.g., produced by a silane-based process) formed in a reaction chamber having a 1000-Angstrom SEG precoat layer comprising silicon germanium disposed on the surfaces therein. As shown by data sets 910B-940B, the presence of a precoat layer on surfaces within the reaction chamber in which the silicon germanium layer is deposited may not significantly affect or improve the germanium composition percentage uniformity of the silicon germanium layer along the substrate.

In light the results shown in FIGS. 7A-7B versus those shown in FIGS. 8A-8B and 9A-9B, the presence of a precoat layer on surfaces within the reaction chamber may further improve the thickness and germanium content uniformity of a silicon germanium layer across a substrate in embodiments involving both a halogenated silicon precursor (e.g., dichlorosilane) and a nonhalogenated precursor (e.g., silane), along with the germanium precursor (indicated in FIGS. 7A-7B). However, a silicon germanium layer formed through a process comprising a single silicon precursor may not receive significant benefits from the inclusion of a precoat layer (indicated in FIGS. 8A-8B and 9A-9B).

Although exemplary embodiments of the present disclosure are set forth herein, it should be appreciated that the disclosure is not so limited. For example, although systems are described in connection with various specific configurations, the disclosure is not necessarily limited to these examples. Various modifications, variations, and enhancements of the systems and methods set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

The invention claimed is:

1. A method of forming a silicon germanium layer on a surface of a substrate, the method comprising the steps of:

depositing a precoat layer on a surface within a reaction chamber, wherein a germanium concentration of the precoat layer during the step of depositing the precoat layer is chosen to reduce nonuniformity of the silicon germanium layer at an edge of the silicon germanium layer;

after depositing the precoat layer, providing the substrate within the reaction chamber;

providing a first silicon precursor to the reaction chamber;

sequential to the step of providing the first silicon precursor, providing a second silicon precursor to the reaction chamber; and sequential to the step of providing the second silicon precursor, providing a germanium precursor to the reaction chamber, and wherein the precoat layer is disposed on the surface within the reaction chamber prior to the providing the first silicon precursor to the reaction chamber, the providing the second silicon precursor to the reaction chamber, and the providing the germanium precursor to the reaction chamber, wherein the precoat layer has a thickness between about 1000 Angstroms and about 3000 Angstroms, wherein the precoat layer comprises silicon germanium, and wherein the precoat layer has the germanium concentration between 5% and 90% by weight.

2. The method of claim 1, wherein the first silicon precursor consists of a halogenated silicon precursor.

3. The method of claim 1, wherein the step of providing a substrate within a reaction chamber comprises heating the substrate to a temperature of less than 600° C.

4. The method of claim 2, wherein the halogenated silicon precursor comprises a compound represented by a formula $Si_xW_yH_z$, wherein W is a halide selected from the group consisting of fluorine, chlorine, bromine, and iodine, x and y are integers greater than zero, and z is an integer greater than or equal to zero.

5. The method of claim 1, wherein the temperature during the step of providing the substrate within the reaction chamber is within a range of 400° C. to 700° C.

6. The method of claim 2, wherein the halogenated silicon precursor comprises a compound selected from the group consisting of trichlorosilane, dichlorosilane, silicon tetrachloride, a silicon bromide, and a silicon iodide.

7. The method of claim 1, wherein the second silicon precursor consists of a nonhalogenated silicon precursor.

8. The method of claim 7, wherein the nonhalogenated silicon precursor consists essentially of silicon and hydrogen.

9. The method of claim 7, wherein the nonhalogenated silicon precursor comprises a silane.

10. The method of claim 1, wherein the germanium precursor comprises a germane.

11. The method of claim 1, wherein the germanium precursor consists essentially of germanium and hydrogen.

12. The method of claim 1, wherein the germanium precursor comprises a halogen.

13. The method of claim 12, wherein the germanium precursor comprises one or more of germanium tetrachloride, germanium chlorohydride, germanium chlorobromide.

14. The method of claim 1, wherein at least one of the first silicon precursor, the second silicon precursor, or the germanium precursor comprises about 10 to about 90, about 1 to about 10, or about 0.1 to about 1 volumetric percent of a volumetric flow.

15. The method of claim 1, wherein the temperature during the step of depositing the precoat layer is within a range of 400° C. to 1250° C.

16. The method of claim 1, further comprising a step of mixing the first silicon precursor and the germanium precursor to form a mixture prior to flowing the mixture into the reaction chamber.

17. A method of forming a silicon germanium layer on a surface of a substrate, the method comprising the steps of:

depositing a precoat layer on a surface within a reaction chamber, wherein a thickness of the precoat layer during the step of depositing the precoat layer is chosen to reduce nonuniformity of the silicon germanium layer at an edge of the silicon germanium layer;

after depositing the precoat layer, providing the substrate within the reaction chamber;

providing a first silicon precursor to the reaction chamber, wherein the first silicon precursor comprises a halogenated silicon precursor;

sequential to the step of providing the first silicon precursor, providing a second silicon precursor to the reaction chamber wherein the second silicon precursor comprises a nonhalogenated silicon precursor; and sequential to the step of providing the second silicon precursor, providing a germanium precursor to the reaction chamber, and wherein the precoat layer is disposed on the surface within the reaction chamber prior to the providing the first silicon precursor to the reaction chamber, the providing the second silicon precursor to the reaction chamber, and the providing the germanium precursor to the reaction chamber, wherein the precoat layer has a thickness between about 1000 Angstroms and about 3000 Angstroms, wherein the precoat layer comprises silicon germanium, and wherein the precoat layer has a germanium concentration between 5% and 90% by weight.

18. A method of forming a silicon germanium layer on a surface of a substrate, the method comprising the steps of:

depositing a precoat layer on a surface within a reaction chamber, wherein a thickness and/or germanium concentration of the precoat layer during the step of depositing the precoat layer is chosen to reduce nonuniformity of the silicon germanium layer at an edge of the silicon germanium layer;

after depositing the precoat layer, providing the substrate within the reaction chamber;

providing a first silicon precursor to the reaction chamber;

sequential to the step of providing the first silicon precursor, providing a second silicon precursor to the reaction chamber; and sequential to the step of providing the second silicon precursor, providing a germanium precursor to the reaction chamber, and wherein the precoat layer is disposed on the surface within the reaction chamber prior to the providing the first silicon precursor to the reaction chamber, the providing the second silicon precursor to the reaction chamber, and the providing the germanium precursor to the reaction chamber, wherein the precoat layer has a thickness between about 1000 Angstroms and about 3000 Angstroms, wherein the precoat layer comprises silicon germanium, and wherein the precoat layer has a germanium concentration between 5% and 90% by weight.

19. The method of claim 17, further comprising a step of providing a sacrificial substrate to the reaction chamber prior to depositing the precoat and a step of removing the sacrificial substrate from the reaction chamber after deposing the precoat.

20. The method of claim 1, further comprising a step of providing a sacrificial substrate to the reaction chamber prior to depositing the precoat and a step of removing the sacrificial substrate from the reaction chamber after deposing the precoat.

21. The method of claim 1, wherein the edge of the silicon germanium layer is an area of the silicon germanium layer about 1.2 millimeters from a substrate edge.

22. The method of claim 21, wherein the precoat layer thickness and/or the germanium concentration is selected to limit a germanium concentration nonuniformity of the edge of the silicon germanium layer.

23. The method of claim 21, wherein the precoat layer thickness and/or the germanium concentration is selected to limit a thickness nonuniformity of the edge of the silicon germanium layer.

24. The method of claim 21, wherein the precoat layer thickness and/or the germanium concentration is selected to limit both a germanium concentration nonuniformity of the edge of the silicon germanium layer and a thickness nonuniformity of the edge of the silicon germanium layer.

* * * * *